US007149110B2

(12) United States Patent
Tran et al.

(10) Patent No.: US 7,149,110 B2
(45) Date of Patent: Dec. 12, 2006

(54) SEEK WINDOW VERIFY PROGRAM SYSTEM AND METHOD FOR A MULTILEVEL NON-VOLATILE MEMORY INTEGRATED CIRCUIT SYSTEM

(75) Inventors: Hieu Van Tran, San Jose, CA (US); Hung Q. Nguyen, Fremont, CA (US); Amitay Levi, Cupertino, CA (US); Isao Nojima, Los Altos, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 228 days.

(21) Appl. No.: 10/737,689

(22) Filed: Dec. 15, 2003

(65) Prior Publication Data
US 2004/0125653 A1     Jul. 1, 2004

Related U.S. Application Data

(60) Continuation-in-part of application No. 10/317,455, filed on Dec. 11, 2002, now Pat. No. 6,959,779, which is a continuation-in-part of application No. 10/211,886, filed on Aug. 1, 2002, now Pat. No. 6,865,099, which is a continuation-in-part of application No. 09/929,542, filed on Aug. 13, 2001, now Pat. No. 6,751,118, which is a division of application No. 09/231,928, filed on Jan. 14, 1999, now Pat. No. 6,282,145.

(51) Int. Cl.
*G11C 11/34* (2006.01)

(52) U.S. Cl. ............................ 365/185.03; 365/185.22
(58) Field of Classification Search ........... 365/185.03, 365/185.22, 185.24
See application file for complete search history.

(56) References Cited

U.S. PATENT DOCUMENTS

| 5,841,165 | A | * | 11/1998 | Chang et al. ............... 257/318 |
| 6,501,682 | B1 | * | 12/2002 | Yoshida ................. 365/185.22 |
| 6,522,580 | B1 | * | 2/2003 | Chen et al. ............ 365/185.02 |
| 2003/0002345 | A1 | * | 1/2003 | Avni et al. ............. 365/185.29 |

* cited by examiner

*Primary Examiner*—Vu A. Le
(74) *Attorney, Agent, or Firm*—DLA Piper Rudnick Gray Cary US LLP

(57) ABSTRACT

A memory comprises a plurality of digital multilevel memory cells. A window of valid data voltages for accessing the said plurality of digital multilevel memory cells is detected. The window may be detected by incrementing a first programming voltage to program data in the plurality of memory cells and verifying whether the data in at least one of said plurality of memory cells is properly programmed. The incrementing and verifying may be repeated until data is verified to be properly programmed in one of said plurality of memory cells. The data in each memory cell of said plurality of memory cells is verified. The verification may be by incrementing a second programming voltage, and verifying whether data in each memory cell is properly programmed within a margin. The incrementing and verifying is repeated for each memory cell outside of the margin.

27 Claims, 86 Drawing Sheets

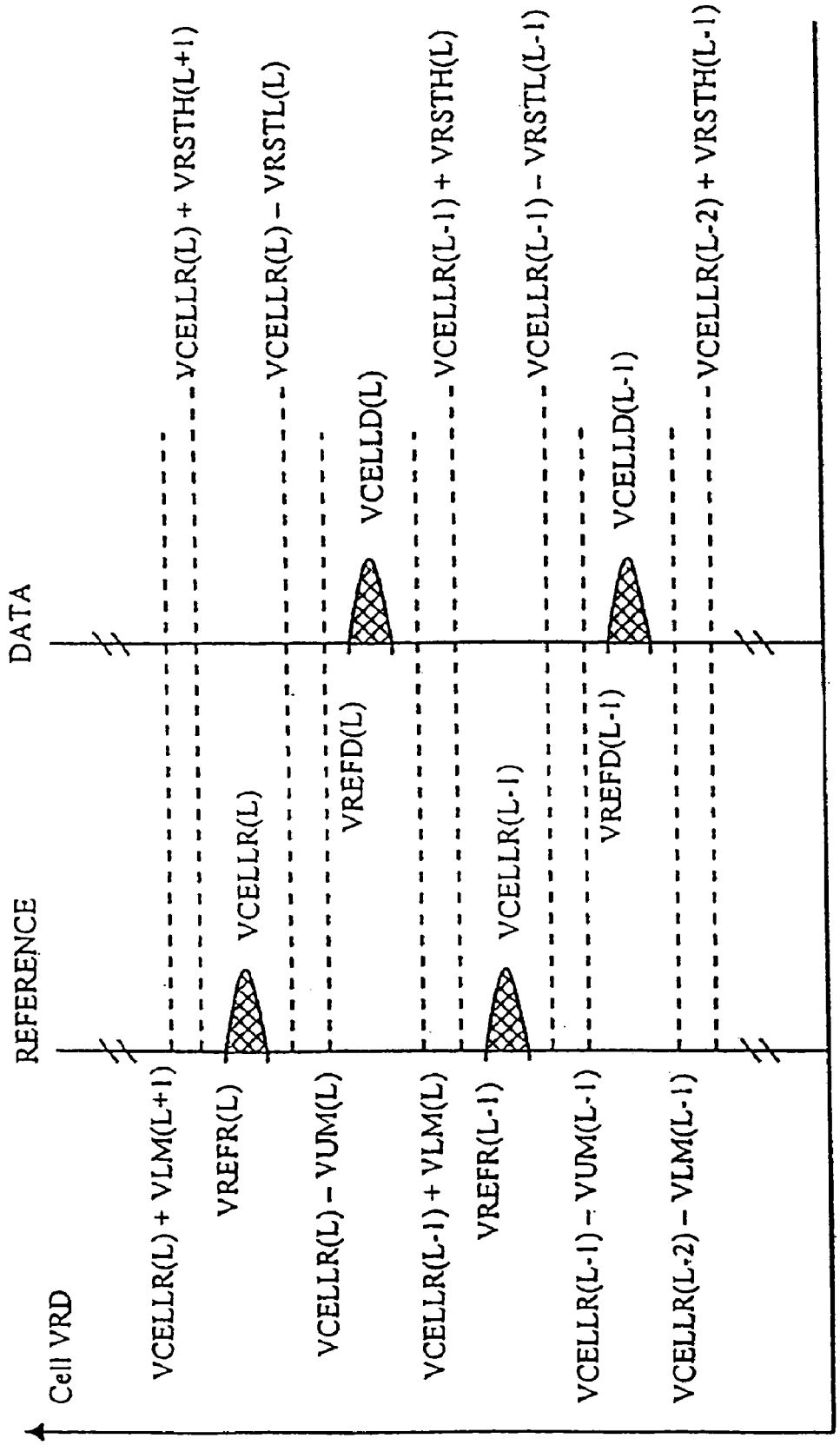
FIG._19A

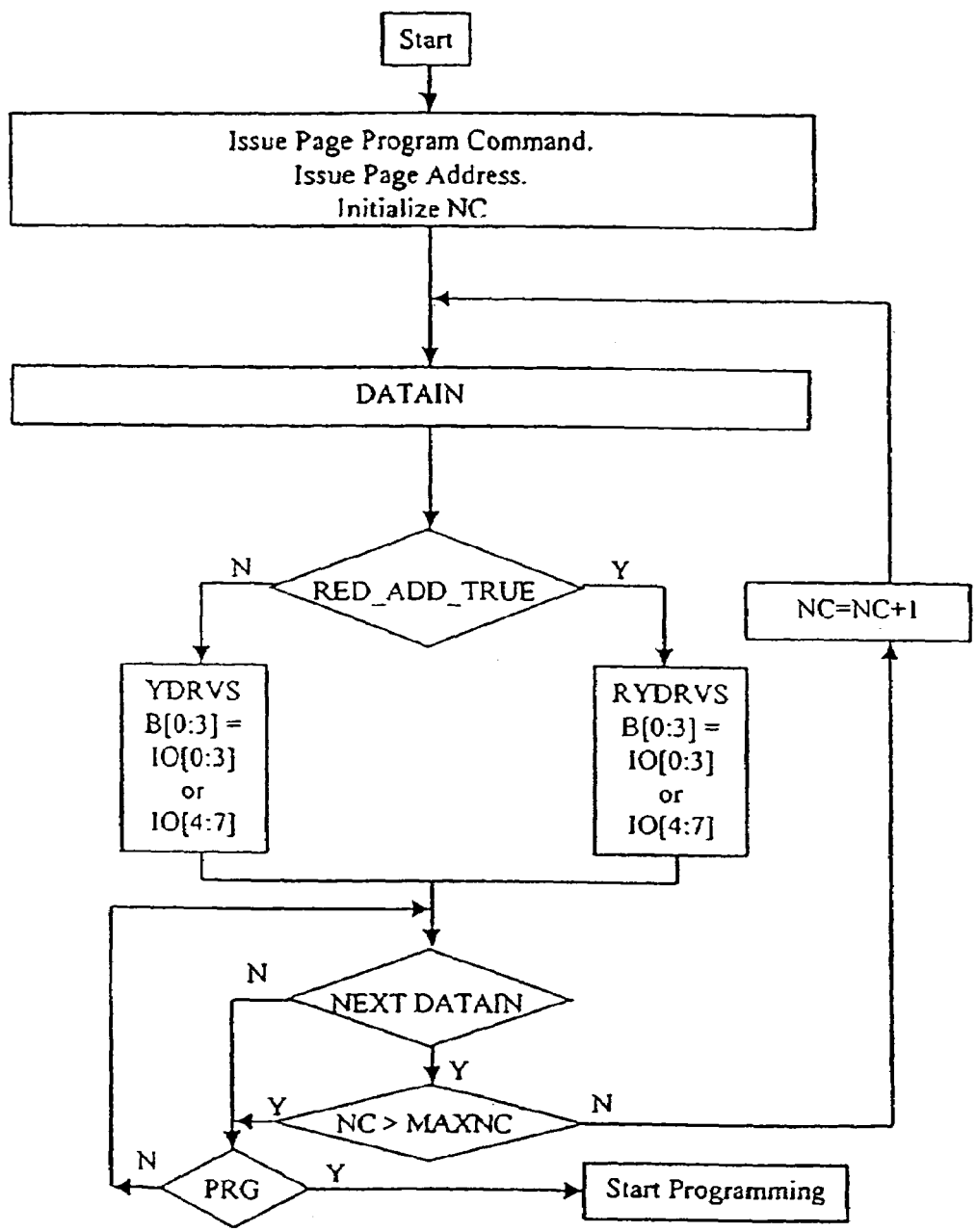
FIG._20

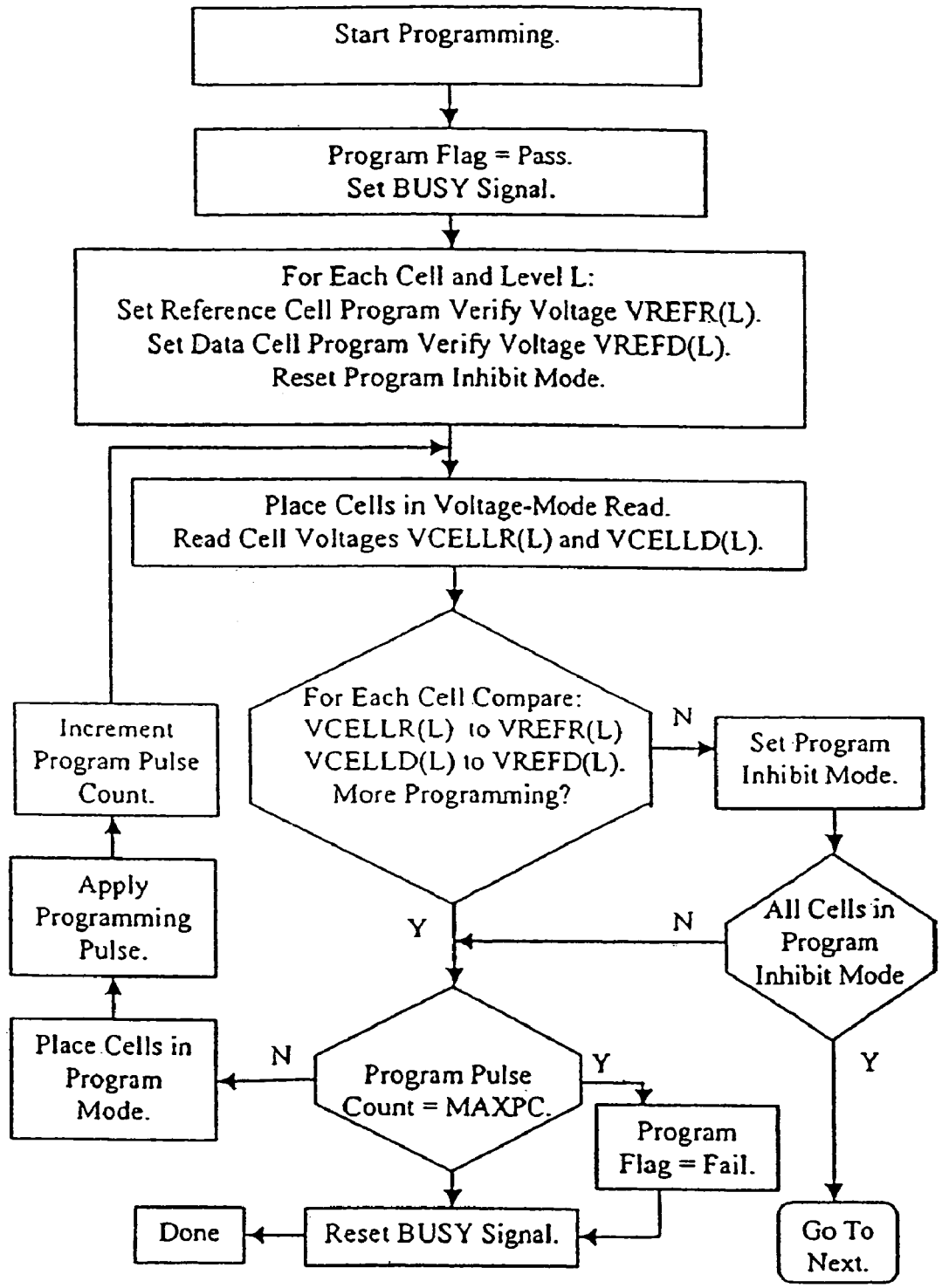
*FIG._21*

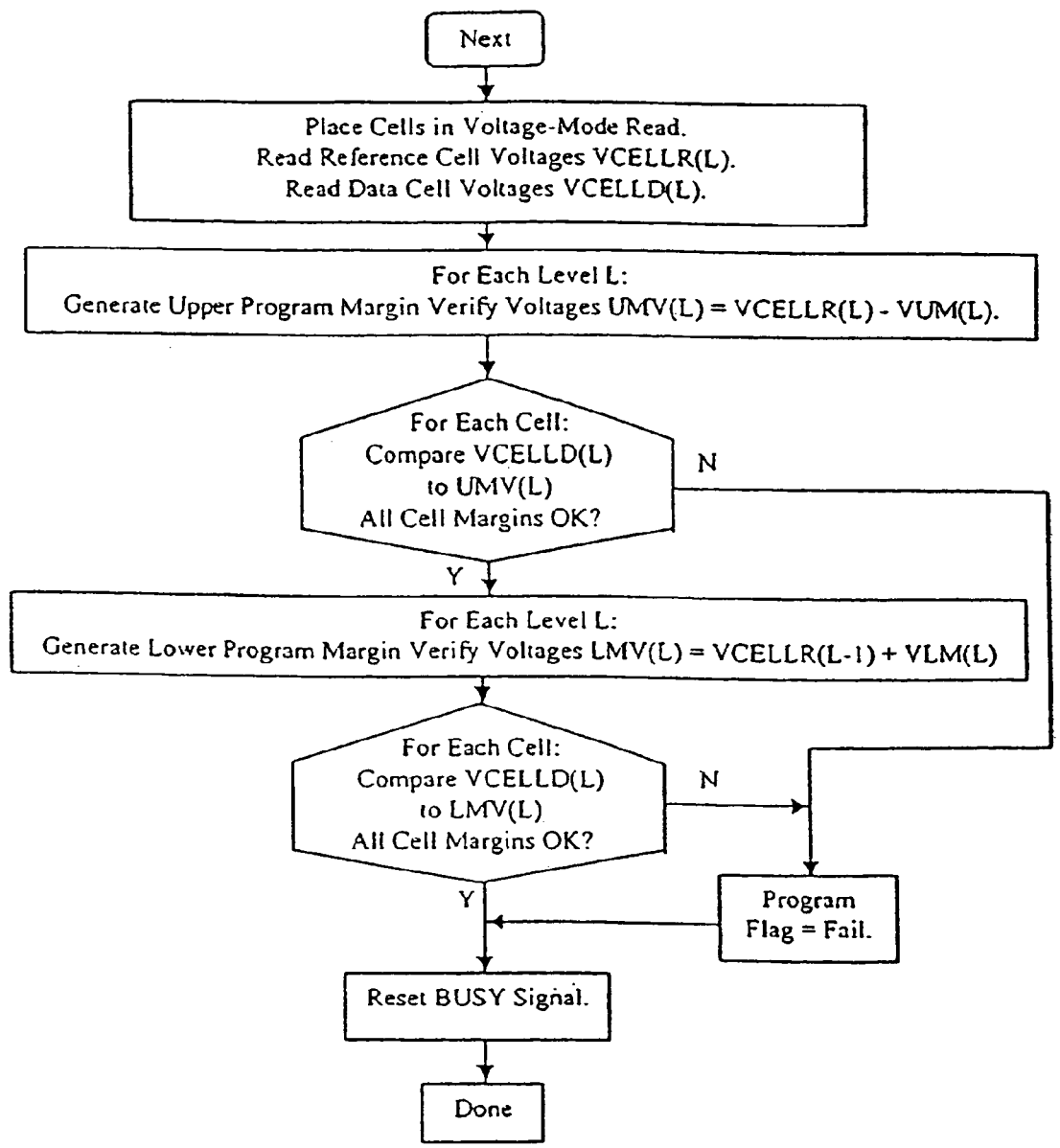
Fig._22A

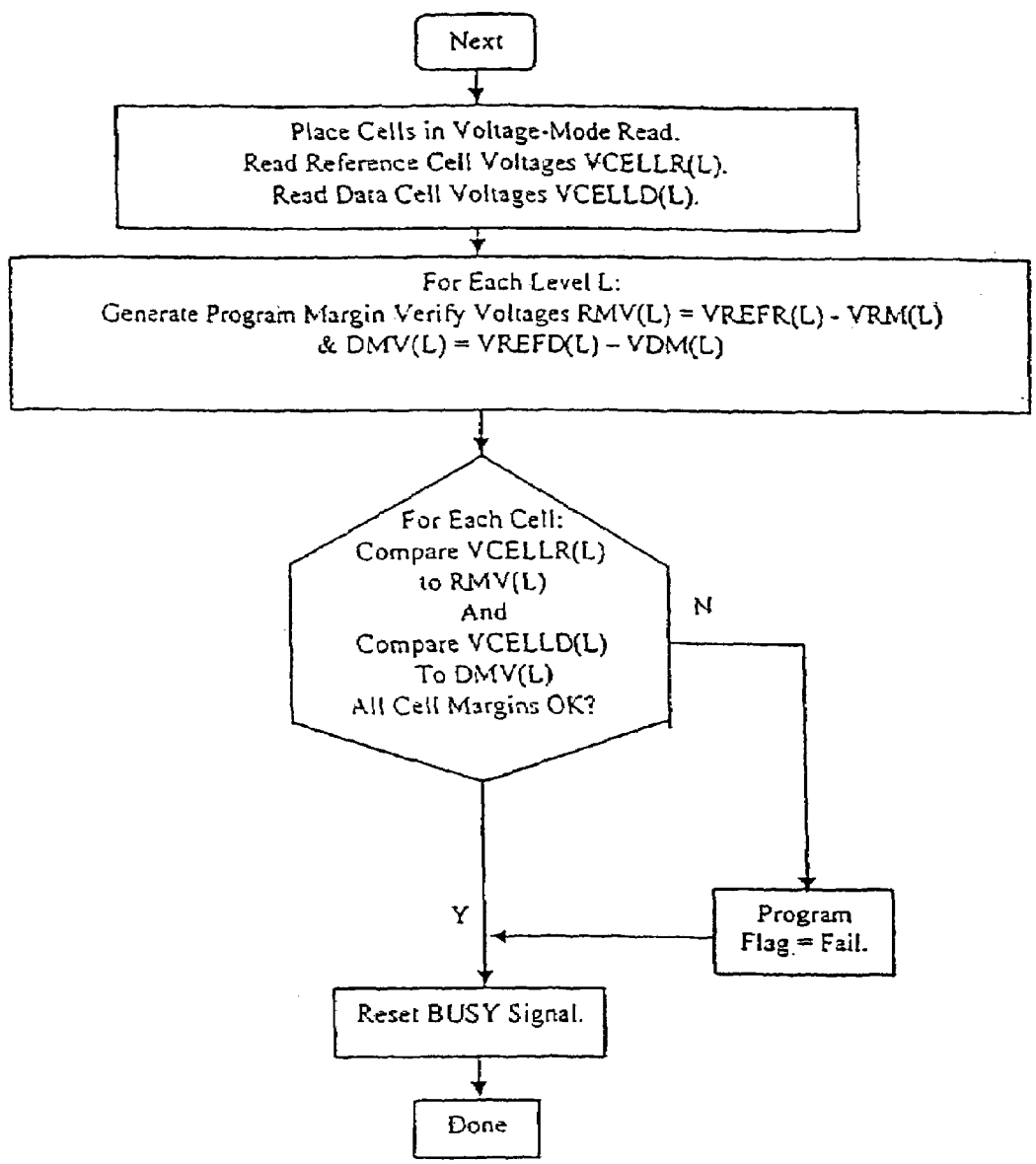
Fig._22B

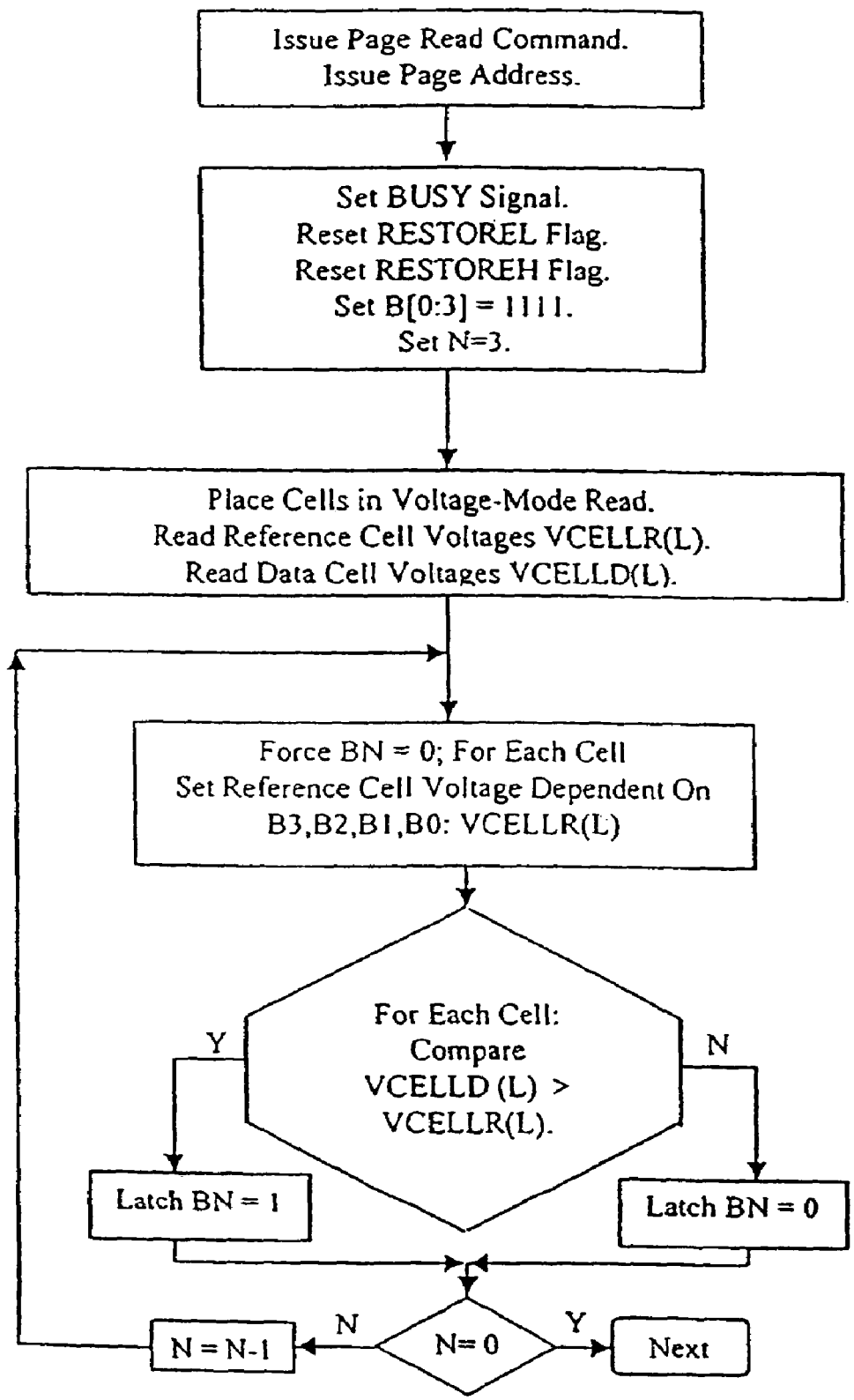
FIG._23

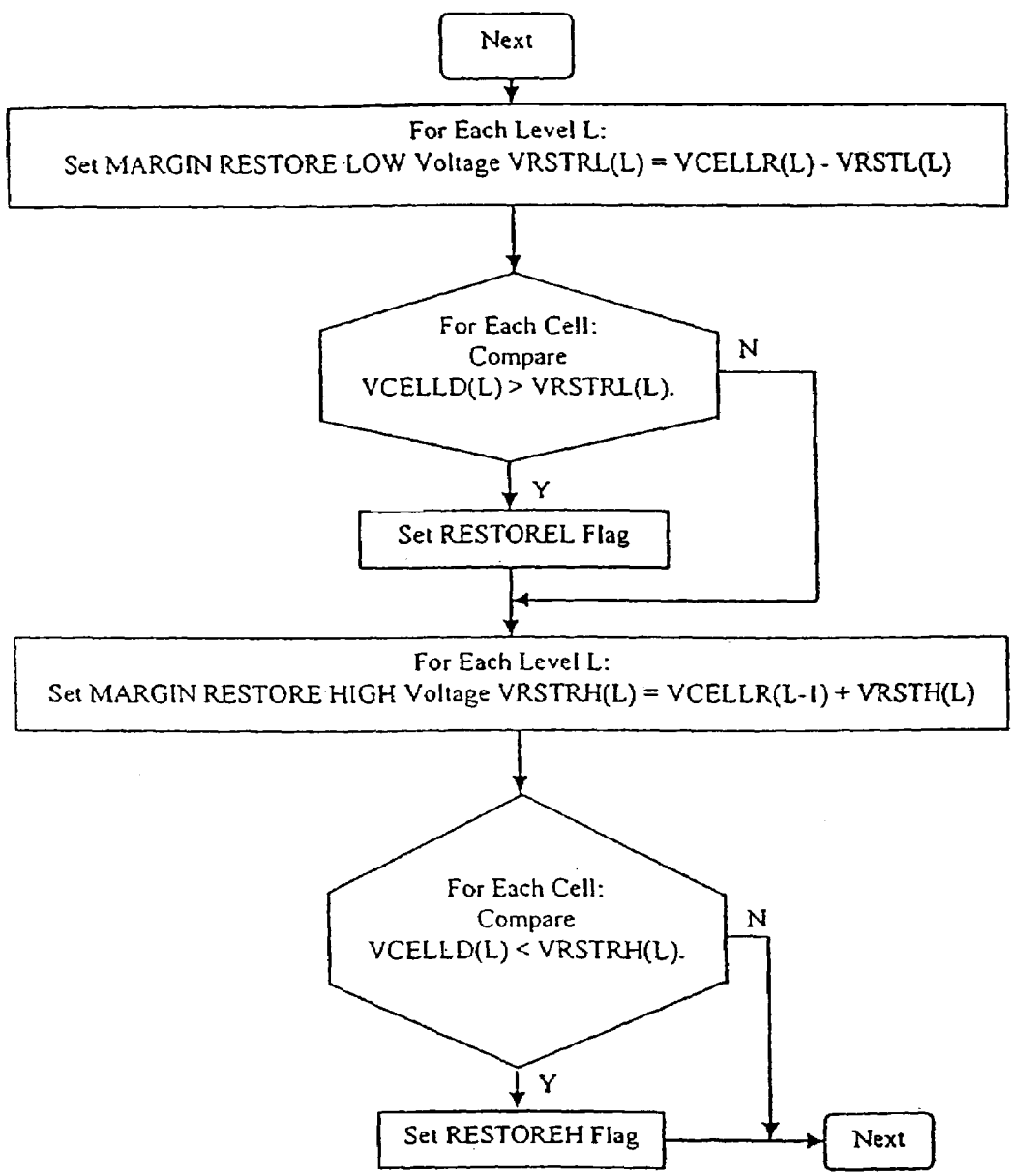
FIG._24

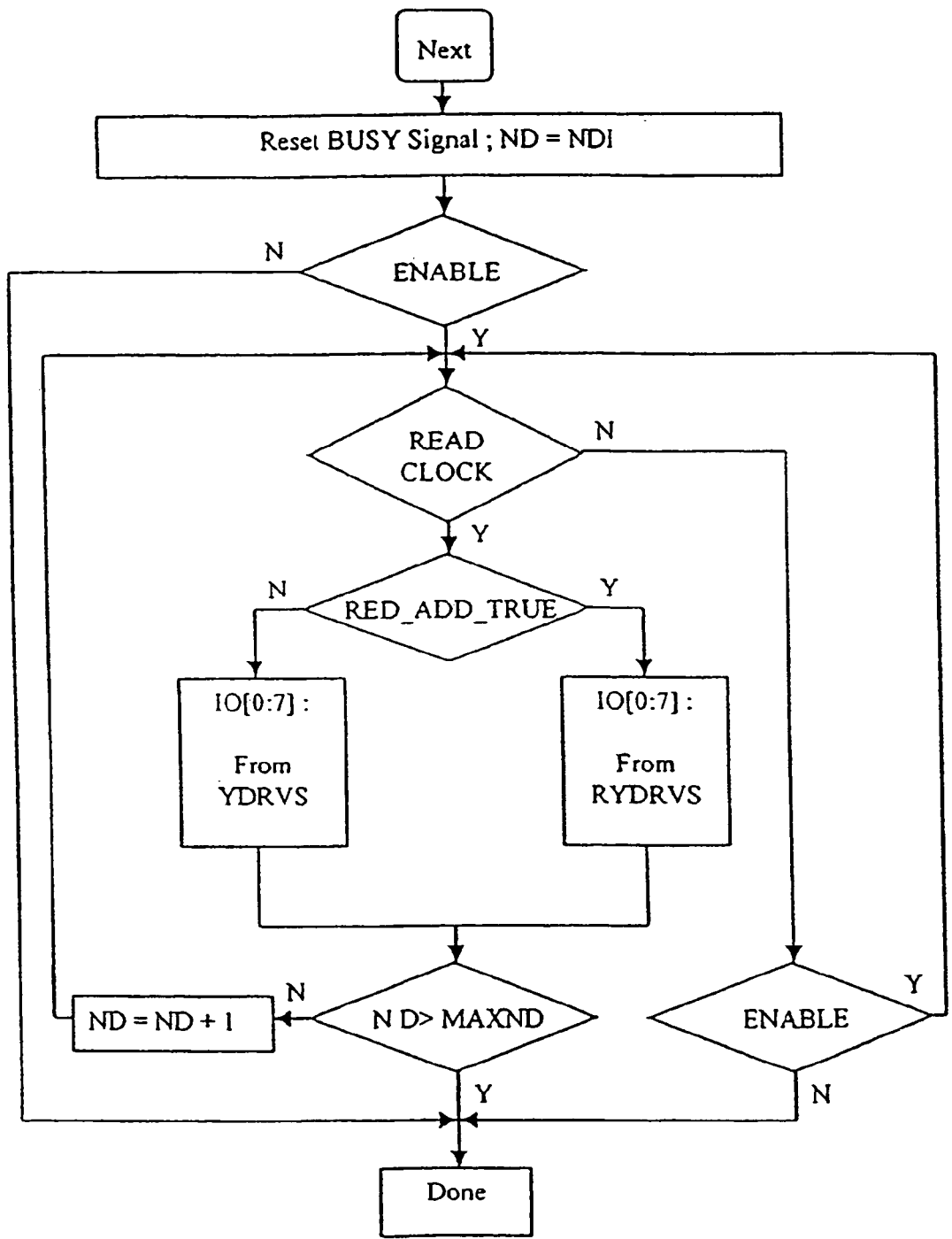
FIG._25

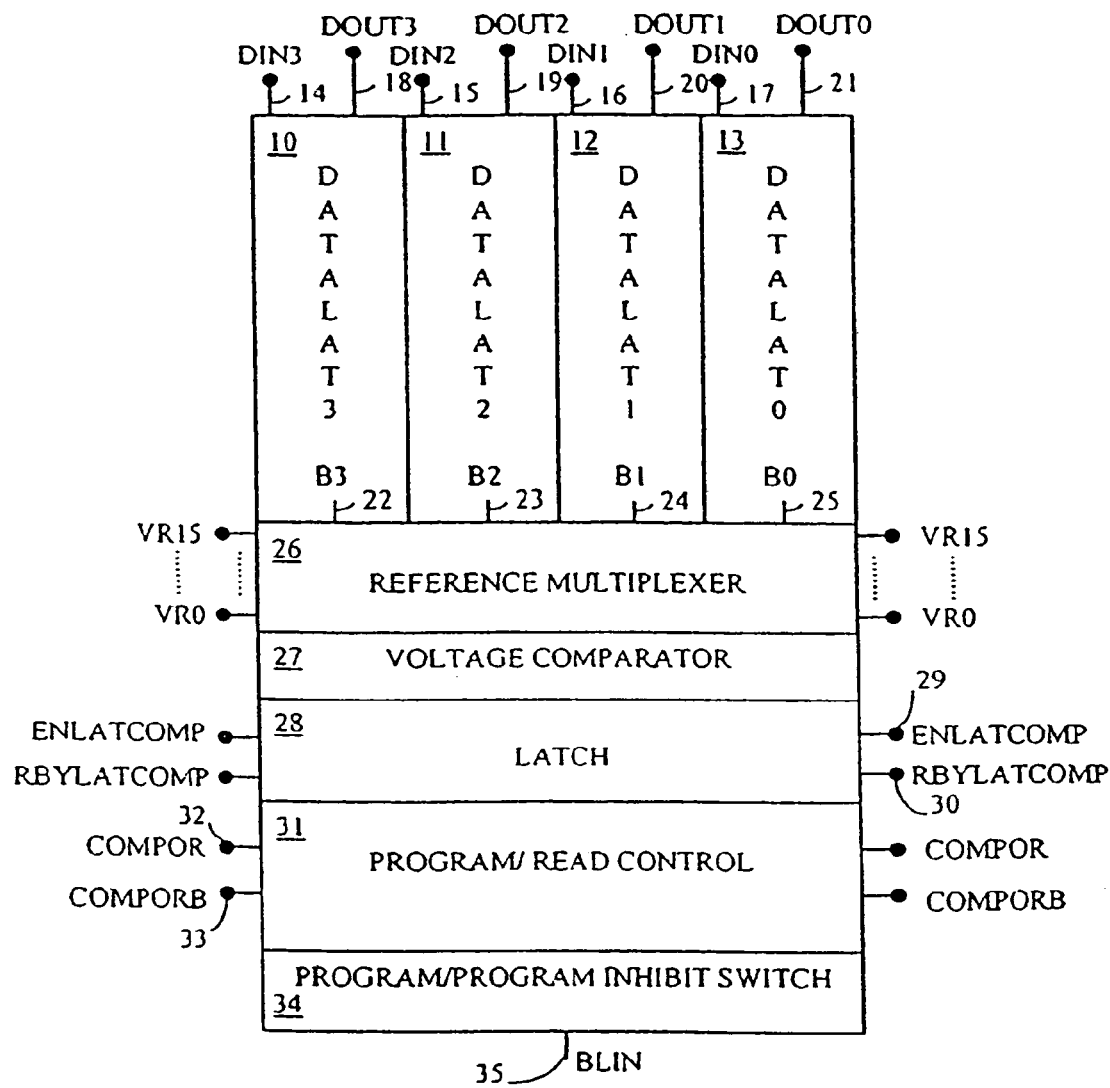
Fig. _26

SEEK WINDOW VERIFY PROGRAM SYSTEM AND METHOD FOR A MULTILEVEL NON-VOLATILE MEMORY INTEGRATED CIRCUIT SYSTEM

CROSS-REFERENCE TO RELATED APPLICATIONS

This is a continuation-in-part of application Ser. No. 10/317,455, filed Dec. 11, 2002 now U.S. Pat. No. 6,959,779, which is a continuation-in-part of application Ser. No. 10/211,886, filed Aug. 1, 2002 now U.S. Pat. No. 6,865,099, which is a continuation-in-part of application Ser. No. 09/929,542, filed Aug. 13, 2001 now U.S. Pat. No. 6,751,118, which is a division of application Ser. No. 09/231,928 filed Jan. 14, 1999, issued as U.S. Pat. No. 6,282,145, the subject matter of each of these applications is incorporated herein by reference.

FIELD OF THE INVENTION

This invention relates in general to semiconductor memories, and, in particular, to the design and operation of multilevel nonvolatile semiconductor memories.

BACKGROUND OF THE INVENTION

As the information technology progresses, the demand for high density giga bit and tera bit memory integrated circuits is insatiable in emerging applications such as data storage for photo quality digital film in multi-mega pixel digital camera, CD quality audio storage in audio silicon recorder, portable data storage for instrumentation and portable personal computers, and voice, data, and video storage for wireless and wired phones and other personal communicating assistants.

The nonvolatile memory technology such as ROM (Read Only Memory), EEPROM (Electrical Erasable Programmable Read Only Memory), or FLASH is often a technology of choice for these application due to its nonvolatile nature, meaning it still retains the data even if the power supplied to it is removed. This is in contrast with the volatile memory technology, such as DRAM (Dynamic Random Access Memory), which loses data if the power supplied to it is removed. This nonvolatile feature is very useful in saving the power from portable supplies, such as batteries. Until battery technology advances drastically to ensure typical electronic systems to function for a typical operating lifetime, e.g., 10 years, the nonvolatile technology will fill the needs for most portable applications.

The FLASH technology, due to its smallest cell size, is the highest density nonvolatile memory system currently available. The advance of the memory density is made possible by rapidly advancing the process technology into the realm of nano meter scale and possibly into the atomic scale and electron scale into the next century. At the present sub-micro meter scale, the other method that makes the super high-density memory system possible is through the exploitation of the analog nature of a storage element.

The analog nature of a flash or nonvolatile storage element provides, by theory, an enormous capability to store information. For example, if one electron could represent one bit of information then, for one typical conventional digital memory cell, the amount of information is equal to the number of electrons stored, or approximately a few hundred thousands. Advances in device physics exploring the quantum mechanical nature of the electronic structure will multiply the analog information manifested in the quantum information of a single electron even further.

The storage information in a storage element is hereby defined as a discrete number of storage levels for binary digital signal processing with the number of storage levels equal to $2^N$ with N equal to the number of digital binary bits. The optimum practical number of discrete levels stored in a nonvolatile storage element depends on the innovative circuit design method and apparatus, the intrinsic and extrinsic behavior of the storage element, all within constraints of a definite performance target, such as product speed and operating lifetime, with a certain cost penalty.

At the current state of the art, all the multilevel systems are only suitable for medium density, i.e. less than a few tens of mega bits, and only suitable for a small number of storage levels per cell, i.e., less than four levels or two digital bits.

As can be seen, memories having high storage capacity and fast operating speed are highly desirable.

The signal path from the data cells to a sense amplifier may have mismatch with the signal path from the reference memory cells to the sense amplifier. The mismatch generates a current ratio error and may be caused by mismatches of the threshold voltage, the width, length, mobility, and oxide thickness of the circuit elements, such as transistors, in the signal paths. The mismatch also may be caused by mismatch in signal paths due to parasitics, such as width and length of interconnects.

Process, temperature, cycling and other variations may alter the usable voltage or current range of memory cells. Programming of data cells should be done in the range, but the range may change over time.

SUMMARY OF THE INVENTION

A method determines valid voltages for accessing the plurality of digital multilevel memory cells. A window of valid data ranges is detected for the plurality of digital multilevel memory cells.

In one aspect, a first programming voltage is incremented to program data in the plurality of memory cells. The method verifies whether the data in at least one of the memory cells is properly programmed and the incrementing and verifying is repeated until data is verified to be properly programmed in one of the plurality of memory cells. In another aspect, a second programming voltage is incremented and data in each memory cell is verified as to whether the memory cell is properly programmed within a margin. The incrementing of the second programming voltage and the verifying of each memory cell outside of a margin is repeated.

BRIEF DESCRIPTION OF THE DRAWINGS

FIG. 19A shows voltage levels for program verify, margin, read, and restore for one embodiment of the current invention.

FIG. 20 shows an embodiment of flow diagram of the page programming cycle.

FIG. 21 shows an embodiment of flow diagram after page programming begins.

FIG. 22A shows a continuation of flow diagram after page programming begins.

FIG. 22B shows an alternative embodiment of continuation of flow diagram after page programming begins shown in FIG. 22A.

FIG. 23 shows an embodiment of flow diagram of the page read cycle.

FIG. 24 shows a continuation of flow diagram of the page read cycle in FIG. 23.

FIG. 25 shows a continuation of flow diagram of the page read cycle in FIG. 24.

FIG. 26 shows details of an embodiment of a single y-driver YDRVS 110S.

DESCRIPTION OF THE SPECIFIC EMBODIMENTS

Figure 1B:
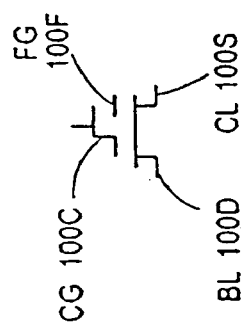
FIG. 1B is a transistor symbol corresponding to the source side injection flash memory cell shown in FIG. 1A.

Described are the design method and apparatus for a super high density nonvolatile memory system capable of giga to tera bits as applied to the array architecture, reference system, and decoding schemes to realize the optimum possible number of storage levels within specified performance constraints. Method and apparatus for multilevel program and sensing algorithm and system applied to flash memory is also described.

Array architectures and operating methods are described that are suitable for a super high density, in the giga to tera bits, for multilevel nonvolatile "green" memory integrated circuit system. "Green" refers to a system working in an efficient and low power consumption manner. The system and method solves the issues associated with super high density multilevel memory system, such as, precision voltage control in the array, severe capacitive loading from MOS transistor gates and parasitics, high leakage current due to memory cells and from cells to cells, excessive power consumption due to large number of gates and parasitics, and excessive memory cell disturbances due to large memory density.

An Inhibit and Select Segmentation Scheme uses a truly-floating-bitline scheme to greatly reduce the capacitance from junctions and parasitic interconnects to a small value.

A Multilevel Memory Decoding scheme is capable of greater than 10-bit multilevel operation. The Multilevel Memory Decoding Scheme includes the Power Supply Decoded Decoding Scheme, the Feedthrough-to-Memory Decoding Scheme, and the Feedthrough-to-Driver Decoding Scheme. The Multilevel Memory Decoding scheme also includes a "winner-take-all" Kelvin Decoding Scheme, which provides precise bias levels for the memory at a minimum cost. A constant-total-current-program scheme is described. Fast-slow and 2-step ramp rate control programming are described. A reference system method and apparatus includes the Positional Linear Reference System, Positional Geometric Reference System, and the Geometric Compensation Reference System. An apparatus and method may provide multilevel programming, reading, and margining.

A sense amplifier system includes local sense amplifiers coupled to memory subarrays and global sense amplifiers coupled to groups of local sense amplifiers.

Method and apparatus described herein are applicable to digital multilevel as well as analog multilevel system.

Memory Cell Technology

To facilitate the understanding of the invention, a brief description of a memory cell technology is described below. In an embodiment the invention applies to Source Side Injection (SSI) flash memory cell technology, which will be referred to as SSI flash memory cell technology. The invention is equally applicable to other technologies such as drain-side channel hot electron (CHE) programming (ETOX), P-channel hot electron programming, NROM (nitride programmable read only memory), SONOS (silicon-oxide-nitride-oxide-silicon), MONOS (metal-oxide-nitride-oxide-silicon), 2-D or 3-D flash, bi-directional memory cell (e.g., two storage nodes, one near drain and one near source of a memory cell; two floating gates of same one memory cell), phase change memory, molecular memory, polymer memory, spin memory, single electron memory, nano particle memory, other hot electron programming schemes, Fowler-Nordheim (FN) tunneling, ferro-electric memory, and other types of memory technology.

Figure 1A:
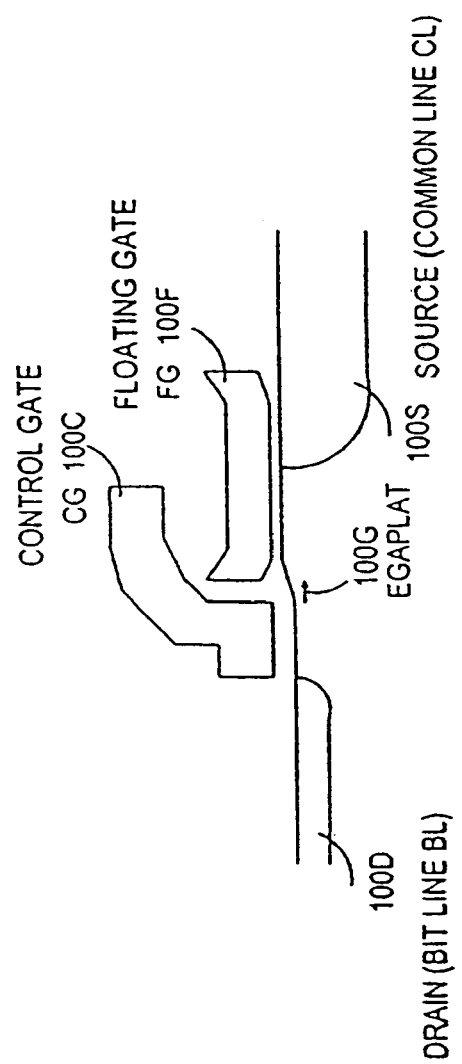
FIG. 1A is a cross section of a source side injection flash memory cell.

A cell structure of one typical SSI flash cell is symbolically shown in FIG. 1A. Its corresponding transistor symbol is shown in FIG. 1B. The cell is made of two polysilicon gates (abbreviated as poly), a floating gate poly FG 100F and a control gate poly CG 100C. The control gate CG 100C also acts as a select gate that individually select each memory cell. This has the advantage of avoiding the over erase problem which is typical of stacked gate CHE flash cell. The floating gate has a poly tip structure that points to the CG 100C, this is to enhance the electric field from the FG 100F to the CG 100C which allows a much lower voltage in FN erase without using a thin interpoly oxide.

The thicker interpoly oxide leads to a higher reliability memory cell. The cell is also fabricated such that a major portion of the FG 100F overlaps the source junction 100S. This is to make a very high coupling ratio from the source 100S to FG 100F, which allows a lower erase voltage and is advantageous to the SSI programming, which will be described shortly. A structural gap between the FG 100F and at CG 100C is also advantageous for the efficient SSI programming.

The SSI flash memory cell enables low voltage and low power performance due to its intrinsic device physics resulting from its device structure. The SSI flash cell uses efficient FN tunneling for erase and efficient SSI for programming. The SSI flash cell programming requires a small current in hundreds of nano amps and a moderate voltage range of ~8 to 11 volts. This is in contrast to that of a typical drain-side channel hot electron memory cell programming which requires current in hundreds of microamp to milliamp range and a voltage in the range of 11 to 13 volts.

The SSI flash memory cell erases by utilizing Fowler-Nordheim tunneling from the floating gate poly to the control gate poly by applying a high erase voltage on the control gate CG 100C, e.g., 8–13 volts, and a low voltage on the source 100S, e.g., 0–0.5 volts. The high erase voltage together with high coupling from the source to the floating gate creates a localized high electric field from the FG 100F tip to the CG 100C and causes electrons to tunnel from the FG 100F to the CG 100C near the tip region. The resulting effect causes a net positive charge on the FG 100F.

The SSI flash memory cell programs by applying a high voltage on the source 100S (herein also known as common line CL), e.g., 4–13 V, a low voltage on the CG 100C, e.g., 0.7–2.5 V, and a low voltage on the drain 100D (herein also known as the bitline BL), e.g., 0–1 V. The high voltage on the source 100S strongly couples to the FG to strongly turn on the channel under the FG (it will be equivalently referred to as the FG channel). This in turn couples the high voltage on the source 100S toward the gap region. The voltage on the CG 100C turns on the channel directly under the CG 100C (it will be equivalently referred to as the CG channel). This in turn couples the voltage on the drain 100D toward the gap region. Hence, the electrons flow from the drain junction 100D through the CG channel, through the gap channel, through the FG channel, and finally arrive at the source junction.

Due to the gap structure between the CG 100C and the FG 100F, in the channel under the gap, there exists a strong lateral electric field (EGAPLAT) 100G. As the EGAPLAT 100G reaches a critical field, electrons flowing across the gap channel become hot electrons. A portion of these hot electrons gains enough energy to cross the interface between the silicon and silicon dioxide into the silicon dioxide. And as the vertical field Ev is very favorable for electrons to move from the channel to the FG 100F, many of these hot electrons are swept toward the FG 100F, thus, reducing the voltage on the FG 100F. The reduced voltage on the FG 100F reduces electrons flowing into the FG 100F as programming proceeds.

Due to the coincidence of favorable Ev and high EGAPLAT 100G in the gap region, the SSI memory cell programming is more efficient over that of the drain-side CHE programming, which only favors one field over the other. Programming efficiency is measured by how many electrons flow into the floating gate as a portion of the current flowing in the channel. High programming efficiency allows reduced power consumption and parallel programming of multiple cells in a page mode operation.

Multilevel Memory Integrated Circuit System:

The challenges associated with putting together a billion transistors on a single chip without sacrificing performance or cost are tremendous. The challenges associated with designing consistent and reliable multilevel performance for a billion transistors on a single chip without sacrificing performance or cost are significantly more difficult. The approach taken here is based on the modularization concept. Basically everything begins with a manageable optimized basic unitary block. Putting appropriate optimized unitary blocks together makes the next bigger optimized block.

A super high density nonvolatile multilevel memory integrated circuit system herein described is used to achieve the performance targets of read speed, write speed, and an operating lifetime with low cost. Read speed refers to how fast data could be extracted from a multilevel memory integrated circuit system and made available for external use such as for the system microcontroller 2001 shown in FIG. 1C which is described later. Write speed refers to how fast external data could be written into a multilevel memory integrated circuit system. Operating lifetime refers to how long a multilevel memory integrated circuit system could be used in the field reliably without losing data.

Speed is modularized based on the following concept, $T=CV/I$, where switching time T is proportional to capacitance C multiplied by the voltage swing V divided by the operating current I. Methods and apparatuses are provided by the invention to optimize C, V, and I to achieve the required specifications of speed, power, and optimal cost to produce a high performance high-density multilevel memory integrated circuit system. The invention described herein makes the capacitance independent of memory integrated circuit density, to the first order, and uses the necessary operating voltages and currents in an optimal manner.

Figure 1C:
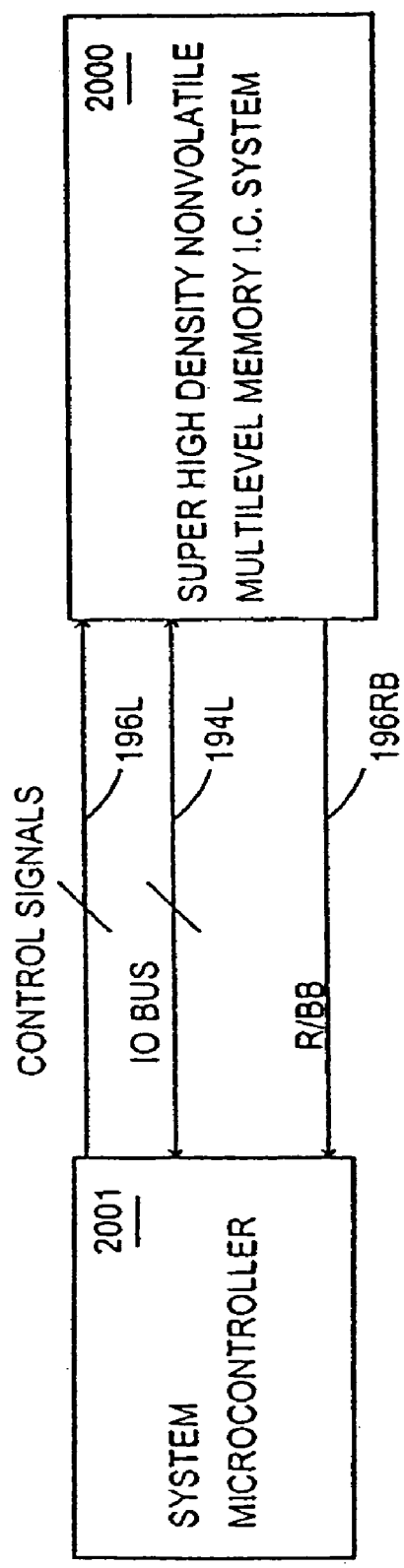
FIG. 1C is a block diagram of a nonvolatile multilevel memory system.

A nonvolatile multilevel memory system is shown in FIG. 1C. A super high density nonvolatile multilevel memory integrated circuit (IC) system 2000 is a digital multilevel nonvolatile flash memory integrated circuit capable of storing $2^N$ storage levels per one memory cell, with N=number of digital bits. A system microcontroller 2001 is a typical system controller used to control various system operations. Control signals (CONTROL SIGNALS) 196L, input/output bus (IO BUS) 194L, and ready busy signal (R/BB) 196RB are for communication between the system microcontroller 2001 and the super high density nonvolatile multilevel memory integrated circuit system 2000.

Figure 1D:
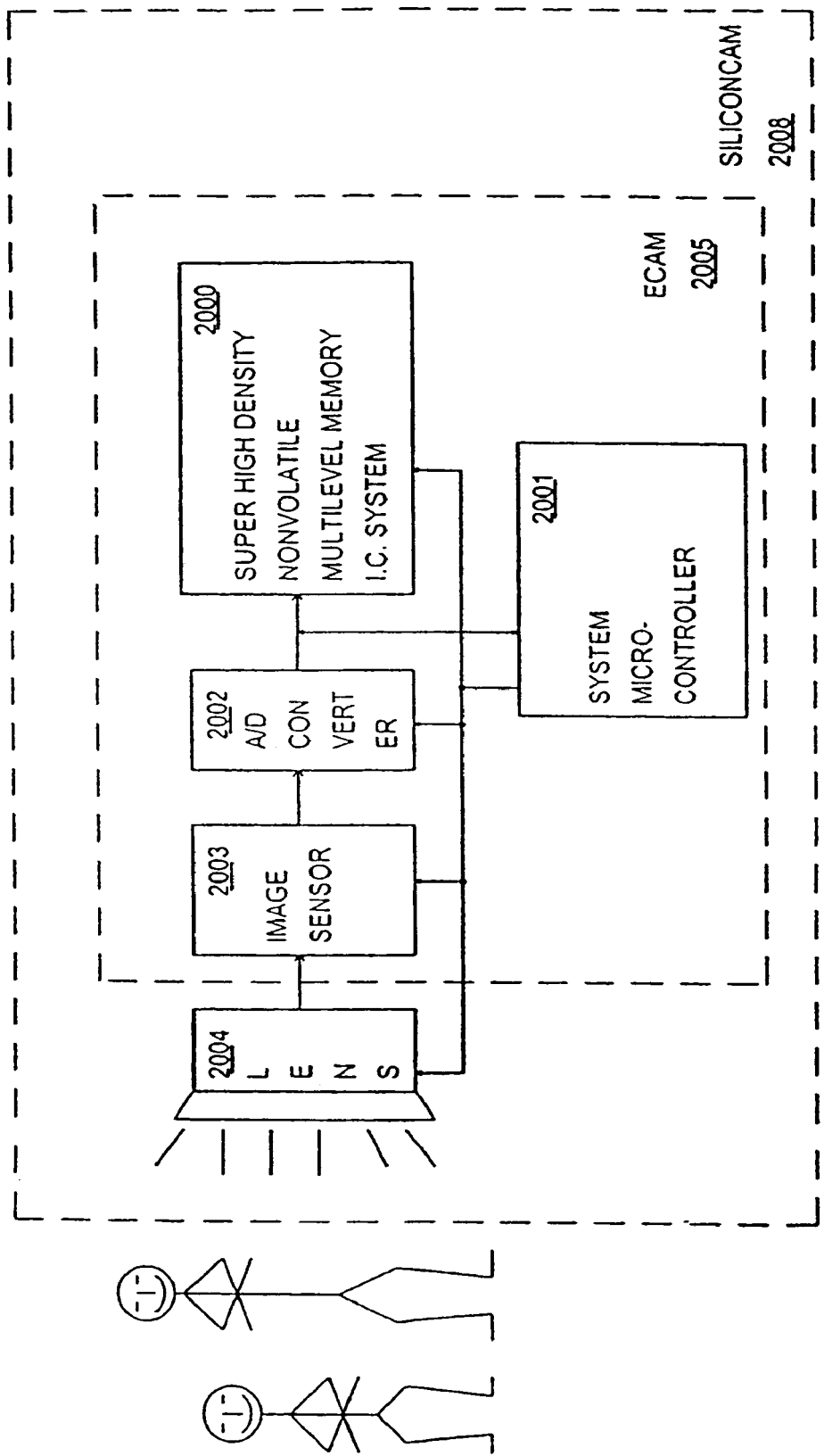
FIG. 1D is a block diagram of an electronic camera system utilizing a nonvolatile multilevel memory system.

An electronic camera system (SILICONCAM) 2008 utilizing super high density nonvolatile multilevel memory IC system 2000 is shown in FIG. 1D. The system (SILICONCAM) 2008 includes an integrated circuit system (ECAM) 2005 and an optical lens block (LENS) 2004. The integrated circuit system (ECAM) 2005 includes an image sensor (IMAGE SENSOR) 2003, an analog to digital converter block (A/D CONVERTER) 2002, a system microcontroller 2001, and the multilevel memory IC system 2000. The optical lens block (LENS) 2004 is used to focus light into the IMAGE SENSOR 2003, which converts light into an analog electrical signal. The IMAGE SENSOR 2003 is a charge coupled device (CCD) or a CMOS sensor. The block (A/D CONVERTER) 2002 is used to digitize the analog electrical signal into digital data. The microcontroller 2001 is used to control various general functions such as system power up and down, exposure time and auto focus. The microcontroller 2001 is also used to process image algorithms such as noise reduction, white balance, image sharpening, and image compression. The digital data is stored in the multilevel memory IC system 2000. The digital data can be down loaded to another storage media through wired or wireless means. Future advances in process and device technology can allow the optical block (LENS) 2004 to be integrated in a single chip with the ECAM 2005.

Figure 1E:
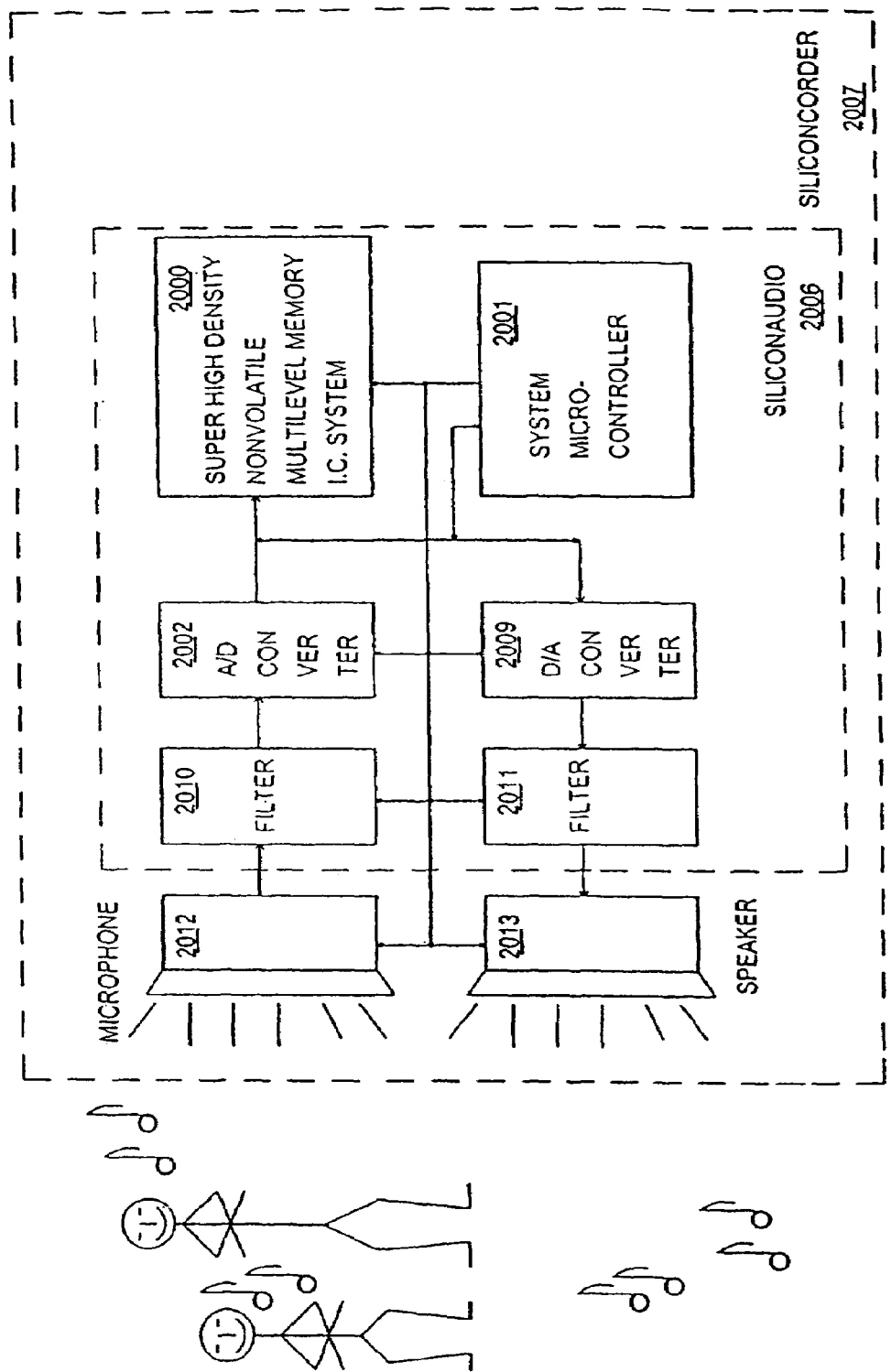
FIG. 1E is a block diagram of an electronic audio system utilizing a nonvolatile multilevel memory system.

An electronic audio system (SILICONCORDER) 2007 utilizing super high density nonvolatile multilevel memory IC system 2000 is shown in FIG. 1E. The SILICONCORDER 2007 includes an integrated circuit system (SILICONAUDIO) 2006, a MICROPHONE 2012, and a SPEAKER 2013. The system (SILICONAUDIO) 2006 includes an anti-alias FILTER 2010, an A/D CONVERTER 2002, a smoothing FILTER 2011, a D/A CONVERTER 2009, a system microcontroller 2001, and the multilevel memory IC system 2000. The FILTER 2010 and the FILTER 2011 can be combined into one filter block if the signals are multiplexed appropriately. The microcontroller 2001 is used to control various functions such as system power up and down, play, record, message management, audio data compression, and voice recognition. In recording a sound wave, the MICROPHONE 2012 converts the sound wave into an analog electrical signal, which is filtered by the FILTER 2010 to reduce non-audio signals. The filtered analog signal is then digitized by the A/D CONVERTER 2002 into digital data. The digital data is then stored in compressed or uncompressed form in the multilevel memory IC system 2000. In playing back the stored audio signal, the microcontroller 2001 first uncompresses the digital data if the data is in compressed form. The D/A CONVERTER 2009 then converts the digital data into an analog signal which is filtered by a smoothing filter (FILTER) 2011. The filtered output analog signal then goes to the SPEAKER 2013 to be converted into a sound wave. The signal filtering can be done by digital filtering by the microcontroller 2001. External digital data can be loaded into the multilevel memory IC system 2000 through wired or wireless means. Future advances in process and device technology can allow the MICROPHONE 2012 and the SPEAKER 2013 to be integrated in a single chip with the SILICONAUDIO 2006.

Figure 2A:
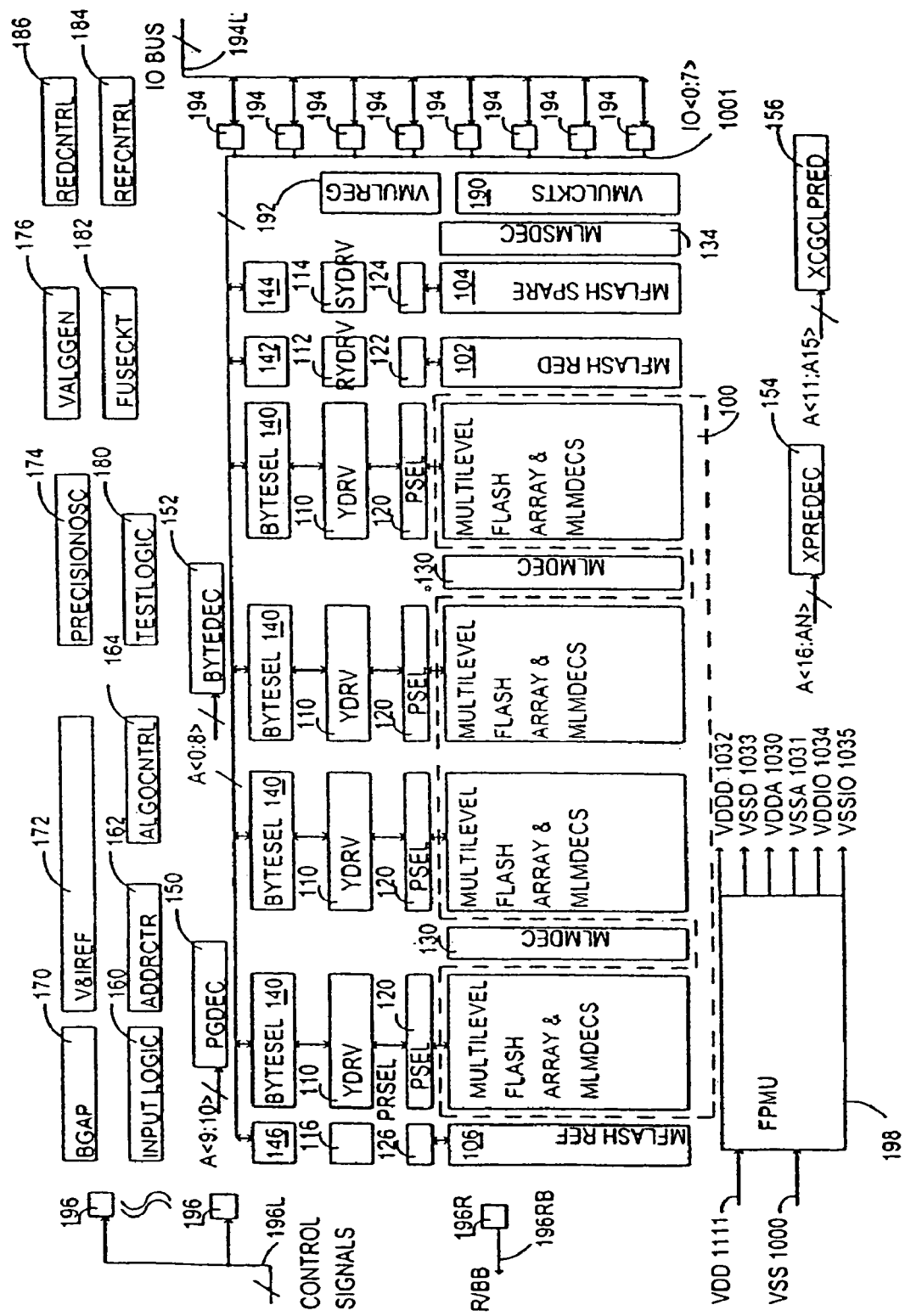
FIG. 2A is a block diagram of super high-density nonvolatile multilevel memory integrated circuit system.

A circuit block diagram of the super high density nonvolatile multilevel memory integrated circuit system 2000 based on the concepts described above and also on ideas described below, is shown in FIG. 2A. For the purpose of discussion, a giga bit nonvolatile multilevel memory chip is described.

A circuit block 100 includes a regular memory array.

It includes a total of for example, 256 million nonvolatile memory cells for a 4-bit digital multilevel memory cell technology or 128 million cells for a 8-bit digital multilevel memory cell technology. An N-bit digital multilevel cell is defined as a memory cell capable of storing $2^N$ levels. A reference array (MFLASHREF) 106 is used for the reference system. A redundancy array (MFLASHRED) 102 is used to increase production yield by replacing bad portions of the regular memory array of the circuit block 100. An optional spare array (MFLASHSPARE) 104 can be used for extra data overhead storage such as for error correction.

A y-driver block (YDRV) 110 including a plurality of single y-drivers (YDRVS) 110S is used for controlling the bitlines during write, read, and erase operation. Block YDRVS 110S will be described in detail below in the description of the multilevel algorithm. Multiples of y-driver block (YDRV) 110 are used for parallel multilevel page writing and reading to speed up the data rate during write to and read from the multilevel memory IC system 2000. A reference y-driver block (REFYDRV) 116 including a plurality of single reference y-drivers (REFYDRVS) 116S is used for the reference array block (MFLASHREF) 106. A redundant y-driver block (RYDRV) 112 including a plurality of single redundant y-drivers (RYDRVS) 112S is used for the redundant array (MFLASHRED) 102. The function of block (RYDRVS) 112S is similar to that of block (YDRVS) 110S. A spare y-driver block (SYDRV) 114 including a plurality of single spare y-drivers (SYDRVS) 114S is used for the spare array (MFLASHSPARE) 104. The function of block (SYDRVS) 114S is similar to that of block (YDRVS) 110S. A page select block (PSEL) 120 is used to select one bitline out of multiple bitlines for each single y-driver (YDRVS) 110S inside the block (YDRV) 110. Corresponding select circuit blocks for reference array, redundant array, and spare array are a reference page select block (PRSEL) 126, a redundant page select block 122, and a spare page select block 124. A byte select block (BYTESEL) 140 is used to enable one byte data in or one byte data out of the blocks (YDRV) 110 at a time. Corresponding blocks for reference array, redundant array, and spare array are a reference byte select block 146, a redundant byte select block 142, and a spare byte select block 144. The control signals for circuit blocks 116, 126, 146, 112, 122, 142, 114, 124, and 144 are in general different from the control signals for circuit blocks 110, 120, and 140 of the regular memory array of the circuit block 100. The control signals are not shown in the figures.

A multilevel memory precision decoder block (MLMDEC) 130 is used for address selection and to provide precise multilevel bias levels over temperature, process corners, and power supply as required for consistent multilevel memory operation for the regular memory array of the circuit block 100 and for the redundant array 102. A multilevel memory precision decoder block (MLMSDEC) 134 is used for address selection and to provide precise multilevel bias levels over temperature, process corners, and power supply as required for consistent multilevel memory operation for the spare array 104.

An address pre-decoding circuit block (XPREDEC) 154 is used to provide decoding of addresses A<16:AN>. The term AN denotes the most significant bit of addresses depending on the size of the memory array. The outputs of block (XPREDEC) 154 couple to blocks (MLMDEC) 130 and block (MLMSDEC) 134. An address pre-decoding block (XCGCLPRED) 156 is used to provide decoding of addresses A<11:15>. The outputs of block 156 also couple to blocks (MLMDEC) 130 and block (MLMSDEC) 134.

A page address decoding block (PGDEC) 150 is used to provide decoding of addresses A<9:10>. The outputs of block (PGDEC) 150 couple to blocks (PSEL) 120. A byte address decoding block (BYTEDEC) 152 is used to provide decoding of addresses A<0:8>. The outputs of block (BYTEDEC) 152 couple to blocks (BYTESEL) 140. An address counter block (ADDRCTR) 162 provides addresses A<11:

AN>, A<9:10>, and A<0:8> for row, page, and byte addresses, respectively. The outputs of the block (ADDRCTR) 162 couple to blocks (XPREDEC) 154, (XCGCLPRED) 156, (PGDEC) 150, and (BYTEDEC) 152. The inputs of the block (ADDRCTR) 162 are coupled from the outputs of an input interface logic block (INPUTLOGIC) 160.

The input interface logic block (INPUTLOGIC) 160 is used to provide external interface to systems off-chip such as the microcontroller 2001. Typical external interface for memory operation are read, write, erase, status read, identification (ID) read, ready busy status, reset, and other general purpose tasks. Serial interface can be used for the input interface to reduce pin counts for high-density chip due to a large number of addresses. Control signals 196L are used to couple the INPUTLOGIC 160 to the system microcontroller 2001. The INPUTLOGIC 160 includes a status register that is indicative of the status of the memory chip operation such as pass or fail in program or erase, ready or busy, write protected or unprotected, cell margin good or bad, restore or no restore, etc. The margin and restore concepts are described more in detail in the multilevel algorithm description.

An algorithm controller block (ALGOCNTRL) 164 is used to handshake the input commands from the block (INPUTLOGIC) 160 and to execute the multilevel erase, programming and sensing algorithms as needed for multilevel nonvolatile operation. The ALGOCNTRL 164 is also used to algorithmically control the precise bias and timing conditions as required for multilevel precision programming.

A test logic block (TESTLOGIC) 180 is used to test various electrical features of the digital circuits, analog circuits, memory circuits, high voltage circuits, and memory array. The inputs of the block (TESTLOGIC) 180 are coupled from the outputs of the INPUTLOGIC 160. The block (TESTLOGIC) 180 also provides timing speed-up in production testing such as faster write/read and mass modes. The TESTLOGIC 180 is also used to provide screening tests associated with memory technology such as various disturb and reliability tests. The TESTLOGIC 180 also allows an off-chip memory tester to directly take over the control of various on-chip logic and circuit bias blocks to provide various external voltages and currents and external timing. This feature permits, for example, screening with external voltage and external timing or permits accelerated production testing with fast external timing.

A fuse circuit block (FUSECKT) 182 is a set of nonvolatile memory cells configured at the external system level, at the tester, at the user, or on chip on-the-fly to achieve various settings. These settings can include precision bias levels, precision on-chip oscillator, programmable logic features such as write-lockout feature for portions of an array, redundancy fuses, multilevel erase, program and read algorithm parameters, or chip performance parameters such as write or read speed and accuracy.

A reference control circuit block (REFCNTRL) 184 is used to provide precision reference levels for precision voltage levels as required for multilevel programming and sensing.

A redundancy controller block (REDCNTRL) 186 is for redundancy control logic.

A voltage algorithm controller block (VALGGEN) 176 provides various specifically shaped voltage signals of amplitude and duration as required for multilevel nonvolatile operation and to provide precise voltage levels with tight tolerance, as required for precision multilevel programming, erasing, and sensing.

A circuit block (BGAP) 170 is a bandgap voltage generator based on the bandgap circuit principle to provide a precise voltage level over process, temperature, and supply as required for multilevel programming and sensing.

A voltage and current bias generator block (V&IREF) 172 is an on-chip programmable bias generator. The bias levels are programmable by the settings of the control signals from the FUSECKT 182 and also by various metal options. A precision oscillator block (PRECISIONOSC) 174 provides accurate timing as required for multilevel programming and sensing.

Input buffer blocks 196 are typical input buffer circuits, for example, TTL input buffers or CMOS input buffers. Input/output (io) buffer blocks 194 includes typical input buffers and typical output buffers. A typical output buffer is, for example, an output buffer with slew rate control, or an output buffer with level feedback control. A circuit block 196R is an open drained output buffer and is used for ready busy handshake signal (R/BB) 196RB.

A voltage multiplier (also known as charge pump) block (VMULCKT) 190 provides voltage levels above the external power supply required for erase, program, read, and production tests. A voltage multiplying regulator block (VMULREG) 192 provides regulation for the block (VMULCKT) 190 for power efficiency and for transistor reliability such as to avoid various breakdown mechanisms.

A flash power management block (FPMU) 198 is used to efficiently manage power on-chip such as powering up only the circuit blocks in use. The FPMU 198 also provides isolation between sensitive circuit blocks from the less sensitive circuit blocks by using different regulators for digital power (VDDD) 1032/(VSSD) 1033, analog power (VDDA) 1030/(VSSA) 1031, and IO buffer power (VDDIO) 1034/(VSSIO) 1035. The FPMU 198 also provides better process reliability by stepping down power supply VDD to lower levels required by transistor oxide thickness. The FPMU 198 allows the regulation to be optimized for each circuit type. For example, an open loop regulation could be used for digital power since highly accurate regulation is not required; and a closed loop regulation could be used for analog power since analog precision is normally required. The flash power management also enables creation of a "green" memory system since power is efficiently managed.

Figure 2B:
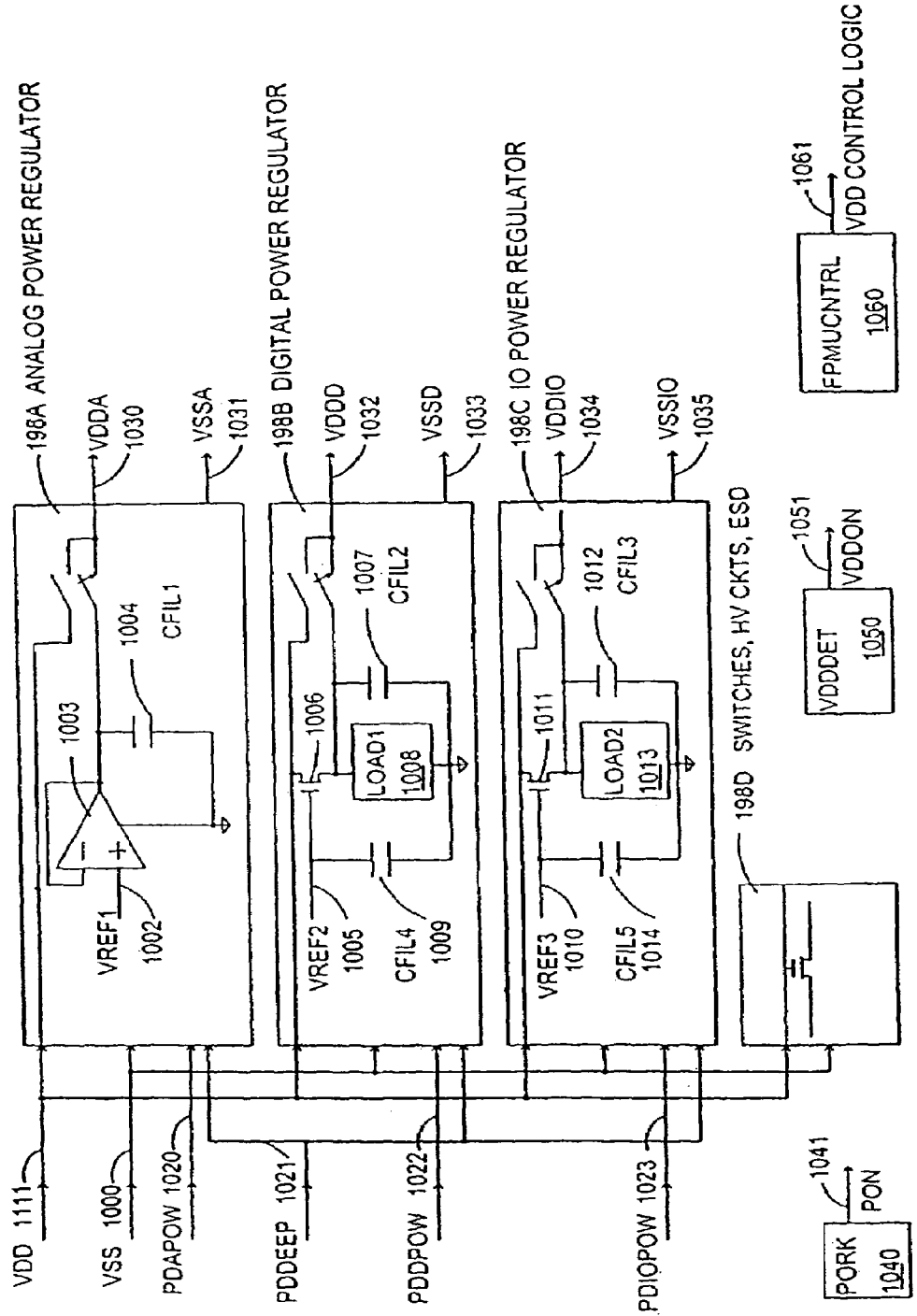
FIG. 2B is a block diagram of flash power management unit.

Block diagram of the FPMU 198 is shown in FIG. 2B. A VDD 1111 and a VSS 1000 are externally applied power supply and ground lines, respectively. A block (ANALOG POWER REGULATOR) 198A is an analog power supply regulator, which uses closed loop regulation. The closed loop regulation is provided by negative feedback action of an operational amplifier (op amp) 1003 configured in a voltage buffer mode with a reference voltage (VREF1) 1002 on the positive input of the op amp 1003. A filter capacitor (CFILL) 1004 is used for smoothing transient response of the analog power (VDDA) 1030. A ground line (VSSA) 1031 is for analog power supply. A block (DIGITAL POWER REGULATOR) 198B is a digital power supply regulator, which uses open loop regulation. The open loop regulation is provided by source follower action of a transistor 1006 with a reference voltage (VREF2) 1005 on its gate. A pair of filter capacitor (CFIL4) 1009 and (CFIL2) 1007 are used for smoothing transient response of digital power (VDDD) 1032. A loading element (LOAD1) 1008 is for the transistor 1006. A ground line (VSSD) 1033 is for digital power supply. A block (IO POWER REGULATOR)

198C is an IO power supply regulator, which uses open loop regulation similar to that of the digital power supply 198B. The open loop regulation is provided by a transistor 1011 with a reference voltage (VREF3) 1010 on its gate. A loading element (LOAD2) 1013 is for transistor 1011. A pair of capacitors (CFIL5) 1014 and (CFIL3) 1012 are used for smoothing transient response of IO power (VDDIO) 1034. A ground line (VSSIO) 1035 is for IO power supply. A block 198D includes various circuits that require unregulated power supply such as transmission switches, high voltage circuits, ESD structures, and the like.

A block (PORK) 1040 is a power on reset circuit which provides a logic signal (PON) 1041 indicating that the power supply being applied to the chip is higher than a certain voltage. The signal (PON) 1041 is typically used to initialize logic circuits before chip operation begins.

A block (VDDDET) 1050 is a power supply detection circuit, which provides a logic signal (VDDON) 1051 indicating that the operating power supply is higher than a certain voltage. The block (VDDDET) 1050 is normally used to detect whether the power supply is stable to allow the chip to take certain actions such as stopping the programming if the power supply is too low.

A block (FPMUCNTRL) 1060 is a power supply logic controller, that receives control signals from blocks (PORK) 104, (VDDDET) 1050, (INPUTLOGIC) 160, (ALGOCNTRL) 164, and other logic control blocks to power up and power down appropriately power supplies and circuit blocks. The FPMUCNTRL 1060 is also used to reduce the power drive ability of appropriate circuit blocks to save power. A line (PDDEEP) 1021 is used to power down all regulators. Lines (PDAPOW) 1020, (PDDPOW) 1022, and (PDIOPOW) 1023 are used to power down blocks 198A, 198B, and 198C, respectively. Lines (PDDEEP) 1021, (PDAPOW) 1020, (PDDPOW) 1022, and (PDIOPOW) 1023 come from block (FPMUCNTRL) 1060.

It is possible that either closed or open loop regulation could be used for any type of power supply regulation. It is also possible that any power supply could couple directly to the applied power supply (VDD) 1111 without any regulation with appropriate consideration. For example, VDDA 1030 or VDDIO 1034 could couple directly to VDD 1111 if high voltage transistors with thick enough oxide are used for analog circuits or IO buffer circuits, respectively.

A typical memory system operation is as follows: a host such as the microcontroller 2001 sends an instruction, also referred to as a command, such as a program instruction via the CONTROL SIGNALS 196L and the IO BUS 194L to the multilevel memory chip 2000 (see FIG. 1C). The INPUTLOGIC 160 interprets the incoming command as a valid command and initiates the program operation internally. The ALGOCNTRL 164 receives the instruction from the INPUTLOGIC 160 to initiate the multilevel programming algorithmic action by outputting various control signals for the chip. A handshake signal such as the ready busy signal R/BB 196RB then signals to the microcontroller 2001 that the multilevel memory chip 2000 is internally operating. The microcontroller 2001 is now free to do other tasks until the handshake signal R/BB 196RB signals again that the multilevel memory chip 2000 is ready to receive the next command. A timeout could also be specified to allow the microcontroller 2001 to send the commands in appropriate times.

Read Operation:

A read command including a read operational code and addresses is sent by the microcontroller 2001 via the CONTROL SIGNALS 196L and 10 BUS 194L. The INPUTLOGIC 160 decodes and validates the read command. If it is valid, then incoming addresses are latched in the ADDRCTR 162. The ready busy signal (R/BB) 196RB now goes low to indicate that the multilevel memory device 2000 has begun read operation internally. The outputs of ADDRCTR 162 couple to blocks (XPREDEC) 154, (XCGCLPRED) 156, (PGDEC) 150, (BYTEDEC) 152, and (REDCNTRL) 186. The outputs of blocks 154, 156, 150, 152, and 186 couple to blocks (MLMDEC) 130, (MLSMDEC) 134, and block 100 to enable appropriate memory cells. Then the ALGOCNTRL 164 executes a read algorithm. The read algorithm will be described in detail later in the multilevel algorithm description. The read algorithm enables blocks (BGAP) 170, (V&IREF) 172, (PRECISIONOSC) 174, (VALGGEN) 176, and (REFCNTRL) 184 to output various precision shaped voltage and current bias levels and algorithmic read timing for read operation, which will be described in detail later in the description of the multilevel array architecture. The precision bias levels are coupled to the memory cells through blocks (MLMDEC) 130, (MLMSDEC) 134, and block 100.

In an embodiment, the read algorithm operates upon one selected page of memory cells at a time to speed up the read data rate. A page includes a plurality of memory cells, e.g., 1024 cells. The number of memory cells within a page can be made programmable by fuses, e.g., 512 or 1024 to optimize power consumption and data rate. Blocks (PGDEC) 150, (MLMDEC) 130, (MLMSDEC) 134, 100, and (PSEL) 120 select a page. All memory cells in the selected page are put in read operating bias condition through blocks (MLMDEC) 130, (MLMSDEC) 134, 100, (PSEL) 120, and (XCGCLPRED) 156. After the readout voltage levels are stable, a read transfer cycle is initiated by the block (ALGOCNTRL) 164. All the readout voltages from the memory cells in the selected page are then available at the y-drivers (YDRVS) 110S, (RYDRVS) 112S, and (SYDRVS) 114S inside block (YDRV) 110, (RYDRV) 112, and (SYDRV) 114, respectively.

Next, in the read transfer cycle the ALGOCNTR 164 executes a multilevel read algorithm to extract the binary data out of the multilevel cells and latches them inside the YDRVS 110S, RYDRVS 112S, and SYDRVS 114S. This finishes the read transfer cycle. A restore flag is now set or reset in the status register inside the INPUTLOGIC 160. The restore flag indicates whether the voltage levels of the multilevel memory cells being read have been changed and whether they need to be restored to the original voltage levels. The restore concept will be described more in detail in the multilevel algorithm description. Now the ready busy signal (R/BB) 196RB goes high to indicate that the internal read operation is completed and the multilevel memory device 2000 is ready to transfer out the data or chip status. The microcontroller 2001 now can execute a status read command to monitor the restore flag or execute a data out sequence. The data out sequence begins with an external read data clock provided by the microcontroller 2001 via the CONTROL SIGNAL 196L coupled to an input buffer 196 to transfer the data out. The external read data clock couples to the blocks (BYTEDEC) 152 and (BYTESEL) 140, 142, and 144 to enable the outputs of the latches inside blocks (YDRV) 110 or (RYDRV) 112 or (SYDRV) 114 to output one byte of data at a time into the bus IO<0:7> 1001. The external read data clock keeps clocking until all the desired bytes of the selected page are outputted. The data on bus IO<0:7> 1001 is coupled to the microcontroller 2001 via IO BUS 194L through IO buffers 194.

Program Operation:

A program command including a program operational code, addresses, and data is sent by the microcontroller 2001 via CONTROL SIGNALS 196L and IO BUS 194L. The INPUTLOGIC 160 decodes and validates the command. If it is valid, then incoming addresses are latched in the ADDRCTR 162. The data is latched in the latches inside YDRV 110, RYDRV 112, and SYDRV 114 via blocks (BYTEDEC) 152, (BYTESEL) 140, 142, and 144, respectively. The ready busy signal (R/BB) 196RB now goes low to indicate that the memory device has begun program operation internally. The outputs of ADDRCTR 162 couple to blocks (XPREDEC) 154, (XCGCLPRED) 156, (PGDEC) 150, (BYTEDEC) 152, and (REDCNTRL) 186. The outputs of blocks 154, 156, 150, 152, and 186 couple to blocks (MLMDEC) 130, (MLSMDEC) 134, and 100 to enable appropriate memory cells. Then the (ALGOCNTRL) 164 executes a program algorithm, which will be described in detail later in the multilevel algorithm description. The (ALGOCNTRL) 164 enables blocks (BGAP) 170, (V&IREF) 172, (PRECISIONOSC) 174, (VALGGEN) 176, and (REFCNTRL) 184 to output various precision shaped voltage and current bias levels and algorithmic program timing for the program operation, which will be described in detail later in the description of the multilevel array architecture. The precision bias levels are coupled to the memory cells through blocks (MLMDEC) 130, (MLSMDEC) 134, and block 100.

In an embodiment, the program algorithm operates upon one selected page of memory cells at a time to speed up the program data rate. Blocks (PGDEC) 150, (MLMDEC) 130, (MLMSDEC) 134, 100, and (PSEL) 120 select a page. All memory cells in the selected page are put in appropriate program operating bias condition through blocks (MLMDEC) 130, (MLMSDEC) 134, 100, (PSEL) 120, and (XCGCLPRED) 156. Once the program algorithm finishes, program flags are set in the status register inside the block (INPUTLOGIC) 160 to indicate whether the program has been successful. That is, all the cells in the selected page have been programmed correctly without failure and with enough voltage margins. The program flags are described more in detail in the multilevel algorithm description. Now the ready busy signal (R/BB) 196RB goes high to indicate that the internal program operation is completed and the memory device is ready to receive the next command.

Erase Operation:

An erase command including an erase operational code and addresses is sent by the microcontroller 2001 via CONTROL SIGNALS 196L and IO BUS 194L. The INPUTLOGIC 160 decodes and validates the command. If it is valid, then incoming addresses are latched in the ADDRCTR 162. The ready busy signal (R/BB) 196RB now goes low to indicate that the memory device has begun erase operation internally. The outputs of ADDRCTR 162 couple to blocks (XPREDEC) 154, (XCGCLPRED) 156, (PGDEC) 150, (BYTEDEC) 152, and (REDCNTRL) 186. The outputs of blocks 154, 156, 150, 152, and 186 couple to blocks (MLMDEC) 130, (MLSMDEC) 134, and 100 to enable appropriate memory cells. Then the ALGOCNTRL 164 executes an erase algorithm. The ALGOCNTRL 164 enables blocks (BGAP) 170, (V&IREF) 172, (PRECISIONOSC) 174, (VALGGEN) 176, and (REFCNTRL) 184 to output various precision shaped voltage and current bias levels and algorithmic erase timing for erase operation. The shaped voltage for erase is to minimize electric field coupled to memory cells, which minimizes the damage to memory cells during erasing. The precision bias levels are coupled to the memory cells through blocks (MLMDEC) 130, (MLMSDEC) 134, and block 100.

In an embodiment, the erase algorithm operates upon one selected erase block of memory cells at a time to speed up the erase time. An erase block includes a plurality of pages of memory cells, e.g., 32 pages. The number of pages within an erase block can be made programmable by fuses to suit different user requirements and applications. Blocks (PGDEC) 150, (MLMDEC) 130, (MLMSDEC) 134, 100, and (PSEL) 120 select a block. All memory cells in the selected block are put in erase operating bias condition through blocks (MLMDEC) 130, (MLMSDEC) 134, 100, (PSEL) 120, and (XCGCLPRED) 156. Once the erase algorithm finishes, the erase flags are set in the status register inside the block (INPUTLOGIC) 160 to indicate whether the erase has been successful. That is, all the cells in the selected page have been erased correctly to desired voltage levels without failure and with enough voltage margins. Now the ready busy signal (R/BB) 196RB goes high to indicate that the internal erase operation is completed and the multilevel memory device 2000 is ready to receive the next command.

Multilevel Array Architecture:

The demanding requirements associated with putting together a billion transistors on a single chip with the ability to store multiple precision levels per cell and operating at a very high speed are contradictory. These requirements need innovative approaches and careful tradeoffs to achieve the objective. Examples of tradeoffs and problems with prior art implementation are discussed below. In conventional prior art architectures, a voltage drop along a metal line of a few tens of millivolts could be easily tolerated. Here, in a super high density nonvolatile multilevel memory integrated circuit system such a voltage drop can cause unacceptable performance degradation in precision levels due to the high number of levels stored per memory cell. In conventional array architectures, a bit line capacitance in the order of 10 pico farads would be a non-issue. Here it may be unworkable due to the high data rate required. In prior art array architectures a bias level variation from one memory cell to another in the order of +/−30 percent would be a typical situation. Here such a bias variation would be a serious performance problem. In prior art array architectures, the total resistance of a memory source line in the order of a few hundreds of ohms would be a typical situation, here a few tens of ohms is a serious problem. The huge number of memory cells of the giga to tera bit high-density memory system compounds the matter even further by making the memory source line longer. Another challenge facing the multilevel system is maintaining high speed sensing and programming with low power, again requiring tradeoffs. Another challenge facing the multilevel system is high speed sensing and programming with very high precision voltages due to a high number of levels stored per digital multilevel memory cell, again a conflicting demand. Another challenge facing the multilevel system is high speed sensing and programming consistently every time over many years, process corners, temperature, and power supply variation.

To get an appreciation of the order of magnitude of the difficulty involved in the super high density multilevel nonvolatile memory system, numerical examples will be given corresponding to a one giga bit array architecture system suitable for 256 levels, i.e., 8 bits. The array is then organized as 8192 bitlines or columns and 16384 rows or wordlines for a total of 134,217,730 physical cells.

One sensing level, V1level,=multilevel sensing range/$2^N$, N=number of digital bits stored per memory cell. Multilevel sensing range is the readout voltage range from sensing a multilevel memory cell. Assuming the multilevel sensing range from the multilevel memory cell available is 2048 millivolts, then V1level=2048/256=8 millivolts.

A very high data rate is required for applications such as image or high density data storage. For example, write and read rates of a mega byte per second are required. To achieve this high data rate, parallel writing and sensing is required for the super high density nonvolatile multilevel memory integrated circuit system. In the present embodiment, a total of 1024 y-drivers (YDRVS) 110S inside blocks (YDRV) 110 are used. This allows 1024 memory cells to be written and sensed at the same time in a page mode manner, effectively increasing the speed by a factor of 1024 over single cell operation. The number of bitlines multiplexed into one single y-driver (YDRVS) 110S is=8192/1024=8 bitlines.

A program algorithm described in more detail elsewhere in this specification is able to achieve desired multilevel resolution. The read or program multilevel resolution is the smallest voltage range in read or program, respectively, needed to operate the multilevel memory cells correctly. An erase algorithm first erases the memory cells to make the cell readout voltage reaching a certain desired voltage level. Then the iterative program algorithm is applied to the memory cells. The program algorithm includes a plurality of verify-program cycles. A verify-program cycle includes a verify cycle followed by a program cycle. A verify cycle is done first to inhibit the cell from the first programming pulse if the cell is verified, therefore preventing possible over-programming. Over-programming means that after a programming pulse the cell sensing level passes a desired voltage level by more than a desired voltage amount. A verify cycle is used to determine whether the desired readout sensing level has been reached. If the desired readout sensing level is reached, the cell is inhibited from further programming. Otherwise, the cell is enabled for the next program cycle. A program cycle is used to change incrementally the charge stored in the cell and the corresponding cell sensing readout voltage. Instead of a verify-program cycle, a program-verify cycle can be used. A program-verify cycle begins with a program cycle followed by a verify cycle. In this case, care should be taken to ensure that the first programming pulse does not cause over-programming.

Figure 2C:
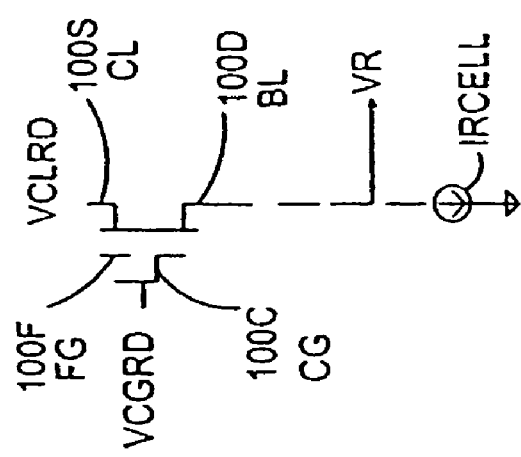
FIG. 2C shows voltage mode sensing.

In an embodiment the program cycle includes applying a voltage on the source line, (interchangeably referred to as common line [CL]) (VCL), with a predetermined program pulsewidth (TPPWD) and a predetermined program bias cell current (Ipcell). The verify cycle makes use of the voltage mode sensing as shown in FIG. 2C, which applies a reference voltage (VCLRD) on the source line (CL), another reference voltage (VCGRD) on the control gate, and a predetermined read bias current (Ircell) on the bitline and through the memory cell. The current (Ircell) is applied to the bitline and the memory cell through select transistors which are not shown. The resulting voltage on the bitline is the sensing readout voltage (VR), which has a unique relationship to the charge on the floating gate. The voltage mode sensing is also used during read. In another embodiment of voltage mode sensing, the source line (CL) and the bitline are interchanged, and thus a reference voltage is applied on the bitline and a predetermined read bias current (Ircell) is applied on the source line through the memory cell. The resulting voltage on the source line is the sensing readout voltage (VR). In this case, the array architecture uses only one source line in read at a given time, for example, by multiplexing through decoder circuitry or over time. This is to be known as Inverse Voltage Mode sensing. In another embodiment of the voltage mode sensing, there is no predetermined read current (Ircell), or the predetermined read current equals to zero. This mode is to be known as No Current (Digital) Multilevel Mode Sensing. In another embodiment of the voltage mode sensing, the predetermined read bias current is replaced by a resistor or an equivalent resistance (like a MOS operated as a resistor). To change incrementally the readout sensing voltage to the next value (VR+dVR), with dVR equals to the incremental readout sensing voltage change, the next program cycle is repeated with the common line voltage increased incrementally to (VCL+dVCLP), with dVCLP equals to the incremental programming voltage change.

The number of verify-program cycles (NC) is dependent on the number of voltage levels and various margins of the memory system. For example, for an equivalent 8-bit digital multilevel cell, there are $2^N=2^8=256$ levels, with N=8. The minimum possible number of verify-program cycles (NC) required would be 256. To cover variations due to cell-to-cell variation, temperature, process corners, an algorithm may require, for example, approximately 1.4×256=360 verify-program cycles. To cover various margins needed such as for data retention and programming distribution, the number of verify-program cycles required is actually higher. Assuming a factor of 2 due to various margin coverage, the number of verify-program cycles is approximately equal to 720. The exact number of verify-program cycles is typically varied depending on various memory technologies and particular desired performance targets.

For write data rate of 1 mega byte per second and for 8-bit digital multilevel operation with 1024 bytes per page, the write timing per page is, TWRT=# of bytes written in parallel/data rate=1024 bytes per page/1 mega bytes/second=1024 μs=1.024 ms per page.

Hence the time to execute each program-verify cycle (TPV) must be less than TWRT/NC=1.024 ms/720=1.42 μs. This fast timing coupled with parallel operation of 1024 cells has important implication on memory cell program speed, capacitance loading, power consumption and other effects as will be described below.

Typical process parameters of a sub-micron memory cell are as follows. A typical diffused source line resistance per cell is 100 ohms. A typical bitline resistance per cell is 80 milliohms. A typical silicided row line resistance per cell is 20 ohms. A typical source line capacitance per cell is 2 fF. A typical bitline capacitance per cell is 1.5 fF. And a typical row line capacitance per cell is 3 fF.

Hence for the 8192×16384 array, the total bitline capacitance is CBL=~16384×1.5 fF=25 pF, where "=~" is defined as approximately equal to. The total metal bitline resistance RBL=~16384×0.08=1330 ohms. The total diffused source line resistance is RSL=8192×100=819 K ohms. The total row line resistance is RWL=8192×20=164 K ohms. For a typical memory system, the diffused source line is strapped by metal along the source line, with approximately 80 milliohms per cell, in this case RSL=8192×0.08=655 ohms.

In conventional stacked gate drain-side CHE programming (abbreviated as CHE flash program), the single cell current is typically 1 ma, which causes a voltage drop along a single metal bitline of =~1 ma×RBL=~1 ma×1330 ohms=1330 millivolts, which is unacceptable since it is much greater than 1 level=8 millivolts. In SSI flash programming (abbreviated as SSI flash program), the typical cell current can be lowered to 1 μa, which causes a voltage drop along a single metal bitline of =~1 µa×1330 ohms=1.33 millivolts, which is acceptable.

For 1024 cells drawing the cell current (Icell) continuously, the voltage drop (DVCL) along the source line from the driver to the other end follows the geometric equation:

$$DVCL = 0.5 * P * (P+1) * R8cell * Icell, tm \quad (1)$$

where R8cell=the metal source line resistance for 8 cells in series=0.08 ohms×8=0.64 ohms, and P=1024.

Along the source line, for 1024 cells programming simultaneously, the total current is 1024×1 ma=1.024 A for the CHE flash program and=1024×1 µa=1.024 ma for the SSI flash program. The power needed for the drain side CHE flash programming for parallel page mode operation is unsustainable due to very high current. Additionally, the voltage drop along the metal source line by equation (1) is=~0.5×1024*1025*0.64*1 ma=336 Volts for CHE. This is unworkable for CHE flash technology. Similarly, the source line voltage drop for the SSI flash=~336 millivolts. This is also unworkable in the multilevel program for the following reasons.

For a multilevel nonvolatile system, in one program cycle, the cell sensing voltage can only shift (dVR) a maximum of <(Q*V1level) for reliable sensing, where Q was 0.5 in the prior example. However Q could vary from ⅓ to ⅛ for long term reliability. This is needed, for example, to allow for sensing margin, verify margin, program disturb, data retention, and endurance. The number of cells programming simultaneously within a selected page can vary between as many as 1024 to as few as only one from one program cycle to the next. Thus the total program current flowing through the common line CL could change by a factor of 1024 from one program cycle to the next. The resulting worst case voltage change in the source line VCL from one program cycle to the next is dVCL=~336 millivolts for SSI flash. This voltage jump in VCL causes the only remaining programming cell to over program, which causes the cell sensing voltage to shift much greater than the (Q*V1level). Hence, the challenge is to bring the voltage drop dVCL to an acceptable level during programming.

For verifying after programming multilevel memory cells, conventional methods would shut off the read cell currents for cells that have already reached their desired verifying levels, this would cause the voltage shift dVCL in verify as much as in programming as described above. This voltage jump dVCL would couple to the memory cells and cause a large jump in cell sensing voltage. This undesired large jump in cell sensing voltage causes an error in sensing, herein called a sense error VRerr. This sense error should be much less than (Q*V1level). Hence this large jump is unacceptable. The invention solves the problem by enabling the total current all the time whether the cells have been verified or not. This mitigates the change in the source line voltage. However a new problem surfaces as compared to that in programming. As temperature changes from −45 C to +85 C the resistance of the source line metal line changes by about 40%, hence the source line voltage drop changes by about 40%, which causes an additional sense error VRerr in read. This sense error should be much less than (Q*V1level) to prevent overall read margin degradation. Therefore, an array architecture is needed to achieve this, as will be described in detail below.

With 1024 cells operating simultaneously, assuming sense current Ircell=10 µa, the total sense current is=1024×10 µa=10.24 ma flowing into the source line. This presents several problems. With power specification for a typical memory chip ICC=20–30 ma. This 10.24 ma is a big percentage of the power specification. To deliver 10.24 ma while maintaining a precise voltage level VCLRD, VCLRD is defined as the voltage in read on CL line, requires a challenging decoding and driver scheme, which will be addressed in the description of the multilevel decoding scheme. Large current flowing across the source line also causes the voltage drop as described above.

High data rate, meaning high sense speed and write speed, is required for data intensive application. The speed is proportional to capacitance and voltage swing and inversely proportional to the current, $$T = C*V/I \quad (2).$$

For typical bitline capacitance as calculated above, CBL=25 pF and assuming voltage swing V=1 V, and assuming available current I=10 µa, the time it takes to charge or discharge a bitline as needed in verify or program cycle is, TBL=25 pF*1 V/10 µa=2.5 µs. This is greater than the TPV=1.42 µs as calculated above. At least a 2× or better timing is required for TBL to allow for various settling time, sensing time, and programming time. Increasing the current would cause higher power consumption, large decoding driver, and voltage problems as described above.

Further, in programming 1024 cells in parallel, the programming current is supplied from an on-chip voltage multiplier, also known as a charge pump. The on-chip voltage multiplier multiplies the low voltage power supply, e.g., 2.5 V to the required higher voltages. Allowing a reasonable area penalty from the on-chip voltage multiplier, a total current of 100 µa is allowed for programming. The programming current per cell is 100 µa/1024=0.1 µa. This causes a TBL=25 pF*1 V/0.1 µa=250 µs, which is even more severe of a timing problem. Here an improvement of more than 2 order of magnitude or better in speed is needed. The invention describes array architectures with suitable operating methods to achieve this improvement and will be described below.

Figure 3A:
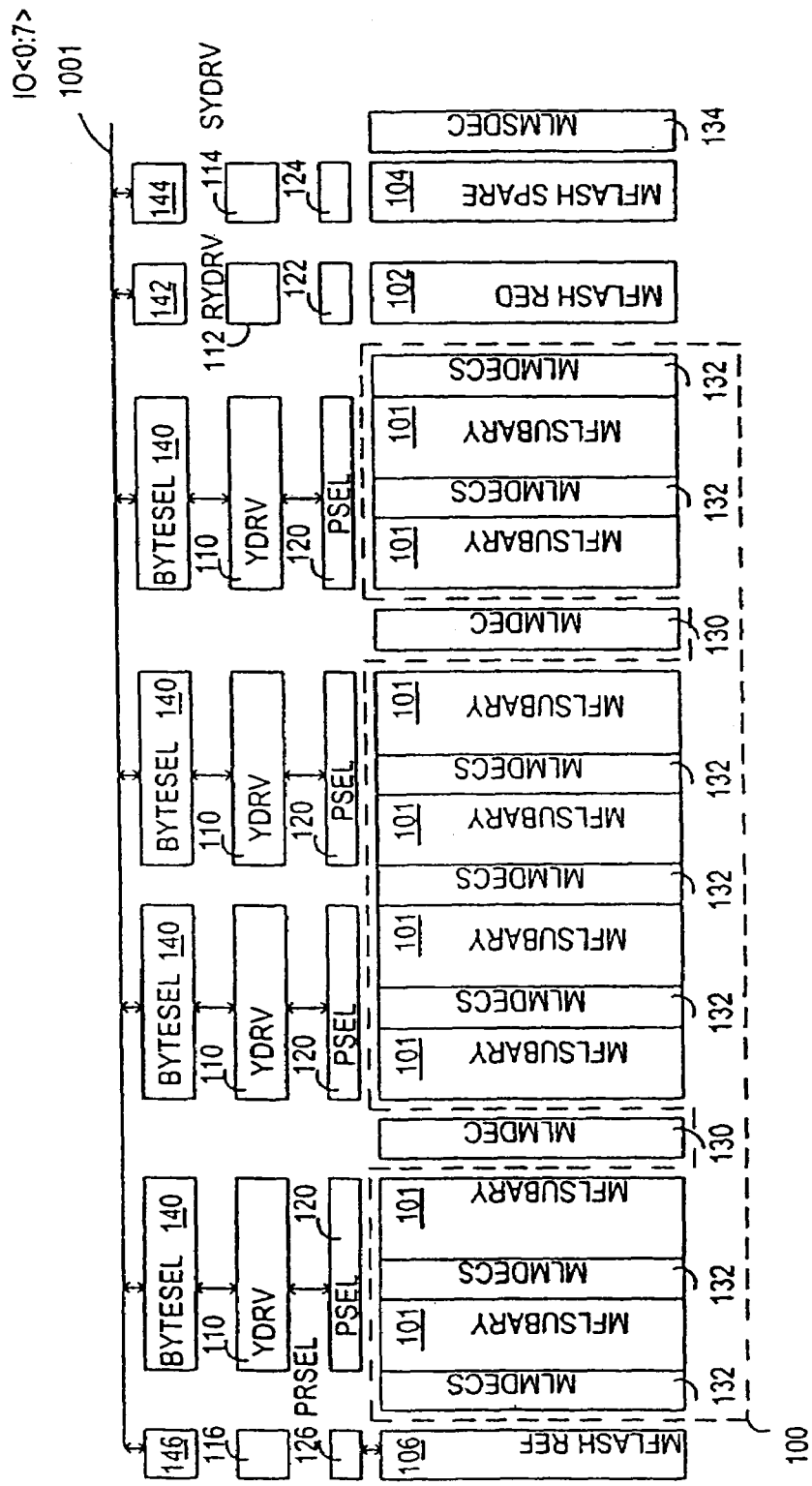
FIG. 3A is a block diagram of super high-density non-volatile multilevel array architecture.

FIG. 3A is the block diagram of a super high-density digital nonvolatile multilevel memory array architecture which is capable of >8-bit multilevel operation. The block 100 has been expanded from FIG. 2A to show the sub-blocks inside. A multilevel precision memory decoder MLMDECS 132 is used for delivering bias voltage levels with tight tolerance over temperature, process, and power supply variation for multilevel memory cells. A multilevel memory sub-array MFLSUBARY 101 includes a plurality of single multilevel memory cells. Other blocks in FIG. 3A have already been described in association with the description of FIG. 2A.

Figure 3B:
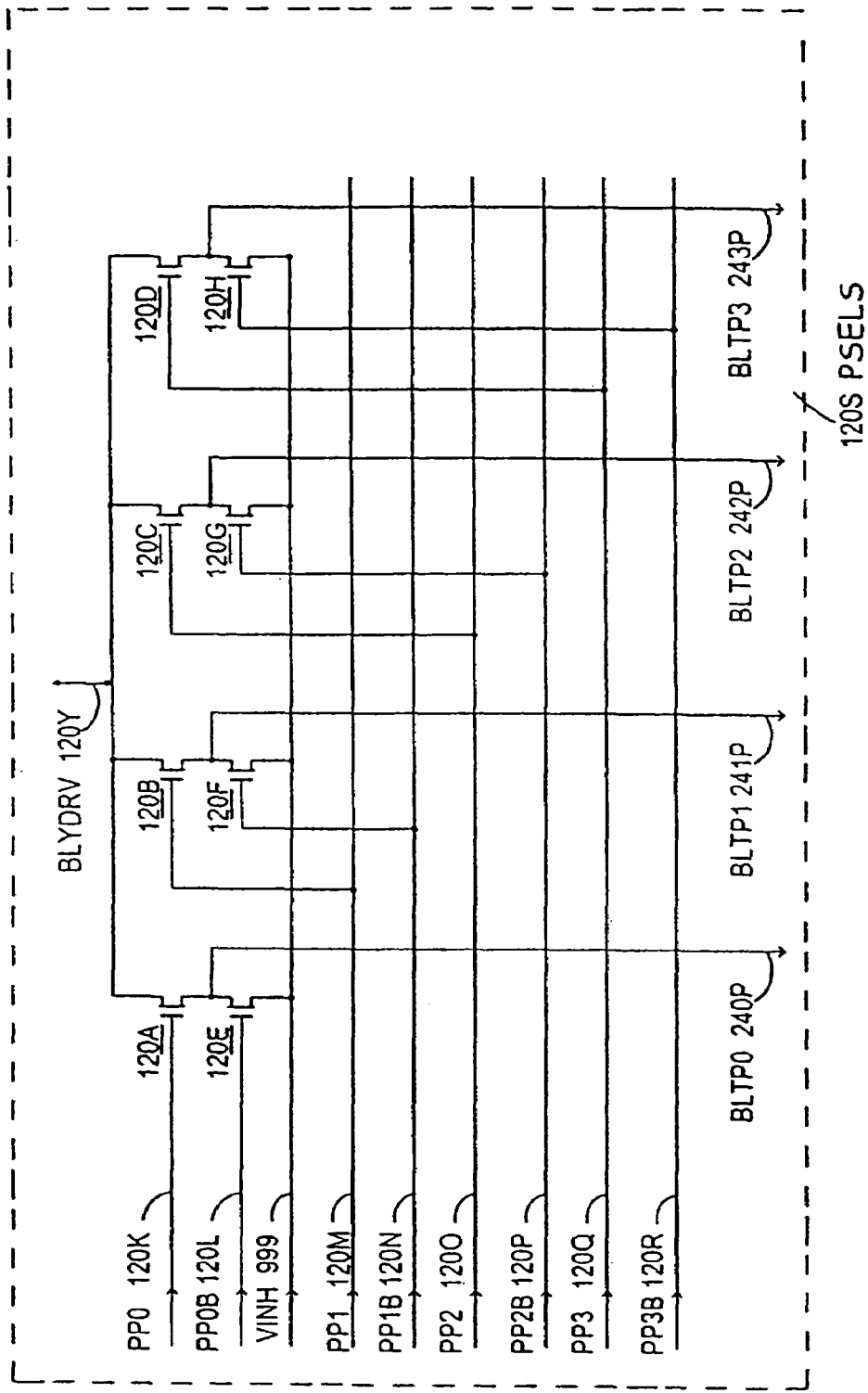
FIG. 3B is a page select circuit, which together with the segment select decoder selects one bitline at a time for each y-driver.

A block (PSEL) 120 includes a plurality of circuit blocks (PSELS) 120S. FIG. 3B shows details of a page select circuit (PSELS) 120S that selects a pair of bitlines at a time. Transistors 120A–D are select transistors. Transistors 120E–H are inhibit transistors. Lines (PP0) 120K, (PP1) 120M, (PP2) 120O, and (PP3) 120Q are complementary signals of lines (PP0B) 120L, (PP1B) 120N, (PP2B) 120P, and (PP3B) 120R, respectively. Line (BLYDRV) 120Y goes to one y-driver (YDRVS) 110S inside the block (YDRV) 110. Block (YDRVS) 110S will be described in detail later in the description of the multilevel algorithm. Lines (BLTP0) 240P, (BLTP1) 241P, (BLTP2) 242P, and (BLTP3) 243P couple to the bitlines in block 101 and couple to a set of lines (BLP0) 240, (BLP1) 241, (BLP2) 242, and (BLP3) 243 of the circuit block 290 in FIG. 4A.

Figure 3C:
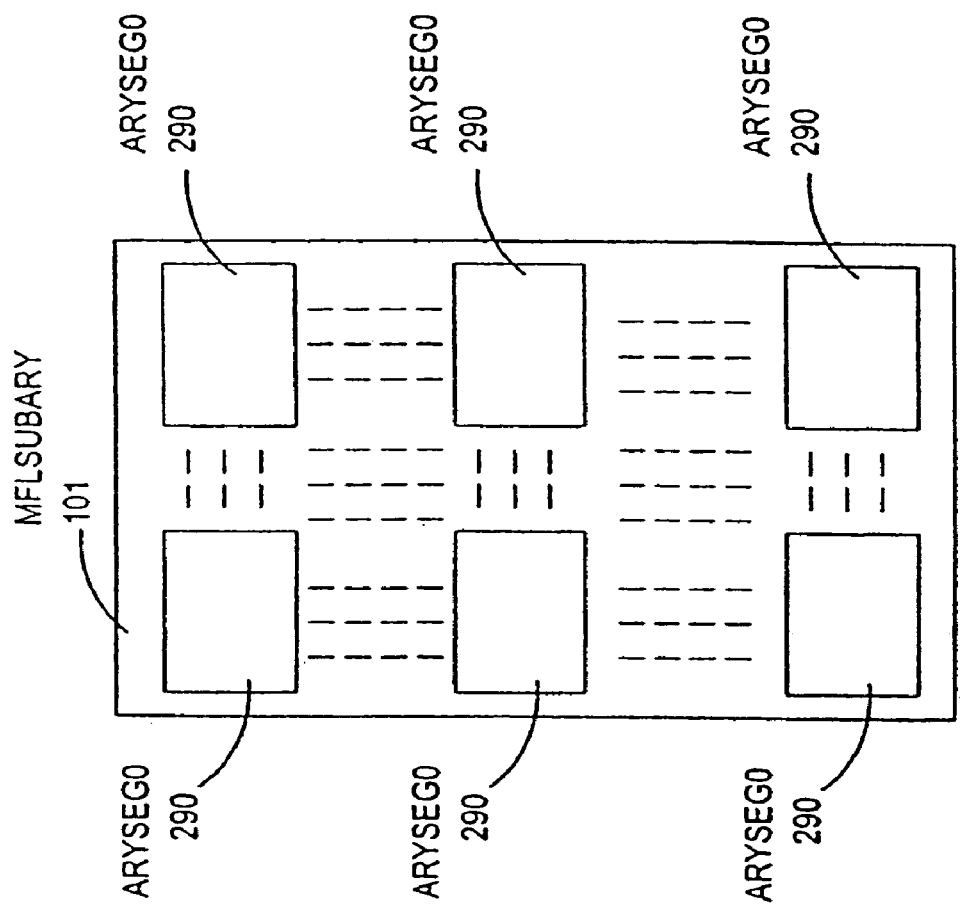
FIG. 3C is a block diagram of a multilevel sub-array block.

FIG. 3C shows a block diagram of a block (MFLSUBARY) 101. A block (MFLSUBARY) 101 includes a plurality of blocks (ARYSEG0) 290. Blocks (ARYSEG0) 290 are first tiled horizontally NH times and then the horizontally tiled blocks 290 are tiled vertically NV times. For a page with 1024 memory cells, NH is equal to 1024. NV is determined such that the total number of memory cells is equal to the size of the desired physical memory array.

Figure 4A:
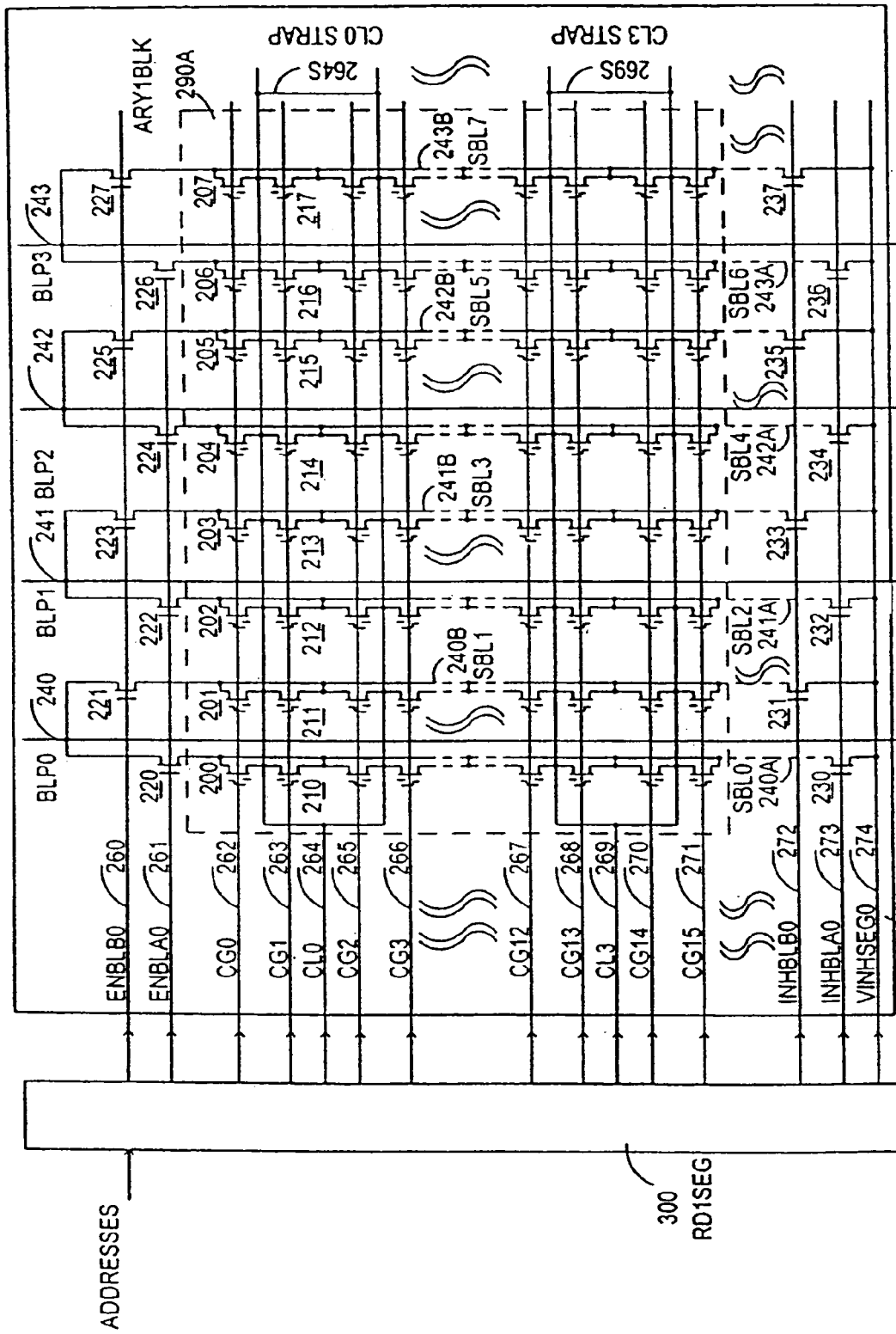
FIG. 4A is one embodiment of a nonvolatile multilevel array unit of inhibit and select segmentation.

FIG. 4A shows a basic array unit (ARYSEG0) 290. A block (RD1SEG) 300 is a multilevel decoding block. A plurality of the blocks RDLSEG makes up the circuit block (MLMDEC) 130. In the block (ARYSEG0) 290, there are 8 columns and FIG. 4A shows only 8 rows of memory cells, while other rows, e.g., 120 rows, are not shown for clarity. Each ARYSEG0 290 includes a plurality, e.g. 8, of array blocks (ARYLBLK) 290A tiled vertically. A set of transistors 220, 221, 222, 223, 224, 225, 226, 227 couples respectively a set of segment bitlines (SBL0) 240A and (SBL1) 240B, (SBL2) 241A and (SBL3) 241B, (SBL4) 242A and (SBL5) 242B, (SBL6) 243A and (SBL7) 243B to a set of top bitlines (BLP0) 240, (BLP1) 242, (BLP2) 242, and (BLP3) 243, respectively. Top bitlines refer to bitlines running on top of the whole array and running the length of the MFLSUBARY 101. Segment bitlines refer to bitlines running locally within a basic array unit ARYSEG0 290. A set of transistors 230, 231, 232, 233, 234, 235, 236, 237 couples respectively segment bitlines (SBL0) 240A and (SBL1) 240B, (SBL2) 241A and (SBL3) 241B, (SBL4) 242A and (SBL5) 242B, (SBL6) 243A and (SBL7) 243B to an inhibit line (VINHSEG0) 274. A line (CL0) 264 is the common line coupled to common lines of the first four rows of memory cells. A line (CL3) 269 couples to common lines of the last four rows of memory cells. A set of control gates (CG0) 262, (CG1) 263, (CG2) 265, (CG3) 266 couples to control gates of memory cells of the first four rows respectively. A set of control gates (CG12) 267, (CG13) 268, (CG14) 270, (CG15) 271 couples to control gates of memory cells of the last four rows, respectively. A pair of inhibit select lines INHBLB0 272 and INHBLB1 273 couples to gates of transistors 231, 233, 235, 237 and transistors 230, 232, 234, 236 respectively. A pair of bitline select lines (ENBLB0) 260 and (ENBLA0) 261 couples to gates of transistors 221, 223, 225, 227 and transistors 220, 222, 224, 226, respectively.

Multiple units of the basic array unit (ARYSEG0) 290 are tiled together to make up one sub-array (MFLSUBARY) 101 as shown in FIG. 3C. And multiples of such (MFLSUBARY) 101 are tiled horizontally to make up the final 8192 columns for a total of 32768×8192=268,435,460 physical memory cells, or called 256 mega cells. The logical array size is 256 mega cells×4 bits per cell=1 giga bits if 4-bit digital multilevel memory cell is used or 256 mega cells×8 bits per cell=2 giga bits if 8-bit digital multilevel memory cell is used. The top bitlines (BLP0) 240, (BLP1) 241, (BLP2) 242, and (BLP3) 243 run from the top of the array to the bottom of the array. The segment bitlines (SBL0) 240A, (SBL1) 240B, (SBL2) 241A, (SBL3) 241B, (SBL4) 242A, (SBL5) 242B, (SBL6) 243A, and (SBL7) 243B only run as long as the number of rows within a segment, for example, 128 rows. Hence the capacitance contributed from each segment bitline is very small, e.g., 0.15 pF.

The layout arrangement of the top bitlines 240–243 in relative position with each other and with respect to the segment bitlines (SBL0) 240A, (SBL1) 240B, (SBL2) 241A, (SBL3) 241B, (SBL4) 242A, (SBL5) 242B, (SBL6) 243A, (SBL7) 243B are especially advantageous in reducing the bitline capacitance. The purpose is to make the top bitlines as truly floating as possible, hence the name of truly-floating-bitline scheme.

Figure 5A:
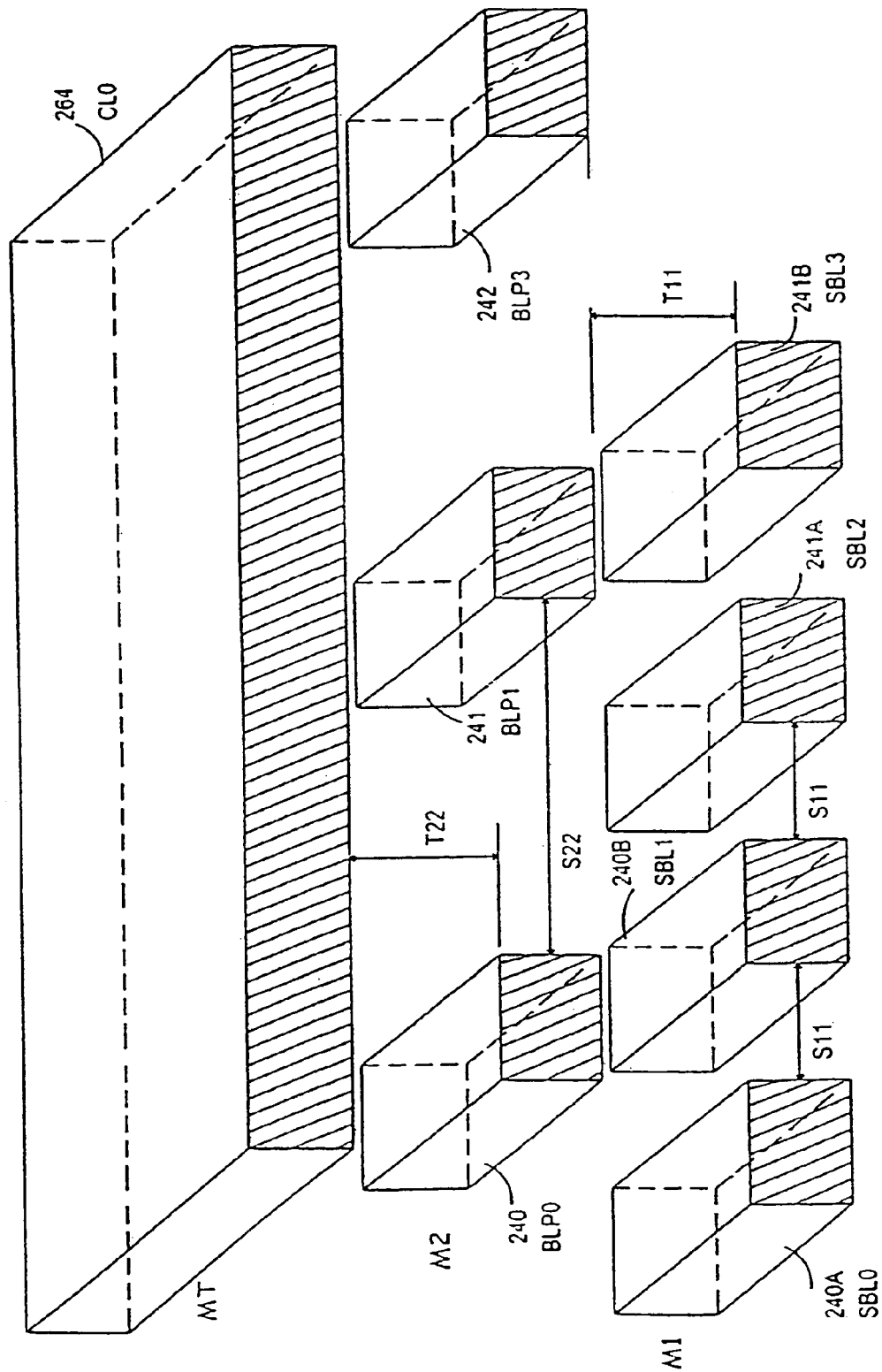
FIG. 5A is a cross section of inhibit and select segmentation interconnection.

In an embodiment as shown in FIG. 5A, lines 240, 241, and 242 are in the middle, sandwiched between lines 240A, 240B, 241A and 241B in the bottom and lines (CL0) 264 in the top. Furthermore, line 240 is on top of the spacing between lines 240A and 240B and line 241 is on top of the spacing between lines 241A and 241B. This has the benefit of reducing significantly the bottom plane capacitance of line 240 and line 241 since the oxide below each line is almost doubled. The lines 240 and 241 could be positioned on top of lines 240A and 241A, respectively, when the sidewall capacitance reduction outweighs the benefit of the bottom plane capacitance reduction. The sidewall capacitance refers to the capacitance resulting from the vertical walls of a line, the bottom plane capacitance refers to the capacitance from the bottom of a line, and the top plane capacitance refers to the capacitance from the top of a line.

Figure 5B:
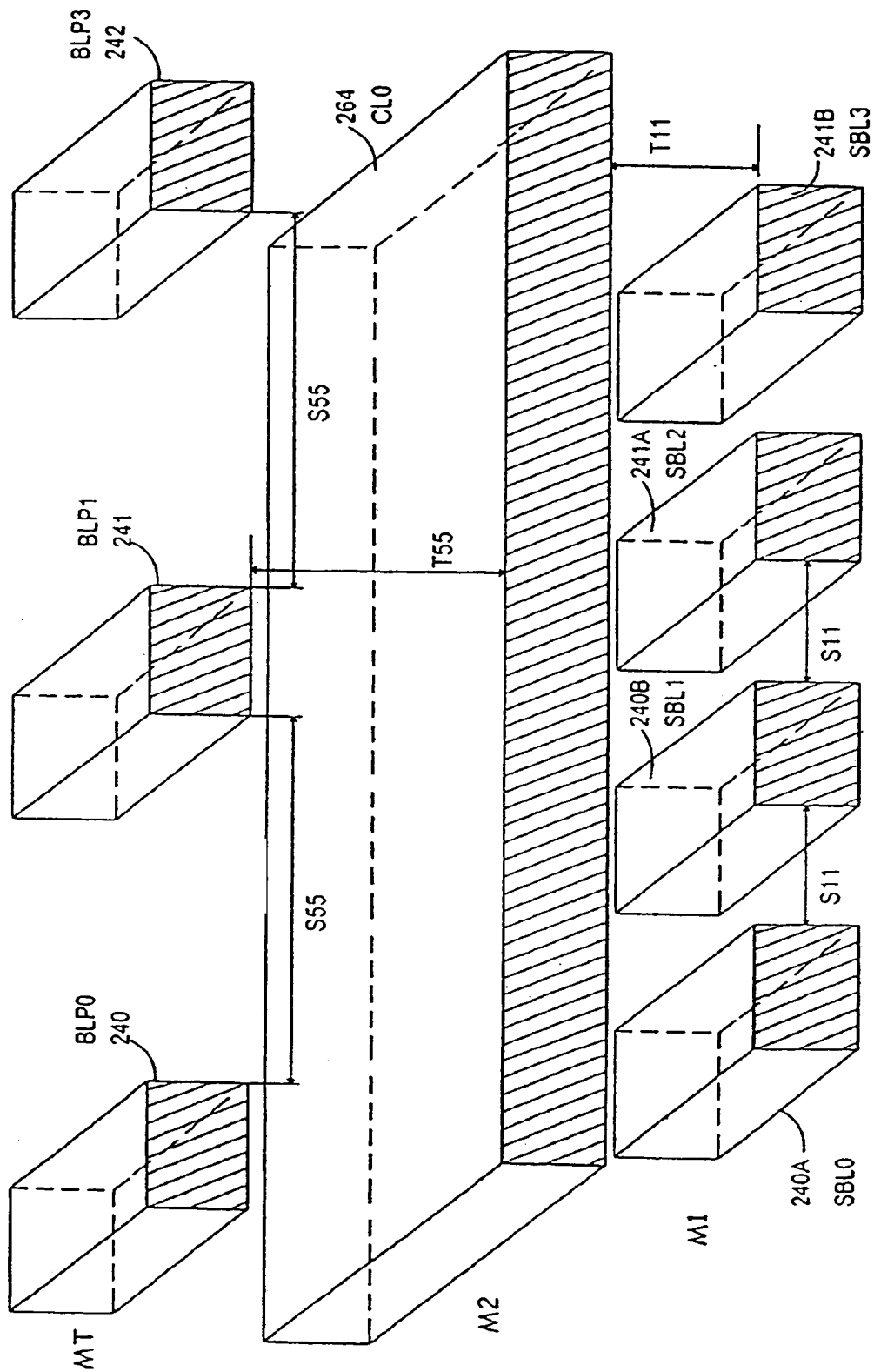
FIG. 5B is a cross section of another embodiment of inhibit and select segmentation interconnection.

In another embodiment, as shown in FIG. 5B, the top bitlines 240–242 have been positioned all the way to the top metal of a multi-layer metal integrated circuit system. For example, for a 5-layer metal integrated circuit system, the top bitlines are metal 5 layer. This avoids the top plane capacitance of the top bitlines 240–242. This also reduces the bottom plane capacitance of the top bitlines 240–242 by a factor of as much as 4 if metal 5 is used. The reduction factor of 4 is due to the oxide below the line increasing by a factor of about as much as 4. Also since the top bitlines 240–242 are spaced further apart as compared to the segment bitlines, the sidewall capacitance is reduced significantly. The top bitlines are now almost floating on top of the array. The end effect is more than on order of magnitude reduction in bitline capacitance. Also since the top bitlines 240–242 spacing are relaxed, the width of the top metal lines can be made larger to reduce the metal bitline resistance.

The reduction in bitline capacitance results in a corresponding increase in speed. To help increase the speed in programming, a bitline-stabilization-assisted operating method can be applied and is described as follows. At the beginning of the programming cycle, a bitline stabilization control signal is used to set all the bitlines to a predetermined voltage VBLPRE, e.g., 0.4–0.8 V. Then high voltage VCL is applied to selected memory common lines for programming. Now the bitlines only have to move partially to a final voltage. This speeds up the TBL timing.

There is an important transient effect related to bitline capacitance in programming. For high speed writing, each program cycle takes time in the microsecond range. The program bias condition for a memory cell is control gate voltage VCGP,=~0.7–2.5 V, bitline cell current Ipcell,=~50–500 nA, and common line voltage VCL going from a low,=~0 V, to a high programming voltage,=~8–13 V. As the VCL ramps from a low to a high voltage, there is a transient current flowing through the memory cell to charge up the bitline node capacitance. This transient current flowing through the cell contributes to the cell programming in addition to the programming current Ipcell. Prior art CHE programming would not be bothered with this effect since the additional transient programming current is small compared to the actual programming current. However, for a very fine programming voltage level control as required for high bits per cell, this effect will cause the programming level to be uncontrollable, making the multilevel memory system useless. The following example is given to appreciate the magnitude of this transient current. Assuming program VCL ramp time=1 μs, CBL=1 pF, the voltage the bitline has to slew=1 V, then, by equation (2), I=CV/T=1 pF×1 V/1 µs=1 µA, which can be 10× the programming current. Hence a method is needed to reduce the transient programming current.

Figure 5C:
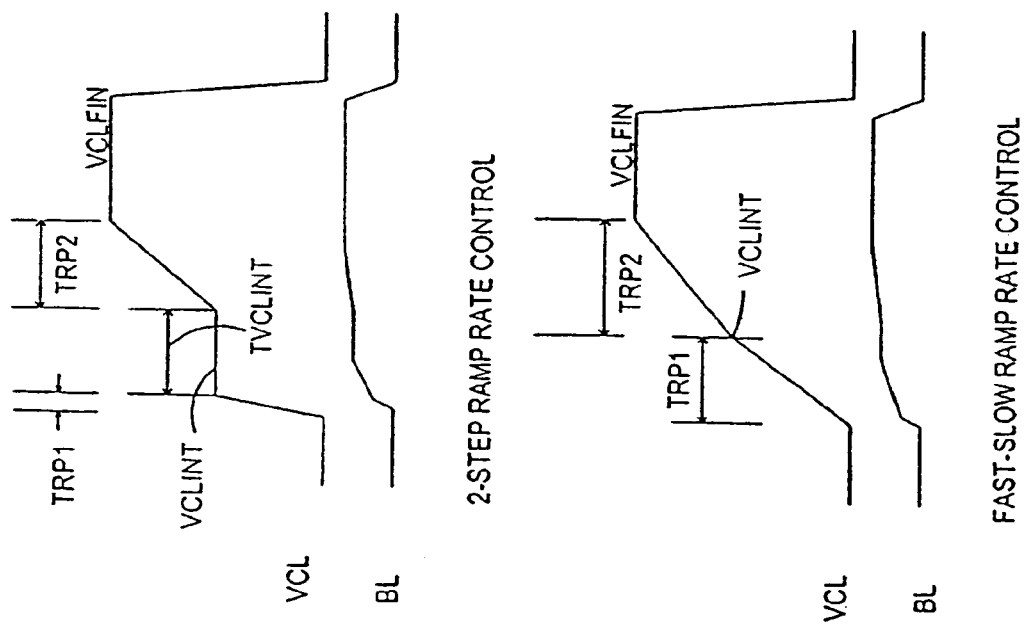
FIG. 5C is a 2-step ramp rate control and fast-slow ramp rate control.

Two approaches are shown in FIG. 5C to reduce this transient phenomenon. In one embodiment, 2-step ramp rate control approach greatly reduces this transient effect without prolonging the programming time as follows. First VCL ramps fast during TRP1 to an intermediate voltage VCLINT, e.g., 2–6 V, then VCL stays at an intermediate voltage for a finite time TVCLINT, then VCL ramps slow during TRP2 to a final voltage VCLFIN. The first fast ramp with the flat intermediate time TVCLINT will let transient current flowing through the cell to stabilize most of the cell capacitances such as CBL in a short time and at sufficiently low VCL voltage so that insignificant programming takes place while the transient current is flowing. The TRP1 is made fast to consume little programming time. The second slow ramp then brings the cell to a final programming voltage without affecting the programming rate since very little current is flowing through the cell in the second ramp.

Another embodiment of the ramp rate control is a fast-slow ramp rate control approach. VCL first ramps fast during TRP1 to an intermediate voltage VCLINT, then VCL ramps slow during TRP2 to a final voltage VCLFIN. The first ramp TRP1 is faster than that of the TRP2 ramp to allow the transient current during the first ramp TRP1 to stabilize quickly all the cell capacitances while VCL is low enough to not cause significant programming.

The ramp rate can be generated by a RC network, meaning the rate is controlled by a certain capacitance multiplied by a certain resistance, or by a CV/I network, meaning the rate is controlled by a certain capacitance multiplied by a voltage swing divided by a certain bias current. Further, the ramp rate can be programmable by programmable fuses as a function of bitline capacitance to optimize the programming time without introducing adverse transient current. That is the ramp rate is made to be faster for smaller bitline capacitance.

The common line CL0 264 is common to four rows of memory cells for the following reason. Allowing 4 mV voltage drop along the CL line during programming to avoid programming error as described previously, with 1024 cells operating simultaneously with 0.1 ala drawn per cell, the voltage drop by equation (1) is, dVCLP=4 mV=0.5*(1024)(1025) R8cell*0.1 µa, hence R8cell=76 milliohms. For a typical CL line with the line width half as wide as the memory cell, the CL resistance per cell is=~80 milliohms, for 8 cells in series, R8cell is 8×80=640 milliohms, which is much greater than 76 milliohms. Hence by making CL line 264 four memory cells wide, R8cells is=~80 milliohms. The reason the width of the line CL 264 cannot be made arbitrarily large is due to the program disturb. As the high voltage is applied to CL line 264 in programming, all the cells connected to the CL line 264 will see the VCL voltage whether they are selected for programming or not. The more cells connected to the same CL line, the longer time for the disturb for the unselected cells.

Shown in FIG. 4A are the metal strapping lines (CL0STRAP) 264S and (CL3STRAP) 269S of the common lines that connect the diffusion common lines to the metal common lines. The metal strapping could be done every 8, 16, or 32 memory cells depending on an allowable voltage drop along the common line diffusion inside the strapping. This voltage drop depends on the diffusion common line resistance for a given operating current.

An alternative method that mitigates the voltage drop problem along the common line in the program cycle is by the constant-total-current-program scheme. Namely by keeping the same total current flowing all the time independent of whether the cells have been verified or not, the common line voltage drop is kept constant during programming. This could be done for example, by adding additional switching transistors in the array every 8, 16, 32, or 64 memory cells and switching into the CL line the current equivalent to the current from verified cells.

Table 1 shows the operating conditions for the memory array in read, erase, and program. The array operating conditions are shown for the cell 200 of the block ARY1BLK 290A in FIG. 4A, of a selected page for read and program. The selected cell 200 is one cell out of 1024 selected cells within a selected page. The other 1023 selected cells belong to the other 1023 ARYSEG0 290 connected horizontally. The array operating conditions are also shown for all cells connected to CL0 264 for erase.

As shown in Table 1, the operating conditions are such that all the unselected memory cells see no voltage other than 0 volts. This reduces significantly the power consumption. This is also particularly advantageous for improved speed in very high-density memory chips since all the necessary driver circuits only see the loading from the selected memory cells. The loading from the whole array is tremendous due to large number of transistors in array, e.g., 256 million transistors, with its tremendous diffusion, metal and poly interconnect parasitics. For example, one bitline capacitance, CBL is 25 pF, with 8192 bitlines the total bitline capacitance is 8192×25 pF=204 nF. This would require a tremendous amount of power during signal switching, for example, to inhibit all the bitlines during programming. Also not shown in Table 1, the unselected control signals ENBLAs, ENBLBs, INHBLAs, and INHBLBs for unselected array units ARYSEG0 290 only see 0 or VDD but not the multiplied high voltage. This again saves significant power and increases speed due to no loading from unselected control circuits.

Another factor that is reduced greatly is the excessive leakage current from the bitline to ground due to junction leakage, bitline to bitline leakage, band-to-band tunneling, and cell subthreshold conduction. For example, for a typical leakage of 10 pA per cell, with 16,384 cells per bitline, the total leakage is 164 nA, which is greater than Ipcell=100 nA. This implies that the multilevel programming will be uncontrolled due to the uncontrollable excessive leakage current contributing to the controlled programming current Ipcell. With the inhibit and segmentation scheme, the total leakage current is reduced to 128×10 pA=1.28 nA, which is much less than Ipcell=100 nA.

Figure 4B:
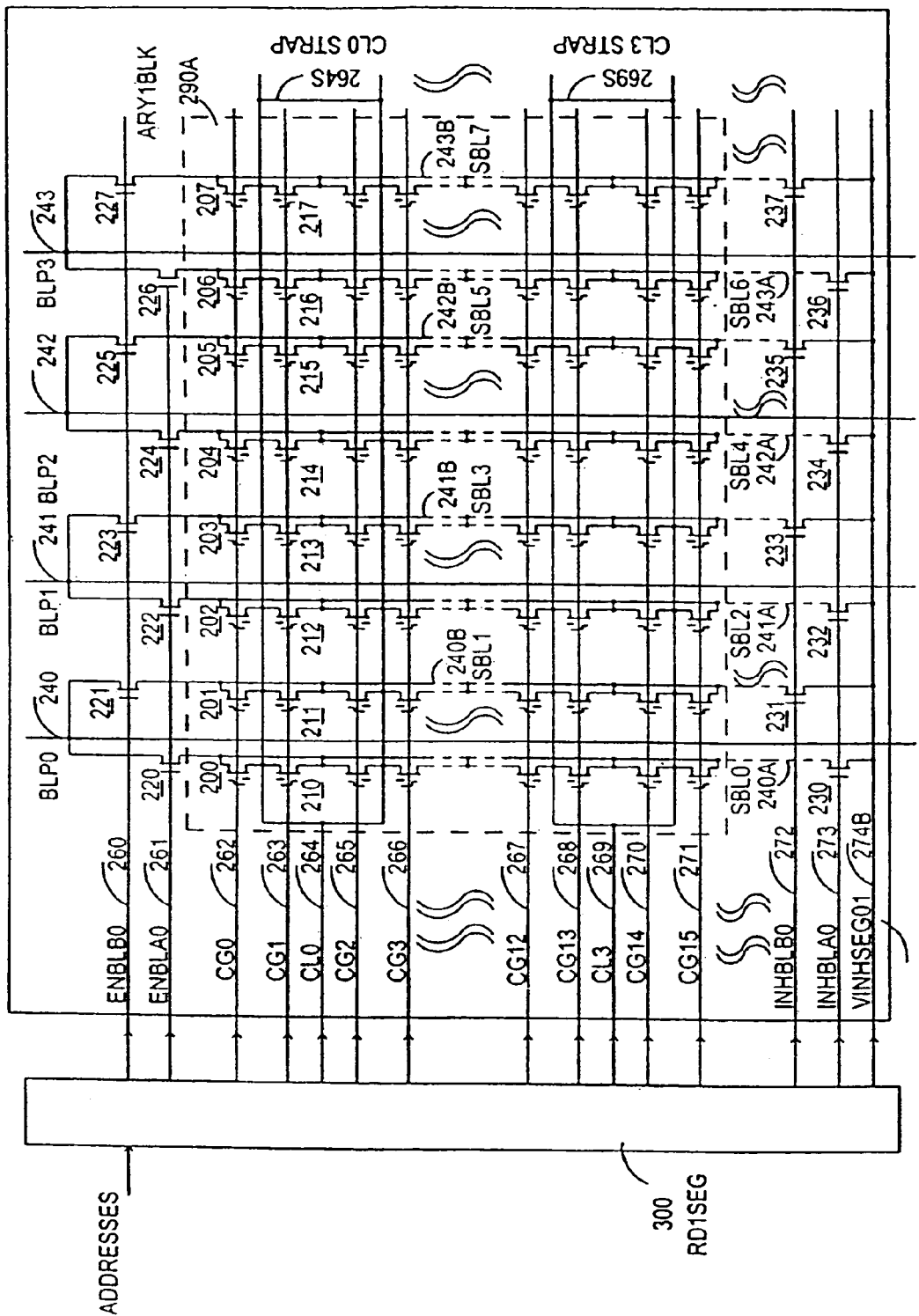
FIG. 4B shows an alternate embodiment of the inhibit and select segmentation scheme.

FIG. 4B shows an alternative array architecture in which the decoded inhibit line VINHSEGO1 274B is shared between any two adjacent segments. This has the benefit of reducing the number of inhibit lines in the array.

Figure 4C:
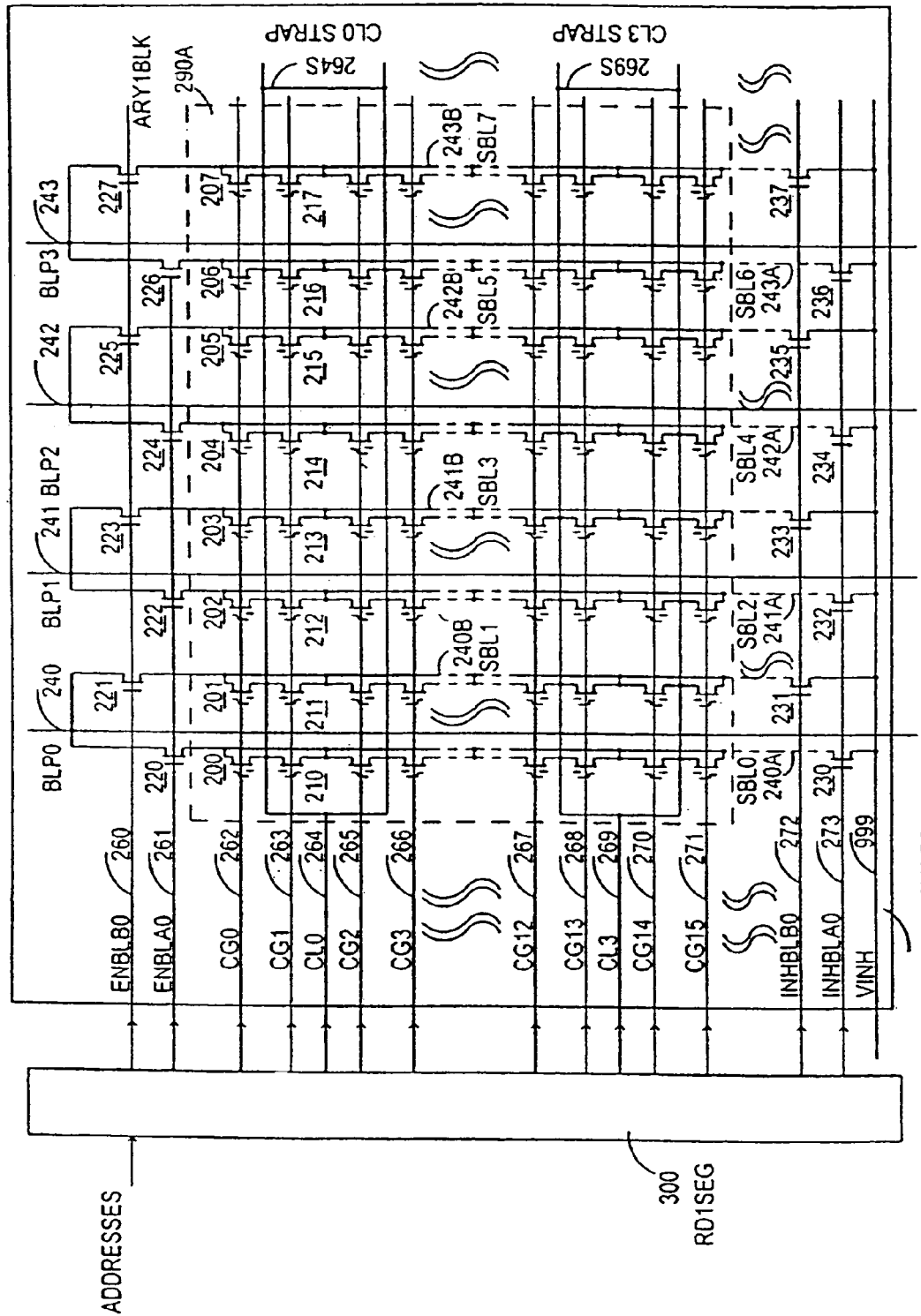
FIG. 4C shows another alternate embodiment of the inhibit and select segmentation scheme.

FIG. 4C shows an alternative array architecture in which the inhibit line VINH 999 is shared for all the segments. This has the benefit of sharing one inhibit line for the whole array.

Figure 4D:
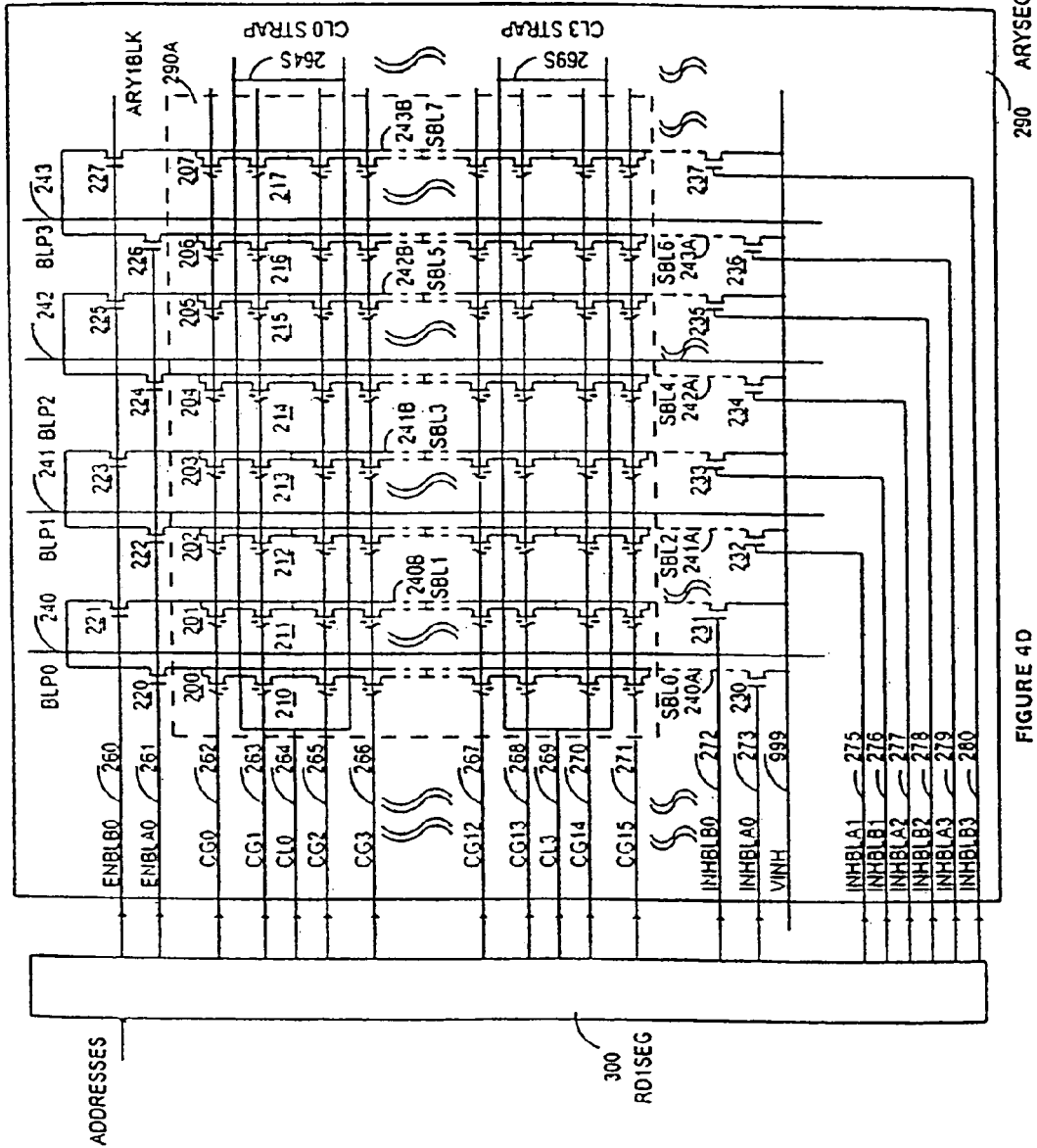
FIG. 4D shows another alternate embodiment of the inhibit and select segmentation scheme.

FIG. 4D shows an alternative array architecture in which a set of inhibit select line INHBLA1–3 and INHBLB1–3 275 to 280 are used to inhibit all segment bitlines except the selected segment bitline. VINH 999 is shared for all the segments. The operating method makes use of a segment cascading scheme that is described as follows. To even isolate the bitline capacitance further, bitline select transistors 220–227 are also used as cascading transistors in programming in addition to the select and inhibit function. In programming, cell 200 for example, the voltage on line 261 is initially pulsed high to pass inhibit voltage VINH 999 from a page select (PSELS) 120S into the selected segment bitline (SBL0) 240A. Then the voltage on line ENBLA0 261 is pulsed to a cascading voltage (VPBCAS), e.g., 1 V. A precharge signal then charges the selected top bitline (BLP0) 240 to 0.3V. The final voltage on the top bitline (BLP0) 240 is=~0.3 V since 1V−VT=~0.3 V. Hence the voltage on line BLP0 240 no longer changes during programming. The voltage on the segment bitline, however, still changes as VCL is applied and stabilized. But the capacitance on the segment bitline is minimal,=~0.15 pF. Here the operating method just described could also apply to the array shown in FIG. 4A but the inhibit voltages on the unselected segment bitlines are floating. The array shown in FIG. 4D just makes sure all the unselected segment bitlines are kept at a constant inhibit voltage (VINH) 999.

Figure 4E:
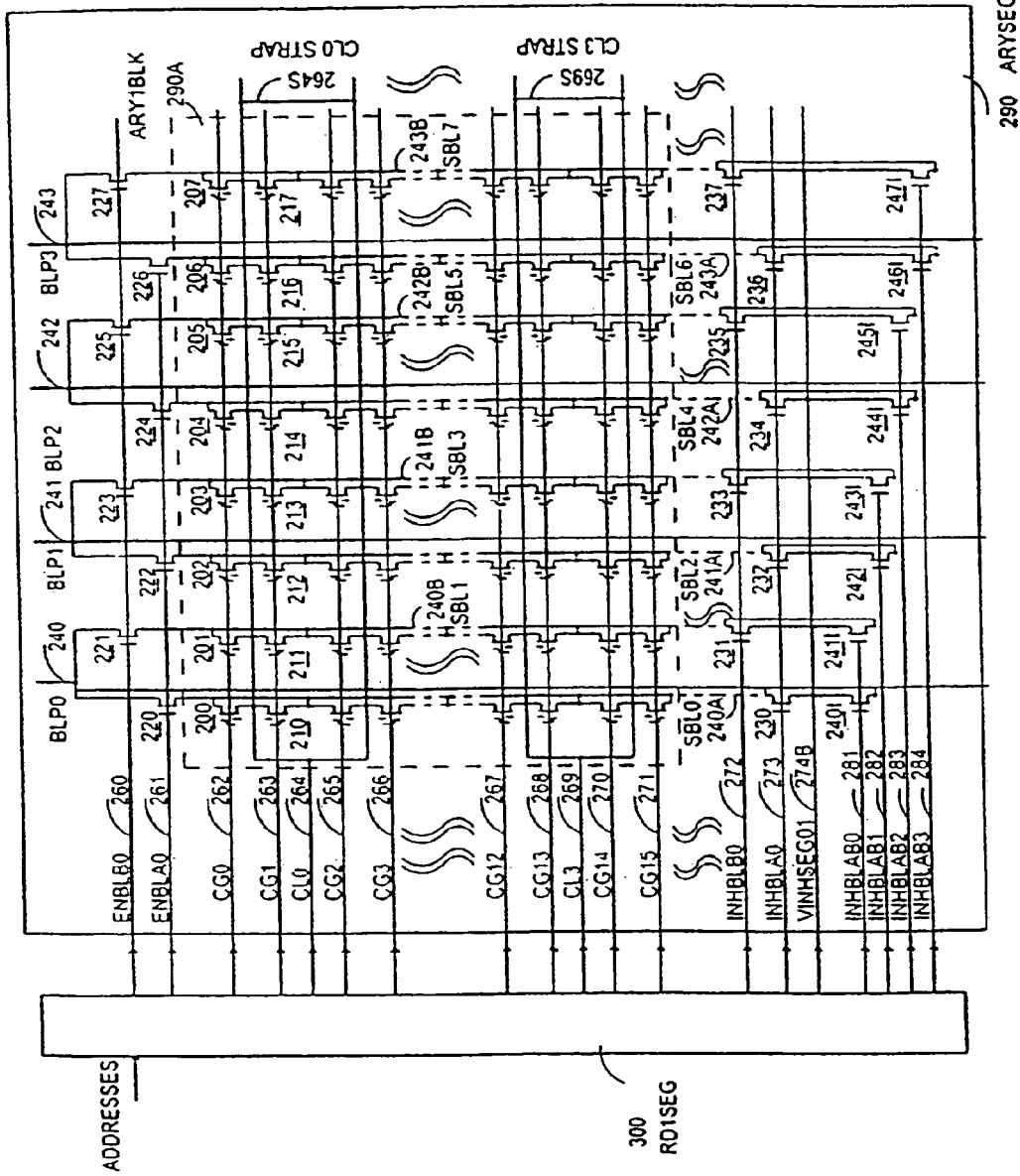
FIG. 4E shows another alternate embodiment of the inhibit and select segmentation scheme.

FIG. 4E shows another array suitable for the method just described above. It needs a set of 4 additional lines (INH-BLAB0–3) 281–284 and a set of 8 additional transistors 240I–247I for inhibit decoding. However additional transistors 240I–247I occupy less die area than that required for additional inhibit decoding lines 275–280 in FIG. 4D.

Figure 4F:
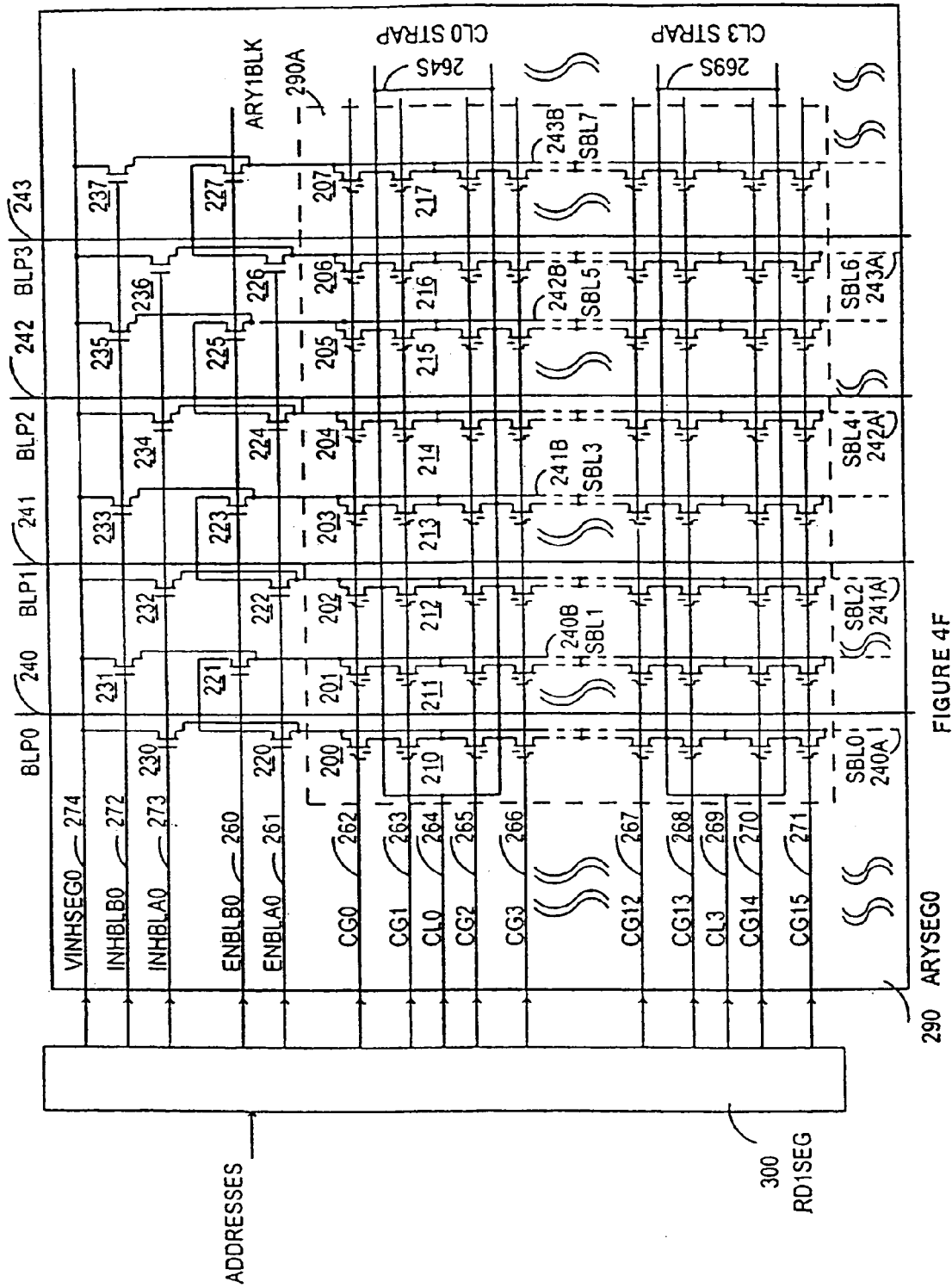
FIG. 4F shows another alternate embodiment of the inhibit and select segmentation scheme.

FIG. 4F shows an array architecture similar to that in FIG. 4A with the inhibit transistors physically at the top of the segment array.

Note that it is possible to do one top bitline per one segmented bitline in the ARYSEG0 290. In this case, the sidewall capacitance from one top bitline to adjacent top bitlines increases due to reduced spacing between the top bitline and the adjacent top bitlines.

Note that it is also possible to do one top bitline per more than two segmented bitlines in the ARYSEG0 290. In this case, more decoding transistors are needed in the array to select one segmented bitline out of more than two segmented bitlines, which leads to more die size. However the sidewall capacitance from one top bitline to adjacent top bitlines decreases due to increased spacing between the top bitline and the adjacent top bitlines. This reduction of capacitance may not be significant if the spacing is already wide enough.

An alternative embodiment of reducing the bitline capacitance is by hierarchical interconnect segmentation that is an extension over the previous concept as follows. A first segment bitline running in first layer of metal couples to a plurality of memory cells. A second segment bitline running in second layer of metal is coupled to a plurality of first segment bitlines by bitline segment transistors through vias between metal 1 and metal 2. Third segment bitline running in third layer of metal is coupled to a plurality of second segment bitlines by other bitline segment transistors through vias between metal 1 and metal 2 and metal 3. This can continue to higher metal layers. This approach allows optimization of horizontal spacing, vertical spacing, interconnect width, and interconnect length between different layers of interconnect metals for minimum capacitive coupling between metal interconnect lines. This results in further reduced bitline capacitance.

TABLE 1

| | Array Operating Conditions | | |
|---|---|---|---|
| | READ | ERASE | PROGRAM |
| SELECTED SEGMENTS: | | | |
| CG0 | 3–6 V | 8–13 V | 0.7–2.5 V |
| CG1, 2, 3 | 0 | | 8–13 V |
| CG4–15 | 0 | 0 | 0 |
| Rest of all CG lines | 0 | 0 | 0 |
| CL0 | 2–3 V | 0 | 4–13 V |
| CL1, 2, 3 | 0 | 0 | 0 |
| Rest of all CL lines | 0 | 0 | 0 |
| BL0, 8, 16 . . . | 0 TO 2–3 V | FL or 0 V | 0–0.8 V |
| BL1–7, 9–15, 17–23, . . . | VINH | VINH | VINH |
| UNSELECTED SEGMENTS: | | | |
| All CG lines | 0 V | 0 V | 0 V |
| All CL lines | 0 V | 0 V | 0 V |
| All BL lines | 0 V | 0 V | 0 V |

Figure 6:
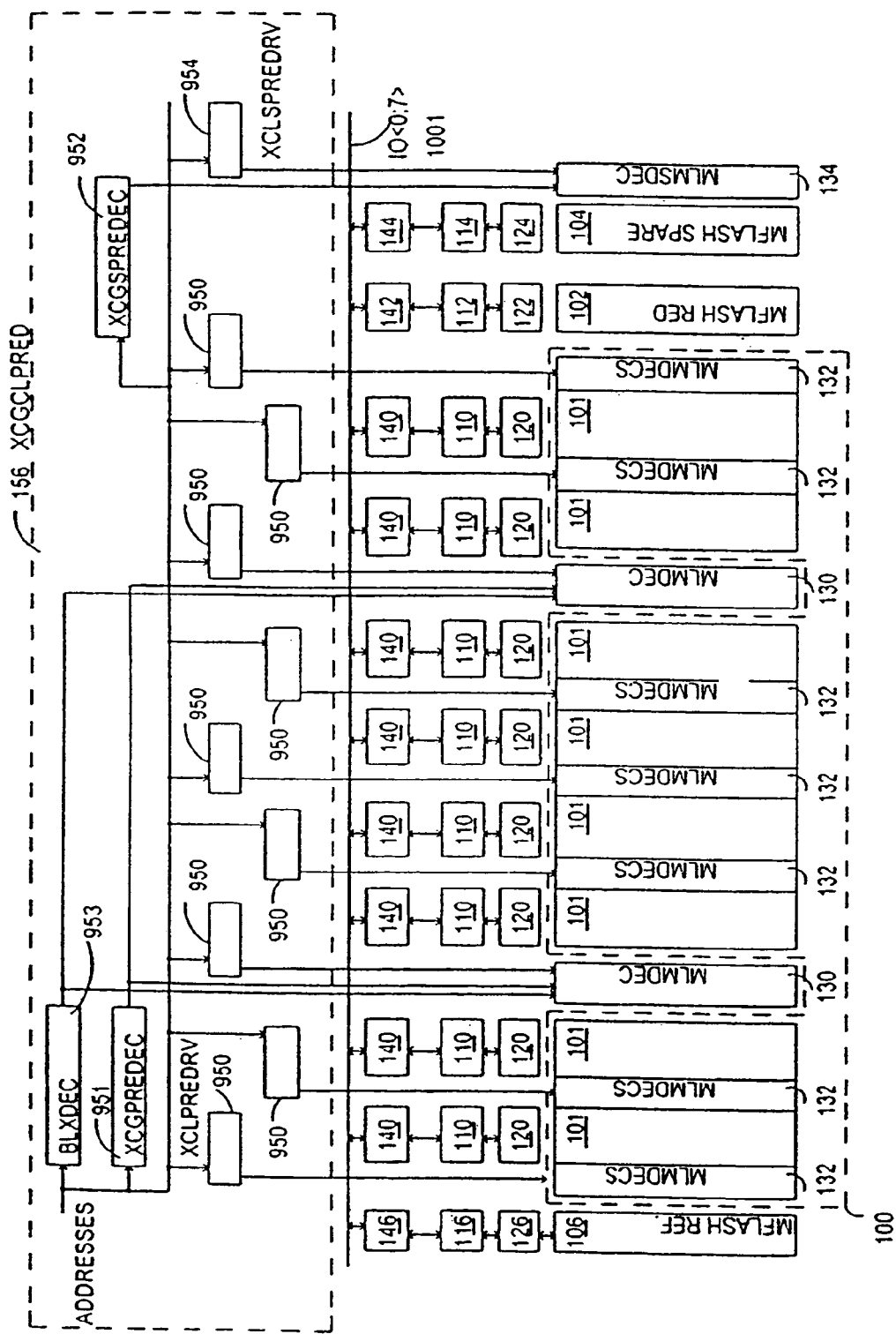
FIG. 6 shows a block diagram of multilevel decoding.

Multilevel Memory Decoding:

FIG. 6 shows the block diagram of the multilevel decoding scheme. The invention provides precision voltages with millivolt control tolerances to the memory array over temperature, process corners, and power supply variation. The invention provides these voltages in an efficient manner, meaning deliver power where it is needed and reducing the output loading through circuit configuration. The invention also provides a multilevel precision decoding circuit with minimum area overhead.

As discussed in the array architecture section, the voltage drop along the common line would cause a programming error as well as sense error in read. Hence the drop is brought down to a manageable level. By partitioning a common line into small line sections, with drivers on both sides of each of the line sections, the voltage drop is reduced. However, prior art partition would cause a tremendous area penalty due to the large amount of decoding lines and circuits. This invention provides an enhanced decoding circuit by routing the interconnect in the higher metal layers and by using circuit configurations suitable for multilevel decoding.

The block (VCGCLPRED) 156 has been expanded to include sub-blocks inside. Common line predecoder and driver (XCLPREDRV) 950 provide predecoded common lines with precision voltages to regular memory common lines in block 130 and 132. A common line predecoder and driver (XCLSPREDRV) 954 provides predecoded common lines with precision voltages to spare memory common lines in block 134. The circuit block 954 is functional equivalent to circuit 950. A control gate predecoder (XCGPREDEC) 951 provides predecoded control gate lines to block 130. A spare control gate predecoder (XCGSPREDEC) 952 provides predecoded control gate lines to block 134. A bitline predecoder (BLXDEC) 953 provides predecoded bitlines to block (MLMDEC) 130. All other circuit blocks have been described in association with FIG. 2A.

Figure 7:
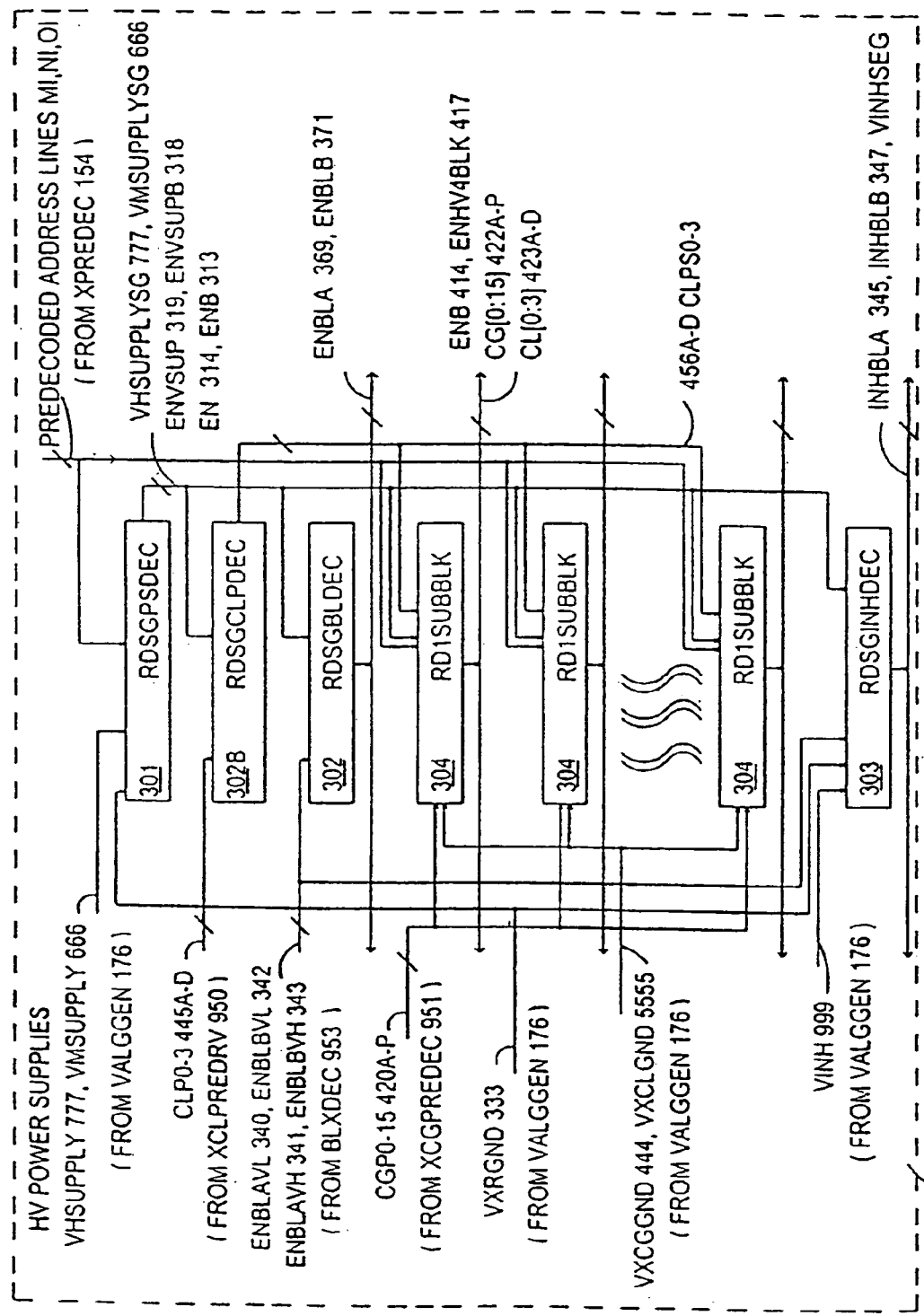
FIG. 7 shows one segment decoder that includes segmented power supply decoder, segmented bitline select decoder, inhibit decoder, segmented predecoded common line decoder, and control gate and control line decoder.

FIG. 7 shows one segmented decoder (RD1SEG) 300. The RD1SEG 300 selects or deselects a plurality of basic array unit (ARYSEG0) 290 connected horizontally. The RD1SEG 300 includes a circuit segmented supply decoder (RDSGPSDEC) 301, a segmented bitline decoder (RDSGBLDEC) 302, a segmented common line pre-decoder (RDSGCLPDEC) 302B, a segmented inhibit decoder (RDSG1HDEC) 303, and multiples of a sub-block decoder (RD1SUBBLK) 304. The RDSGPSDEC 301 decodes the high voltage supply for each segmented decoder (RDLSEG 300). The high voltage supplies for the unselected segmented decoders (RD1SEG) 300 are disabled and hence power is minimized due to much less loading and die size is reduced due to a smaller voltage multiplier. The RDSGBLDEC 302 couples the segment bitlines to the top bitlines when selected. The RDSGINHDEC 303 couples the inhibit voltage (VINH) 999 to the appropriate bitlines of the selected array units (ARYSEG) 290 when selected or unselected as described later in FIG. 9B. The RD1SUBBLK 304 enables appropriate control gates and common lines for the memory cells.

Figure 8:
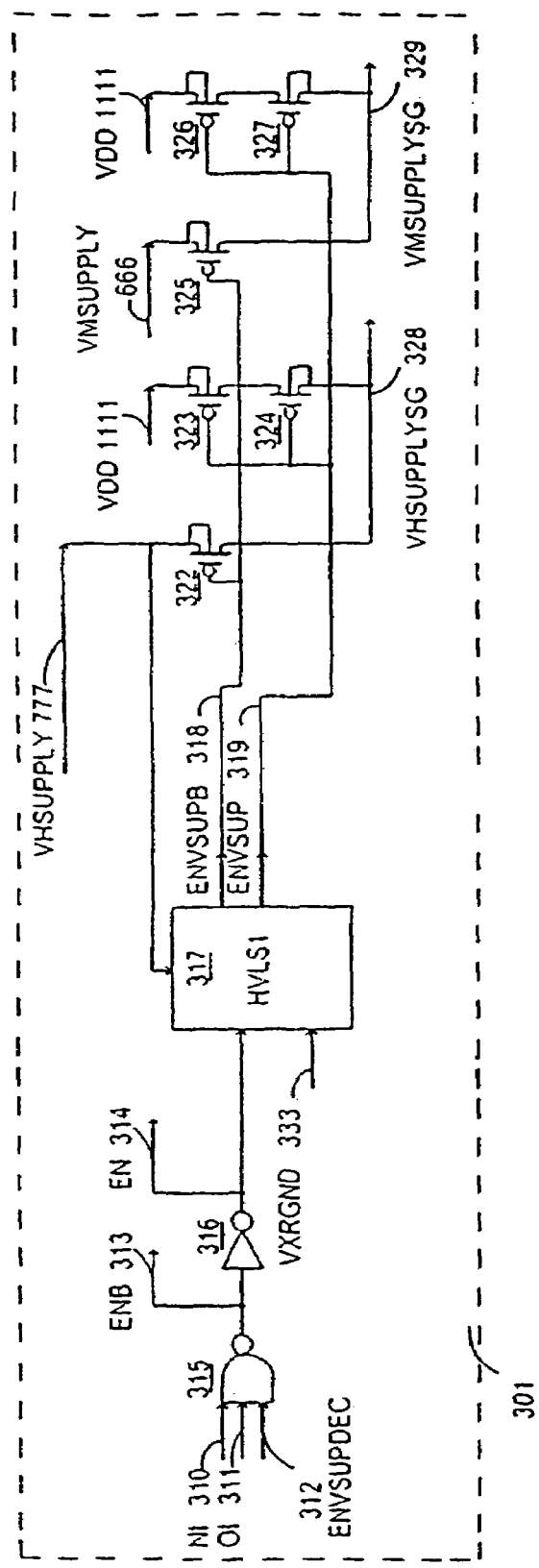
FIG. 8 shows a segmented power supply decoder.

FIG. 8 shows details of the power supply decoder (RDSGPSDEC) 301. Line (NI) 310 and (OI) 311 are predecoded address lines coming from the address predecoder block (XPREDEC) 154. Line ENVSUPDEC 312 is a global enable signal for disabling or enabling all the supply decoders. A NAND gate 315 is a typical 3-input NAND gate with an output line (ENB) 313. An inverter 316 is a typical inverter with input line (ENB) 313 and an output line 314. A high voltage level shifter (HVLS1) 317 shifts logic signal EN 314 into high voltage complementary output signal lines (ENVSUPB) 318 and (ENVSUP) 319. A line (VXRGND) 333 is a low voltage line for (HVLS1) 317. A line (VHSUPPLY) 777 is a precisely regulated high voltage supply for the decoding. A line (VMSUPPLY) 666 is another precisely regulated high voltage supply. A transistor PMOS 322 couples the high voltage supply (VHSUPPLY) 777 into line (VHSUPPLYSG) 328 when the RDSGPSDEC 301 is selected. Transistors PMOS 323 and 324 couple regular voltage supply (VDD) 1111 into line (VHSUPPLYSG) 328 when the RDSGPSDEC 301 is deselected. A transistor PMOS 325 couples another high voltage supply (VMSUPPLY) 666 into line (VMSUPPLYSG) 329 when the RDSGPSDEC 301 is selected. The voltage level on line (VMSUPPLY) 666, e.g., 5–10V, is such that in read the bitline select transistors in the memory array are heavily overdriven to reduce their on resistance, which results in insignificant sense error. Transistors PMOS 326 and 327 couple regular voltage supply (VDD) 1111 into line (VMSUPPLYSG) 329 when the RDSGPSDEC 301 is deselected. The PMOS 323 and 326 have their wells connected to line (VDD) 1111. The PMOS 324 and 327 have their wells connected to the VHSUPPLYSG 328 and VMSUPPLYSG 329, respectively. The connection of their wells is done to avoid source and drain junction diodes turning on during the switching.

Figure 9A:
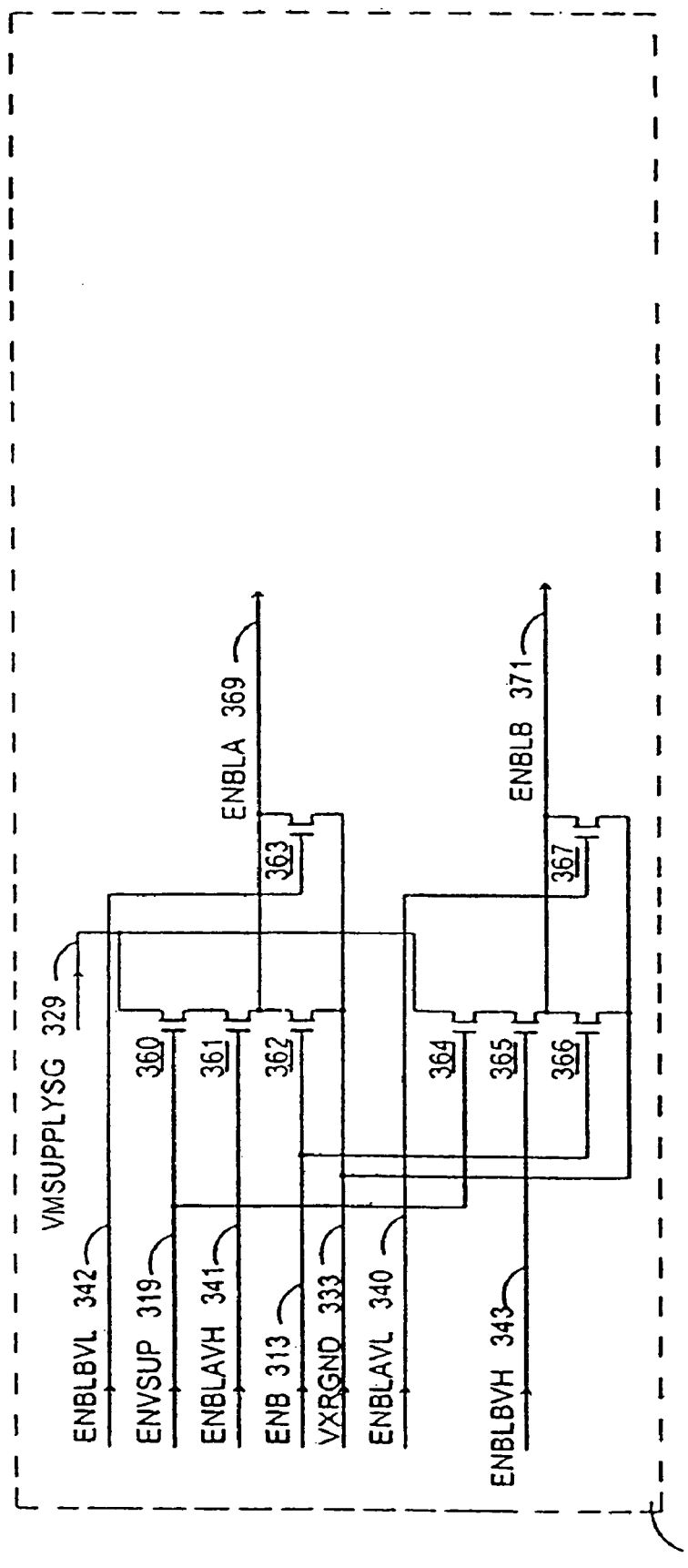
FIG. 9A shows a segmented bitline decoder.

FIG. 9A shows details of the segmented bitline select decoder (RDSGBLDEC) 302. Line (ENVSUP) 319 and line (ENBLAVH) 341 connected to the gates of transistors 360 and 361, respectively, are used to couple voltage on line VMSUPPLYSG 329 into line ENBLA 369. Either transistor 362 with line (ENB) 313 on its gate or transistor 363 with line (ENBLBVL) 342 on its gate is used to couple line (ENBLA) 369 to line (VXRGND) 333. Similarly transistors 364 and 365 together with lines (ENVSUP) 319 and line (ENBLBVH) 343, respectively, on their gates are used to couple voltage on line (VMSUPPLYSG) 329 into line (ENBLB) 371. Either transistor 366 with line (ENB) 313 on its gate or transistor 367 with line ENBLAVL 340 on its gate are used to couple line (ENBLB) 371 to line (VXRGND) 333. The voltage level on line (VHSUPPLY) 777 in the block (RDSGPSDEC) 301, e.g., 7–12 V, is such that the transistors 360, 361, 364, 365 couple, with minimal loss, the voltage from VMSUPPLYSG 329 into lines (ENBLA) 369 and (ENBLB) 371. The deselect transistors 362, 363, 366, and 367 have their gates coupled only to the low voltage signals instead of the high voltage control signals as conventionally done. This circuit configuration has the benefit of reducing significantly the loading for the high voltage supply (VHSUPPLY) 777. This circuit configuration is applied throughout all the decoding circuits.

Figure 9B:
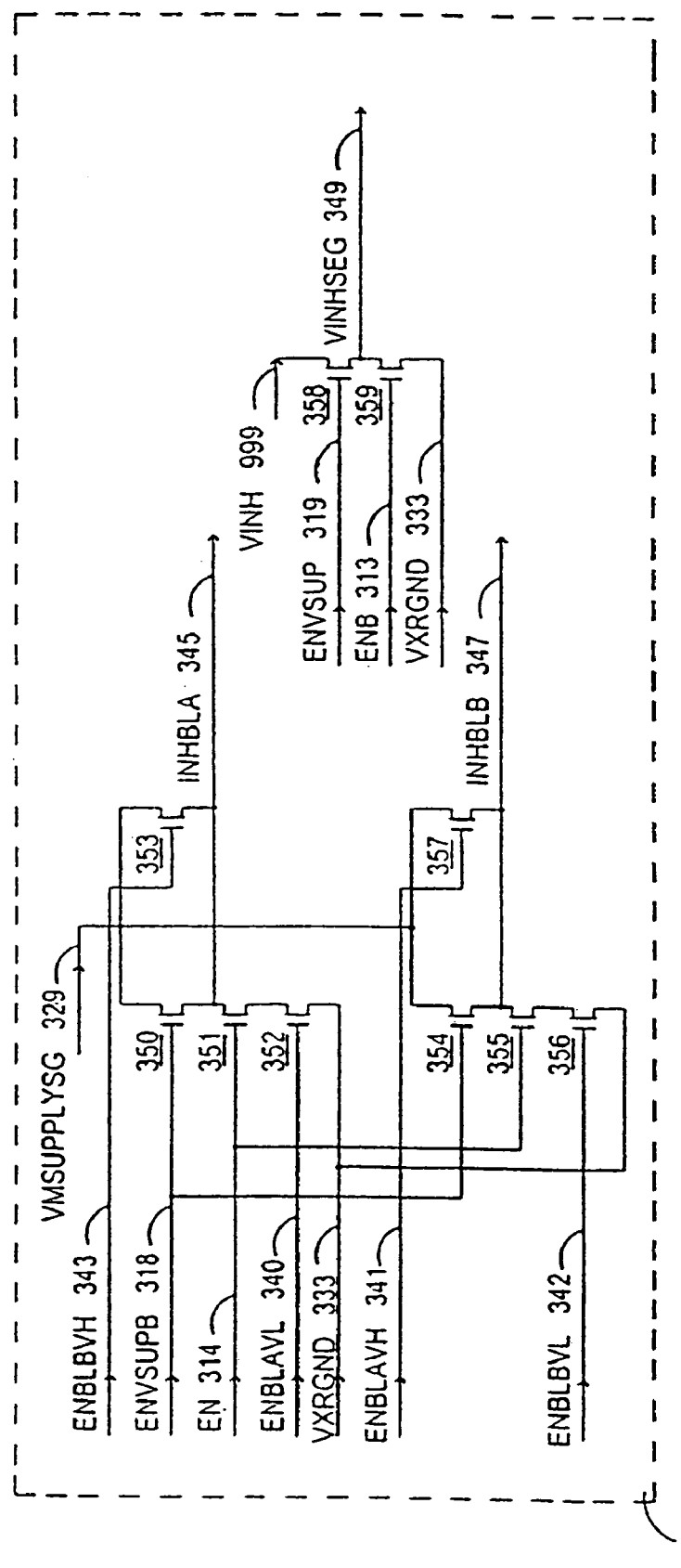
FIG. 9B shows a segmented inhibit decoder.

FIG. 9B shows details of the segmented inhibit select decoder (RDSGINHDEC) 303. Either transistor 350 with line (ENVSUPB) 318 on its gate or transistor 353 with line (ENBLBVH) 343 on its gate couples the voltage on line (VMSUPPLYSG) 329 to line (INHBLA) 345. Transistors 351 and 352 together with lines (EN) 314 and (ENBLAVL) 340, respectively, on their gates are used to couple line (INFBLA) 345 to line (VXRGND) 333. Similarly either transistor 354 with line (ENVSUPB) 318 on its gate or transistor 357 with line (ENBLAVH) 341 on its gate is used to couple the voltage on line (VMSUPPLYSG) 329 to line (INHBLB) 347. Transistors 355 and 356 together with lines (EN) 314 and line (ENBLBVL) 342 respectively on their gates are used to couple line (INHBLB) 347 to line (VXRGND) 333. Transistor 358 with line (ENVSUP) 319 on its gate is used to couple the inhibit voltage on line (VINH) 999 to line (VINHSEG) 349. Transistor 359 with line (ENB) 313 on its gate is used to couple the voltage on line (VINHSEG) 349 to line (VXRGND) 333. Similar to the circuit configuration in the RDSGBLDEC 302, the low voltage signals are used for signal deselection.

The circuit blocks RDSGPSDEC 301, RDSGBLDEC 302, RDSGINHDEC 303, and RD1SUBBLK 304 are used in the array as shown in FIG. 4A for array selection and inhibit decoding.

Figure 9C:
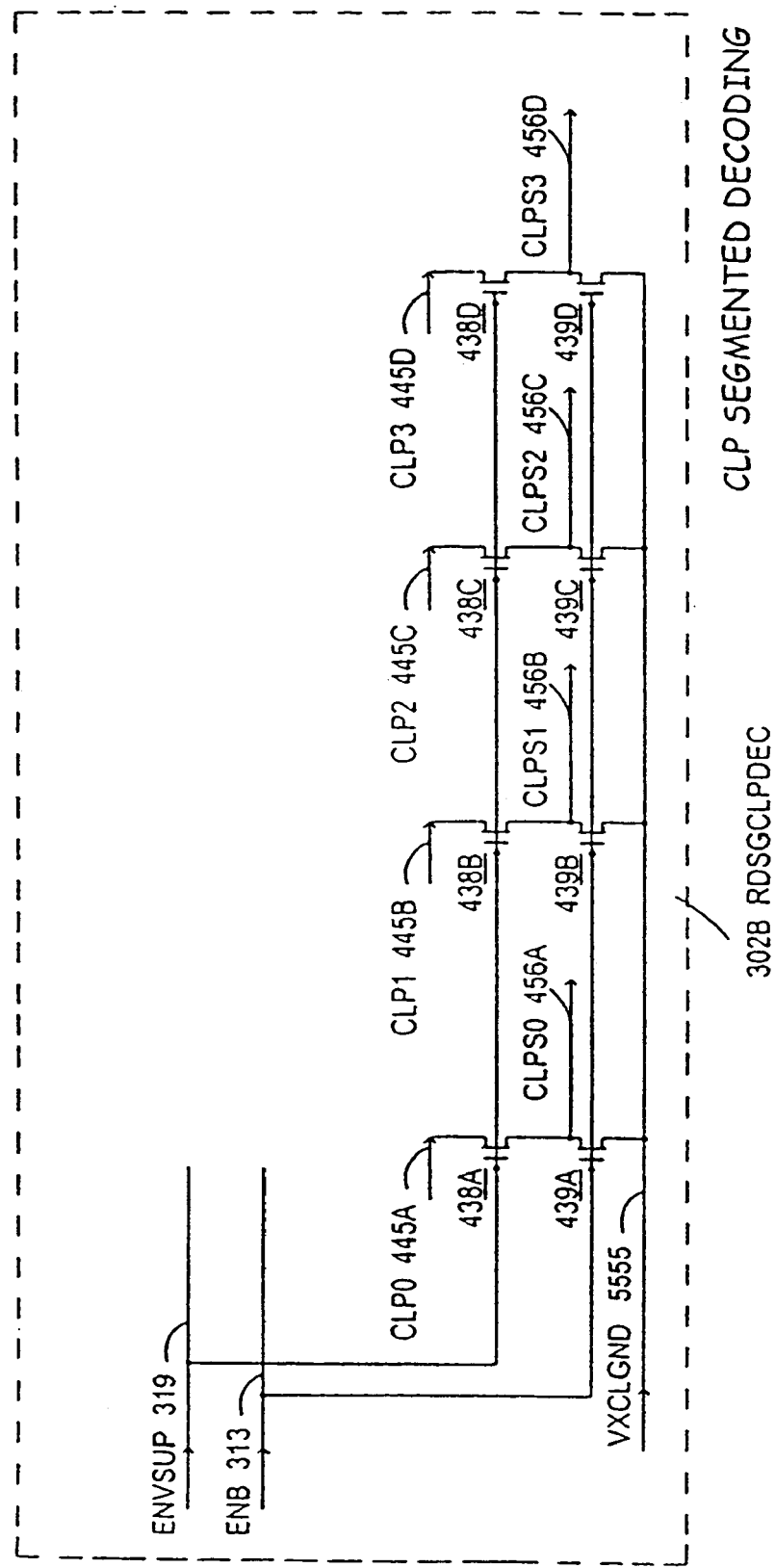
FIG. 9C shows a segmented predecoded common line decoder.

FIG. 9C shows a predecoded common line segmented decoder (RDSGCLPDEC) 302B for lines (CLP0–3) 445A–D. Lines (CLP0–3) 445A–D come from a common line pre-decoder (XCLPREDRV) 950. The purpose of this circuit (RDSGCLPDEC) 302B is to greatly reduce the capacitive loading on lines CLP0–3 seen by the common line pre-decoder (XCLPREDRV) 950. Lines (CLPS0–3) 456A–D are the output lines. Transistors 438A–D with line (ENVSUP) 319 on their gates are used to couple lines (CLP0–3) 445A–D to lines (CLPS0–3) 456A–D, respectively. Transistors 439A–D with line (ENB) 313 on their gates are used to couple lines (CLPS0–3) 456A–D to line (VXCLGND) 5555. This concept of segmented loading could also be applied to predecoded control gates CGP0–15.

Figure 10:
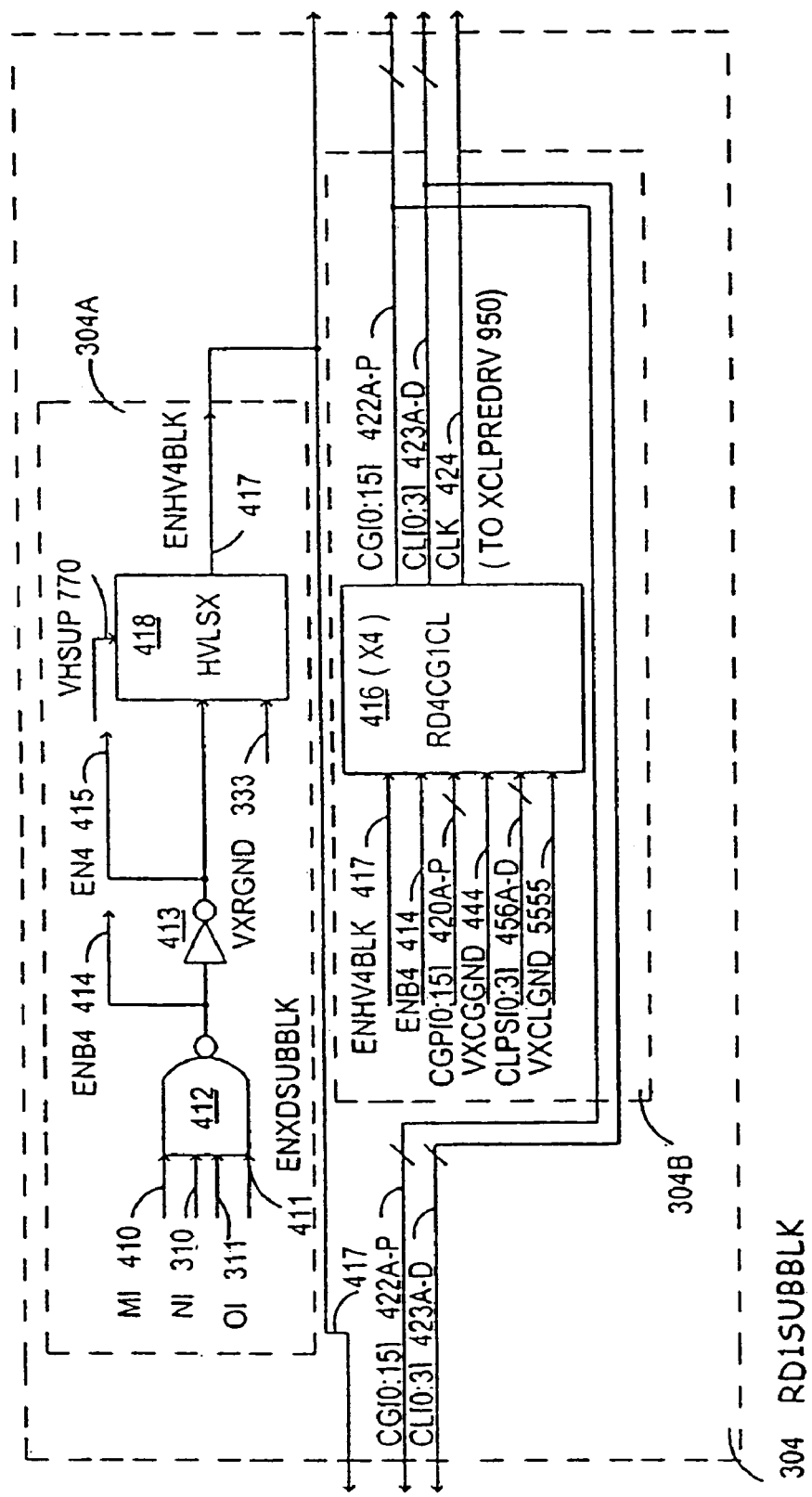
FIG. 10 shows a sub-block decoder for control gate and common line multilevel decoder.

FIG. 10 shows details of the sub-block decoder (RDLSUBLK) 304, that includes a circuit block 304A and a circuit block 304B. The bloc6tgk 304A includes a NAND gate 412, an inverter 413, and a high voltage level shifter (HVLSX) 418. The 3-input NAND gate 412 is used for address decoding. Line (ENB4) 414 is its output. Lines (MI) 410, (NI) 310, and (OI) 311 are predecoded address lines coming from the address pre-decoder (XPREDEC) 154. The inverter 413 inverts line (ENB4) 414 into line (EN4) 415. The high voltage level shift (HVLSX) 418 is used to shift the logic signal EN4 415 into the high voltage output signal (ENHV4BLK) 417. Line (VHSUP) 770 supplies high voltage for the level shifter (HVLSX) 418. Line (VHSUP) 770 couples to line (VHSUPLYSG) 328 of circuit block (RDSGPSDEC) 301. The circuit block 304B including a set of four circuit blocks (RD4CG1CL) 416 provides control signals for control gates (CG) and common lines (CL). Lines CG[0:15] 422A–P couple to 16 rows of memory cells, for example, lines 262, 263, 265–268, 270, 271 of the block (ARY1BLK) 290A in FIG. 4A. Lines CL[0:3] 423A–D couple to 4 shared common lines of memory cells, for example, lines 264 and 269 of the block ARY1BLK 290A in FIG. 4A. Lines CGP[0:15] 420A–P are predecoded control gate lines coming from the control gate pre-decoder (XCGPREDEC) 951. Lines CLPS[0:3] 456A–D are predecoded common lines coming from block RDSGCLPDEC 302B.

Line (VXCGGND) 444 is a line for control gate (CG) deselection. Line (VXCLGND) 5555 is a line for common line (CL) deselection.

Figure 11A:
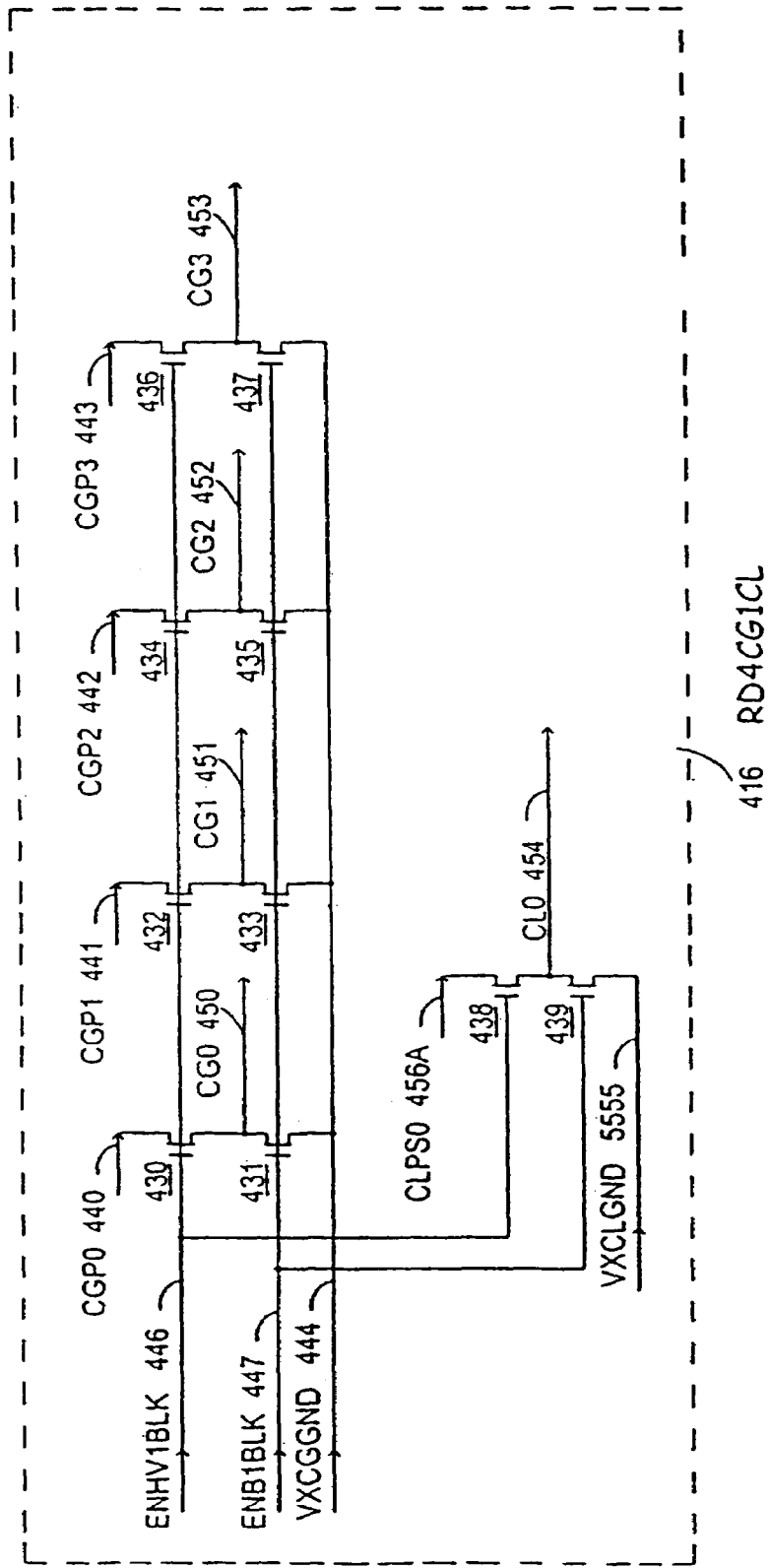
FIG. 11A shows a sub-block of the circuit in FIG. 10 for four control gates and one common line multilevel decoder.

FIG. 11A shows details of circuit block (RD4CG1CL) 416. Transistors 430, 432, 434, 436 together with lines (CGP0) 440, line (CGP1) 441, line (CGP2) 442, line (CGP3) 443, respectively, on their drains are used to couple these lines 440–443 to output line (CG0) 450, line (CG1) 451, line (CG2) 452, and line (CG3) 453, respectively. Lines CGP0–CGP3) 440–443 come from a control gate predecoder (XCGPREDEC) 951. Transistor 438 is used to couple line (CLPS0) 456A to line (CL0) 454. Transistor 439 is used to couple line (CL0) 454 to line (VXCLGND) 5555. Line (ENHVLBLK) 446 couples high voltage into the gates of transistors 430, 432, 434, and 436. Line (ENB1BLK) 447 couples lines CG0–3) 450–453 to the line (VXCGGND) 444 through transistors 431, 433, 435, and 437, respectively, and couples line (CL0) 454 to line (VXCLGND) 5555 through transistor 439. The lines (ENHV1BLK) 446 and (ENB1BLK) 447 are coupled respectively to lines (ENHV4BLK) 417 and (ENB4) 414 generated by circuit block 304.

Four common lines of memory cells are coupled together to one decoded common line CL as shown in the block (ARYSEG0) 290 in FIG. 4A. Four blocks of the RD4CG1CL 416 are used to provide array block selection as shown in the block (ARYSEG0) 290 in FIG. 10. One array block is defined as including 16 rows and 4 common lines of memory cells. One array block includes a plurality of blocks (ARY1BLK) 290A connected horizontally.

The lines (VXRGND) 333, (VXCLGND) 5555, and (VXCGGND) 444 could be individually controlled to be biased at different voltage levels during erase, read, and program to optimize circuit functionality, for instance, to increase the breakdown or to reduce the leakage of MOS decoding transistors.

Note that the same transistors are used for decoding in erase, read, and program operation. In conventional decoding, read decoding is isolated from erase and program decoding since read decoding requires only low voltage and hence the decoding size can be optimized for read speed. Here all decoding is combined together to minimize the die size. Further all decoding is done by NMOS transistors instead of by both PMOS and NMOS transistors as conventionally done. This has the benefit of reducing the capacitive loading. This is so because in deselection one PMOS presents itself as a gate capacitor load while one NMOS only presents itself as a source or drain overlap capacitor load, which is much smaller than a gate capacitor load. Low capacitive loading leads to less power consumption for NMOS decoding. This is against conventional wisdom, which holds that a CMOS circuit is more power efficient than a NMOS circuit.

Figure 11B:
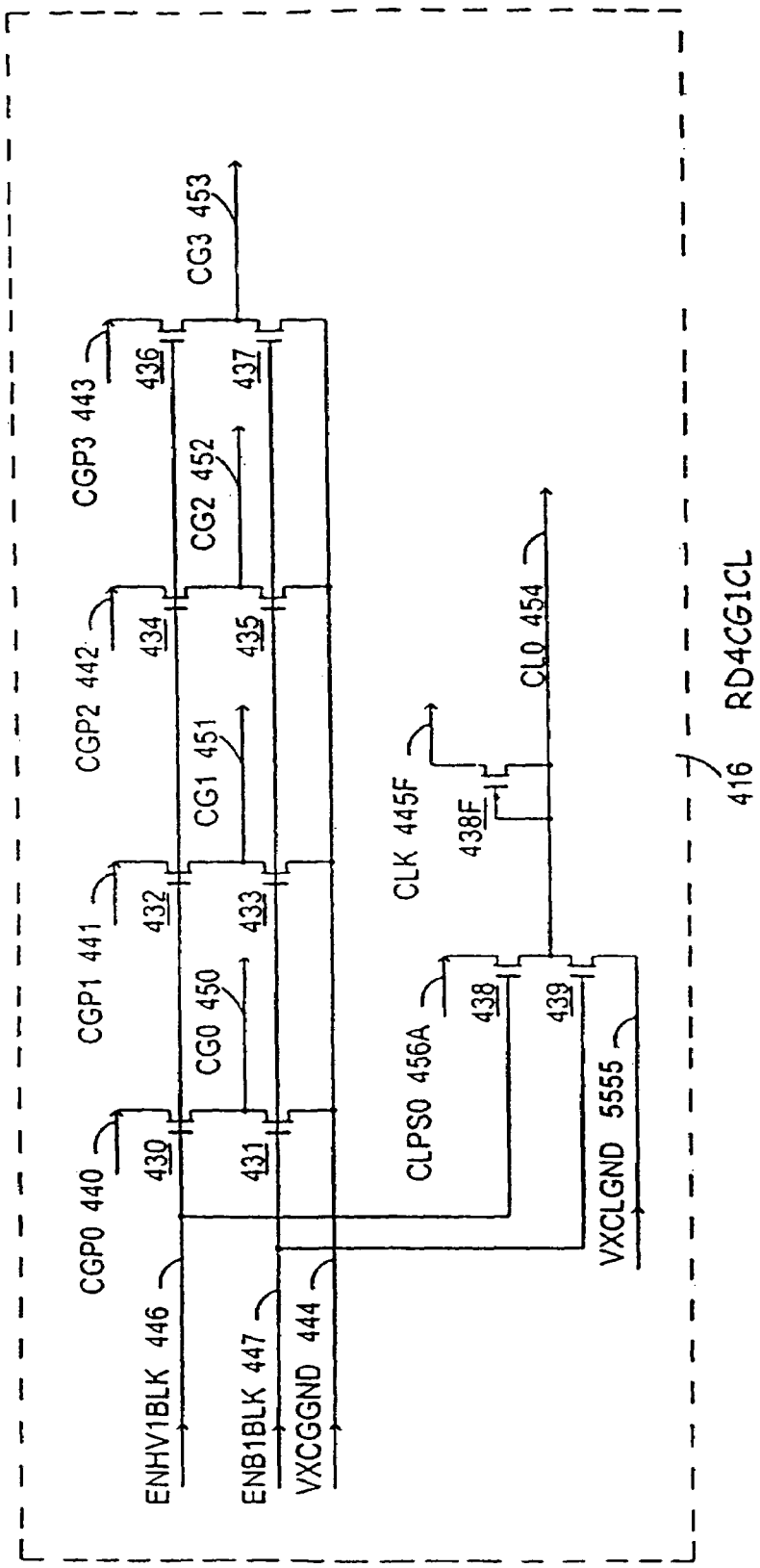
FIG. 11B shows another embodiment of sub-block for four control gates and one common line multilevel decoder with winner-take-all Kelvin connection.

FIG. 11B shows an alternative circuit block (RD4CG1CL) 416 with a diode-connected transistor 438F. The transistor 438F provides feedback signal (CLK) 445F for a Kelvin type connection to a circuit driver inside the block (XCLPREDRV) 950. A Kelvin connection line consumes minimal (or no) DC current. A Kelvin connection allows a circuit driver such as a common line circuit driver to stabilize its output signal at a desired voltage level based on feedback voltage from the Kelvin connection line. This Kelvin connection line (CLK) 445F is connected to other Kelvin connection lines vertically. This is possible since only one common line is on at any given time. Once a common line is selected, this common line will take control of the CLK 445F line since the diode-connected transistor will be forward biased and other diode-connected transistors on the rest of the common lines will be reverse biased. This will be known as winner-take-all Kelvin decoder. This winner-take-all Kelvin decoder will ensure a predetermined voltage on the line (CL0) 454 will be stable all the time over varying load, process corners, temperature, and power supply variation with minimum cost. The stable voltage on the common line is required to not introduce significant voltage error in program or in read as described previously in the description of the multilevel array architecture.

Figure 11C:
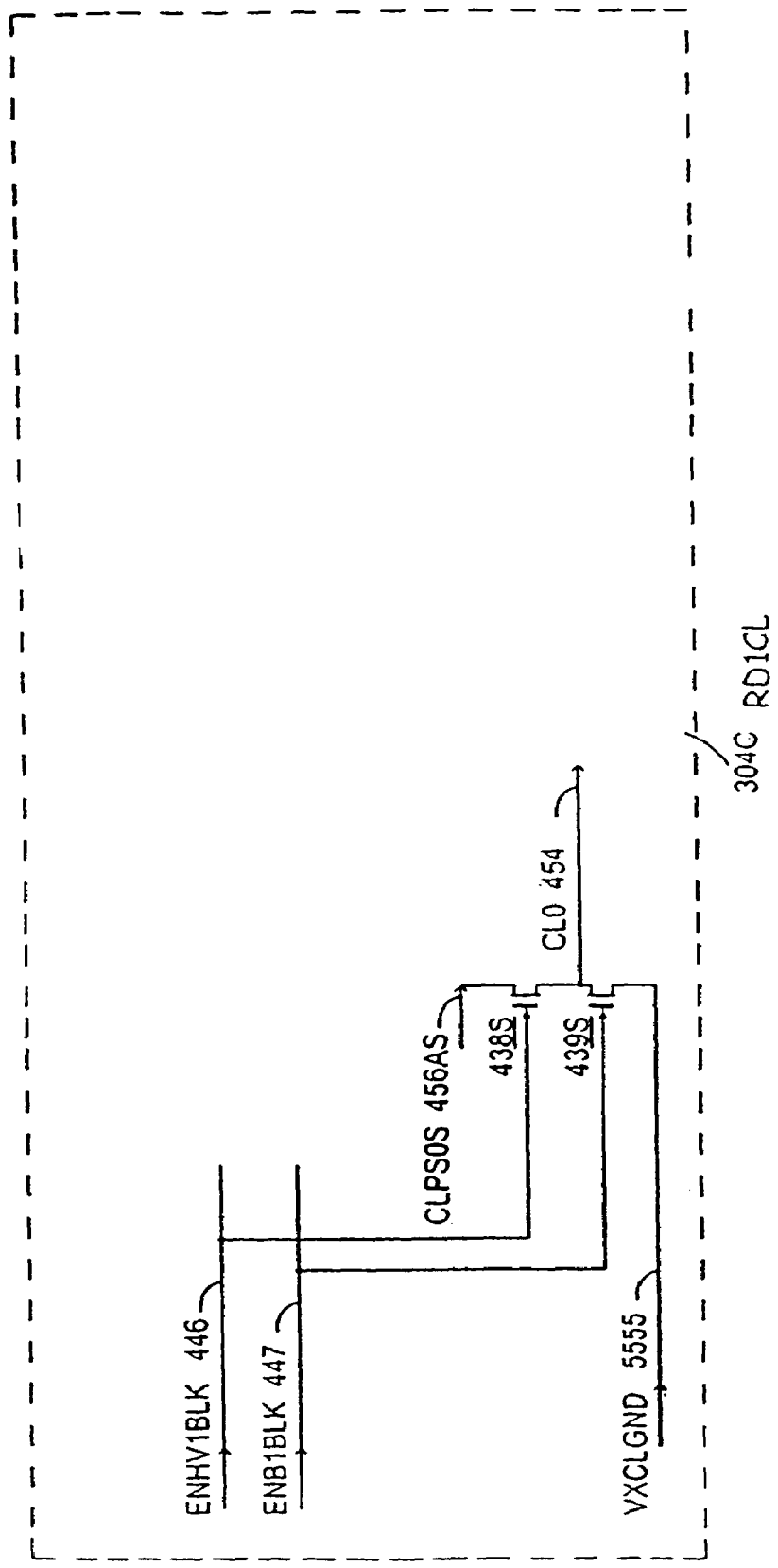
FIG. 11C shows a circuit for one common line driver.
Figure 12:
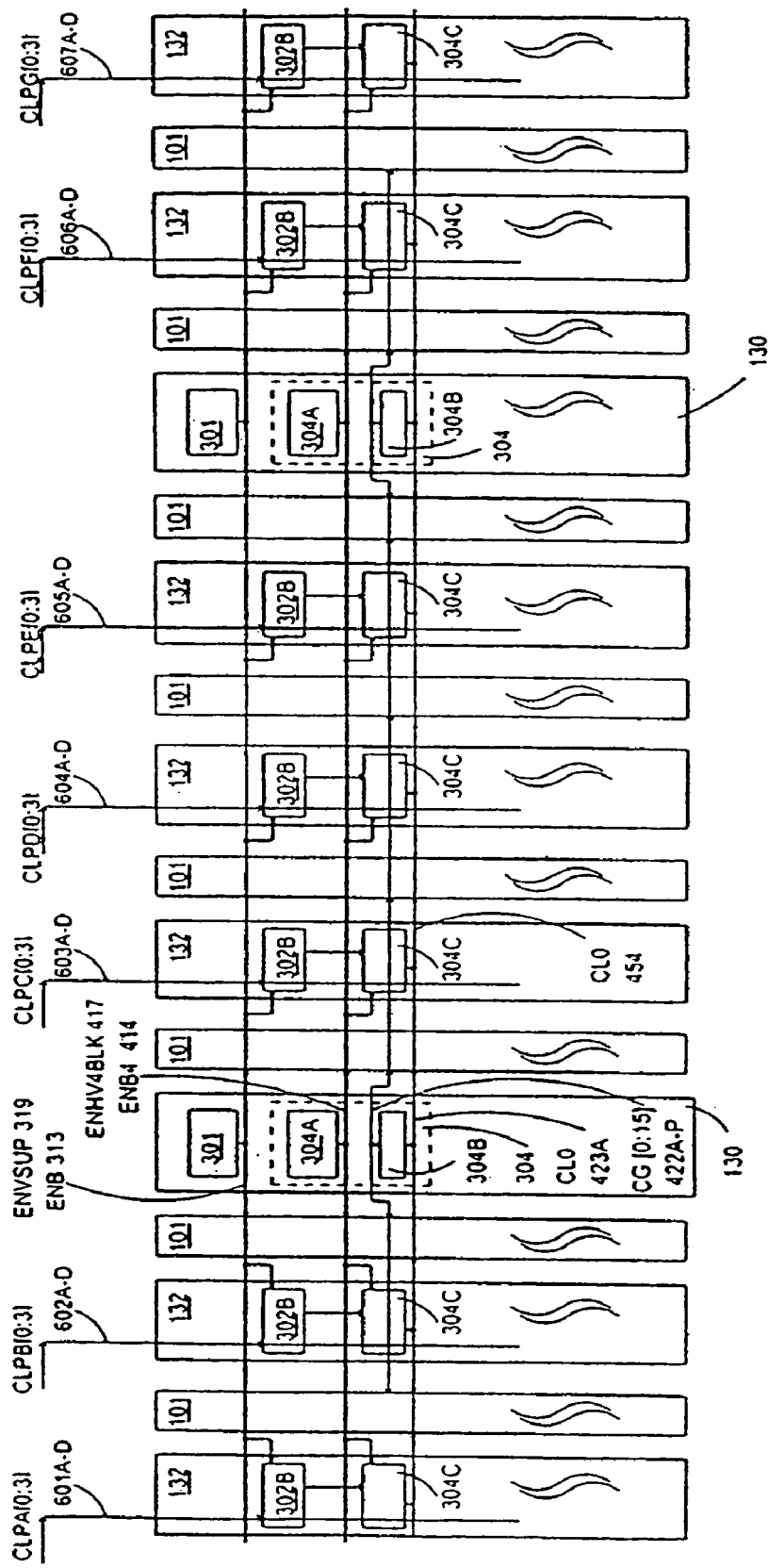
FIG. 12 shows a scheme of the feedthrough-to-driver and feedthrough-to-memory multilevel precision decoding.

FIG. 11C shows a circuit block (RD1CL) 304C, which is used in a common line segmentation scheme with the array partitioning shown in FIG. 12 to reduce the voltage drop along the common lines. In an embodiment, one common line (CL) is connected together across the full array with a plurality of blocks (RD1CL) 304C driving the same common line (CL). Transistor 438S with line (ENHV1BLK) 446 on its gate couples line (CLPS0S) 456AS to line (CL0) 454. Line (CL0) 454 of this circuit block 304C is the same line (CL0) 454 of the circuit block (RD4CG1CL) 416. A deselect transistor 439S with line (ENB1BLK) 447 couples line (CL0) 454 to line (VXCLGND) 5555. The transistor 439S is optional in this circuit since the function of coupling line (CL0) 454 to line (VXCLGND) 5555 is already provided by the transistor 439 in the RD4CG1CL 416. The transistor 439S provides additional drive ability in addition to that of the transistor 439. Line (CLPS0S) 456AS couples to a common line pre-decoder (XCLPREDRV) 950. The winner-take-all Kelvin decoding can also be used here. The control signals (ENHV4BLK) 417 and (ENB4) 414 shown in the block (RD1SUBBLK) 304 couple to control signals (ENHVLBLK) 446 and (ENB1BLK) 447, respectively. The control signals (ENHV4BLK) 417 and (ENB4) 414 are fed through the memory array as shown in FIG. 12. In an alternate embodiment, one common line is divided into many separate common lines across the full array. These separate common lines are not connected to each other. In this case, each separate common line is driven on both sides by two blocks (RD1CL) 304C or by a (RD1CL) 304C and a (RD4CG1CL) 416. Common line segmentation is described more in detail below in description associated with FIG. 12.

FIG. 12 shows a feedthrough-to-memory and feedthrough-to-driver scheme together with the common line segmentation to deliver precise voltages for memory cells as described in the following. The feedthrough scheme exploits the multi-layer metal interconnect to reduce the circuit complexity and die size and to enable innovative circuit configurations. A conventional flash memory system typically only uses up to a maximum of 2 metal layers and hence is limited in core interconnect scheme possibilities. This feedthrough scheme is made possible by three or more metal layers.

The block (MLMDECS) 132, shown in FIG. 12 and also in FIG. 3A, includes a plurality of the blocks (RDSGCLPDEC) 302B and a plurality of the blocks (RD1CL) 304C. Only one block (RDSGCLPDEC) 302B and one block (RD1CL) 304C per block 132 are shown in FIG. 12 for clarity. Other blocks have similar connections. The block (MLMDEC) 130, shown in FIG. 12 and also in FIG. 3A, includes a plurality of the blocks (RD1SEG) 300. The block RD1SEG 300 includes a block (RDSGPSDEC) 301 and a plurality of blocks (RD1SUBBLK) 304. Only the block (RDSGPSDEC) 301 and one block (RD1SUBBLK) 304 inside one block RDLSEG 300 are shown in FIG. 12 for clarity. Other blocks have similar connections.

The feedthrough-to-memory uses a single driver to drive both left and right sides of a memory array. The layout of row decoding circuits such as of the block (RD1SUBBLK) 304 is very dense because of the limited height of a typical advanced memory cell, e.g., 0.5–1 µm per cell height, and the very wide width of each decoding transistor, e.g., 20–50 µm, due to their required precision multilevel drive ability. This makes it extremely difficult to route the required lines from the right side across the active circuit of this row decoding circuit to the left side with limited layers of metal interconnect. As shown in FIG. 10, the control lines CG[0:15] 422A–P and common lines CL [0:3] 423A–D provides the control signals to the memory cells on the right side as well as the memory cells on the left side. This is also shown in FIG. 12 in block 304B with lines pointing to the right as well as to the left. Similarly it also shows the control lines from circuit block 304A and 304C driving both sides. The feedthrough-to-memory scheme also shows predecoded high voltage lines (ENHV4BLK) 417 and (ENVSUP) 319 and predecoded low voltage lines (ENB) 313 and (ENB4) 414 being fed through the memory by running on top of the memory, for example, in metal 4, without interfering with the memory cells underneath. Other control lines could also be fed through the memory. Again this is achievable by three or more metal layers which allow a different circuit configuration with minimal active area. The circuit block 304C is the precision voltage driver for the common lines CL of the memory cells in addition to the circuit block 304B. The feedthrough-to-driver scheme shows control signals from circuit blocks 304B and 304A being fed through the memory array to the precision voltage drivers 304C.

The common line segmentation is also shown in FIG. 12. Each metal common line runs the length of the memory core horizontally across the full array with seven circuit blocks (RD1CL) 304C and two circuit blocks (RD1SUBBLK) 304 driving the same common line. The voltage drop across one common line is thus divided into eight voltage drop segments. Each voltage drop segment belongs to each common line of each sub-array block (MFLSUBARY) 101. Within each voltage drop segment, the voltage value on the left side is same as the voltage value on the right side of the voltage drop segment and the lowest voltage value is in the middle of the voltage drop segment. This is because there is a precision circuit driver (RDLCL) 304C or (RD4CG1CL) 416 on each side of the voltage drop segment. One alternative embodiment of the common line segmentation scheme is to have these common lines physically divided into eight separate common lines. That is, each sub-array block (MFLSUBARY) 101 shown in FIG. 12 has its separate common line. However, in this case, the deselect transistor 439S in the block (RD1CL) 304C is no longer optional but necessary to deselect each separated common line.

The voltage level on the control gates is controlled by the voltage on the lines (CGP[0:15]) 420A–P in circuit block 304. The voltage on lines (CGP[0:15]) 420A–P are in turn controlled by a precise bandgap-referred regulated voltage. Hence precision voltage level is provided at the memory control gates. The voltage level on the common lines is controlled by the voltage on the predecoded common lines (CLP[0:3]) 421A–D in circuit block 304. The voltage on lines (CLP[0:3]) 421A–D are in turn controlled by a precise bandgap-referred regulated voltage for each common line driver. Hence precision voltage level is provided at the memory common lines. The programming and sensing current bias are also bandgap-referred; hence they are highly stable.

Note that in FIG. 12 an alternative embodiment is to share one block (RDSGPSDEC) 301 or 304A across the full array by doing feedthrough of the outputs of (RDSGPSDEC) 301 or 304A across the full memory array. In this case the drive ability of the driver circuit inside block (RDSGPSDEC) 301 or 304A should be adequately designed to drive the long interconnect lines.

Note that in FIG. 10 an alternative embodiment is to have a separate block (RD4CG1CL) 416 for driving the right side of an array and another separate block (RD4CG1CL) 416 for driving the left side of an array. Another alternative embodiment is to share just one CL driver for both left and right sides but to have separate control gate CG drivers for the left side and the right side.

Figure 13:
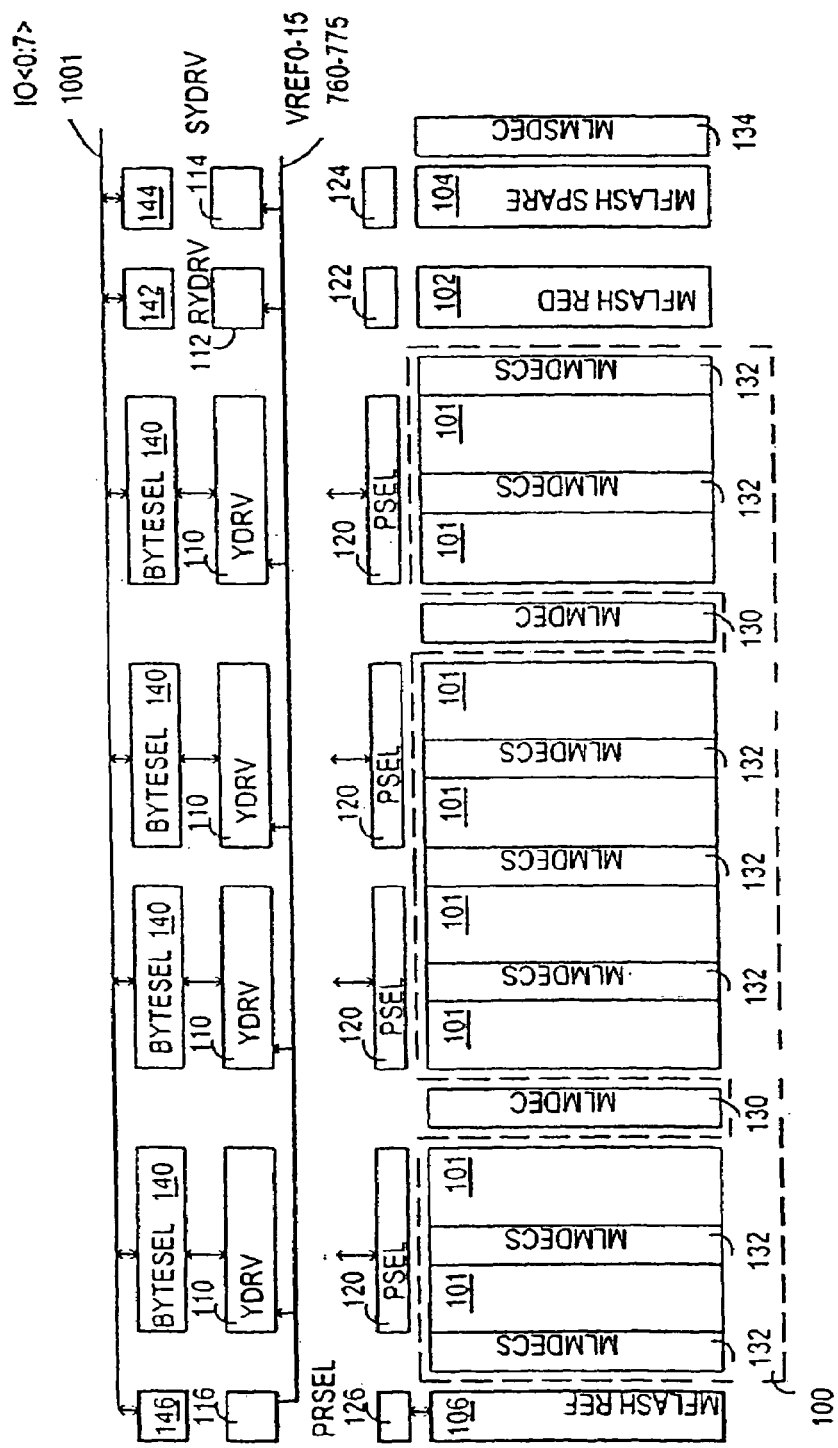
FIG. 13 shows a block diagram of a multilevel reference system.

Multilevel Reference System:

FIG. 13 shows a block diagram for a multilevel digital memory reference system. All the relevant blocks have been described in association with previous figures. The highlighted blocks 106, 116, 126, and 146 with the highlighted lines (VREF0–15) 760–775 are shown to show the reference system in relation to the physical position of the array and y-drivers. The physical position of the reference array corresponding to various schemes is explained in the following description.

Figure 14:
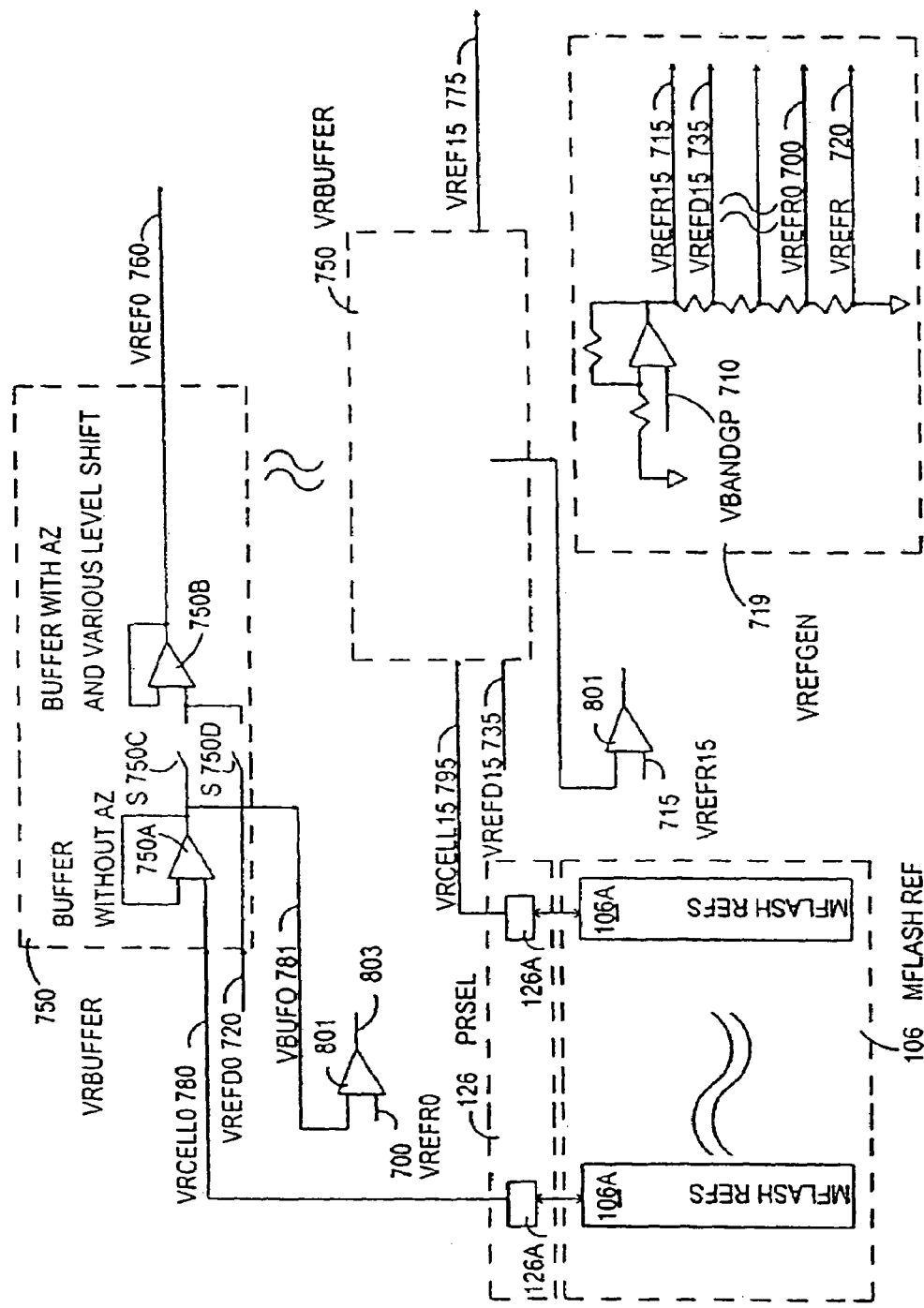
FIG. 14 shows details of a block diagram of a multilevel reference system.

FIG. 14 shows details of a multilevel digital memory reference system. A reference circuit block (VREFGEN) 719 is used to provide all reference voltage levels for erasing, programming, sensing, margin tests, and production tests. Shown are reference levels for reference cells (VREFR0–15) 700–715 and reference levels for data cells (VREFD0–15) 720–735. Data cells refer to memory cells that store digital data. A 16 level multilevel flash cell is assumed for this discussion. A flash reference array (MFLASHREF) 106 includes a plurality of blocks (MFLASHREFS) 106A. A block (MFLASHREFS) 106A includes a plurality of reference memory cells. A reference page select 126A is used to select the reference cells in the blocks (MFLASHREFS) 106A associated with a selected page. Each block 126A selects one reference cell in one corresponding block (MFLASHREFS) 106A. For each selected page, there are 16 blocks 126A selecting 16 reference cells in 16 corresponding blocks (MFLASHREFS) 106A. The 16 selected reference cells makes up one page reference.

A buffer (VRBUFFER) 750 and a comparator 801 are inside a block (REFYDRVS) 116S. The buffer (VRBUFFER) 750 is used to drive each reference level of (VREF0–15) 760–775 for all the y-drivers. A buffer circuit without offset auto zero 750A is used to isolate the reference cell from all capacitance from auxiliary circuits. The offset auto zero cancels out the voltage offset of an analog buffer. The voltage offset of an analog buffer is typically uncontrollable and is caused by threshold voltage mismatch, transistor transconductance mismatch, and systematic offset. This voltage offset would cause an uncertainty in the reference voltage, which would degrade the margin of one voltage level with respect to another voltage level. Line (VBUF0) 781 is used to verify a reference cell is programmed to one desired reference level out of 16 possible reference levels. Line (VBUF0) 781 is used instead of the direct memory cell output for verifying in the verify cycle. This is to include the buffer offset from buffer 750A in the verifying process. The comparator 801 is used to do the actual comparison in verify. A buffer with offset auto zero 750B is used to drive a reference level. Various voltage levels needed for multilevel algorithm are also generated by the buffer 750B with switch capacitor technique. The auto zero is needed to zero out the offset of this buffer since a typical buffer offset is 10–20 mV. This voltage amount if not canceled out would degrade the margin of a reference level, which effectively reduces the voltage margin for each level. Capacitors are needed to accomplish the auto zero and level shifting operation in the buffer 750B. However as described in the array architecture description, any additional capacitance would adversely degrade the write and read speed. Hence buffer 750A is inserted between the reference cell and the buffer 750B so that the reference cell only sees one gate capacitance inside a typical buffer as a capacitor load.

Lines (VREF0–15) 760–775 are the final reference lines driving into all the y-drivers as needed for verify-program cycles and read cycles. Switch S 750D couples line (VREFD) 720 to the input terminal of buffer 750B when one selected page programs for the first time. Switch S 750C couples line (VBUF0) 781 to input terminal of buffer 750B when the same selected page programs for the second time or more without an erase in between program. The reason is that for first time programming, reference levels for data cells come from a reference generator VREFGEN 719 and for subsequent programming reference levels come from the reference cells in MFLASHREFS 106A.

For the memory system described herein, there are 8 pages for each row, 4 rows for each block, and 512 bytes per page with a 4-bit digital multilevel memory cell. Since any one page is written or read at any time a complete reference set of 16 levels is reserved for each page instead of for each row. This is done to preserve the operating conditions through the lifetime of a memory system exactly the same for reference cells as regular data cells. This is done for example to make the reference and data cells have the same voltage readout drift over time. For each row, there are 8×16=128 reference cells. This has some small die size penalty. The reference cells are written at the same time as the regular data cells.

Figure 15:
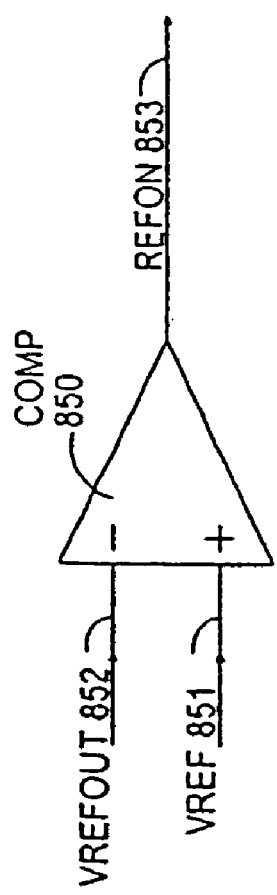
FIG. 15 shows a reference detection scheme.

After the reference cells are written with the first programming sequence, if subsequent programming cycles are allowed to write other data cells in the same page, the previously programmed reference cells stay in the program inhibit mode. This is accomplished as shown in FIG. 15. A comparator 850 is used to compare a reference voltage from a bandgap VREF 851, e.g., 1.2 V, versus a readout voltage from a reference memory cell VREFOUT 852, for example, level 0, e.g., 0.5V. If the reference cell has not been written, VREF 851<VREFOUT 852, then line (REFON) 853 would be low. If the reference cell has been written, VREF 851>VREFOUT 852, then line (REFON) 853 would be high indicating that the reference cells have been previously written and the reference cells are inhibited in programming.

For subsequent programming cycles after the first programming cycle, the reference voltages for the data cells come from the reference cells and the reference voltages are shifted appropriately to place the data voltages in between the adjacent reference voltages.

The voltage drop along the common line poses a particular problem for a multilevel reference system. Reference cells are needed to track the data cells over temperature, process, or power supply. But as temperature changes, the voltage drop along the common line changes, which causes a sense error. The voltage drop along the line from one end to the other end follows geometrically as described earlier. That is depending on position along the common line, the cells experience different amounts of common line voltage changes, which cause different voltage readout shifts due to different voltage amounts being coupled into the cells. This cannot be corrected by a conventional reference system.

Figure 16:
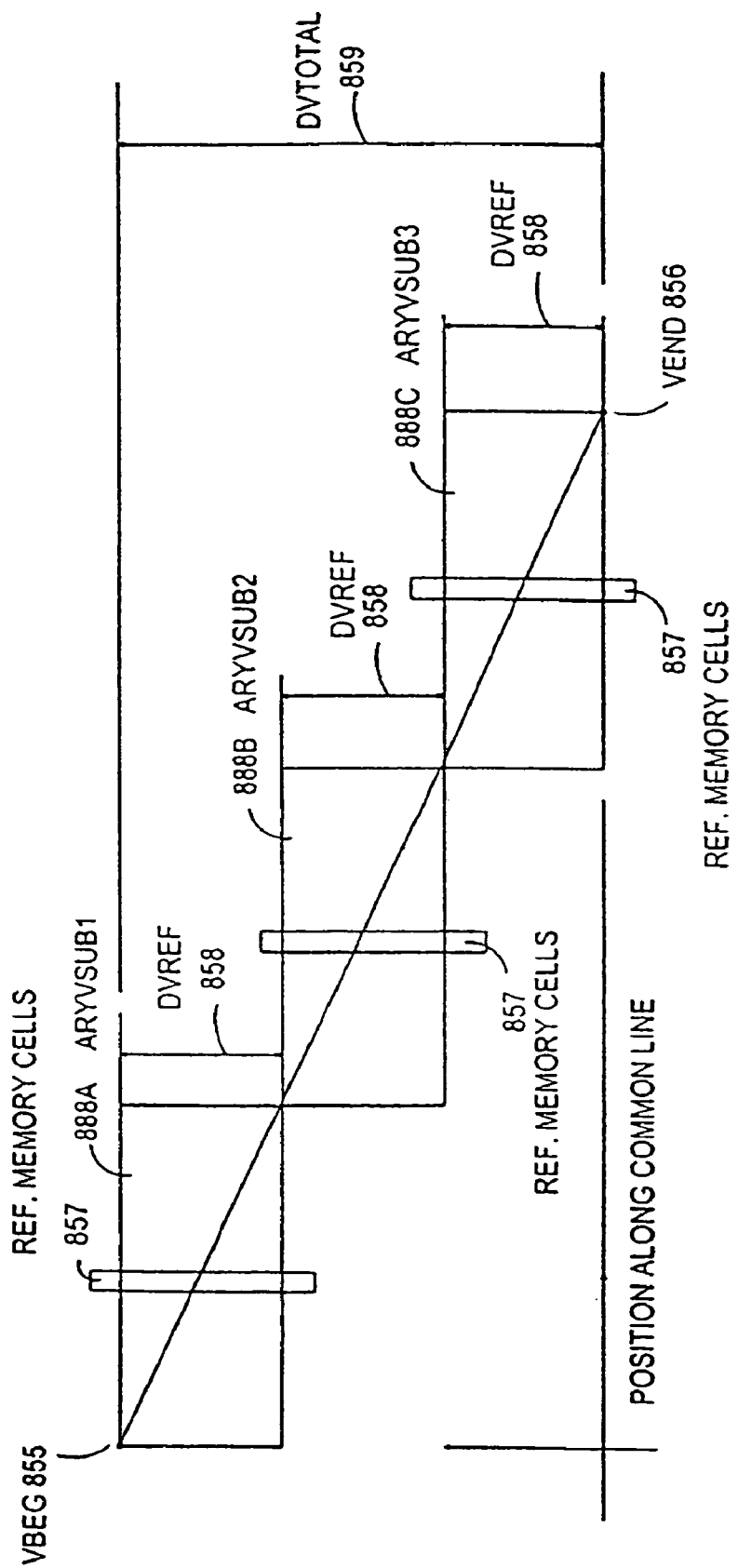
FIG. 16 shows positional linear reference system.

FIG. 16 shows a positional linear reference system that corrects this error. Assuming the voltage drop along a line is linear and assuming an acceptable voltage shift is DVREF/2, by dividing the voltage drop DVTOTAL 859=VBEG 855-VEND 856, into different voltage segments with equal voltage drop DVREF 858 and by positioning the reference cells 857 in the middle of a divided array segment (ARYV-SUB1–3) 888A–C corresponding to a voltage segment, the maximum voltage difference from a reference cell to a data cell in the beginning or at the end of the voltage segment is=<DVREF/2. Hence reference correction over temperature is achieved. It is possible to place the reference cells 857 at the beginning or the end of a divided array segment (ARYV-SUB1–3) 888A–C. In this case the maximum voltage difference from a reference cell to a data cell is DVREF instead of DVREF/2 as in the case of positioning the reference array in middle of a divided segment array. Another advantage of placing the reference cells in the middle of a divided array segment is to minimize the electrical variation due to the edge interface from the memory array to peripheral circuits.

Figure 17:
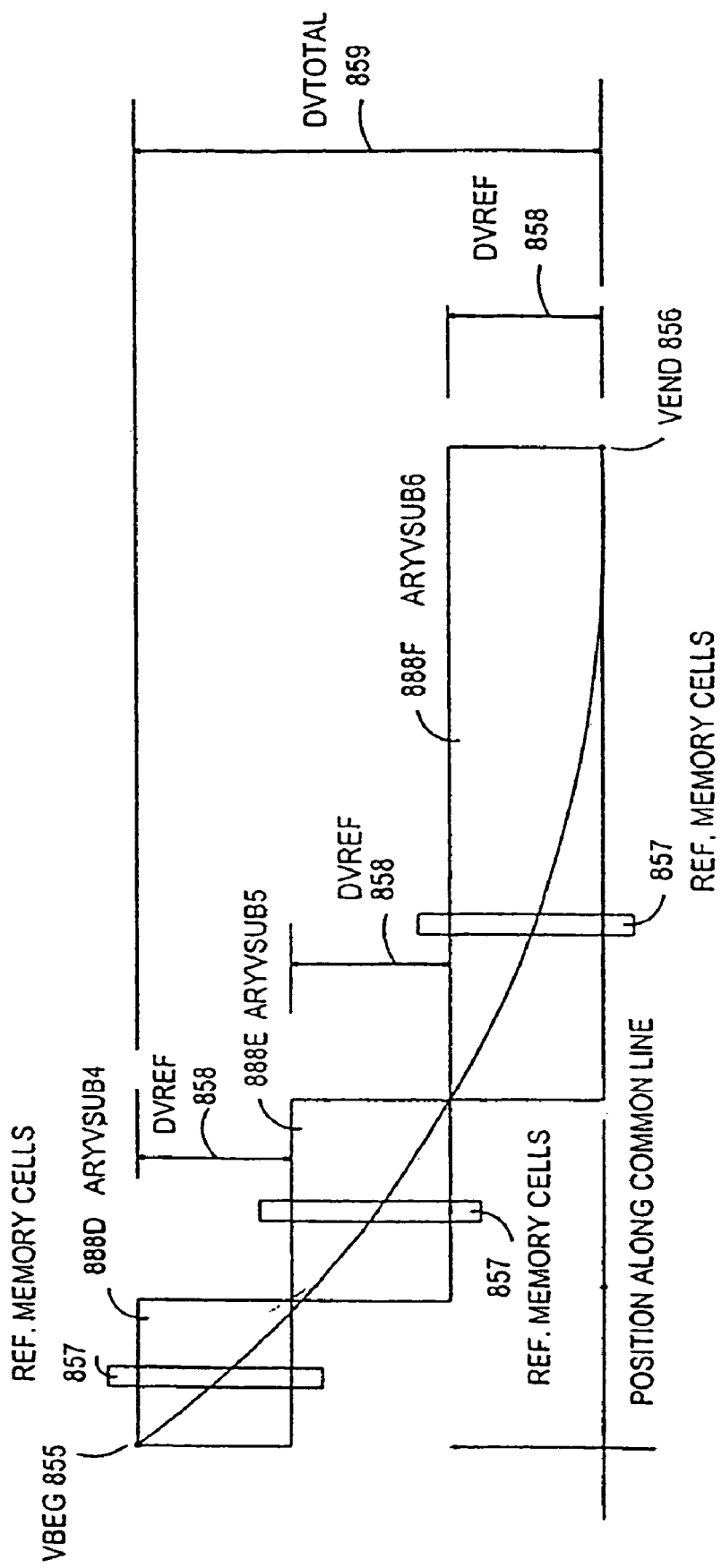
FIG. 17 shows a positional geometric reference system.

FIG. 17 shows a positional reference geometric system basing on the concepts similar to FIG. 16. In this embodiment, the reference cells 857 are not symmetrically but geometrically positioned to correct for the geometric effect of the voltage drop.

In FIGS. 16 and 17, each full array is divided into three sub-arrays (ARYVSUB1–3) 888A–C and (ARYVSUB4–6) 888D–F respectively. It should be noted that the array could be divided into as many sub-arrays as needed to reduce the voltage error. Also shown in FIGS. 16 and 17, each sub-array of ARYVSUB1–6 888A–F includes its own complete set of reference cells in the middle. A complete set of reference cells provides all the reference levels, e.g., 16 levels for 4-bit digital multilevel cell per page, for all the pages. One row of reference cells includes 128 reference cells if each row has 8 pages and each reference cell provides one reference level. An alternative embodiment is to have more than one reference cell per level, e.g., 4–16 cells per level. This averages out the electrical variation of multiple cells.

Figure 18:
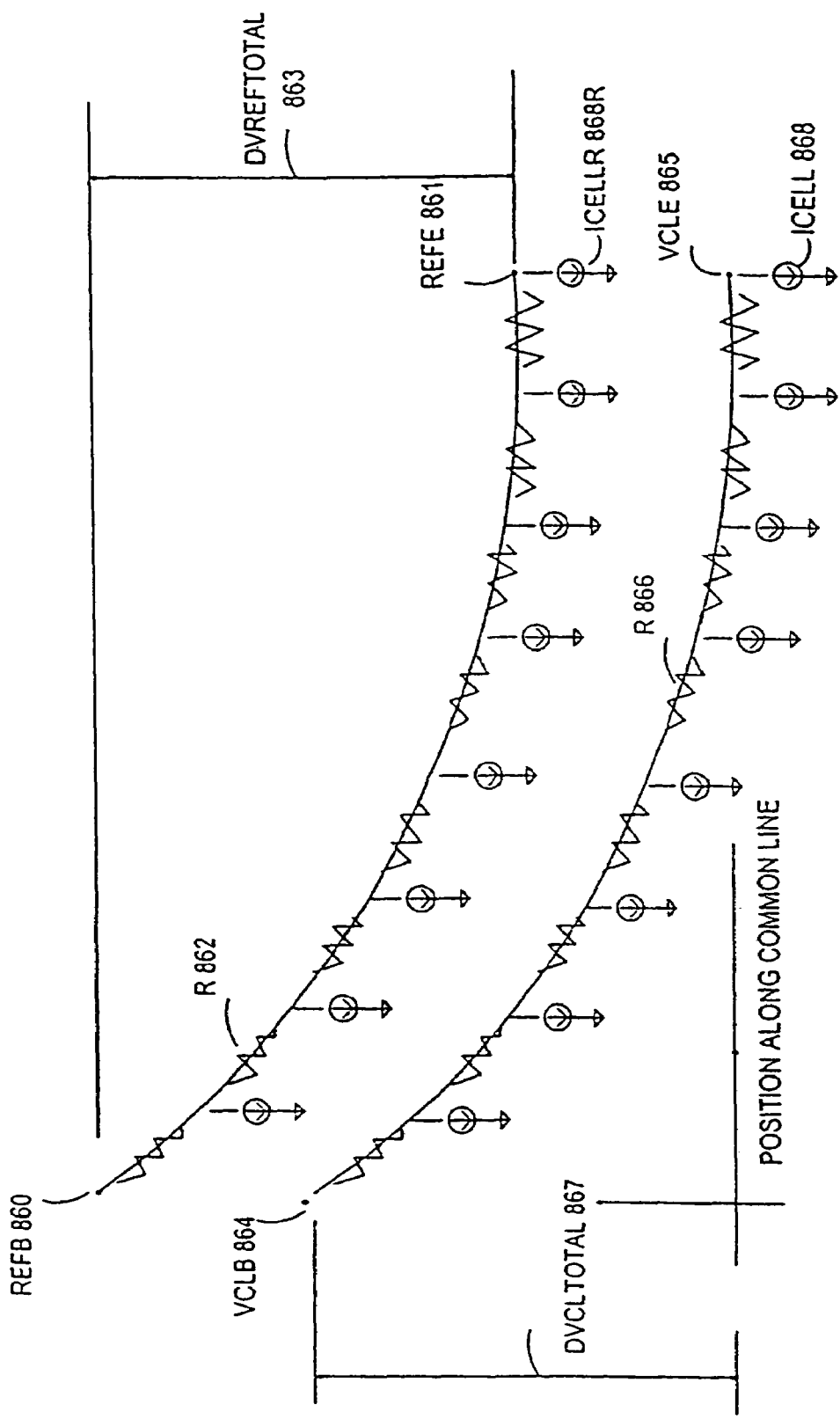
FIG. 18 shows an embodiment of geometric compensation reference scheme.

FIG. 18 shows a geometric compensation reference system. The objective is to simulate the voltage drop in the common line into the reference readout voltage by attaching similar loading currents to the reference readout voltage. A resistance R 862 in the reference line is made equivalent to a resistance R 866 in the common line. A reference loading current (ICELLR) 868R is made the same as that of ICELL 868. Hence the total voltage drop in reference DVREFTOTAL 863,=REFB 860-REFE 861, is equal to DVCLTOTAL 867,=VCLB 864–VCLE 865. It is not necessary to attach the same number of loading reference currents ICELLR 868R to the number of ICELL 868. It is only necessary to attach the approximate amount of the current loading at appropriate positions to minimize the error to an acceptable level.

One alternative embodiment of the reference system is, instead of using 16 reference cells for a 4-bit digital multilevel cell, to use 2 or 4 or 8 reference cells to generate 16 reference levels with level interpolation. That is from reference levels coming from reference cells, the other reference levels are interpolated by using linear or any other interpolation.

Multilevel Algorithm:

FIG. 19A shows various voltages generated and used in one embodiment of the invention for program verifying, program upper and lower margin verifying, read sensing and restore high or restore low margin verifying during read sensing. The read sensing is advantageously performed in the voltage-mode but other modes of read sensing are also applicable. All the voltages are generated by the V&IREF block 172. VREFR(L) is the program verify voltage used to verify program level (L) of a reference cell. VREFD(L) is the program verify voltage used to verify program level (L) of a data cell. For example, in a 4 bit per cell storage embodiment there are 16 levels used. It is also possible to use 15 levels instead of 16 levels since the extreme low or high levels not need to be constrained to exact low or high levels but can go to ground or power supply respectively. VREFR0 through VREFR15 are program verify voltages used for verifying programming of the reference cells. VREFD0 through VREFD15 are program verify voltages used for verifying programming of the data cells. VUM(L) and VLM(L) are upper and lower program margin voltages respectively for level L. Each level L may have its own VUM(L) and VLM(L) voltage values. VUM(L) and VLM (L) can each be of different value also for each level L. On the other hand, VUM(L) and VLM(L) can be of the same voltage value for all the levels. VUM(L) and VLM(L) voltages are generated by the block V&IREF 172. VRSTH (L) and VRSTL(L) are RESTORE HIGH and RESTORE LOW margin voltages respectively for level L. Each level L may have its own VRSTH(L) and VRSTL(L) voltage value. VRSTH(L) and VRSTL(L) can each be of different value also for each level L. On the other hand, VRSTH(L) and VRSTL(L) can be of the same voltage value for all the levels. VRSTH(L) and VRSTL(L) voltages are generated by the V&IREF 172 block. VCELLR(L) is the voltage read back from a reference cell during read sensing. VCELLD(L) is the voltage read back from a data cell during read sensing. The cross-hatched regions show the distribution of possible read back voltages during read sensing after reference cells or data cells have been programmed to a certain level L, while using VREFR(L) or VREFD(L) as the program verify voltage, respectively. The distributions occur because every cell does not have the same programming or read sensing characteristics.

Page Programming Cycle:

FIG. 20 shows the flow diagram for one embodiment of the page programming cycle. During a page programming cycle a plurality of memory cells are programmed in parallel. However this algorithm is equally applicable for single cell programming. As an example, 4 bit per cell is programmed in each cell. First the program command is issued and the address of the page to be programmed is loaded. The data count NC is initialized. The address loading may be performed through a single or a plurality of address cycles. Program data is input during the DATAIN step and is selectively loaded in the internal latches of a YDRVS 110S or SYDRVS 114S or RYDRV 112S. Block YDRV 110, SYDRV 114, (RYDRV) 112 includes a plurality of YDRVS 110S, SYDRVS 114S, RYDRVS 112S respectively. Block YDRVS 110S will be described in detail later in the description associated with FIG. 26. Data gets loaded into the data latches of the current YDRVS 110S or SYDRVS 114S selected from the ADDRCTR 162 and the BYTEDEC 152. The redundancy control block REDCNTRL 186 asserts RED_ADD_TRUE true (YES or Y) or false (NO or N) to signify whether the current YDRVS 110S or SYDRVS 114S is GOOD or BAD. A YDRVS 110S or SYDRVS 114S is GOOD if it has not been flagged as one that cannot be used to load input data on its data latches. A YDRVS 110S or SYDRVS 114S is BAD if it has been flagged as one that cannot be used to load input data on its data latches. GOOD or BAD YDRVSs or SYDRVSs are flagged during manufacturing testing and the flags are internally stored on non-volatile latches. If RED_ADD_TRUE=NO, meaning current YDRVS 110S or SYDRVS 114S is GOOD, then a data nibble on the IO[0:3] or IO[4:7] bus is placed at the input of the data latches of the current YDRVS 110S or SYDRVS 114S. A data byte consists of 8 digital bits and a data nibble consists of 4 digital bits. If RED_ADD_TRUE=Y, meaning current YDRVS 110S or SYDRVS 114S is BAD, then the data nibble on the IO[0:3] or IO[4:7] bus is placed at the data latches of the selected RYDRVS 112S. Next, if NEXTDATAIN=Y, the data at the input of the data latches of the respective YDRVS 110S, SYDRVS 114S or RDYRVS 112S is latched. If NEXTDATAIN=N then the flow waits for the program start command PRG. Next, if the data count NC>MAXNC=not true (N), then NC=NC+1 and the flow loops back to DATAIN step to load in the next data byte. If the data count NC>MAXNC=true (Y), then the flow goes out of the loop and waits for the program start command PRG. The data count MAXNC signifies the number of data bytes that are simultaneously programmed in a page. Next, if command PRG is received then page programming begins. If command PRG is not received then the flow loops back to check for NEXTDATAIN. No data loading is required for blocks (REFYDRVS) 116S because their latches are internally set. A block (REFDRV) 116 includes a plurality of blocks (REFYDRVS) 116S.

FIG. 21 shows the flow diagram after page programming begins. The Program flag=Pass is set and the BUSY signal is set. In another embodiment a configuration (fuse) bit initialization is executed to load in data from fuse non-volatile memory cells to volatile latches located in the fuse circuit block (FUSECKT) 182 at this step. The program inhibit mode of all cells in the page being programmed are reset to enable programming. Based on the output B[0:3] of the data latches of each YDRVS 110S, SYDRVS 114S or RYDRVS 112S a program verify voltage VREFD(L) is set at the input of the comparator in each of the respective YDRVS 110S, SYDRVS 114S or RYDRVS 112S. Based on the output B[0:3] of the data latches of each REFYDRVS 116S a program verify voltage VREFR(L) is set at the input of the comparator in each REFYDRVS 116S. For each reference cell and data cell in the page being programmed, the cell voltage VCELLD(L) or VCELLR(L) is read. Depending on the output B[0:3] of the data latches (a) for each REFYDRVS 116S the appropriate program verify voltage VREFR(L) is compared to the reference cell read back voltage VCELLR(L) and (b) for each YDRVS 110S, SYDRVS 114S, RYDRVS 112S, the appropriate program verify voltage VREFD(L) is compared with data cell read back voltage VCELLD(L) to indicate whether further programming is required. If no further programming is required for a particular reference cell or data cell, it is put in the program inhibit mode. If the Program Pulse Count=MAXPC is not true, then the cells are placed in the program mode and another programming pulse is applied to all the cells in the page, including the reference cells. Cells which are in the program inhibit mode do not get any additional programming. Cells which are not in the program inhibit mode get additional programming. After the programming pulse is applied, the program pulse count is incremented and the cells are placed in the voltage-mode read to verify if further programming is required. This iterative verify-program loop is continued until either all the cells in the page including the reference cells are in the program inhibit mode or when the program pulse count=MAXPC is true. If program pulse count=MAXPC true condition is reached, before all cells in the page including the reference cells are all in program inhibit mode, then the program flag=fail condition is set, BUSY signal is reset and the programming cycle is done. Whenever the All Cells in Program Inhibit Mode=true condition is reached, the flow moves to the next step as shown in FIG. 22A.

As shown in FIG. 22A, next, for each level L, upper program margin verify voltage UMV(L)=VCELLR(L)−VUM(L) is generated, where VUM(L) is the upper margin voltage for level L. Depending on the data latch output B[0:3] of the data latches in the respective YDRVS 110S, SYDRVS 114S, RYDRVS 112S the appropriate voltage UMV(L) is compared with read back cell voltage VCELLD (L) for all the data cells. If the result of comparison indicates that all upper cell margins are not within limits then a program flag=fail condition is set; BUSY signal is reset and programming cycle is done. If the result of comparison indicates that all the upper cell margins are within limits then a program flag=fail condition is not set and then, for each level L, lower program margin verify voltage LMV(L)=VCELLR(L−1)+VLM(L) is generated, where VLM(L) is the lower margin voltage for level L. Depending on the data latch output B[0:3] of the data latches in the respective YDRVS 110S, SYDRVS 114S, RYDRVS 112S the appropriate voltage LMV(L) is compared with read back cell voltage VCELLD(L). If the result of comparison indicates that all lower cell margins are not within limits then a program flag=fail condition is set; BUSY signal is reset and programming cycle is done. If the result of comparison indicates that all the lower cell margins are within limits then a program flag=fail condition is not set and BUSY signal is reset and programming cycle is done. The program flag=fail indicates the programming cycle has been unsuccessful to program the current page. It does not indicate specifically which cell or cells caused the unsuccessful programming.

Page Read Cycle:

FIG. 23 shows the flow diagram for the page read cycle. During a page read cycle a plurality of memory cells are read in parallel. However this algorithm is equally applicable for single cell read. After the page read command is issued along with the address of the page to be read, the BUSY signal is set, RESTOREL and RESTOREH flags are reset, the data latches in the YDRVS 110S, SYDRVS 114S, RYDRVS 112S are set to output B[0:3]=1111 and N is set to 3. N represents the number of bits stored per memory cell. In another embodiment a configuration (fuse) bit initialization is executed to load in data from fuse non-volatile memory cells to volatile latches located in the fuse circuit block (FUSECKT) 182 at this step. All the cells in the addressed page are placed in the voltage-mode read and the cell voltages, VCELLR(L) for reference cells and VCELLD (L) for data cells are read. BN is forced to "0" and the read verify voltage VCELLR(L), which is one of the reference read back voltages dependent on B3, B2, B1, B0, is compared with the cell read back voltage VCELLD(L). For each cell, if the VCELLD(L)>VCELLR(L) then BN is latched as "1", otherwise BN is latched as "0". The loop continues until all the bits B3, B2, BE1, B0 are latched and N=0. Next, as shown in FIG. 24, for each level L, a MARGIN RESTORE LOW Voltage VRSTRL(L)=VCELLR(L)−VRSTL(L) is generated, where VRSTL(L) is the restore low margin voltage. Depending on the latched bits B3, B2, B1, B0 on each of the YDRVS 110S, SYDRVS 114S, RYDRVS 112S, the voltage VRSTRL(L) is compared with the respective data cell read back voltage VCELLD(L). If VCELLD(L) >VRSTRL(L) for any one of the cells, then the RESTOREL flag is set. Next, for each level L a MARGIN RESTORE HIGH Voltage VRSTRH(L)=VCELLR(L−1)+VRSTH(L) is generated, where VRSTH(L) is the restore high margin voltage. Depending on the latched bits B3, B2, B1, B0 on each of the YDRVS 110S, SYDRVS 114S, RYDRVS 112S, the voltage VRSTRH(L) is compared with the respective data cell read back voltage VCELLD(L). If VCELLD(L) <VRSTRH(L) for any one of the cells, then the RESTOREH flag is set, otherwise RESTOREH flag is not set. Next, as shown in FIG. 25, BUSY signal is reset and the byte count ND is initialized to NDI. NDI is the byte count of the existing byte address location. All bits in the respective YDRVSs, SYDRVSs, or RYDRVSs data latches are ready to be sequentially read. Whenever READ CLOCK=Y, the RED_ADD_TRUE is checked for that byte address location. If RED_ADD_TRUE=Y, then data from RYDRVS 112S is output to the IO port IO[0:7] 1001, otherwise data from YDRVS 110S is output to the io port IO[0:7] 1001. If READ CLOCK=N and ENABLE=Y then the flow loops back until READ CLOCK=Y or ENABLE=N. After all the data is output i.e. ND>MAXND=Y or if ENABLE=N, the Page read cycle is done. If ND>MAXND is=N, then ND is incremented and the flow loops back to check the READ CLOCK.

FIG. 26 shows the details of an embodiment of YDRVS 110S. SYDRVS 114S and RYDRVS 112S have similar details. The description given for YDRVS 110S is equally applicable for SYDRVS 114S and RYDRVS 112S. In this embodiment 4 bits are stored per memory cell, hence four data latches are required per YDRVS 110S. A set of four data latches (DATALAT3) 10, (DATALAT2) 11, (DATALAT1) 12, (DATALAT0) 13 holds the data during the DATAIN step of a page programming cycle or holds the data during a LATCH EN=1 or=0 step during a page read cycle. Data is loaded into DATALAT3 10, DATALAT2 11, DATALAT1 12, DATALAT0 13 through the DIN3 14, DIN2 15, DIN1 16, DIN0 17 lines respectively and read out from the DATALAT3 10, DATALAT2 11, DATALAT1 12, DATALAT0 13 through the DOUT3 18, DOUT2 19, DOUT1 20, DOUT0 21 lines respectively. Lines (DIN3) 14, (DIN2) 15, (DIN1) 16, (DIN0) 17, (DOUT3) 18, (DOUT2) 19, (DOUT1) 20, (DOUT0) 21 connect to BYTESEL 140 for YDRV 110 and connect to blocks 144, 142 for SYDRV 114, RDYRV 112 respectively. During page program cycle, lines (B3) 22, (B2) 23, (B1) 24, (B0) 25 are outputs of DATALAT3 10, DATALAT2 11, DATALAT1 12, DATALAT0 13, respectively, and have a latched logical relationship to the lines (DIN3) 14, (DIN2) 15, (DIN1) 16, (DIN0) 17, respectively. During page read cycle lines B3 22, B2 23, B1 24, B0 25 are output of DATALAT3 10, DATALAT2 11, DATALAT1 12, DATALAT0 13 respectively and represent the 4 bits read out of the cell. Depending on the status of lines (B3) 22, (B2) 23, (B1) 24, and (B0) 25, the REFERENCE MULTIPLEXER 26 couples one of the lines VR0 through VR15 to one input of the VOLTAGE COMPARATOR 27. The output of the VOLTAGE COMPARATOR 27 connects to the input of the LATCH 28. Under the control of ALGOCNTRL 164, the line ENLATCOMP 29 functions as a strobe signal to enable the LATCH 28 during a certain time to latch the output of the VOLTAGE COMPARATOR 27. Line RBYLATCOMP 30 resets the LATCH 28 at suitable times under the control of ALGOCNTRL 164. The PROGRAM/READ CONTROL 31 outputs lines COMPOR 32 and COMPORB 33. COMPOR 32 and COMPORB 33 lines are connected together in a wire-OR manner for all YDRV 110, SYDRV 114, and RYDRV 112. The PROGRAM/ PROGRAM INHIBIT SWITCH 34 puts the memory cell coupled to it indirectly through line BLIN 35 into a program or program inhibit mode under the control of PROGRAM/ READ CONTROL 31. Line BLIN 35 goes to the PSEL 120 for YDRV 110 and to blocks 124, 122 for SYDRV 114, RYDRV 112 respectively. The lines VR0 through VR15 individually are coupled to the output of a VRBUFFER 750.

Figure 27:
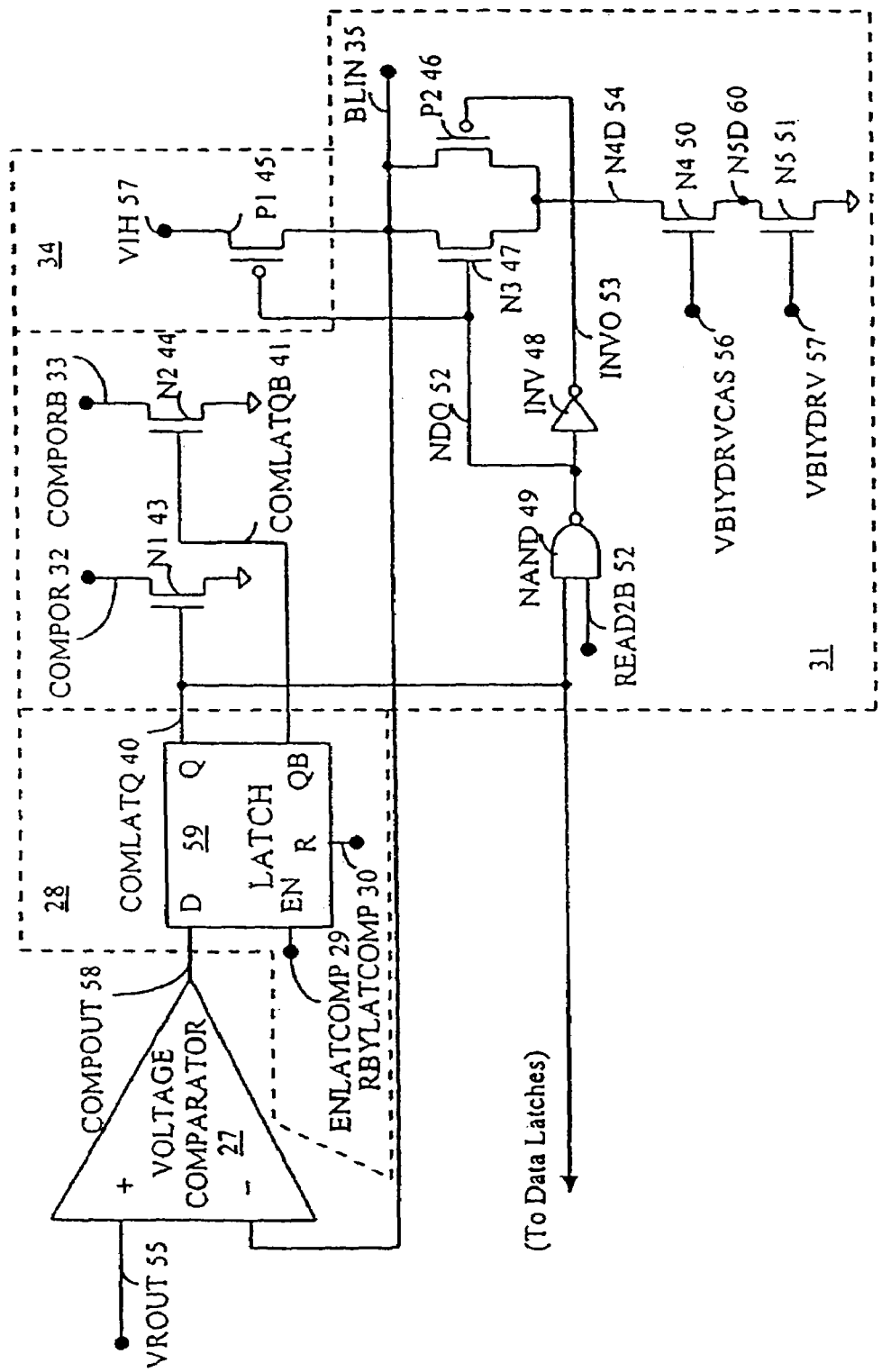
FIG. 27 shows details of a latch block, a program/read control block, and program/program inhibit block included in the single y-driver YDRVS 110S.

FIG. 27 shows the details of a LATCH 28 block, a PROGRAM/READ CONTROL 31 block and a PROGRAM/PROGRAM INHIBIT 34 block. The VROUT line 55 couples the output of REFERENCE MULTIPLEXER 26 to the positive input of a VOLTAGE COMPARATOR 27. The line COMPOUT 58 couples the output of the VOLTAGE COMPARATOR 27 to the D input of a latch 59. ENLATCOMP 29 goes to the EN input of the latch 59. ENLATCOMP 29 acts as a strobe signal for the latch. When ENLATCOMP 29 is at logic high the latch 59 outputs the logic level on D input to the Q output. QB is the inverted logic level of Q. When ENLATCOMP 29 goes to logic low, the latch 59 latches the logic level on D input. RBYLATCOMP 30 goes to the reset R input of the latch 59. When RBYLATCOMP 30 is logic low latch 59 is reset, whereby Q is at logic low and QB is at logic high. Line COMLATQ 40 couples the Q output of the latch 59 to the gate of a NMOS transistor N1 43. Line COMLATQB 41 couples the QB output of the latch 59 to the gate of a NMOS transistor N2 44. Line COMLATQ 40 also couples to the data latches DATALAT3 10, DATALAT2 11, DATALAT1 12, DATA-LAT0 13. COMLATQ 40 also couples to one input of a 2 input NAND gate NAND 49. The other input of the NAND 49 is coupled to the signal READ2B. READ2B is at logic high during page programming cycle and at logic low during page read cycle. The line NDO 52 couples the output of NAND 49 to the input of an inverter INV 48 and also to the gate inputs of PMOS transistor P1 45 and NMOS transistor N3 47. The line INVO 53 couples the output of INV 48 to the gate of a PMOS transistor P2 46. Line BLIN 35 connects to one terminal of each of P1 45, N3 47 and P2 46. BLIN 35 also connects to the negative input of VOLTAGE COMPARATOR 27. The other terminal of P1 45 is connected to inhibit voltage input VIH 57. Line N4D 54 connects the other terminals of N3 47 and P2 46 to one terminal of NMOS transistor N4 50. Line N5D 60 connects the other terminal of N4 50 to one terminal of NMOS transistor N5 51. The other terminal of N5 51 is connected to ground. The gates of N4 50 and N5 51 are connected to inputs VBIYDRVCAS 56 and VBIYDRV 57 respectively. N4 50 and N5 51 form a current bias circuit whereby a constant current load is placed on the BLIN 35 when INVO 53 is at logic low and NDO 52 is at logic high. N4 50 and N5 51 together represent the predetermined bias current for the voltage mode sensing as shown in FIG. 2C.

After the page program command and the address of the page to be program is issued, the data to be programmed is loaded in the data latches DATALAT3 10, DATALAT2 11, DATALAT1 12, DATALAT0 13 of each of the YDRVS 110S, SYDRVS 114S or RYDRVS 112S. The REFERENCE MULTIPLEXER 26 then couples one of the inputs VR0 through VR15 to its output VROUT 55. During a program verify cycle VREFD(0) through VREFD(15) are available on the VR0 through VR15 lines respectively. VR0 through VR15 are commonly coupled to REFERENCE MULTIPLEXER 26 of all the YDRV 110, SYDRV 112, RYDRV 14. The REFYDRVS 116S have the data latches internally set. In this embodiment there are 16 REFYDRVS 116S. Each REFYDRVS 116S is used for a specific level. For example, the data latches of a REFYDRVS 116S used for level 5 will be internally set to program level 5 into reference cells coupled to it. VR0 through VR15 are commonly coupled to REFERENCE MULTIPLEXER 26 of all the REFYDRVS 116S. During a program verify cycle, VREFR(0) through VREFR(15) are respectively available at the VR0 through VR15 lines of a REFYDRVS 116S. Depending on the output B3, B2, B1, B0 of the data latches DATALAT3 10, DATALAT2 11, DATALAT1 12, DATALAT0 13 within each YDRVS 110S, SYDRVS 114S, SYDRVS 112S one specific voltage VREFD(0) through VREFD(15) is output to the input of the VOLTAGE COMPARATOR 27. Depending on the output B3, B2, B1, B0 of the data latches DATALAT3 10, DATALAT2 11, DATALAT1 12, DATALAT0 13 within each REFYDRV 116 one specific voltage VREFR(0) through VREFR(15) is output to the input of the VOLTAGE COMPARATOR 27.

The latch 59 within each REFYDRVS 116S, YDRVS 110S, SYDRVS 114S and RYDRVS 112S are all reset by pulsing line RBYLATCOMP 30. RBYLATCOMP 30 is commonly connected to the reset input of the latch 59 within each REFYDRVS 116S, YDRVS 110S, SYDRVS 114S, and RYDRVS 112S. After latch 59 is reset, COMLATQ 40 is at logic low. The NAND 49 then outputs logic high to line NDO 52. Output of INV 48 then is at logic low on line INVO 53. With NDO 52 at logic high and INVO 53 at logic low transistors N3 47 and P 246 couple BLIN 35 to N4 50. P1 45 de-couples the inhibit voltage VIH 57 from BLIN 35. The memory cell is placed in the voltage read mode and the cell read back voltage VCELLR(L) or VCELLD(L) is available on BLIN 35. At this point, the VOLTAGE COMPARATOR 27 compares the voltages at its inputs. If voltage on BLIN 35 is higher then voltage on VROUT 55 the output COMPOUT 58 is low, otherwise it is high. At this time a positive going strobe pulse is applied to the ENLATCOMP 29 common to all the latches 59 in REFYDRVS 116S, YDRVS 110S, SYDRVS 114S and RYDRVS 112S, to latch the status of line COMPOUT 58. If COMPOUT 58 is low, then the COMLATQ 40 remains at logic low.

If COMPOUT 58 is high, then the COMLATQ 40 switches to logic high. If during an iteration of verify-program cycles any one of the latches 59 latches a logic high on COMLATQ 40, called a program inhibit state, then for that specific REFYDRVS 116S, YDRVS 110S, SYDRVS 114S or RYDRVS 112S, the line NDO 52 is at low and the line INVO 53 is at logic high. With latch 59 in a program inhibit state, BLIN 35 is de-coupled from N4D 54 and there is no current load, whereas, BLIN 35 is coupled to the inhibit voltage VIH 57 through P1 45. With latch 59 in the program inhibit state, further programming pulses do not cause programming.

The line COMPOR 32 is connected in a wire-OR fashion to all the COMPOR 32 lines of each REFYDRVS 116S, YDRVS 110S, SYDRVS 114S or RYDRVS 112S. There is a pull up load coupling the COMPOR 32 line to the power supply. Similarly, the line COMPORB 33 is connected in a wire-OR fashion to all the COMPORB 33 lines of each REFYDRVS 116S, DRVS 110S, SYDRVS 114S or RYDRVS 112S. There is a pull up load coupling the COMPORB 33 line to the power supply. The COMPORB line 33 goes high whenever all the latches 59 have reached the program inhibit mode. When the Program Pulse Count=MAXPC is reached, the ALGOCNTRL 164 latches the status of COMPORB line 33 in a status latch in block INPUT LOGIC 160. The status latch can be read at one of the IO[0:7] 1001 lines by the external host. If ALGOCNTRL 164 latches a logic low in the status latch in block INPUT LOGIC 160 then a program fail condition is reached and the ALGOCNTRL 164 goes out of the page programming cycle.

If at the end of any verify-program iteration, the COMPOR 32 line goes high, the ALGOCNTRL 164 sequences to the margin verify mode. All latches 59 are reset. All cells are placed in the voltage read mode by READB 52 at logic low. At this time inhibit voltage is de-coupled from BLIN 35 and current bias transistor N4 50 is coupled to BLIN 35. Cell voltages VCELLR(L) or VCELLD(L) are respectively available on BLIN 35 of a REFYDRVS 116S or BLIN 35 of YDRVS 110S, SYDRVS 114S, or RYDRVS 112S. During program margin verify the voltages read back from the data cells are checked for adequate margin from voltages read back from reference cells for each programmed level L. In the Upper Program Margin Verify mode, voltages UMV(0) through UMV(15) are placed on the VR0 through VR(15). Depending on the output B3, B2, B1, B0 of the data latches DATALAT3 10, DATALAT2 11, DATALAT1 12, DATALAT0 13 within each YDRVS 110S, SYDRVS 114S, RYDRVS 112S one specific voltage UMV(0) through UMV (15) is output to the input VROUT 55 of the VOLTAGE COMPARATOR 27. At this time the VOLTAGE COMPARATOR 27 compares the voltages at its inputs. If voltage on BLIN 35 is higher then voltage on VROUT 55 the output COMPOUT 58 is low, otherwise it is high. At this time a positive going strobe pulse is applied to the ENLATCOMP 29 common to all the latches 59 in YDRVS 110S, SYDRVS 114S and RYDRVS 112S, to latch the status of line COMPOUT 58. If COMPOUT 58 is low, then the COMLATQ 40 remains at logic low. If COMPOUT 58 is high, then the COMLATQ 40 switches to logic high. At this time, if LGOCNTRL 164 latches a logic low in the status latch in INPUT LOGIC 160 block by looking at the status of the COMPORB 33 line, then a program fail condition is reached and the ALGOCNTRL 164 goes out of the page programming cycle. Otherwise, ALGOCNTRL 164 sequences to the Lower Program Margin Verify mode.

In the Lower Program Margin Verify mode, all latches 59 are reset. Voltages LMV(0) through LMV(15) are placed on the VR0 through VR(15). Depending on the output B3, B2, B1, B0 of the data latches (DATALAT3) 10, (DATALAT2) 11, (DATALAT1) 12, (DATALAT0) 13 within each YDRVS 110S, SYDRVS 114S, RYDRVS 112S one specific voltage LMV(0) through LMV(15) is output to the input VROUT 55 of the VOLTAGE COMPARATOR 27. At this time the VOLTAGE COMPARATOR 27 compares the voltages at its inputs. If voltage on BLIN 55 is higher then voltage on VROUT 55 the output COMPOUT 58 is low, otherwise is high. At this time a positive going strobe pulse is applied to the ENLATCOMP 29 common to all the latches 59 in YDRVS 110S, SYDRVS 114S and RYDRVS 112S, to latch the status on line COMPOUT 58. If COMPOUT 58 is low, then the COMLATQ 40 remains at logic low. If COMPOUT 58 is high, then the COMLATQ 40 switches to logic high. At this time, if ALGOCNTRL 164 latches a logic low in the status latch in INPUT LOGIC 160 block by looking at the status of the COMPOR line 32, then a program fail condition is reached and the ALGOCNTRL 164 goes out of the page programming cycle.

During page read cycle, after page read command and the page address is issued, the reference and the data cells are placed in the voltage read mode. At this time all the B3[0:3] lines output 1111. VR0 through VR15 have VCELLR(0) through VCELLR(15). VCELLR(0) through VCELLR(15) are the voltages read out of the reference cells of the page being read. Under the control of the ALGOCNTRL 164 block 4 bits are sequentially read into the data latches (DATALAT3) 10, (DATALAT2) 11, (DATALAT1) 12, (DATALAT0) 13. For example, B3 is read by forcing the output of DATALAT3 to output B3=0. At this time B[0:3]=1110. The REFERENCE MULTIPLEXER 26 then outputs VCELLR(7) on the VROUT 55 in each of the YDRVS 110S, SYDRVS 114S and RYDRVS 112S. The output COMPOUT 58 of the VOLTAGE COMPARATOR 27 is high or low depending on whether voltage VCELLD (L) on the BLIN 35 is lower or higher relative to voltage VCELLR(7) on line VROUT 55. If COMPOUT 58 is high then a logic high is latched into DATALAT3 10 and B3=0, otherwise logic low is latched and B3=1. Next, B2 is read by forcing the output of DATALAT2 11 to output B2=0. At this time B[0:3]=110B3. B3 is the output of DATALAT3 10 from previous sequence. The REFERENCE MULTIPLEXER 26 then outputs VCELLR(L), depending on 110B3 on the VROUT 55 line in each of the YDRVS 110S, SYDRVS 114S and RYDRVS 112S. The output COMPOUT 58 of the VOLTAGE COMPARATOR 27 is high or low depending on whether voltage VCELLD(L) on the BLIN 35 is lower or higher relative to voltage VRCELL(L) on line VROUT 55. If COMPOUT 58 is high then a logic high is latched into DATALAT2 11 and B2=0, otherwise logic low is latched and B2=1. In this manner, the next two sequences latch two bits into the DATALAT1 12 and DATALAT0 13.

After all 4 bit from the cell are latched into the DATALAT3 10, DATALAT2 11, DATALAT1 12, DATALAT0 13 for all the YDRVS 110S, SYDRVS 114S and RYDRVS 112S, the restore margins are checked. All latches 59 are reset. First the RESTORE LOW margin is checked. At this time, for each level 0 through 15, MARGIN RESTORE LOW Voltage VRSTRL(0) through VRSTRL(15) is placed at the VR0 through VR15 lines respectively. Depending on each outputs B3, B2, B 1, B0 of the data latches DATALAT3 10, DATALAT2 11, DATALAT1 12, DATALAT0 13 within each YDRVS 110S, SYDRVS 114S and RYDRVS 112S, the REFERENCE MULTIPLEXER 26 outputs one of VRSTRL (0) through VRSTRL(15) on line VROUT 55 going into the positive input of the VOLTAGE COMPARATOR 27. ENLATCOMP 29 is strobed with the positive pulse to latch the status of the COMPOUT 58 line. If data cell read out voltage VCELLD(L) on BLIN 35 line is higher than voltage VRSTRL(L) on VROUT 55 line then COMLATQ 40 remains at logic low and COMLATQB 41 at logic high. Otherwise, COMLAT 40 is at logic high and COMLATQB 41 at logic low. At this time, if ALGOCNTRL 164 latches a logic low in the RESTORE LOW latch in INPUT LOGIC 160 block by looking at the status of the COMPORB line 33, then a restore low flag condition is reached. Next, all latches 59 are reset.

Next the RESTORE HIGH margin is checked. At this time, for each level 0 through 15, MARGIN RESTORE HIGH Voltage VRSTRH(0) through VRSTRH(15) is placed at the VR0 through VR15 lines respectively. Depending on each outputs B3, B2, B1, B0 of the data latches DATALAT3 10, DATALAT2 11, DATALAT1 12, DATALAT0 13 within each YDRVS 110S, SYDRVS 114S and RYDRVS 112S, the REFERENCE MULTIPLEXER 26 outputs one of VRSTRH (0) through VRSTRH(15) on line VROUT 55 going into the positive input of the VOLTAGE COMPARATOR 27. ENLATCOMP 29 is strobed with the positive pulse to latch the status of the COMPOUT 58 line. If data cell read out voltage VCELLD(L) on BLIN 35 line is higher than voltage VRSTRH(L) on VROUT 55 line then COMLATQ 40 remains at logic low and COMLATQB 41 at logic high. Otherwise, COMLAT 40 is at logic high and COMLATQB 41 at logic low. At this time, if ALGOCNTRL 164 latches a logic low in the RESTORE HIGH latch in INPUT LOGIC 160 block by looking at the status of the COMPOR line 32, then a restore high flag condition is reached.

At this time, 4 bits from every cell with the page being read are latched into the respective data latches within each YDRVS 110S, SYDRVS 114S and RYDRVS 112S. Next under the control of the READ CLOCK data is sequentially read on IO[0:7]. If after READ CLOCK the RED_ADD_TRUE=Y condition is true then the data is read from the addressed RYDRVS 112S otherwise data is read from the addressed YDRVS 110S or SYDRVS 114S.

Figure 19B:
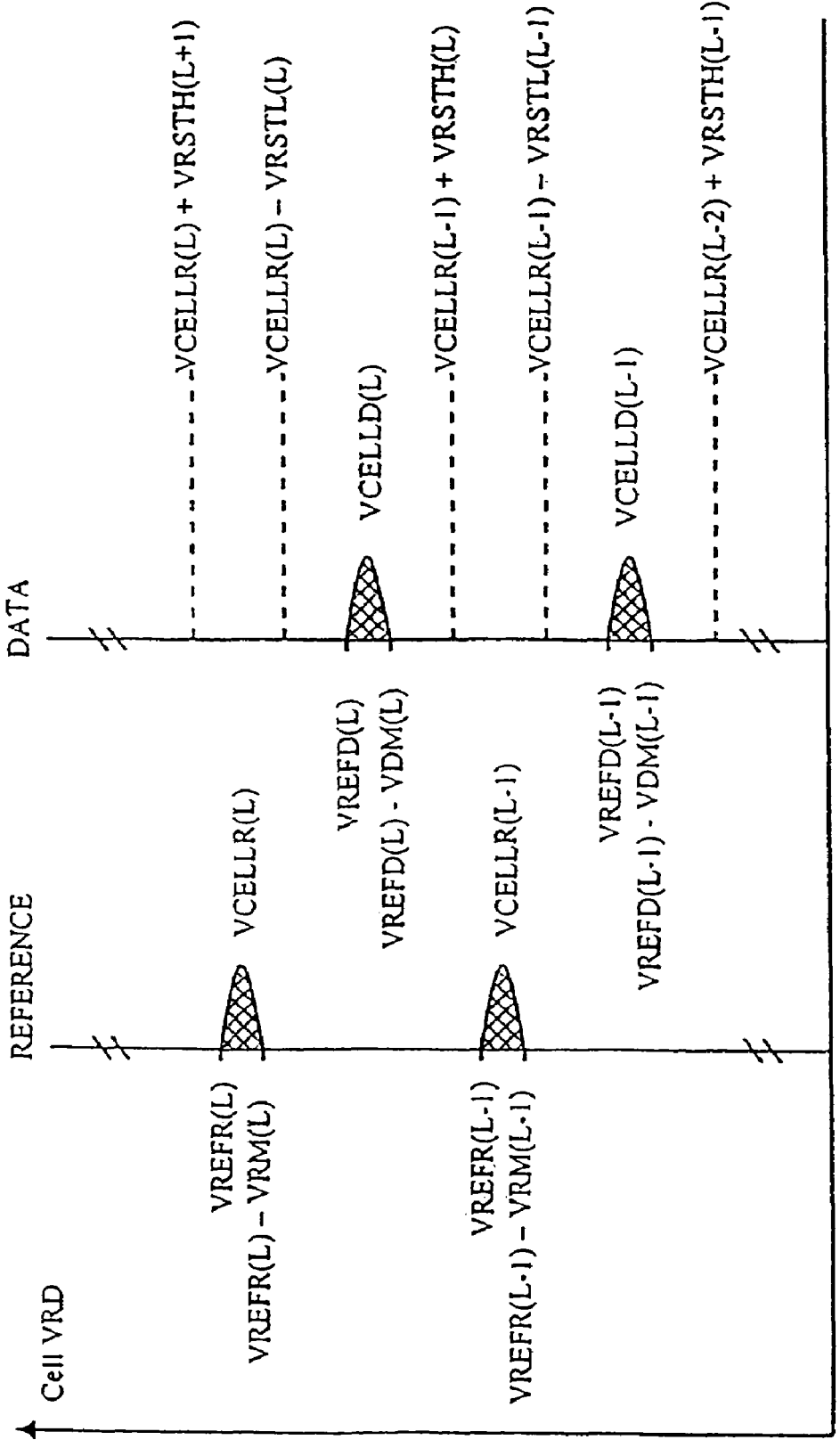
FIG. 19B shows voltage levels for program verify, margin, read, and restore for an alternative embodiment of the current invention.

FIG. 19B shows various voltages generated and used in another embodiment of the current invention for program verifying, program margin verifying, read sensing and restore high or low margin verifying. In this embodiment the program margin verify voltage VREFR(L)–VRM(L) and VREFD(L)–DM(L) for a level L of a reference cell and a data cell respectively, are generated by the block V&IREF 172 independent of the voltages VCELLR(L) and VCELLD (L) programmed into the reference cell and data cell respectively. The voltage VRM(L) for a level L of the reference cells can be unique for each level or the same for all levels. The voltage VDM(L) for a level L of the data cells can be unique for each level or the same for all levels.

FIG. 22B shows the portion of the flow for the page programming cycle that uses the voltages as shown in FIG. 19B. In the flow shown in FIG. 22B, only one program margin verify comparison is made instead of two as shown in FIG. 22A. This has the advantage of reducing the total time for completion of a page programming cycle.

Figure 22C:
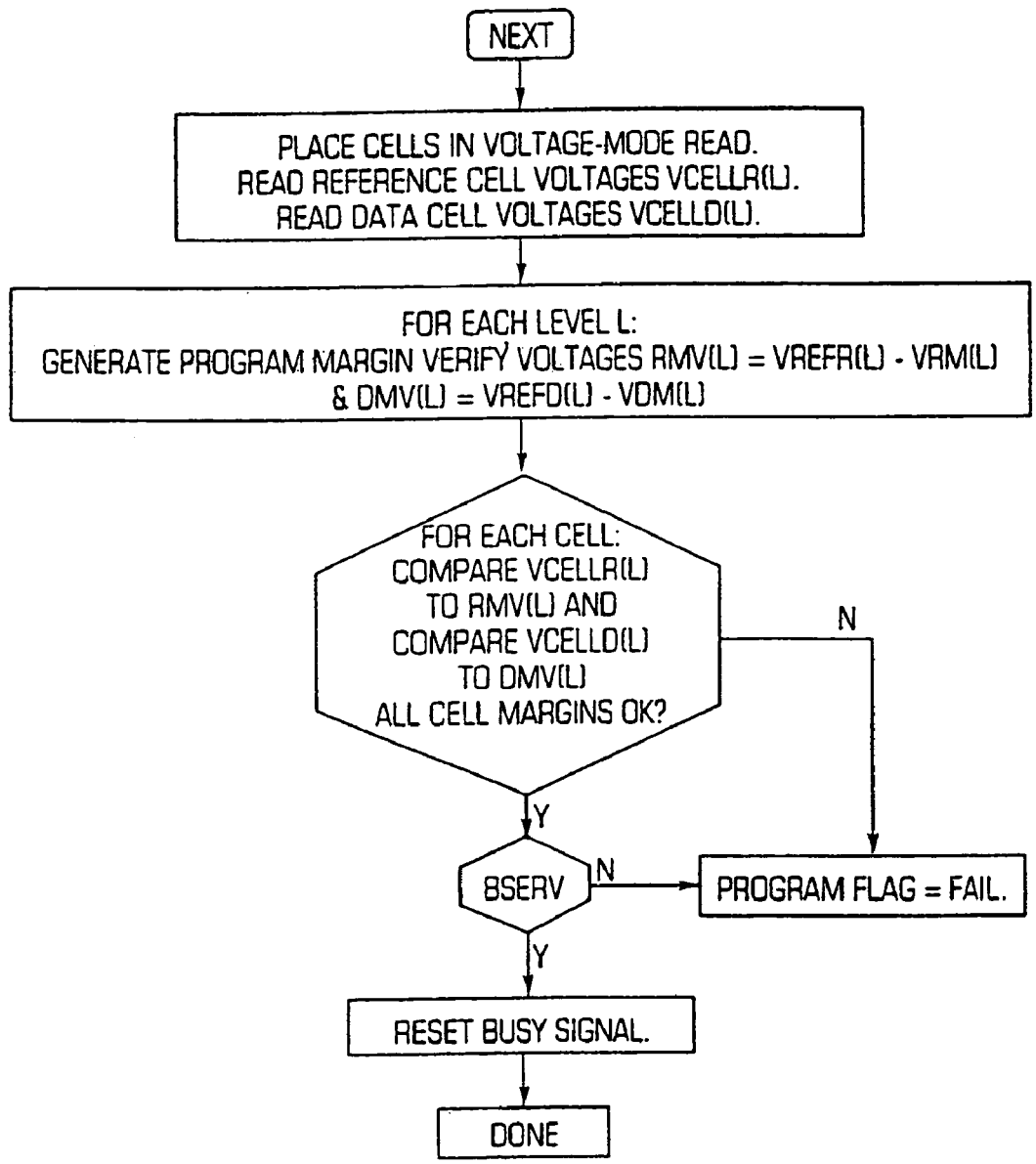
FIG. 22C shows an alternate embodiment of the flow diagram shown in FIG. 22B.

FIG. 22C shows an alternative embodiment of the flow shown in FIG. 22B. At the end of the programming, a BSERV operation is done to verify that the read operation is operational versus the data in. The BSERV operation is a binary search read verification operation that is substantially the same as described in FIGS. 23 and 24 with the additional step of comparing resulting digital bits BR<3:0> from the binary search with a stored digital bits B<3:0> from loading data in. If the comparison is not true, the program flag is set to indicate program failure. The operation further ensures that all cells are within an operational range, for example not out of range due to programming overshoot to the next levels.

The embodiment shown in FIGS. 19B and 22B can be used in combination with the embodiment shown in FIGS. 19A and 22A. As discussed in the multilevel reference system section above, the embodiment shown in FIGS. 19B and 22B can be used when a selected page programs for the first time after block erase. For subsequent page programming cycles on the same page, the embodiment shown in FIGS. 19A and 22A is advantageous since the VCELLR(L) values may shift between initial page programming and subsequent page programming.

Figure 28:
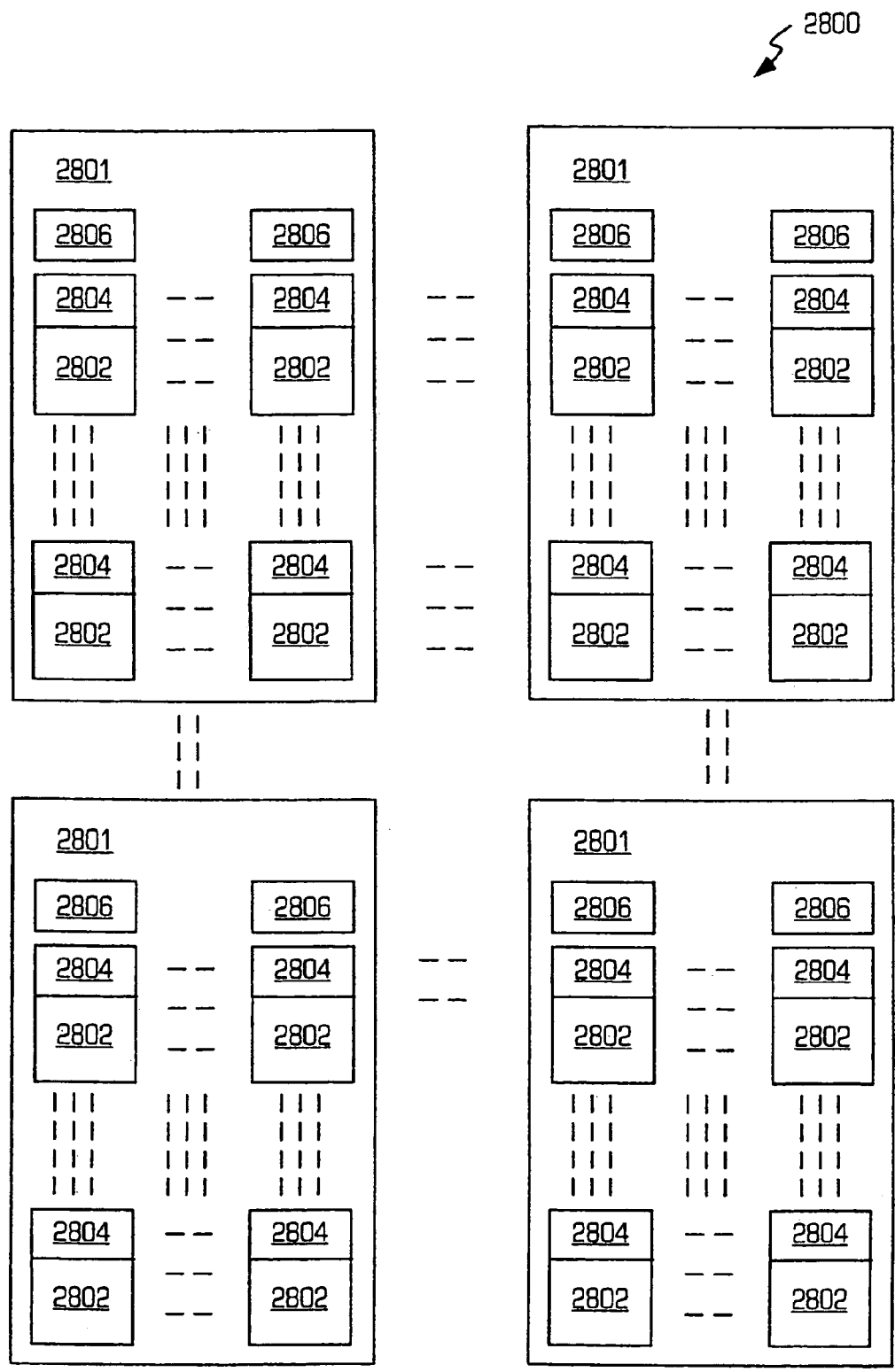
FIG. 28 is a block diagram illustrating a memory system for a multilevel memory.

FIG. 28 is a block diagram illustrating a memory system 2800 for a multilevel memory.

The memory system 2800 comprises a plurality of memory arrays 2801 arranged in rows and columns of memory arrays 2801. Each memory array 2801 comprises a plurality of memory subarrays 2802, a plurality of local sense amplifiers 2804, and a plurality of global sense amplifiers 2806. In one embodiment, a local sense amplifier 2804 is disposed adjacent to a memory subarray 2802. In another embodiment, the local sense amplifier 2804 is shared between a plurality of memory subarrays 2802. The local sense amplifier 2804 reads the contents of the memory cells within the corresponding memory subarray 2802. The memory subarrays 2802 are arranged in rows and columns. The local sense amplifiers 2804 coupled to a column of memory subarrays 2802 are coupled to a global sense amplifier 2806. The memory cells may include redundant cells, reference cells or spare cells.

Figure 29A:
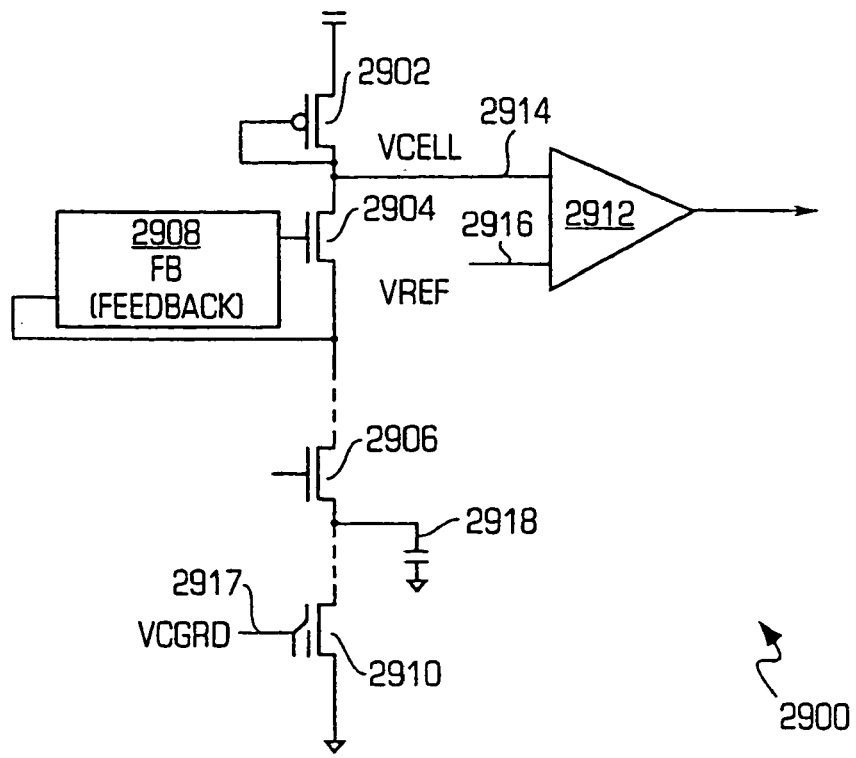
FIG. 29A is a block diagram illustrating an inverter mode sensing circuit.

FIG. 29A is a block diagram illustrating an inverter mode sensing circuit 2900.

The inverter mode sensing circuit 2900 comprises a PMOS transistor 2902, a plurality of NMOS transistors 2904 and 2906, a feedback circuit 2908, a plurality of memory cells 2910, and a comparator 2912. For clarity, only one memory cell 2910 and one NMOS transistor 2906 are shown for a subarray, but the subarray comprises a plurality of memory cells 2910 arranged in columns. Each column has a corresponding NMOS transistor 2906 or a plurality of NMOS transistors 2906 arranged in series. Only one column with one memory cell 2910 is shown.

The comparator 2912 determines the voltage of the memory cell by comparing the cell voltage (VCELL) 2914 to a reference voltage (VREF) 2916 in a manner described above. The PMOS transistor 2902, the NMOS transistors 2904 and 2906 and the memory cells 2910 are coupled in series between the supply voltage and ground. The selected memory cell 2910 is read by applying a control gate reference voltage (VCGRD) 2917 on the control gate of the memory cell 2910. The column of memory cells 2910 and an associated bit line has a capacitance 2918 that slows the sensing of the memory cells 2910. The NMOS transistor 2906 functions as a switch to couple the column of memory cells 2910 to the sensing portion of the circuit. The feedback circuit 2908 controls biasing of the NMOS transistor 2904 to stabilize the cell voltage 2914. The drain of the diode connected PMOS transistor 2902 is coupled to the cell voltage 2914. Inverter mode sensing may also be referred to as current mode sensing or common source sensing. In another embodiment of current mode sensing, the source line (CL) (as shown coupled to ground) and the bitline are interchanged, and thus the voltage on the source line is coupled to the readout voltage 2914. In this case, the array architecture uses only one source line in read at a given time, for example by multiplexing through decoder circuitry or over time. This mode is to be known as Inverse Current Mode sensing.

Figure 29B:
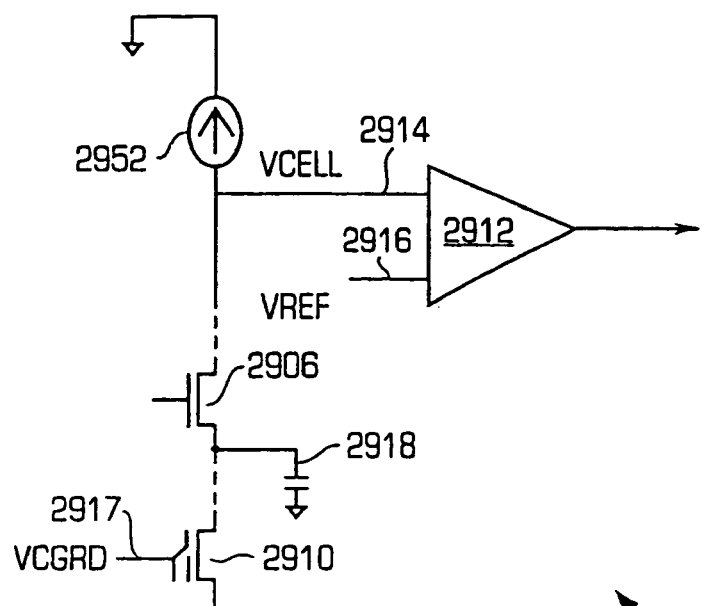
FIG. 29B is a block diagram illustrating a voltage mode sensing circuit.

FIG. 29B is a block diagram illustrating a voltage mode sensing circuit 2950.

The voltage sensing circuit 2950 is similar to the inverter mode sensing circuit 2900 except that a current source 2952 replaces the PMOS transistor 2902 and is coupled to ground, the memory cell 2910 is coupled to a reference bias, and the NMOS transistor 2904 and the feedback circuit 2908 are omitted. The voltage mode sensing may also be referred to as source follower sensing.

Figure 30:
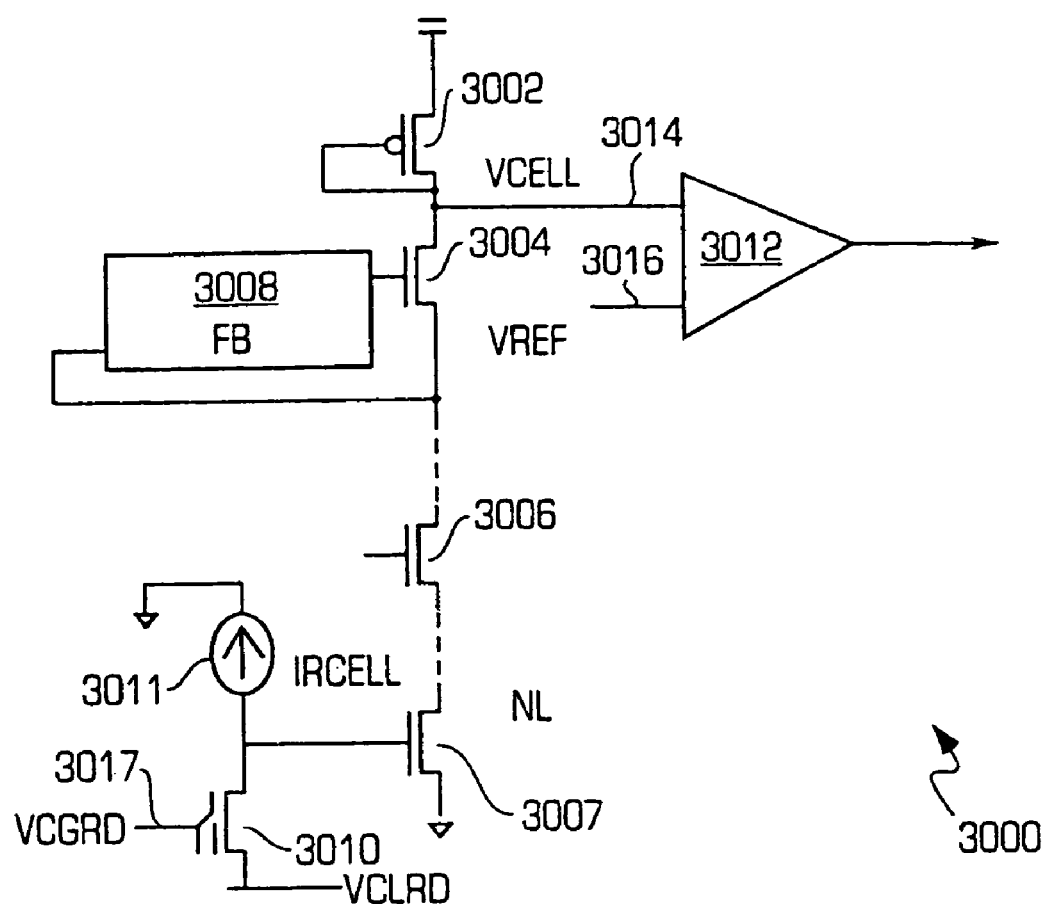
FIG. 30 is a block diagram illustrating a wide range, high speed voltage mode sensing circuit.

FIG. 30 is a block diagram illustrating a wide range, high speed voltage mode sensing circuit 3000.

The memory array 2800 includes a plurality of voltage mode sensing circuits 3000. The voltage mode sensing circuit 3000 comprises a PMOS transistor 3002, a plurality of NMOS transistors 3004, 3006, 3007, a feedback circuit 3008, a plurality of memory cells 3010, a current source (IRCELL) 3011, and a comparator 3012. For clarity, only one memory cell 3010, one NMOS transistor 3006, and one NMOS transistor 3007 are shown for a subarray, but the subarray comprises a plurality of memory cells 3010 arranged in columns. Each column has a corresponding NMOS transistor 3006. Only one column with one memory cell 3010 is shown. Possible decoding circuitry between the current source 3011 and the memory cell 3010 and between the current source 3011 and the NMOS transistor 3007 is not shown.

The comparator 3012 determines the voltage of the memory cell by comparing a cell voltage (VCELL) 3014 to a reference voltage (VREF) 3016 in a manner described above. The PMOS transistor 3002, the NMOS transistors 3004, 3006 and 3007 are coupled in series between the supply voltage and ground. The current source 3011 is coupled between the gate of the NMOS transistor 3002 and ground. The memory cell 3010 is coupled between a reference voltage (VCLRD) and the common node formed of the current source 3011 and the gate of the NMOS transistor 3007.

The selected memory cell 3010 is read by applying a control gate reference voltage (VCGRD) 3017 on the control gate of the memory cell 3010. The biasing of the gate of the NMOS transistor 3007 by the current source 3011 and the memory cell 3010 controls the voltage on the bit line.

The NMOS transistor 3006 functions as a switch to couple the column of NMOS transistors 3007 and the associated memory cells 3010 to the sensing portion of the circuit. The feedback circuit 3008 controls biasing of the NMOS transistor 3004 to stabilize the cell voltage 3014. The drain of the diode connected PMOS transistor 3002 is coupled to the cell voltage 3014.

Figure 31:
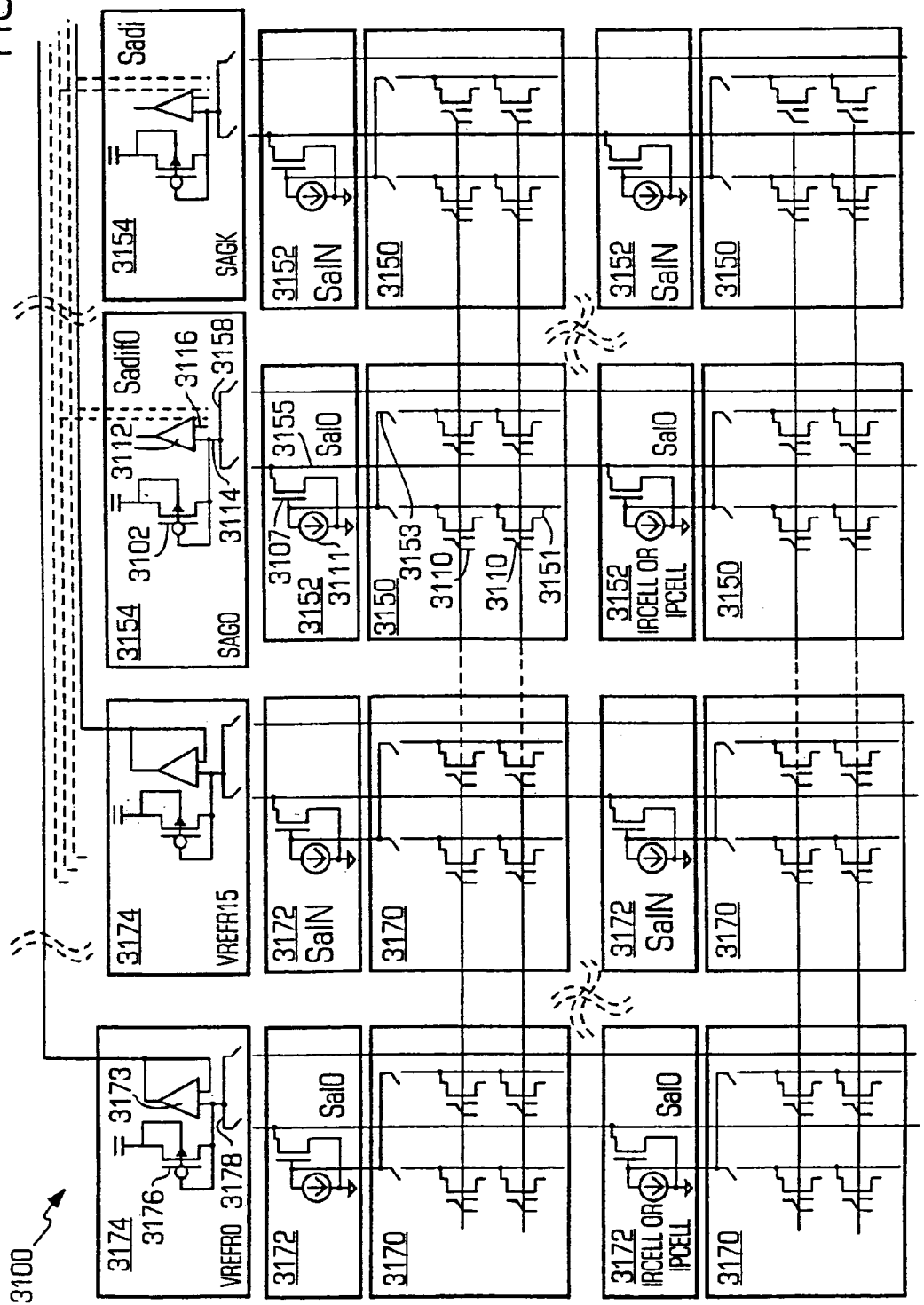
FIG. 31 is a block diagram illustrating a wide range, high speed mode sensing circuit having a local source follower stage and a global common source stage.

FIG. 31 is a block diagram illustrating a voltage mode sensing circuit 3100.

The voltage mode sensing circuit 3100 comprises a plurality of memory subarrays 3150, a plurality of local sense amplifiers 3152, and a plurality of global sense amplifiers 3154. The local sense amplifier 3152 includes a local source follower stage. The global sense amplifier 3154 includes a common source stage.

The memory array 3150 includes columns of memory cells 3110 coupled to first bitlines 3151.

Each local sense amplifier 3152 is coupled to a memory subarray 3150. In one embodiment, the local sense amplifier 3152 is disposed adjacent the memory subarray 3150. The local sense amplifier 3152 includes a selection circuit 3153 that couples a selected bitline 3151 to a bitline 3155. In one embodiment, the selection circuit 3153 comprises transistors. The local sense amplifier 3152 senses the selected memory cell on the bitline 3151 and provides a voltage to a global sense amplifier 3154.

The local sense amplifier 3152 comprises an NMOS transistor 3107 coupled between the bitline 3155 and ground, and includes a gate coupled to the bitline 3151. A current source 3111 is coupled between the gate of the NMOS transistor 3107 and ground.

The global sense amplifier 3154 comprises a comparator 3112, a PMOS transistor 3102 and a selection circuit 3158. The selection circuit 3158 couples the selected one of the bitlines 3155 to a common node formed of a voltage cell input 3114 of the comparator 3112 and the drain of the diode connected PMOS transistor 3102. A reference voltage 3116 is applied to the second input of the comparator 3112.

The local sense amplifier 3152 provides a larger voltage range by using optimally low current bias. The global sense amplifier 3154 includes a common source stage with a PMOS transistor 3114 as a load, and buffers the column capacitance.

The voltage mode sensing circuit 3100 further comprises a plurality of reference subarrays 3170, a plurality of local sense amplifiers 3172, and a plurality of global sense amplifiers 3174. The reference subarrays 3170 comprise a plurality of reference cells for storing reference signals. In one embodiment, the reference subarrays 3170 are similar to the memory subarrays 3150. The local sense amplifiers 3172 read the reference subarrays 3170. In one embodiment, the local sense amplifiers 3172 are similar to the local sense amplifiers 3152. The global sense amplifiers 3174 detect and amplify the voltage from the local sense amplifiers 3172.

The global sense amplifier 3174 comprises a comparator 3173, a PMOS transistor 3176 and a selection circuit 3178, which are arranged in similar manner as the comparator 3112, the PMOS transistor 3102 and the selection circuit 3158 of the global sense amplifier 3154, except the comparator 3173 is configured as a buffer. The comparator 3173 serves as a comparator in sensing the reference cells and serves as a buffer for driving the reference level.

Figure 32:
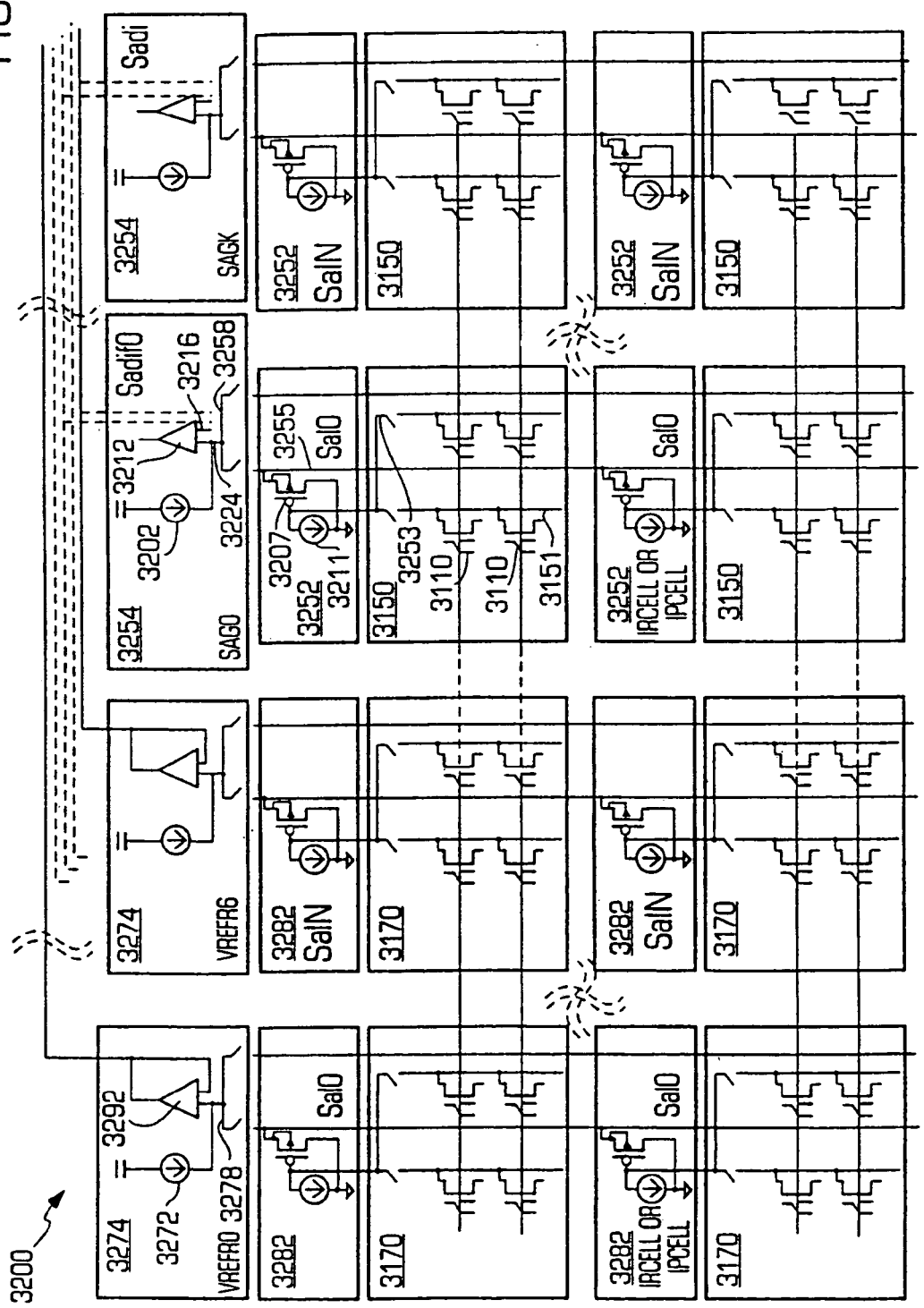
FIG. 32 is a block diagram illustrating a wide range, high speed mode sensing circuit with a local PMOS source follower stage and a global source follower stage.

FIG. 32 is a block diagram illustrating a voltage mode sensing circuit 3200.

The voltage mode sensing circuit 3200 includes like elements as the voltage mode sensing circuit 3100 (FIG. 31) and are given like reference numbers. The voltage mode sensing circuit 3200 comprises a memory array 3150, a plurality of local sense amplifiers 3252 and a plurality of global sense amplifiers 3254. The local sense amplifier 3252 includes a local source follower stage and includes a PMOS source follower as part of the global sense amplifier. The global sense amplifier 3254 includes a source follower stage.

Each local sense amplifier 3252 is coupled to a memory subarray 3150. In one embodiment, the local sense amplifier 3252 is disposed adjacent the memory subarray 3150. The local sense amplifier 3252 includes a selection circuit 3253 that couples a selected bitline 3151 to a bitline 3255. In one embodiment, the selection circuit 3253 comprises transistors. The local sense amplifier 3252 senses the selected memory cell on the bitline 3151 and provides a voltage to a global sense amplifier 3254.

The local sense amplifier 3252 comprises a PMOS transistor 3207 coupled between the bitline 3255 and ground, and includes a gate coupled to the bitline 3151. A current source 3211 is coupled between the gate of the PMOS transistor 3207 and ground. The local sense amplifier 3252 provides a maximum voltage range by using low current bias.

The global sense amplifier 3254 comprises a comparator 3212, a current source 3202 and a selection circuit 3258. The current source 3202 couples the supply voltage to the cell voltage terminal 3214 of the comparator 3212 to ground. The selection circuit 3258 couples the selected one of the bitlines 3255 to a common node formed of a voltage cell input 3214 of the comparator 3212 and the current source 3202. A reference voltage 3216 is applied to the second input of the comparator 3212.

The global sense amplifier 3254 buffers the column capacitance.

The voltage mode sensing circuit 3200 further comprises a plurality of reference subarrays 3170, a plurality of local sense amplifiers 3282, and a plurality of global sense amplifiers 3274. The reference subarrays 3170 comprise a plurality of reference cells for storing reference signals. In one embodiment, the reference subarrays 3170 are similar to the memory subarrays 3150. The local sense amplifiers 3282 read the reference subarrays 3170. In one embodiment, the local sense amplifiers 3282 are similar to the local sense amplifiers 3252. The global sense amplifiers 3274 detect and amplify the voltage from the local sense amplifiers 3282.

The global sense amplifier 3274 comprises a comparator 3292, a current source 3272 and a selection circuit 3278, which are arranged in similar manner as the comparator 3212, the current source 3202 and the selection circuit 3258 of the global sense amplifier 3254, except the comparator 3292 is configured as a buffer. The comparator 3292 serves as a comparator in sensing the reference cells and serves as a buffer for driving the reference level.

Figure 33:
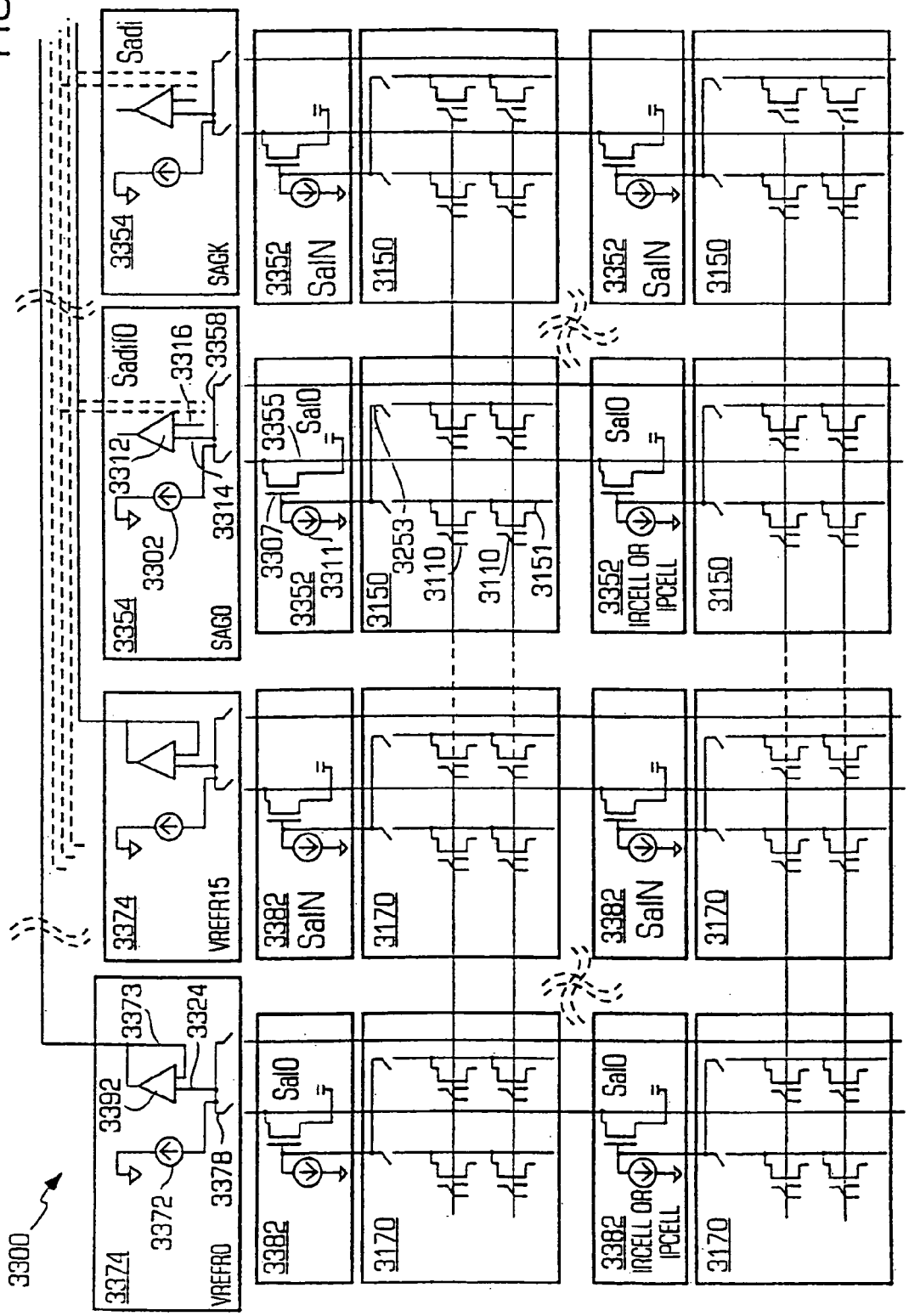
FIG. 33 is a block diagram illustrating a wide range, high speed mode sensing circuit with a local NMOS source follower stage and a global source following stage.

FIG. 33 is a block diagram illustrating voltage mode sensing circuit 3300.

The voltage mode sensing circuit 3300 includes like elements as the voltage mode sensing circuit 3200 (FIG. 32) and are given like reference numbers. The voltage mode sensing circuit 3300 comprises a memory array 3150, a plurality of local sense amplifiers 3352 and a plurality of global sense amplifiers 3354. The local sense amplifier 3352 includes a local source follower stage and includes an NMOS source follower as part of the global sense amplifier. The global sense amplifier 3354 includes a source follower stage.

Each local sense amplifier 3352 is coupled to a memory subarray 3150. In one embodiment, the local sense amplifier 3352 is disposed adjacent the memory subarray 3150. The local sense amplifier 3352 includes a selection circuit 3253 that couples a selected bitline 3151 to a bitline 3355. In one embodiment, the selection circuit 3253 comprises transistors. The local sense amplifier 3252 senses the selected memory cell on the bitline 3151 and provides a voltage to a global sense amplifier 3254.

The local sense amplifier 3352 comprises an NMOS transistor 3307 coupled between the bitline 3355 and a supply voltage terminal, and includes a gate coupled to the bitline 3151. A current source 3311 is coupled between the gate of the NMOS transistor 3307 and ground. The local sense amplifier 3252 provides a maximum voltage range by using low current bias.

The global sense amplifier 3354 comprises a comparator 3312, a current source 3302 and a selection circuit 3358. The current source 3302 couples the voltage terminal 3314 of the comparator 3312 to a ground terminal. The selection circuit 3358 couples the selected one of the bitlines 3355 to a common node formed of a voltage cell input 3314 of the comparator 3312 and the current source 3302. A reference voltage 3316 is applied to the second input of the comparator 3312. The global sense amplifier 3354 is selectively coupled to the bitline to compare the cell voltage to a reference voltage 3316. The global sense amplifier 3354 buffers the column capacitance.

The voltage mode sensing circuit 3300 further comprises a plurality of reference subarrays 3170, a plurality of local sense amplifiers 3382, and a plurality of global sense amplifiers 3374. The reference subarrays 3170 comprise a plurality of reference cells for storing reference signals. In one embodiment, the reference subarrays 3170 are similar to the memory subarrays 3150. The local sense amplifiers 3382 read the reference subarrays 3170. In one embodiment, the local sense amplifiers 3382 are similar to the local sense amplifiers 3352. The global sense amplifiers 3374 detect and amplify the voltage from the local sense amplifiers 3382.

The global sense amplifier 3374 comprises a comparator 3392, a current source 3372 and a selection circuit 3378, which are arranged in similar manner as the comparator 3312, the current source 3302 and the selection circuit 3358 of the global sense amplifier 3354, except the comparator 3392 is configured as a buffer. The comparator 3392 serves as a comparator in sensing the reference cells and serves as a buffer for driving the reference level.

In another embodiment, the local sense amplifier is a common source amplifier, and the global sense amplifiers are NMOS source follower stages or PMOS source follower stages.

In another embodiment, the local sense amplifier is a common source amplifier, and the global sense amplifiers are common source amplifiers.

Figure 34:
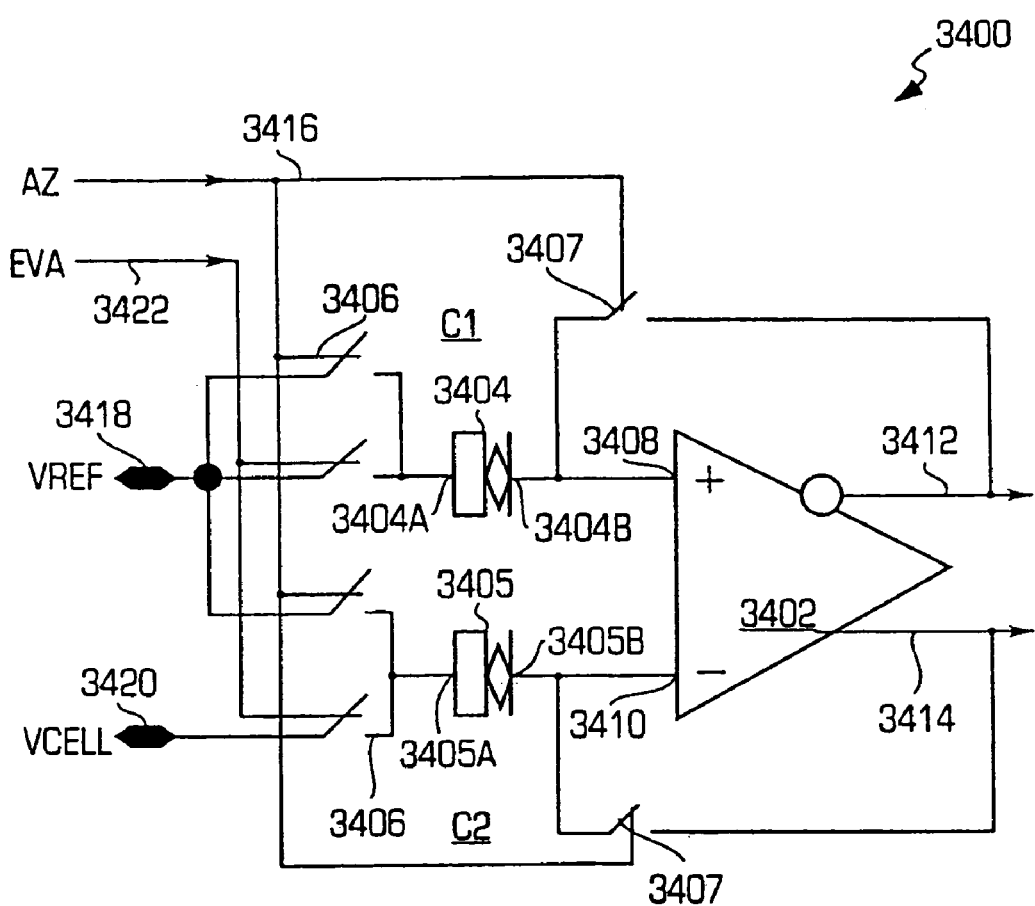
FIG. 34 is a block diagram illustrating a global sense amplifier having an auto zeroing function.

FIG. 34 is a block diagram illustrating a global sense amplifier 3400 having an auto zeroing function.

The comparators 3012, 3112, 3212, and 3312 of FIGS. 30–33 maybe the global sense amplifier 3400.

The sense amplifier 3400 comprises an operational amplifier 3402, a pair of capacitors 3404 and 3405, and a plurality of switches 3406 and 3407.

The capacitors 3404 and 3405 couples respective inputs 3408 and 3410 of the operational amplifier 3402 to the switch 3406.

In response to an auto zero (AZ) command 3416, the switches 3407 selectively couples an output 3412 of the operational amplifier 3402 to the input 3408 to equalize the voltages on the output 3412 and input 3408, and selectively couples an output 3414 of the operational amplifier 3402 to the input 3410 to equalize the output 3414 and the input 3410. In the auto zero mode, the voltage on A terminals of the capacitors 3404 and 3405 are set equal to the reference voltage (VREF) 3418, and the B terminals of the capacitors 3404 and 3405 are equalized to the complementary outputs of the operational amplifier 3402. The switch 3406 is switched by an evaluation (EVA) command 3422 to connect the cell voltage (VCELL) 3420 to the other end of the capacitor 3405 for comparison from the operational amplifier 3402.

The switch 3406 selectively applies the reference voltage (VREF) 3418 to the capacitor 3404 in response to the evaluation (EVA) command 3422. The switch 3406 also selectively applies either the reference voltage (VREF) 3418 or a cell voltage (VCELL) 3420 to the capacitor 3405 in response to the evaluation (EVA) command 3422. The evaluation command 3422 equalizes the signals on terminals 3404A and 3505A of the capacitors 3404 and 3405.

In an alternate embodiment, the nodes 3404B and 3405B of the capacitors 3404 and 3405 are reset to a fixed bias voltage. In another embodiment, the nodes 3404B and 3405B of the capacitors 3404 and 3405 are shorted together.

By using a capacitor for sensing, the input common load range to the operational amplifier (or comparator) is substantially constant and independent of the memory cell voltage or current.

Figure 35:
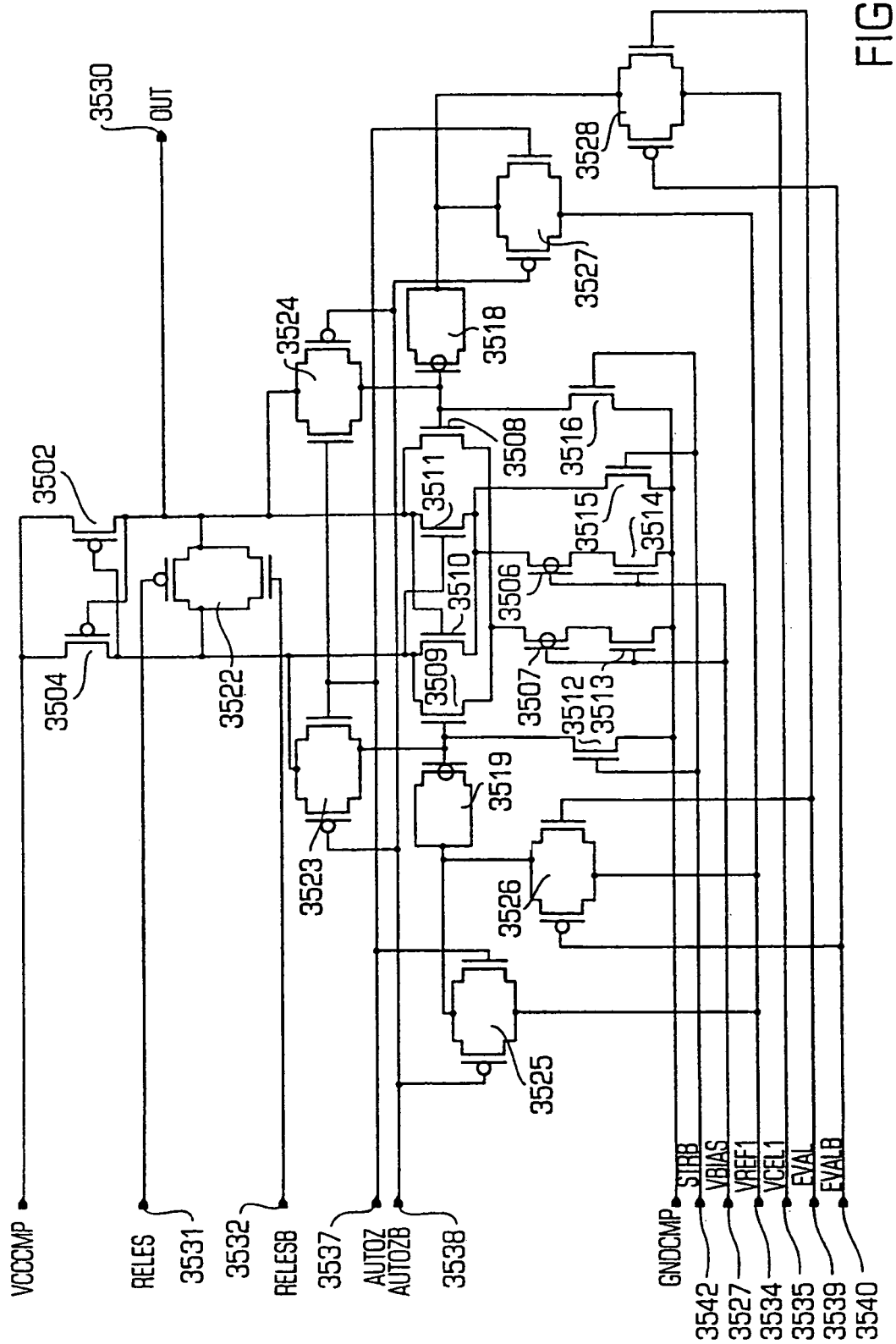
FIG. 35 is a block diagram illustrating an auto zero sense amplifier.

FIG. 35 is a block diagram illustrating an auto zero sense amplifier 3500.

The autozero sense amplifier 3500 comprises a plurality of PMOS transistors 3502 and 3504, a plurality of NZ NMOS transistors 3506 and 3507, a plurality of NMOS transistors 3508 through 3516, a plurality of capacitors 3518 and 3519 and a plurality of transfer gates 3522 through 3528.

The PMOS transistors 3502 and 3504 and the NMOS transistors 3508, 3509 and 3513 and the NZ NMOS transistor 3507 are arranged as a differential pair. The NMOS transistors 3508 and 3509 provide the differential input pair. The NZ NMOS transistor 3507 and the NMOS transistor 3513 provide bias for the NMOS transistor 3508 and 3509. The PMOS transistors 3502 and 3504 are coupled for cross-coupled loading. The PMOS transistor 3502 is coupled between the supply voltage and an output terminal 3530. A bias voltage 3529 is applied to the gates of the NZ NMOS transistors 3506 and 3507 and the NMOS transistors 3513 and 3514.

The NMOS transistors 3510 and 3511 provide an NMOS coupled internal latch, which is active while the differential input pair is on. The drain of the NMOS transistor 3510 is coupled to the drain of the NMOS transistor 3509 and the gate of the NMOS transistor 3511. The drain of the NMOS transistor 3511 is coupled to a common node formed of the drain of the NMOS transistor 3508 and gate of the NMOS transistor 3510. The NZ NMOS transistor 3506 and the NMOS transistor 3514 provide bias for the NMOS transistors 3510 and 3511 and are coupled between the common node formed of the sources of the NMOS transistors 3510 and 3511, and ground.

The transfer gate 3522 couples the drains of the PMOS transistors 3502 and 3504 and the output 3530 to each other for equalization and quick recovery for the next comparison in response to a release signal 3531 and an inverted release signal 3532.

The capacitor 3519 couples the gate of the NMOS transistor 3509 to first terminals of the transfer gates 3525 and 3526 which include a second terminal coupled to a reference voltage 3534. The capacitor 3518 couples the gate of the NMOS transistor 3508 into first terminals of the transfer gates 3527 and 3528, which have second terminals coupled to the reference voltage 3534 and a cell voltage 3535, respectively. The transfer gates 3525 and 3527 are controlled by a auto zero signal 3537 and an inverted auto zero signal 3538. The transfer gates 3526 and 3528 are controlled by evaluation signals 3539 and 3540.

The transfer gates 3523 and 3524 couple the drains of the PMOS transistors 3504 and 3502, respectively, to the gates of the NMOS transistors 3509 and 3508, respectively, in response to the auto zero signal 3537 and inverted auto zero signal 3538. The NMOS transistors 3512 and 3516 couple the gates of the NMOS transistors 3509 and 3508, respectively, to ground in response to a strobe signal 3542 to pull down the transistors 3509 and 3508 to turn off the differential pair. The NMOS transistor 3515 couples the sources of the NMOS transistors 3510 and 3511 to the ground in response to the strobe signal 3542 for full level latching.

The array architectures described herein may enable multilevel parallel operation.

A pipelined read operation may be as follows. A first row is selected in a selected subarray, such as subarray 2802 or subarray 3150/3170, and the content of selected memory cells are coupled to the local bitline and to the global bitlines while a second row in another subarray 2802 or 3150/3170 is selected and the content of the selected memory cells are coupled to the local bitlines but not yet coupled to the global bitlines. After the read operation completes processing the data of the first row, the data of the second row is enabled to couple to the global bitlines to continue the read operation, and a third row in a different subarray 2802 or 3150/3170 is selected to enable the content of the selected memory cells to couple to the local bitlines but not yet to the global bitlines. This cycle continues until all desired data are read out. This, for example, enables continuous read of multilevel memory cells.

In another embodiment, pipelined read operation is performed by operating on memory cells in a row in an array, such as memory array 2801, while another row in another memory array 2801 is selected to enable the contents of the memory cells to be ready.

A read-while-read operation may be as follows. A read operation operates on both arrays, such as memory array 2801 (or memory subarrays 2802 or 3150), simultaneously and the data are available from both arrays possibly at the same time. In this case, for example, data latches are used to latch the data from both arrays. In another embodiment, two sets of data lines may be used to transfer the data from both arrays to an on-chip controller.

A read/write-while-write/read operation may be as follows. Similarly while one operation, e.g., read, is executed on an array, such as subarray 2802 or array 2801 or subarrays 3150/3170, another operation is executed, e.g., write, on another array such as subarray 2802 or 2801 or subarray 3150/3170. This is possible because control circuits associated with decoding and sensing and/or writing may be embedded for each array.

A read/erase-while-erase/read may be as follows. Similarly while one operation, e.g., read, is executed on an array, such as subarray 2802 or 2801 or subarray 3150/3170, another operation is executed, e.g., erase, on another array such as subarray 2802 or 2801 or subarray 3150/3170. This is possible because each array may have its own decoders and embedded control circuits associated with sensing.

An erase-while-erase operation may be as follows. Similarly while one erase operation is executed on an array, such as subarray 2802 or 2801 or subarray 3150/3170, another erase operation is executed on another array, such as subarray 2802 or 2801 or subarray 3150/3170. This is possible because each array may have its own decoders.

A write/erase-while-erase/write operation may be as follows. Similarly while one operation, e.g., write, is executed on an array, such as subarray 2802 or array 2801 or subarrays 3150/3170, another operation is executed, e.g., erase, on another array such as subarray 2802 or 2801 or subarray 3150/3170. This is possible because each array may have its own decoders and embedded control circuits associated with sensing and/or writing.

A write-while-write operation may be as follows. Similarly while one write operation is executed on an array, such as subarray 2802 or 2801 or subarray 3150/3170, another write operation is executed on another array, such as subarray 2802 or 2801 or subarray 3150/3170. This is possible because each array may have its own decoders and embedded control circuits associated with sensing and/or writing.

Figure 36:
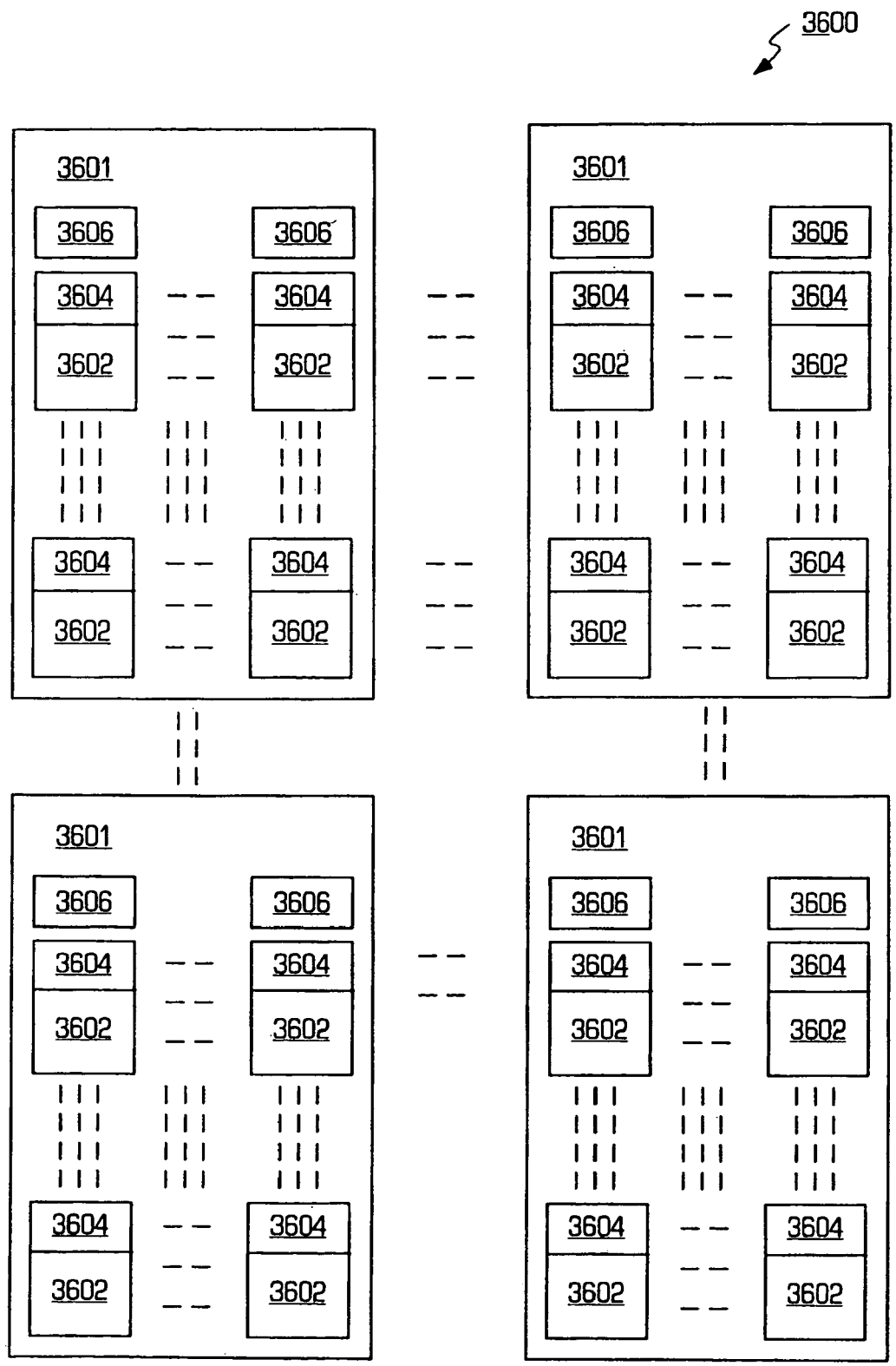
FIG. 36 is a block diagram illustrating a memory system for a multilevel memory including local autozero sense amplifiers and global autozero sense amplifiers.

FIG. 36 is a block diagram illustrating a memory system 3600 for a multilevel memory including local autozero sense amplifiers and global autozero sense amplifiers.

The memory system 3600 comprises a plurality of memory arrays 3601 arranged in rows and columns of memory arrays 3601. Each memory array 3601 comprises a plurality of memory subarrays 3602, a plurality of local sense amplifiers 3604, and a plurality of global sense amplifiers 3606. In one embodiment, the local sense amplifier 3604 is disposed adjacent to a memory subarray 3602. In another embodiment, the local sense amplifier 3604 is shared between a plurality of memory subarrays 3602. The local sense amplifier 3604 reads the contents of the memory cells within the corresponding memory subarray 3602. The memory subarrays 3602 are arranged in rows and columns. The local sense amplifiers 3604 coupled to a column of memory subarrays 3602 are coupled to a global sense amplifier 3606. The memory cells may include redundant cells, reference cells, or spare cells. The local sense amplifier 3604 may include an autozero function. In one embodiment, the global sense amplifiers 3606 include an autozero function. In another embodiment, the global sense amplifiers 3606 does not include an autozero function. In another embodiment, the memory system 3600 includes only the global sense amplifiers 3606 at the top level (at the system 3600), which are shared between the memory arrays 3601.

Figure 36A:
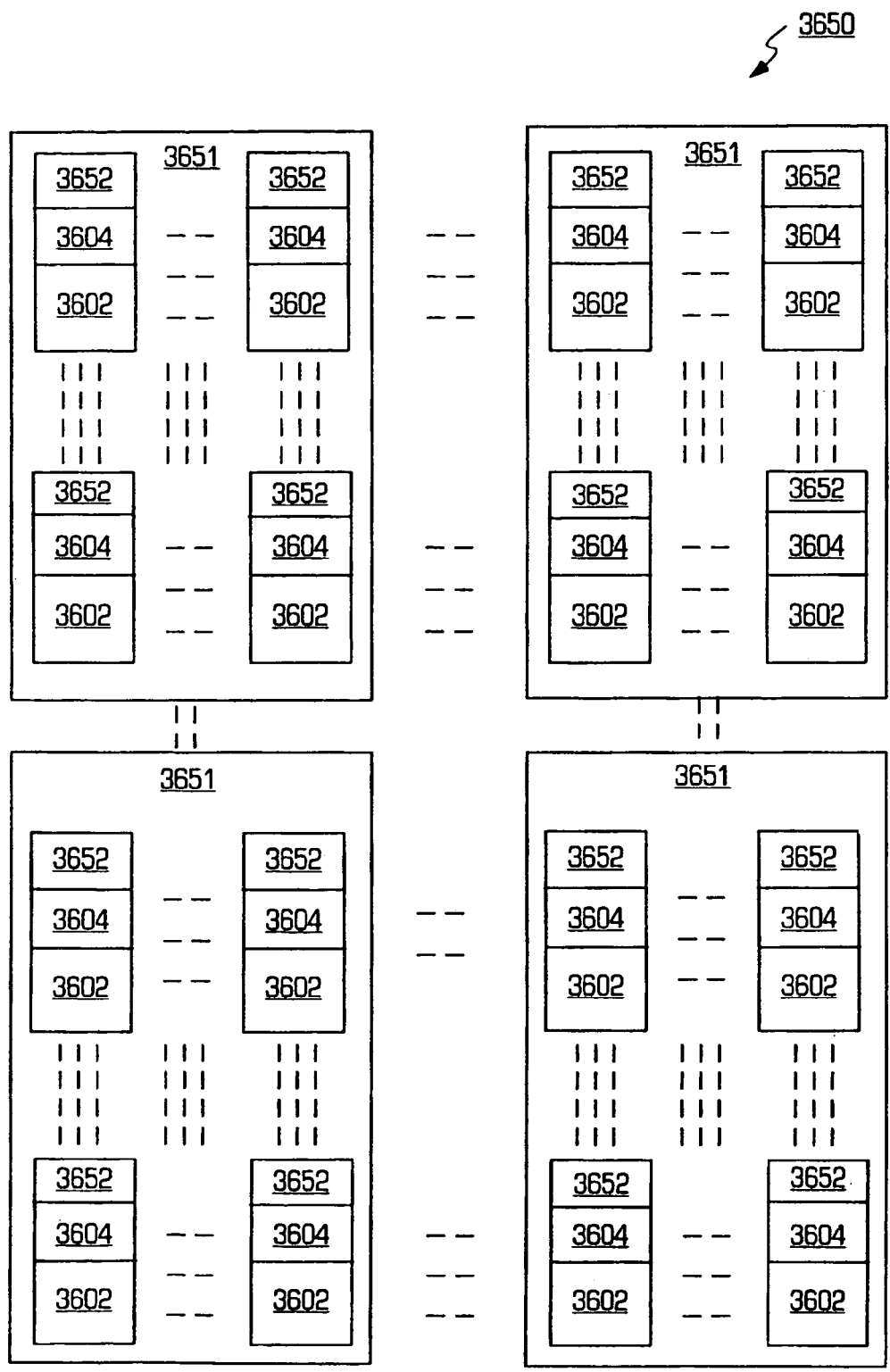
FIG. 36A is a block diagram illustrating a memory system for a multilevel memory including local autozero sense amplifiers.

FIG. 36A is a block diagram illustrating a memory system 3650 for a multilevel memory including local autozero sense amplifiers.

The memory system 3650 is similar to memory system 3600, but it does not include the global sense amplifiers

3606. In this case, memory subarrays 3651 are similar to the memory subarrays 3601 without the global sense amplifiers 3606, but include buffers 3652 that are disposed locally right after the local sense amplifier 3604 to drive a global bus (not shown) coupled between a sensed and amplified output of the buffer 3652 to global latches (not shown) or output buffers (not shown). This architecture may be most realizable for highest speed. Alternatively, the latches instead of global latches may be disposed locally next to the local sense amplifier 3604.

The memory subarrays 3602 of FIGS. 36 and 36A may be segmented arrays. The memory subarray 3602 may include status cells disposed in a separate row or rows or same row which indicates status of the subarray/row such as it is used for data or code storage, whether the subarray/row is at erase or program state, whether the subarray/row is good, not-so-good or bad condition, a number of bad cells in a subarray/row, or degree of cell storage level wearing, or operational status such as bias values for erase/program/read bias for each row or page. The memory subarray 3602 may include reference cells disposed in a separate row or rows, which are enabled when a data row is enabled in a verify or a read mode.

The memory subarray 3602 may include reference cells that are read for each page, such as described above, or for each segment.

Figure 44:
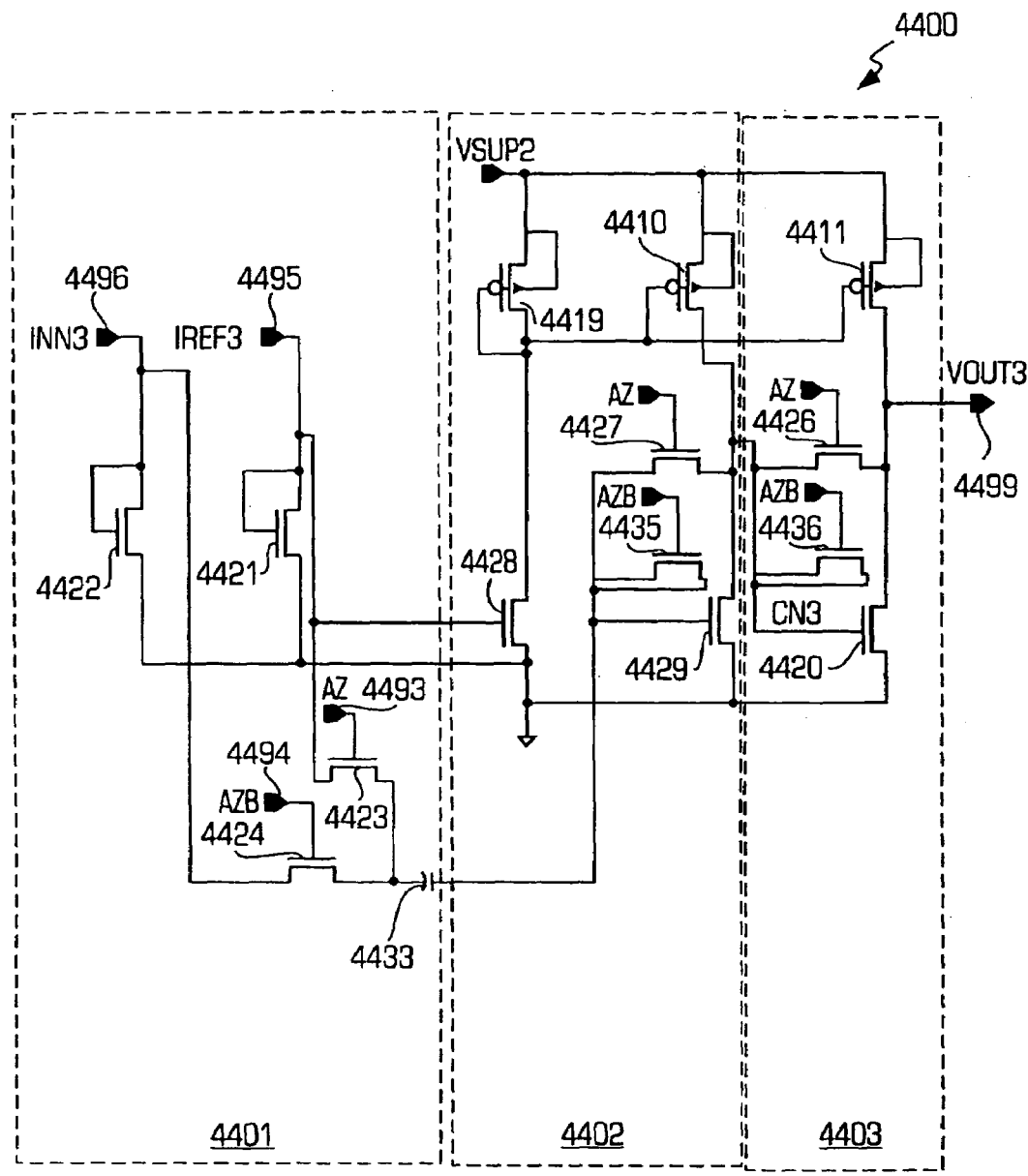
FIG. 44 is a block diagram illustrating a two-stage indirect current sense amplifier having autozero.
Figure 45:
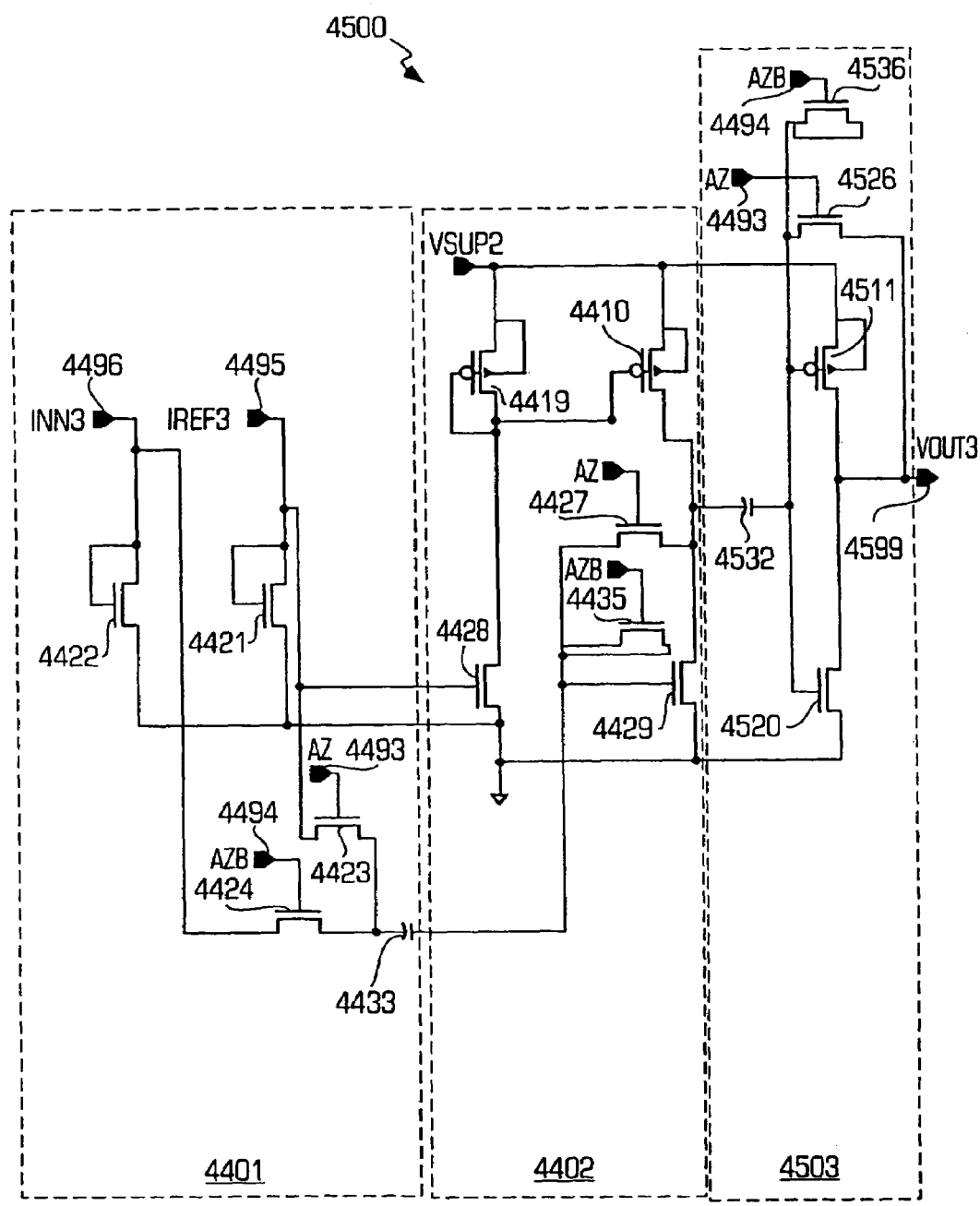
FIG. 45 is a block diagram illustrating a two-stage indirect current sense amplifier having autozero.

The local current sense amplifier 3604 may be a current sense amplifier 4000 (FIG. 40), the current sense amplifier 4100 (FIG. 41), the two-stage current sense amplifier 4200 (FIG. 42), a two-stage current sense amplifier 4300 (FIG. 43), a two-stage indirect current sensing amplifier 4400 (FIG. 44), and a two-stage indirect current sensing amplifier 4500 (FIG. 45).

Figure 37:
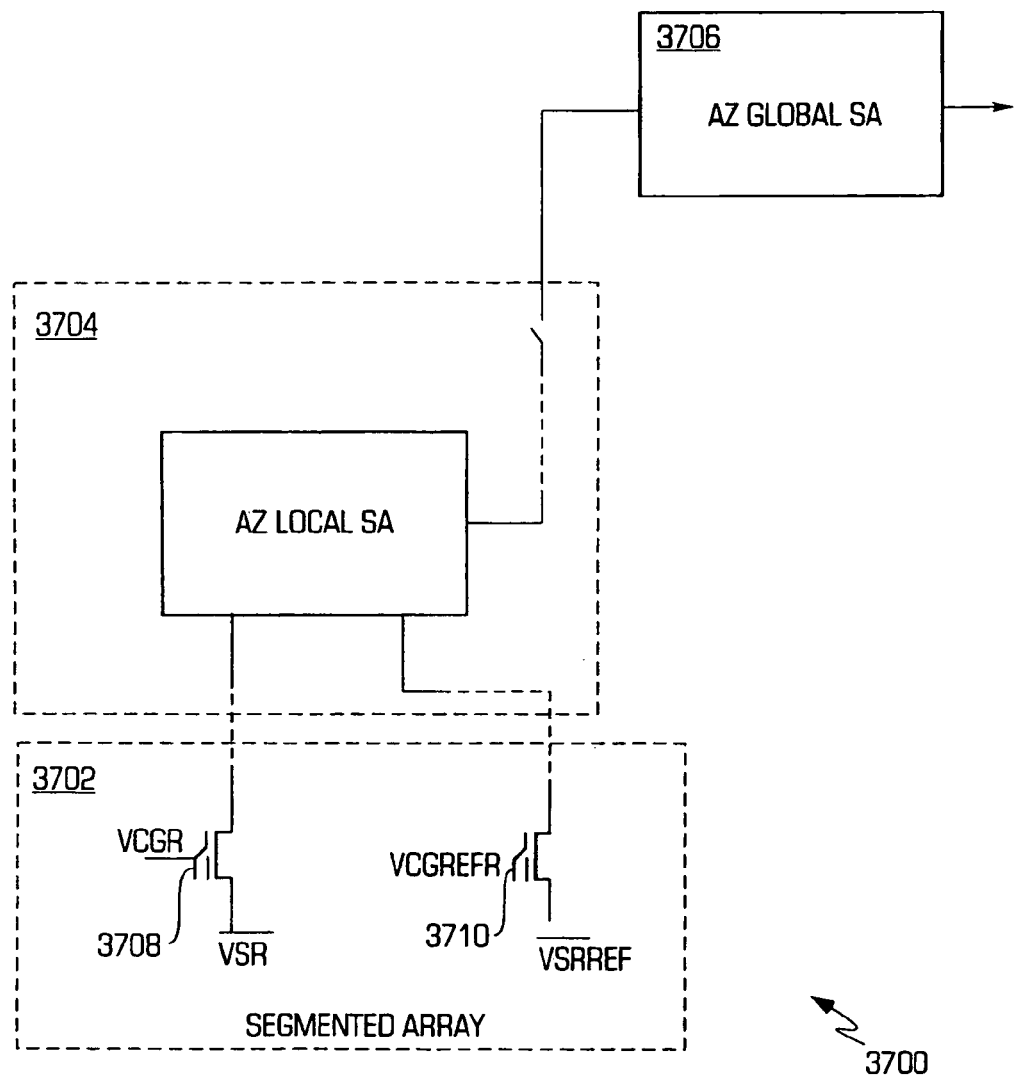
FIG. 37 is a block diagram illustrating a memory system including single ended autozero sense amplifiers.

FIG. 37 is a block diagram illustrating a memory system 3700 including single ended autozero sense amplifiers.

A memory system 3700 comprises a plurality of segmented arrays 3702, a plurality of autozero local sense amplifiers 3704, and a plurality of autozero global sense amplifiers 3706. The memory system 3700 may be arranged in a manner similar to the memory system 3600 described above. For clarity, FIG. 37 shows only one segmented array 3702, one autozero local sense amplifier 3704, and one autozero global sense amplifier 3706. The segmented array 3702 comprises a plurality of data memory cells 3708 and a plurality of reference memory cells 3710. For clarity only one data memory cell 3708 and one reference memory cell 3710 are shown. The data cells 3708 and the reference memory cells 3710 are coupled to the corresponding autozero local sense amplifier 3704 for sensing the content of the data memory cell 3708 in comparison with the reference memory cell 3710. The autozero local sense amplifier 3704 may be, for example, one of the sense amplifiers described below in conjunction with FIGS. 40 through 45. The autozero local sense amplifier and the autozero global sense amplifier are single ended amplifiers.

In another embodiment, the autozero local sense amplifier 3704 may be a current sensing autozero sense amplifier, and the autozero global sense amplifier 3706 may be a voltage sensing autozero sense amplifier, such as described above. In another embodiment, the autozero local sense amplifier 3704 may be a current sensing autozero sense amplifier, and the autozero global sense amplifier 3706 may be a current sensing autozero sense amplifier. In another embodiment, the autozero local sense amplifier 3704 may be a voltage sensing autozero sense amplifier, and the autozero global autozero sense amplifier 3706 may be a current sensing autozero sense amplifier.

Figure 38:
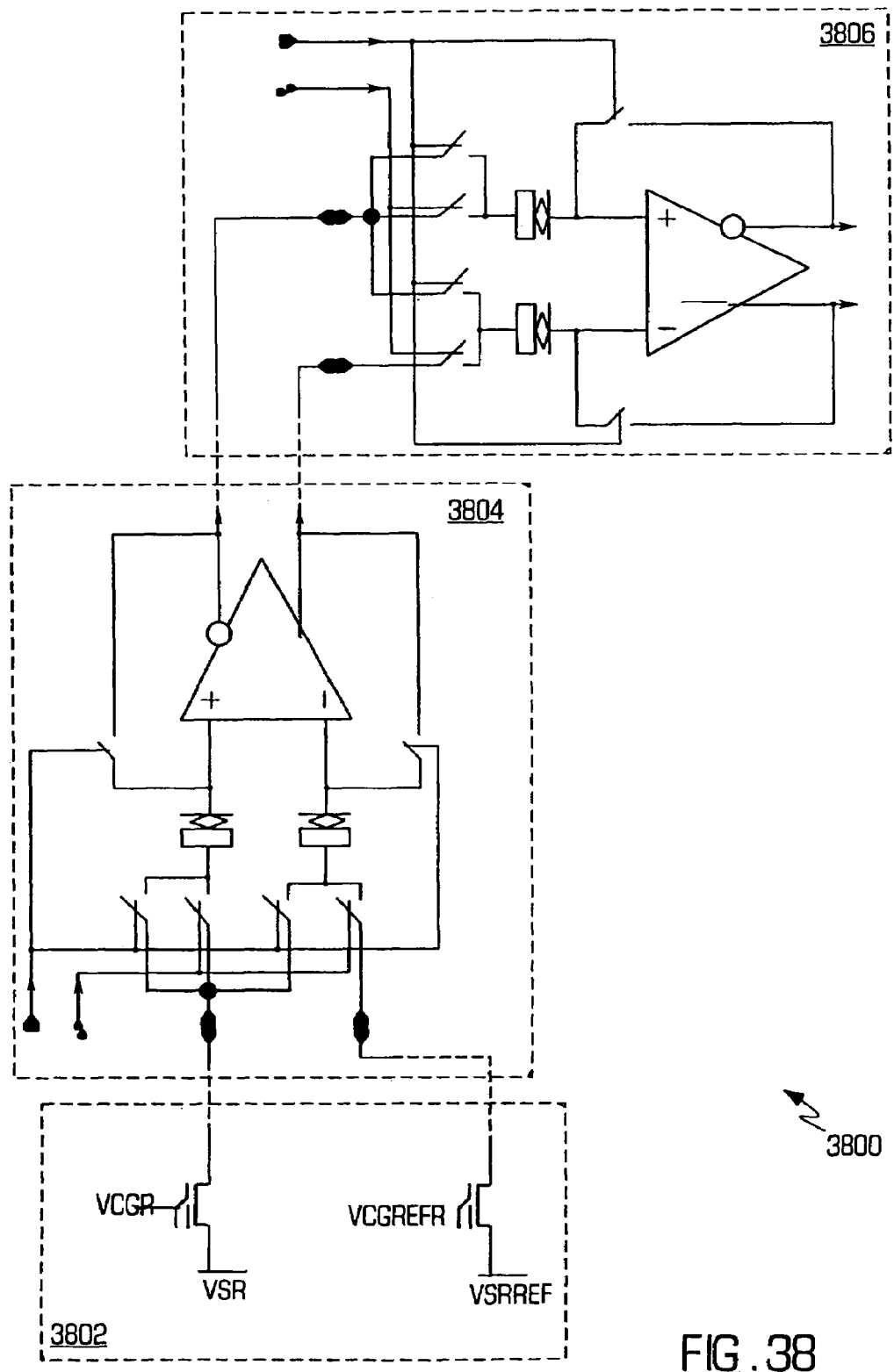
FIG. 38 is a block diagram illustrating a memory system including differential autozero sense amplifiers.

FIG. 38 is a block diagram illustrating a memory system 3800 including differential autozero sense amplifiers.

The memory system 3800 comprises a plurality of segmented memory arrays 3802, a plurality of local autozero sense amplifiers 3804, and a plurality of global sense amplifiers 3806. For clarity, FIG. 38 shows only one segmented memory array 3802, one autozero local sense amplifier 3804, and one autozero global sense amplifier 3806. The memory system 3800 may be arranged in a manner similar to the memory systems 3600 and 3700, except that the autozero local sense amplifier 3804 and the autozero global sense amplifier 3806 may include a differential autozero sense amplifier such as the global sense amplifier 3400 described above in conjunction with FIG. 34. In another embodiment, the memory system 3800 does not include a global sense amplifier 3806. In this case, a differential to single ended output and buffered stage may be coupled locally right after the local sense amplifier 3804 to drive a global bus (not shown) coupled between from a sensed and amplified output of the buffered stage to global latches (not shown) or output buffers (not shown).

Figure 39:
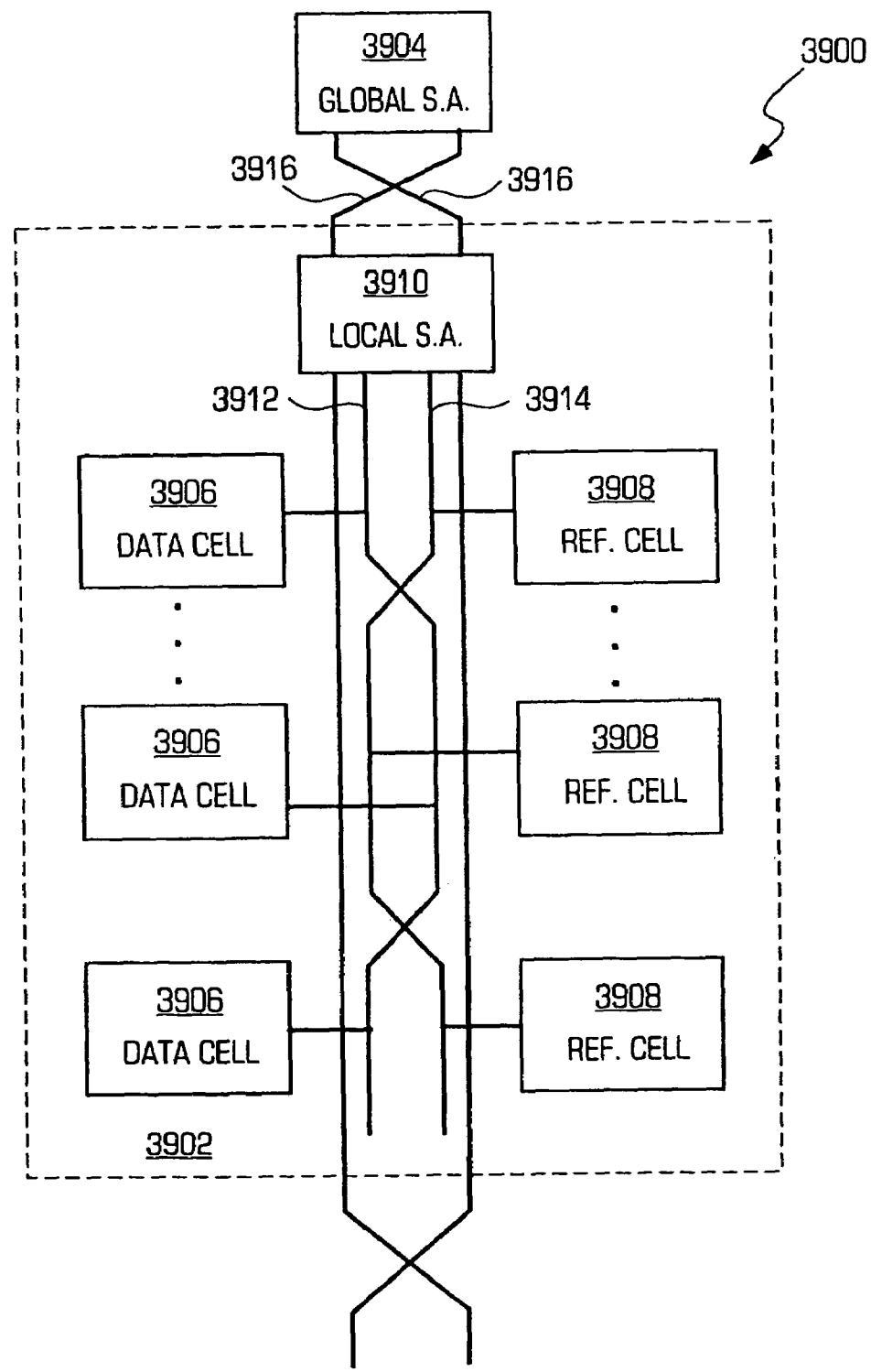
FIG. 39 is a block diagram illustrating a memory system including crossed bitlines.

FIG. 39 is a block diagram illustrating a memory system 3900 including crossed bitlines.

The memory system 3900 comprises a plurality of memory arrays 3902, and a plurality of global sense amplifiers 3904. For clarity and simplicity, only one memory array 3902 and one global sense amplifier 3904 are shown. The memory 3902 comprises a plurality of data cells 3906, a plurality of reference cells 3908 and a plurality of local sense amplifiers 3910. For clarity and simplicity, only one column of data cells 3906, one column of reference cells 3908, and one local sense amplifier 3910 are shown. A data bitline 3912 couples a column of data cells 3906 to the local sense amplifier 3910. A reference bitline 3914 couples a column of reference cells 3908 to the local sense amplifier 3910. The local sense amplifier 3910 is coupled to the global sense amplifier 3904. The data bitline 3912 and the reference bitline 3914 are disposed in a crossed configuration with the bitlines 3912 and 3914 being disposed so the signal path goes back and forth between the physical location of the columns of data cells 3906 and reference cells 3908. Crossing may provide similar electrical characteristics as a twisted wire pair. A global bitline 3916 couples the global sense amplifier 3904 to the local sense amplifier 3910. Global bitlines 3916 may be arranged in a crossed configuration. One bitline 3912 or 3914 may be crossed in the same metal while the other bitline makes a crossing jump by another metal line, a poly line, or a diffusion over the first bitline.

In another embodiment, the local sense amplifiers 3910 and the global sense amplifiers 3904 may use the sense amplifiers described below in conjunction with FIGS. 40–48.

Figure 40:
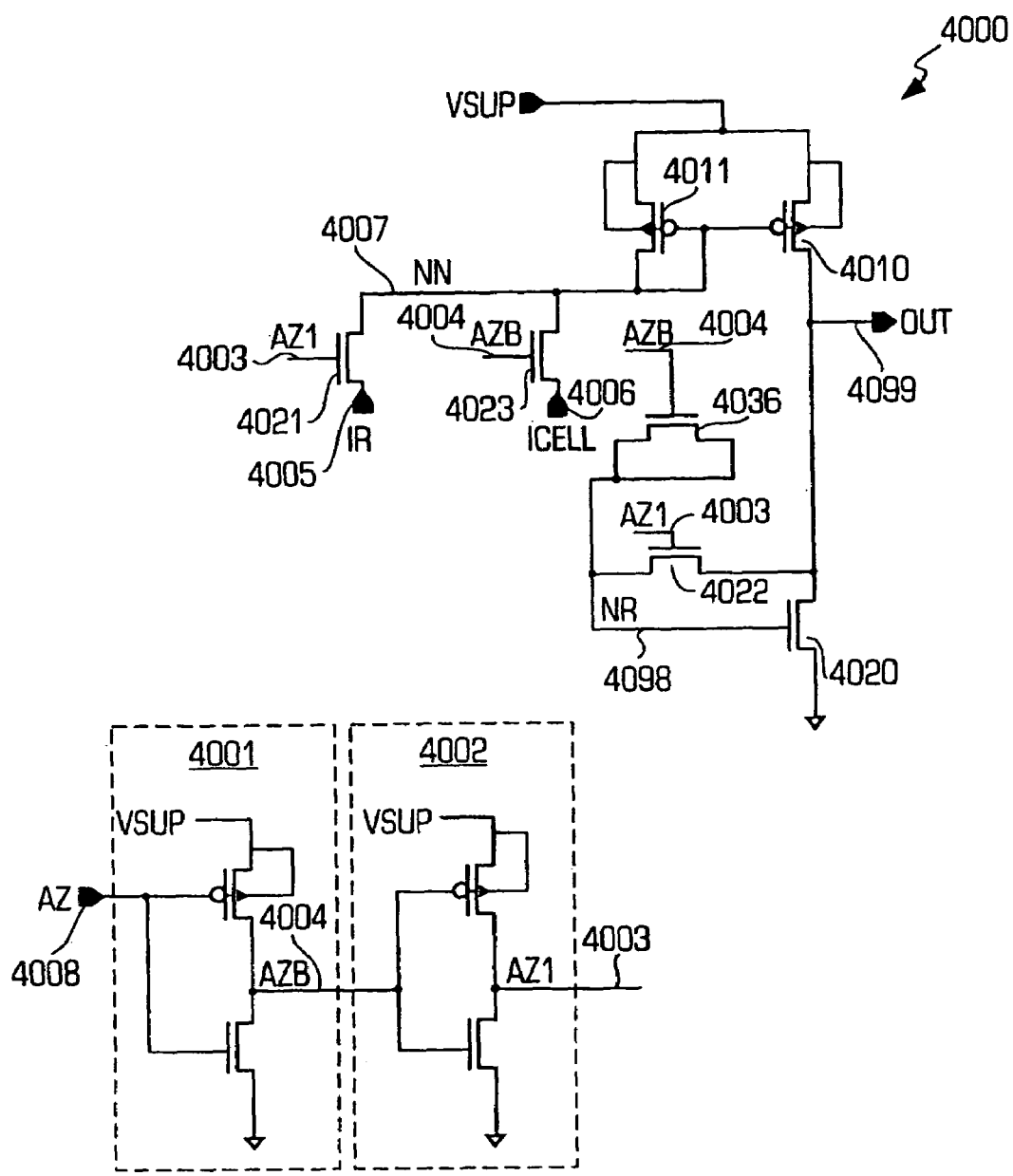
FIG. 40 is a block diagram illustrating a current sense amplifier including an autozero.

FIG. 40 is a block diagram illustrating a current sense amplifier 4000 including auto-zero.

The current sense amplifier 4000 uses autozero or equalization to equalize voltages on an output terminal 4099 and a node 4098 that stores a voltage corresponding to the current on a reference cell bitline (IR) 4005 so that the signal path through the current sense amplifier 4000 is similar for both the data cell bitline (ICELL) 4006 and the reference cell bitline (IR) 4005. The current sense amplifier 4000 may be used in the autozero local sense amplifier 3704 of FIG. 37.

The current sense amplifier 4000 comprises a plurality of inverters 4001 and 4002, a plurality of PMOS transistors 4010 and 4011, a plurality of NMOS transistors 4020 through 4023, and a charge cancellation injection circuit 4036.

The NMOS transistors 4021 and 4023 are arranged as a switch to selectively couple the reference cell bitline (IR) 4005 or the data cell bitline (ICELL) 4006 to a first node 4007. The drain-source terminals of the NMOS transistor 4021 couple the reference cell bitline (IR) 4005 to the first node 4007 in response to a first autozero selection signal 4003 applied to a gate of the NMOS transistor 4021. The drain-power terminals of the NMOS transistor 4023 couple the data cell bitline (ICELL) 4006 to the first node 4007 in response to a second autozero selection signal 4004 applied to a gate of the NMOS transistor 4023. In another embodiment, PMOS transistors (not shown) may be coupled in parallel to the NMOS transistors 4021 and 4023 and controlled by the second autozero selection signal 4004 and the first autozero selection signal 4003, respectively.

The inverters 4001 and 4002 are coupled in series to generate the second autozero selection signal 4004 and the first autozero selection signal 4003, respectively, in response to an autozero control signal 4008 applied to the input of the inverter 4001. In one embodiment, the timing of the generation of the first and second autoselection signals 4003 and 4004, respectively, causes the NMOS transistors 4021 and 4023 operating as switches to break before make.

The drain-source terminals of the diode connected PMOS transistor 4011 couple a supply voltage VSUP to the first node 4007 to generate a current indicative of the voltage on the first node 4007 and correspondingly indicative of the voltage in the respective data memory cell or reference memory cell.

The drain-source terminals of the PMOS transistor 4010 and the NMOS transistor 4020 are coupled in series between the supply voltage and ground to form an output terminal 4099 formed of the common node of the drains of the transistors 4010 and 4020. The gate of the PMOS transistor 4010 is coupled to the common node of the gate and drain of the PMOS transistor 4011 to form a current mirror with the PMOS transistor 4011.

The NMOS transistor 4022 is arranged as a switch to selectively couple the voltage on the common node formed of the output terminal 4099 and the drain terminals of the transistors 4010 and 4020 to a second node 4098 in response to the first autozero selection signal 4003. When the voltage on the output terminal 4099 is coupled to the second node 4098, the voltage on the second node 4098 is indicative of the voltage on the first node 4007, which corresponds to the data cell plus any offset through the data path and the sense amplifier 4000. The drain-source terminals of the NMOS transistor 4022 couple the drain of the NMOS transistor 4020 to the common node formed of the second node 4098 and the gate of the NMOS transistor 4020 to diode connect the NMOS transistor 4020 in response to the first autozero selection signal 4003 applied to the gate of the NMOS transistor 4022.

In another embodiment, a capacitor (not shown) is coupled between the second node 4098 and ground to store charge indicative of the reference memory cell current.

The charge injection cancellation circuit 4036 provides charge injection cancellation caused by the NMOS transistor 4022 switching. The charge injection cancellation circuit 4036 may be an NMOS transistor arranged as a capacitor coupled between the source of the NMOS transistor 4022 and the second autozero selection signal 4004. In one embodiment, the NMOS transistor 4036 is one-half the size of the NMOS transistor 4022. In another embodiment, the drain-source terminals of a PMOS transistor (not shown) may be coupled between the drain-source terminals of the NMOS transistor 4022.

As an overview, the NMOS transistors 4021 and 4023 selectively couple the reference memory cell line (IR) 4005 and the data memory cell (Icell) 4006 to the first node 4007 in response to the first and second autozero selection signals 4003 and 4004, respectively. The data from the reference memory cell line 4005 and the data memory cell line 4006 may be mismatched, but after the data reaches the first node 4007, the current sense amplifier 4000 provides a similar path to eliminate mismatch of the signals from the data memory cell and the reference memory cell when they are compared. The reference level of the reference memory cell is first converted from a current to a voltage and a corresponding voltage is stored on the second data node 4098 and then the data cell is read by applying the current to the first node 4007 and comparing to the reference memory cell stored on the second node 4098 to produce an output signal on the output terminal 4099 indicative of the difference in the voltage on the first node 4007 and the second node 4098 to indicate the difference between the data memory cell and the reference voltage from the reference memory cell.

During a first operation, the current sense amplifier 4000 is operated to store a voltage on the second node 4098 indicative of the reference bitline (IR) 4005. The first autozero selection signal 4003 is set to an enable state, and the second autozero selection signal 4004 is correspondingly set to the disabled state. When the first autozero selection signal 4003 is enabled, the NMOS transistors 4021 and 4022 are turned on. The NMOS transistor 4021 applies the reference current (IR) to the first node 4007 which is applied to the PMOS transistor 4011. The PMOS transistor 4010 mirrors the current from the PMOS transistor 4011. The NMOS transistor 4020 is diode connected because the enabled NMOS transistor 4022 shorts the output terminal to the second node 4098. The voltage on the second node 4098 sustains the current in the PMOS transistor 4010 and the NMOS transistor 4020. The voltage on the second node 4098 corresponds to the reference memory cell current IR plus any offset between the PMOS transistors 4011 and 4010, hence the current in the PMOS transistor 4010 corresponds to the reference memory cell current IR but not necessarily exactly due to any mismatch between the PMOS transistors 4010 and 4011.

During the second operation, the first autozero selection signal 4003 is disabled and the second autozero selection signal 4004 is enabled, to connect the data cell to the first node 4007. The NMOS transistor 4023 is turned on and the NMOS transistors 4021 and 4022 are turned off. The NMOS transistor 4023 provides the data cell current ICELL to the PMOS transistor 4011, which the PMOS transistor 4010 mirrors. The PMOS transistor 4010 compares this current to the current from the NMOS transistor 4020 generated in response to the voltage on the second node 4098. The output voltage VOUT on the output terminal 4099 is the current difference between the two currents multiplied by the output impedance looking into the PMOS transistor 4010 and the NMOS transistor 4020. In biased voltage range, the output impedance is the drain-source resistance of the PMOS transistor 4010 in parallel with the drain-source resistance of the NMOS transistor 4020.

Figure 41:
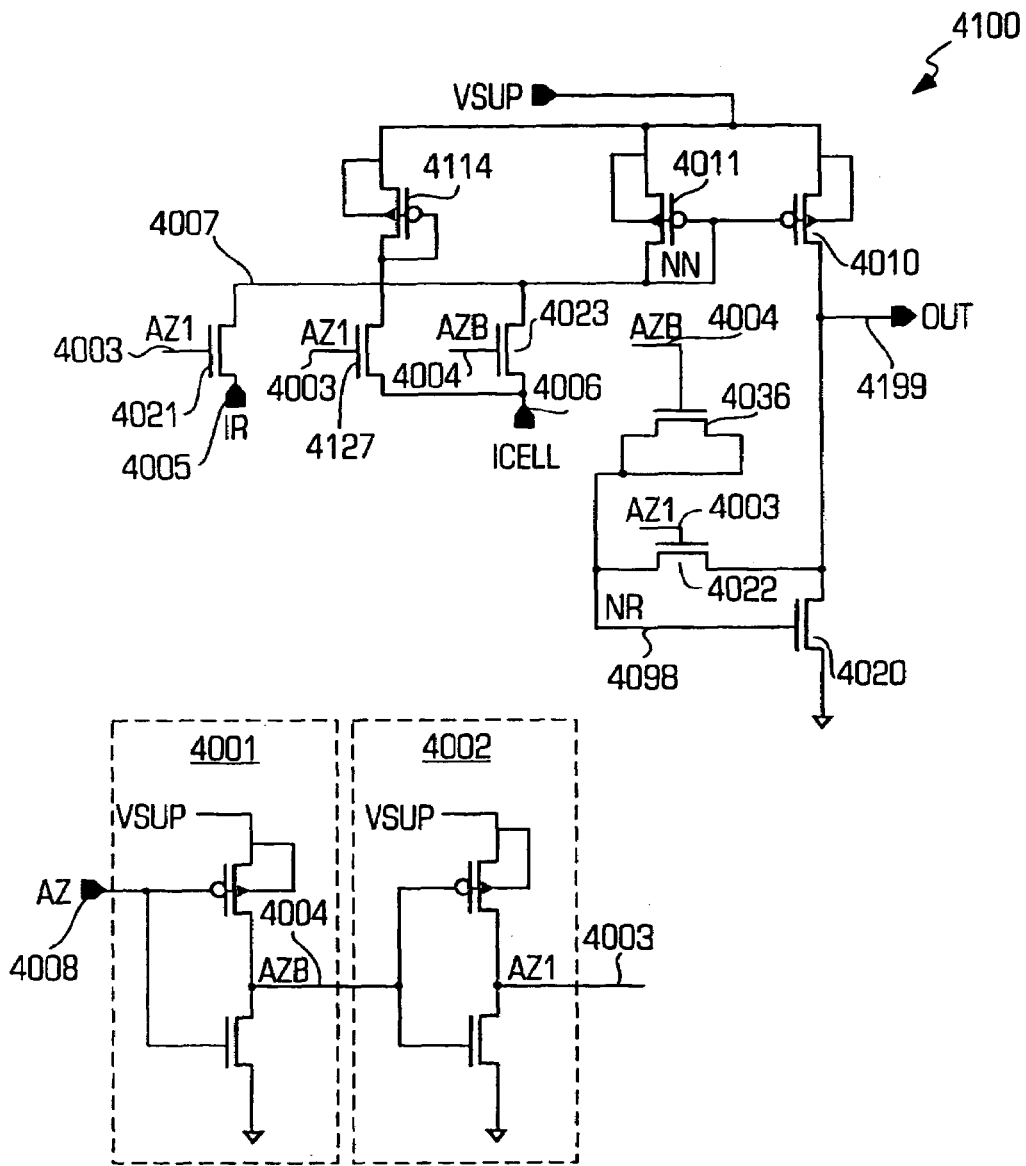
FIG. 41 is a block diagram including a current sense amplifier including autozero and replica loading.

FIG. 41 is a block diagram illustrating a current sense amplifier 4100 including autozero and replica loading.

The current sense amplifier 4100 is similar to the current sense amplifier 4000, and includes a replica loading circuit comprising a PMOS transistor 4114 and an NMOS transistor 4127 that are arranged to precharge the data cell reference line (ICELL) 4006. Like numbers represent like elements.

The current sense amplifier 4100 may be used in the autozero sense amplifier 3704 of FIG. 37.

The drain-source terminals of the diode connected PMOS transistor 4114 and the NMOS transistor 4127 are coupled in series between the supply voltage Vsup and the data memory cell line (ICELL) 4006. The NMOS transistor 4127 is enabled by the first autozero selection signal 4003 applied to the gate thereof. The transistors 4114 and 4127 replicate the loading of the transistors 4011 and 4021. In one embodiment, the PMOS transistor 4114 is the same size as the PMOS transistor 4011. Likewise, the NMOS transistor 4127 is the same size as the NMOS transistor 4021.

When the first autozero selection signal 4003 is enabled, both the NMOS transistors 4021 and 4127 are enabled. The first node 4007 is brought to the level of the reference memory cell line (IR) 4005 as described above, and the data cell line (ICELL) 4006 is precharged. After the second autozero selection signal 4004 is enabled, the NMOS transistor 4127 is disabled and the first node 4007 is brought to the data cell reference as described above, but at a faster speed because of the precharge.

Figure 42:
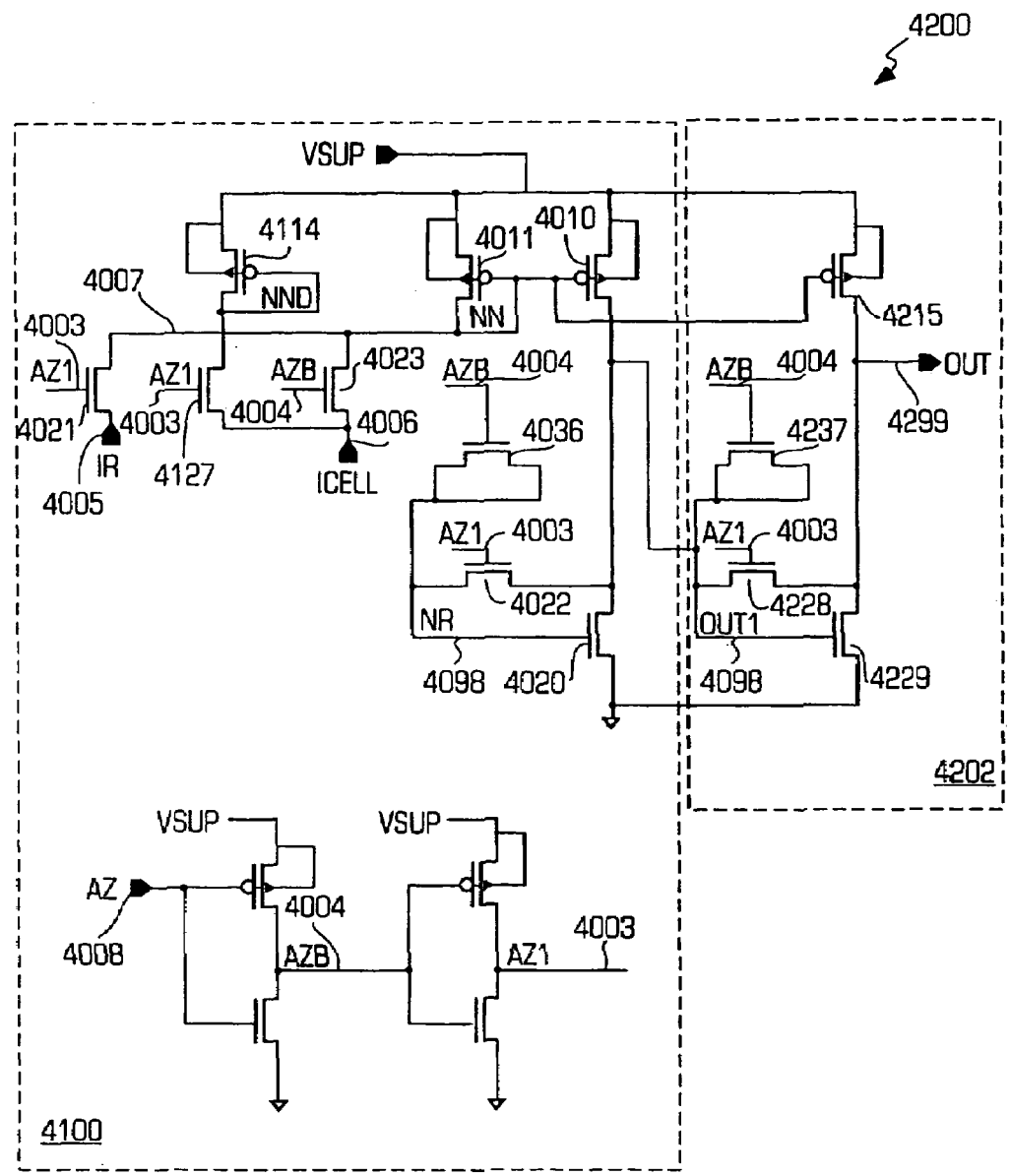
FIG. 42 is a block diagram illustrating a two-stage current sense amplifier including autozero.

FIG. 42 is a block diagram illustrating a two stage current sense amplifier 4200 including autozero.

The two-stage current sense amplifier 4200 is similar to the current sense amplifier 4100 of FIG. 41, but also includes an output stage. The output stage is autozeroed or equalized to the output of the current sense amplifier 4100 during a first operation. The two-stage current sense amplifier 4200 may be used in the autozero sense amplifier 3704 of FIG. 37.

The two stage current sense amplifier 4200 comprises a current sense amplifier 4100 and an output stage 4202.

The output stage 4202 compares or amplifies the output of the current sense amplifier 4100. The output stage 4202 comprises a PMOS transistor 4215, NMOS transistors 4228 and 4229, and a charge injection cancellation circuit 4237. The drain-source terminals of the PMOS transistor 4215 and the NMOS transistor 4229 are coupled in series between the supply voltage and ground, and form an output terminal 4299 at a common node formed of the drains of the transistors 4215 and 4229. The gate of the PMOS transistor 4215 is coupled to the gate of the PMOS transistor 4010 for biasing that is the same as the same autozero bias condition. The gate of the NMOS transistor 4229 is biased by the output 4199 of the current sense amplifier 4100. The drain-source terminals of the NMOS transistor 4228 diode connect the NMOS transistor 4229 in response to the first autozero selection signal 4003. In one embodiment, the transistors 4215, 4229, and 4228 are similar to respective transistors 4010, 4020, and 4022 to increase gain and speed. The charge injection cancellation circuit 4237 may be an NMOS transistor arranged as a capacitor coupled between the source of the NMOS transistor 4228 and the second autozero selection signal 4004. In one embodiment, the NMOS transistor of the charge injection cancellation circuit 4237 is similar to the charge injection cancellation circuit 4036.

In an alternative embodiment, a decoupling capacitor (not shown) may be coupled between the output of the current sense amplifier 4100 and the common node formed of the gate of the NMOS transistor 4229, the source of the NMOS transistor 4228 and the charge injection cancellation circuit 4237.

Figure 43:
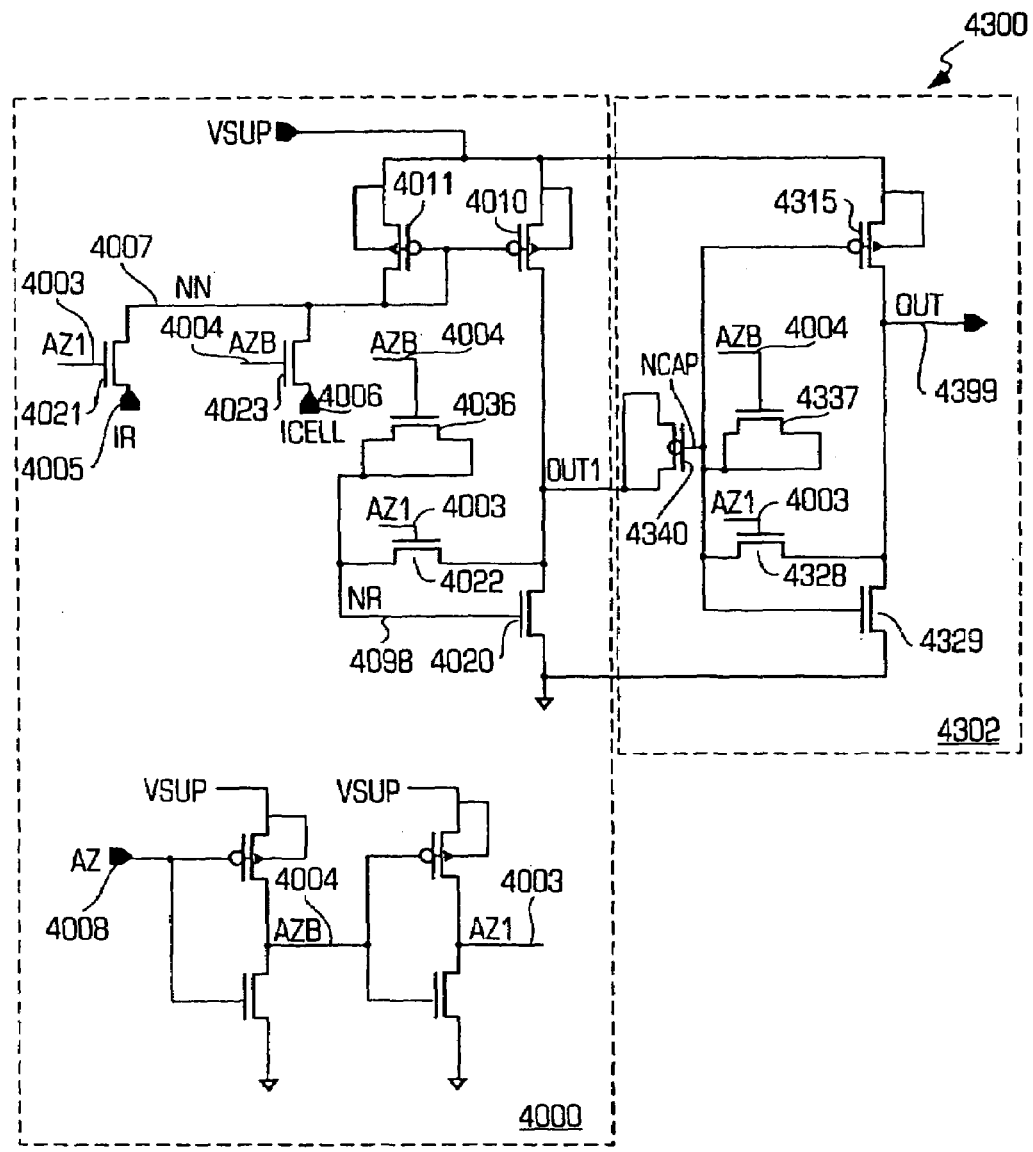
FIG. 43 is a block diagram illustrating a two-stage current sense amplifier including autozero.

FIG. 43 is a block diagram illustrating a two-stage current sense amplifier 4300 including autozero.

The two-stage current sense amplifier 4300 is similar to the current sense amplifier 4000 of FIG. 40, but also includes an output stage. The output stage is autozeroed or equalized to the output of the current sense amplifier 4000 during a first operation. The two-stage current sense amplifier 4300 may be used in the autozero local sense amplifier 3704 of FIG. 37.

The two-stage current sense amplifier 4300 comprises the current sense amplifier 4000 and an output stage 4302.

The output stage 4302 inverts and amplifies the output signal from the current sense amplifier 4000. The output stage 4302 comprises a PMOS transistor 4315, NMOS transistors 4328 and 4329, a charge injection cancellation circuit 4337, and a capacitor 4340. The drain-source terminals of the PMOS transistor 4315 and the NMOS transistor 4329 are coupled in series between the supply voltage and ground, and form an output terminal 4399 at the common node formed of the drains of the transistors 4315 and 4329. The gates of the transistors 4315 and 4329 are coupled together to form an inverter of the transistors 4315 and 4329. The drain-source terminals of the NMOS transistor 4328 diode connect the NMOS transistor 4329 in response to the first autozero selection signal 4003. The charge injection cancellation circuit 4337 may be an NMOS transistor arranged as a capacitor coupled between the source of the NMOS transistor 4328 and the second autozero selection signal 4004. The capacitor 4340 is coupled between the output 4099 of the current sense amplifier 4000 and the common node formed of the gates of the transistors 4315 and 4329, the source of the NMOS transistor 4328 and the charge injection cancellation circuit 4337. The capacitor 4340 decouples the output stage 4302 from the current sense amplifier 4000.

In an alternative embodiment, the gate of the PMOS transistor 4315 may be coupled to the PMOS transistor 4010.

FIG. 44 is a block diagram illustrating a two-stage indirect current sensing amplifier 4400 having autozero.

The two-stage indirect current sensing amplifier 4400 may be used in the autozero local sense amplifier 3704 of FIG. 37.

The two-stage indirect current sensing amplifier 4400 comprises an indirect current input stage 4401, an indirect current sense amplifier 4402, and an output stage 4403. The indirect current input stage 4401 selectively switches between a reference memory cell bitline (IREF) 4495 and a data memory cell bitline (ICELL) 4496. In a first operation, the indirect current input stage 4401 stores a voltage corresponding to the current on the reference memory cell bitline (IREF) 4495 and any offset in the circuit. The two-stage indirect current sensing amplifier 4400 autozeroes or equalizes the output of the indirect current sense amplifier 4402 and the output of the output stage 4403 with the stored voltage. During a second operation, the indirect current input stage 4401 couples the data memory cell bitline (ICELL) 4496 to an input of the indirect current sense amplifier 4402 for comparison with the reference current on the reference memory cell bitline (IREF) 4495 as adjusted by the stored voltage in the indirect current input stage 4401. The indirect current sense amplifier 4402 amplifies the voltage difference, which is further amplified by the output stage 4403.

The indirect current input stage 4401 comprises a plurality of NMOS transistors 4421 through 4424 and a capacitor 4433. The indirect current sense amplifier 4402 comprises a plurality of PMOS transistors 4410 and 4419, a plurality of NMOS transistors 4427 through 4429, and a charge injection cancellation circuit 4435. The output stage 4403 comprises a PMOS transistor 4411, a plurality of NMOS transistors 4420 and 4426, and a charge injection cancellation circuit 4436.

The diode connected NMOS transistor 4421 couples the reference memory cell bitline (IREF) 4495 to ground. The reference memory cell bitline (IREF) 4495 is coupled to the gate of the NMOS transistor 4428 for providing a reference bias and also is coupled to the drain of the NMOS transistor 4423 for selective switching to the capacitor 4433 in response to a first autozero selection signal 4493.

The diode connected NMOS transistor 4422 couples the data memory cell bitline (ICELL) 4496 to ground. The data memory cell bitline (ICELL) 4496 is coupled to the drain of the NMOS transistor 4424 for selective switching to the capacitor 4433 in response to a second autozero selection signal 4494.

The drain-source terminals of the diode connected PMOS transistor 4419 and the NMOS transistor 4428 are coupled in series between the supply voltage VSUP and ground to provide a reference current in response to the reference bias applied to the gate of the NMOS transistor 4428 by the reference memory cell bitline (IREF) 4495. The drain-source terminals of the PMOS transistor 4410 and the NMOS transistor 4429 are coupled in series between the supply voltage VSUP and ground. The gate of the PMOS transistor 4410 is coupled to the common node formed of the gate and drain of the PMOS transistor 4419 to form a current mirror with the PMOS transistor 4419. The drain-source terminals of the NMOS transistor 4427 diode connect the NMOS transistor 4429 in response to being enabled by the first autozero selection signal 4493. The charge injection cancellation circuit 4435 is coupled to the source of the NMOS transistor 4427 to provide charge injection cancellation in response to the second autozero selection signal 4494. The charge injection cancellation circuit 4435 may be an NMOS transistor arranged as a capacitor coupled between the source of the NMOS transistor 4427 and the second autozero selection signal 4494.

In the output stage 4403, the drain-source terminals of the PMOS transistor 4411 and the NMOS transistor 4420 are coupled in series between the supply voltage VSUP and ground, and the drains of the transistors 4411 and 4420 form an output terminal 4499. The gate of the PMOS transistor 4411 is coupled to the common node formed of the gate and drain of the PMOS transistor 4419 to form a current mirror with the PMOS transistor 4419. The drain-source terminals of the NMOS transistor 4426 diode connect the NMOS transistor 4420 and couple the output 4459 of the indirect current sense amplifier 4402 to the output terminal 4499 of the output stage 4403 in response to being enabled by the first autozero selection signal 4493. The charge injection cancellation circuit 4436 is coupled to the source of the NMOS transistor 4426 to provide charge injection cancellation in response to the second autozero selection signal 4494. The charge injection cancellation circuit 4436 may be an NMOS transistor arranged as a capacitor coupled between the source of the NMOS transistor 4426 and the second autozero selection signal 4494.

During the first operation, the first autozero selection signal 4493 is enabled, and the transistors 4423, 4427, and 4426 are enabled to couple the reference memory cell bitline (IREF) 4495 to the capacitor 4433 which stores the voltage corresponding to the current on the reference memory cell bitline (IREF) 4495 and any offset in the circuit, and couples the voltage to the output of the indirect current sense amplifier 4402 and the output 4499 of the output stage 4403. During a second operation, the second autozero selection signal 4494 is enabled, which enables the NMOS transistor 4424 to couple the data memory cell bitline (ICELL) 4496 to the capacitor 4433, which is compared to the stored voltage. The indirect current sense amplifier 4402 amplifies the voltage difference, which is further amplified by the output stage 4403.

The mismatch between the NMOS transistors 4421 and 4422 may not be cancelled in the two-stage indirect current sense amplifier 4400.

FIG. 45 is a block diagram illustrating a two-stage indirect current sensing amplifier 4500 having autozero.

The two-stage indirect current sensing amplifier 4500 is similar to the indirect current sensing amplifier 4400, but instead includes an inverter arranged output stage. The output stage is autozeroed or equalized to the output of an indirect current sense amplifier during a first operation. The two-stage indirect current sensing amplifier 4500 may be used in the autozero local sense amplifier 3704 of FIG. 37.

The two-stage indirect current sense amplifier 4500 comprises an indirect current input stage 4401, an indirect current sense amplifier 4402 and an output stage 4503. The output stage 4503 comprises a PMOS transistor 4511, a plurality of NMOS transistors 4520 and 4526, a capacitor 4532, and a charge injection cancellation circuit 4536. The transistors 4511 and 4520 are arranged as an inverter gain stage with self bias. The drain-source terminals of the PMOS transistor 4511 and the NMOS transistor 4520 are coupled in series between the supply voltage VSUP and ground, and include gates coupled to each other. The drains of the transistors 4511 and 4520 form an output node 4599. The capacitor 4532 couples the output of the indirect current sense amplifier 4402 to the common node formed of the gates of the transistors 4511 and 4520 to decouple the indirect current sense amplifier 4402 and the output stage 4503. The drain-source terminals of the NMOS transistor 4526 couple the output terminal of the output stage 4503 to the common node formed of the gates of the transistors 4511 and 4520 in response to the first autozero selection signal 4493. The charge injection cancellation circuit 4536 is coupled to the source of the NMOS transistor 4526 in response to the second autozero selection signal 4494. The charge injection cancellation circuit 4536 may be an NMOS transistor arranged as a capacitor coupled between the source of the NMOS transistor 4526 and the second autozero selection signal 4494.

The memory system 3700 of FIG. 37 may be configured to operate at low voltages, e.g. 0. to 1.2 volts. The local sense amplifier 3706 may include a readout circuit that operates to read multilevel memory cells in this voltage range, such as described below in conjunction with FIGS. 46–48.

Figure 46:
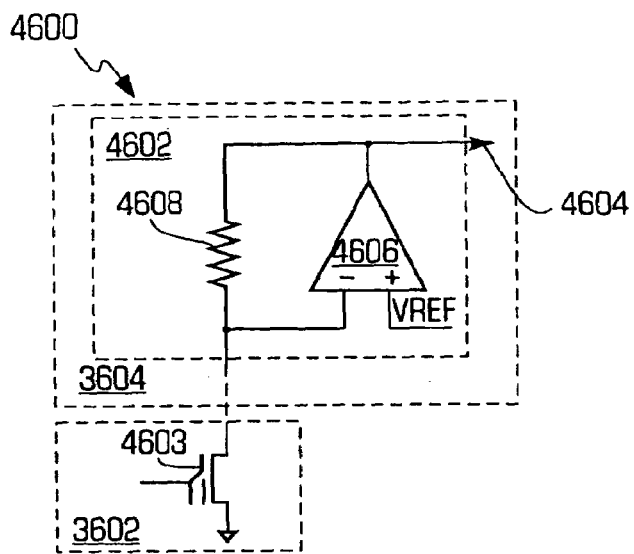
FIG. 46 is a block diagram illustrating a memory system including a low voltage sense amplifier.

FIG. 46 is a block diagram illustrating a memory system 4600 including a low voltage sense amplifier. The sensing shown in FIGS. 46, 46A, 47, 47A, 47B, 48, 48A, and 48B is to be known as Direct (Memory) Cell Sensing because a sensing element (the load) is connected directly through decoding circuitry to the memory cell but not through bias (cascading transistors. The sensing elements are capable of sub-volt (less than 1 volt power supply) sensing. In one embodiment, the circuits of FIGS. 46, 46A, 47, 47A, 47B, 48, 48A, and 48B are coupled to a comparison circuit that uses capacitors for autozero, signal coupling, and signal comparison, such as shown in FIGS. 34, 35, 38, and 57.

The memory system 4600 is similar to the memory system 3600 described above in conjunction with FIG. 36, but the local sense amplifier 3604 includes a readout circuit 4602. For clarity, FIG. 46 shows only one memory subarray 3602 and one local sense amplifier 3604, and only one memory cell 4603 is shown in the memory subarray 3602. The readout circuit 4602 may operate in a low voltage range. The readout circuit 4602 may read memory cells that store low voltages and may provide a read signal 4604 indicative of the content of the memory cells 4603.

The readout circuit 4602 comprises a buffer 4606 and a resistor 4608. The resistor 4608 provides feedback between an output and an inverting input of the buffer 4606. The inverting input of the buffer 4606 is coupled to the bitline for coupling to the memory cells 4603. A non-inverting input of the buffer 4606 is coupled to a reference voltage from a reference memory cell (not shown).

As an illustrative example, the voltage stored in the memory cell 4603 and the voltage (VBITLN) on the bitline may be in the range of 0.0 through 1.0 volts. The minimum supply voltage ($VDD_{min}$) equals the voltage (VBITLN) on the bitline plus a differential operating voltage (dVOP), for example 0.5 volts. A control gate voltage (VCGR) of 1.8 to 2.4 volts is applied to the control gate of the memory cell 4603. The memory cell 4603 operates in a linear region or saturation. During a read or verify, the bitline voltage (VBITLN) may be 0.2 V or 0.6 V. The read signal 4604 output from the comparator 4606 may be in a range of 0.2 to 0.4 volts or 0.8 to 1.2 volts.

Figure 46A:
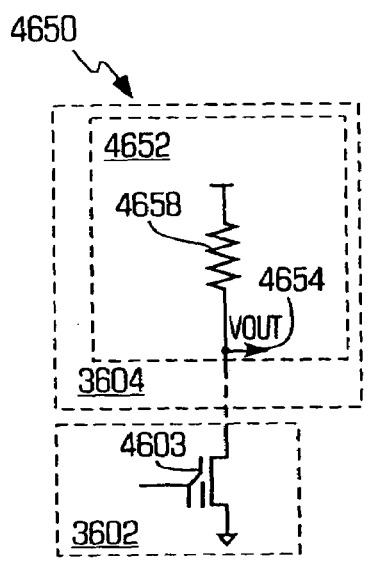
FIG. 46A is a block diagram illustrating a memory system including a low voltage sense amplifier.

FIG. 46A is a block diagram illustrating a memory system 4650 including a low voltage sense amplifier.

The memory system 4650 is similar to the memory system 4600 described above in conjunction with FIG. 46, but the local sense amplifier 3604 includes a readout circuit 4652 that may operate in a low voltage range. The readout circuit 4602 may read memory cells that store low voltages and may provide a read signal 4654 indicative of the content of the memory cells 4603. The readout circuit 4652 comprises a resistor 4608 coupled between the supply voltage and the output 4654, which is coupled to the bitline coupled to the memory cell 4603.

Figure 47:
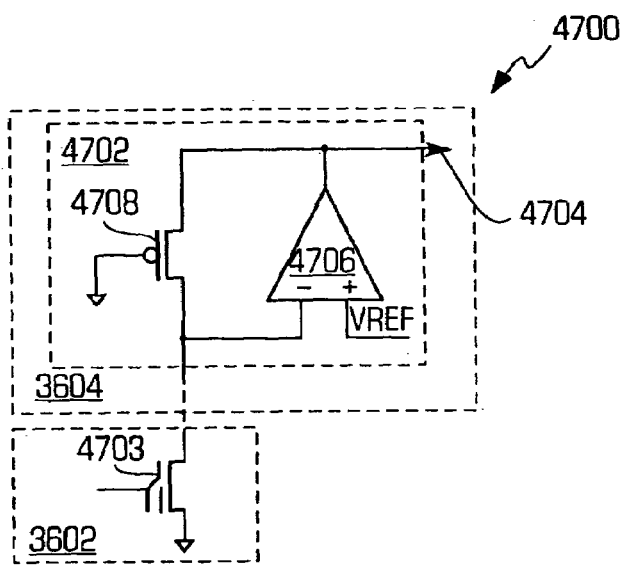
FIG. 47 is a block diagram illustrating a memory system including a low voltage sense amplifier according to another embodiment.

FIG. 47 is a block diagram illustrating a memory system 4700 including a low voltage sense amplifier.

The memory system 4700 is similar to the memory system 4600 in FIG. 46 described above. For clarity, FIG. 47 shows only one memory subarray 3602 and one local sense amplifier 3604. The local sense amplifier 3604 includes a readout circuit 4702, which is similar to the readout circuit 4602, except that a PMOS transistor 4708 functions as the feedback element and replaces the resistor 4608. The readout circuit 4702 may operate in a low voltage range. The PMOS transistor 4708 includes drain-source terminals coupled between the output and the inverting input of a buffer 4706 and includes a gate coupled to a fixed voltage, such as ground.

Figure 47A:
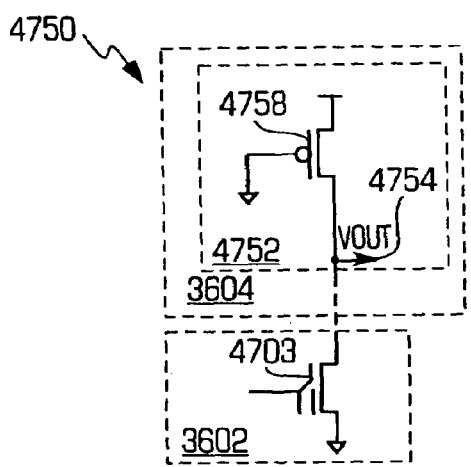
FIG. 47A is a block diagram illustrating a memory system including a low voltage sense amplifier according to another embodiment.

FIG. 47A is a block diagram illustrating a memory system 4750 including a low voltage sense amplifier.

The memory system 4750 is similar to the memory system 4700 in FIG. 47 described above, but the local sense amplifier 3604 includes a readout circuit 4752 that comprises a PMOS transistor 4758 that includes drain-source terminals coupled between a supply voltage and an output node 4754, which is coupled to the bitline coupled to the memory cell 4603, and includes a gate coupled to a fixed voltage, such as ground.

Figure 47B:
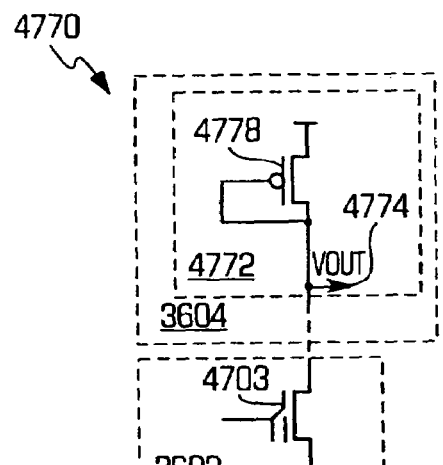
FIG. 47B is a block diagram illustrating a memory system including a low voltage sense amplifier according to another embodiment.

FIG. 47B is a block diagram illustrating a memory system 4770 including a low voltage sense amplifier.

The memory system 4770 is similar to the memory system 4750 in FIG. 47A described above, but the local sense amplifier 3604 includes a readout circuit 4772 that comprises a diode connected PMOS transistor 4758 coupled between the supply voltage and an output node 4774.

Figure 48:
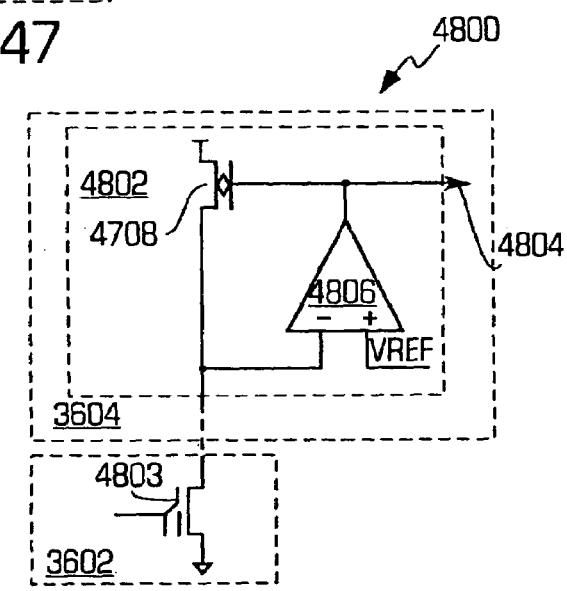
FIG. 48 is a block diagram illustrating a memory system including a low voltage sense amplifier according to another embodiment.

FIG. 48 is a block diagram illustrating a memory system 4800 including a low voltage sense amplifier.

The memory system 4800 is similar to the memory system 4700 of FIG. 47. For clarity, FIG. 48 shows only one memory subarray 4602 and one local sense amplifier 3604. The local sense amplifier 3604 includes a readout circuit 4802 that comprises a buffer 4806 and an NMOS transistor 4808, which can be an enhancement NMOS transistor (threshold voltage VT=~0.5 to 1.0V) or a native NMOS transistor (threshold voltage VT=~0.2 to 0.2). The NMOS transistor 4808 includes drain-source terminals coupled between the supply voltage VDD and an inverting input of the buffer 4806, and includes a gate coupled to the output of the buffer 4806 for feedback. The operation of the readout circuit 4802 is similar to that described above for the readout circuit 4602, except the minimum supply voltage VDDmin equals a fixed voltage, e.g., 0.4 volts, plus a differential operating voltage (dVOP), e.g., 0.5 volts.

Figure 48A:
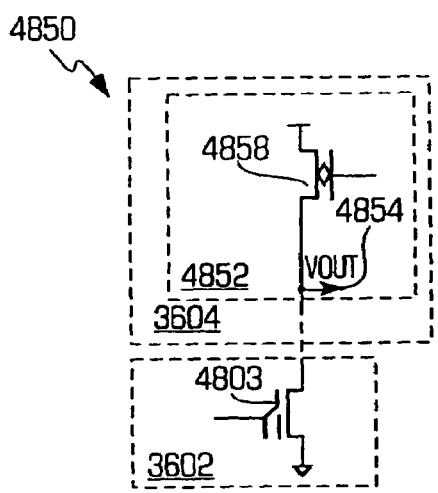
FIG. 48A is a block diagram illustrating a memory system including a low voltage sense amplifier according to another embodiment.

FIG. 48A is a block diagram illustrating a memory system 4850 including a low voltage sense amplifier.

The memory system 4850 is similar to the memory system 4800 in FIG. 48 described above, but the local sense amplifier 3604 includes a readout circuit 4852 that comprises a NMOS transistor 4858 that includes drain-source terminals coupled between a supply voltage and an output node 4854, which is coupled to the bitline coupled to the memory cell 4603, and includes a gate coupled to a fixed voltage.

Figure 48B:
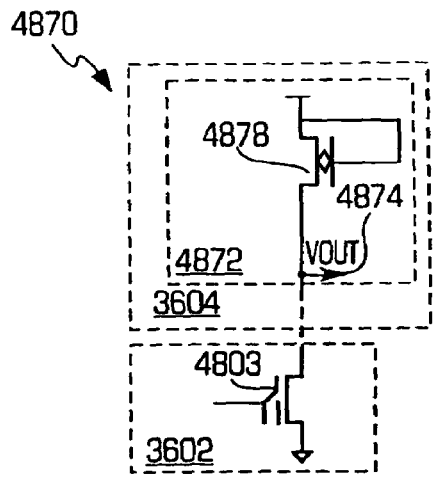
FIG. 48B is a block diagram illustrating a memory system including a low voltage sense amplifier according to another embodiment.

FIG. 48B is a block diagram illustrating a memory system 4870 including a low voltage sense amplifier.

The memory system 4870 is similar to the memory system 4850 in FIG. 48A described above, but the local sense amplifier 3604 includes a readout circuit 4872 that comprises a diode connected NMOS transistor 4878 coupled between the supply voltage and an output node 4874.

Figure 49:
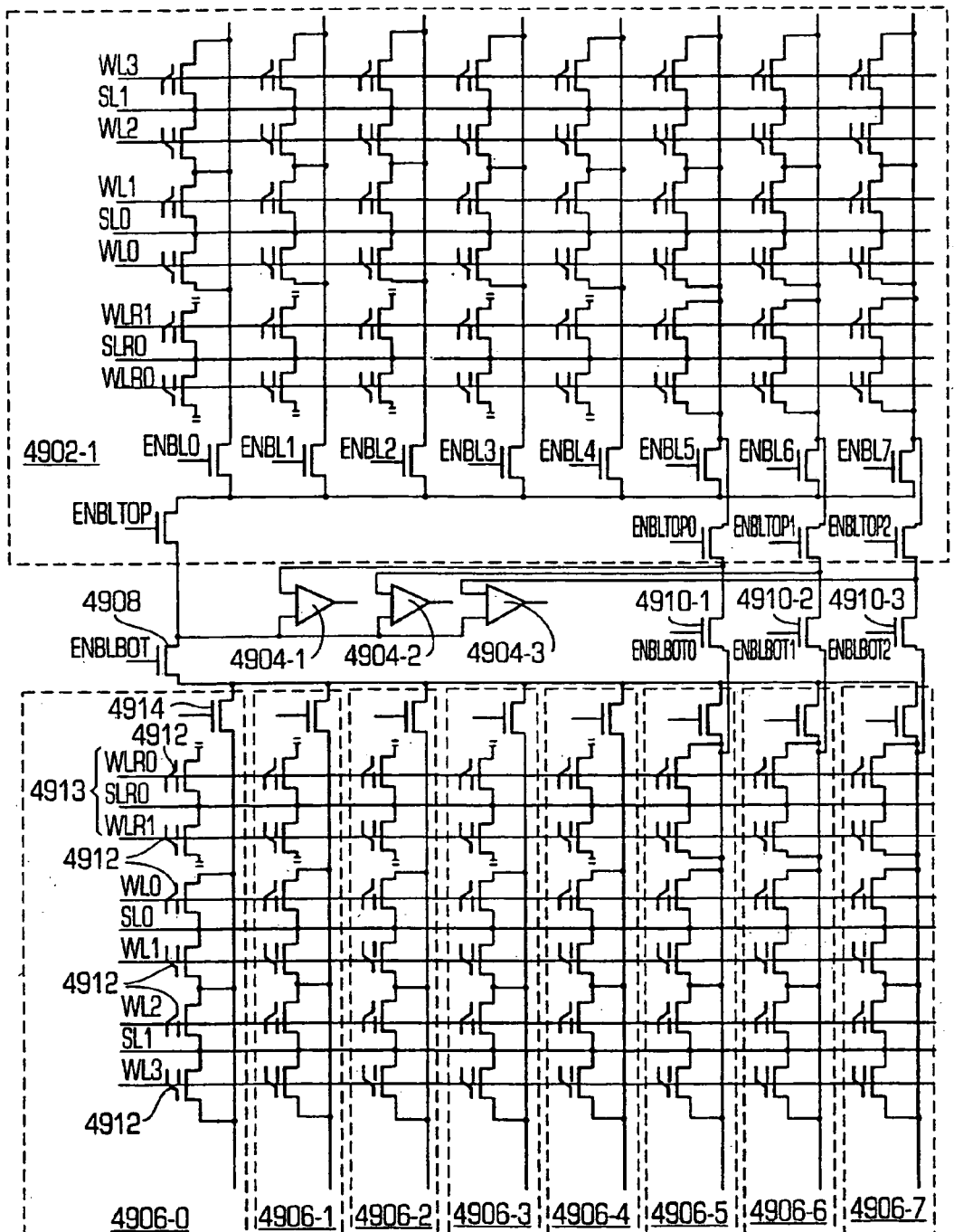
FIG. 49 is a schematic diagram illustrating a shared sense amplifier segmented reference array.

FIG. 49 is a schematic diagram illustrating a shared sense amplifier segmented reference array 4900. The shared sense amplifier segmented reference array 4900 may be used in the memory system 3800 described above in conjunction with FIG. 38.

The shared sense amplifier segmented reference array 4900 comprises a plurality of array segments 4902-1 and 4902-2 and a plurality of differential sense amplifiers 4904-1 through 4904-3. As an illustrative example, the array 4900 includes two array segments 4902. In one embodiment, the array segments 4902 are disposed above and below the differential sense amplifiers 4904.

The array segment 4902 comprises a plurality of memory cells 4912 arranged in rows and columns. A pair of reference rows 4913 comprise two rows of memory cells that store reference levels. Word lines WLR0 and WLR1 are coupled to even and odd reference rows, respectively, to account for odd and even row effect. Even or odd reference rows are used for even or odd data rows respectively. Word lines WL0 through WL3 are coupled to the data rows.

The array segment 4902 comprises a plurality of memory columns 4906-0 through 4906-7, a first multiplexer 4908 and a plurality of second multiplexers 4910-1 through 4910-3. As an illustrative example, the memory cells store two bits, and accordingly, there are three reference cells for three reference levels. In this case, the memory cells 4912 of the reference rows 4913 store reference voltages in the memory cells in the three memory columns 4906-5-through 4906-7. The other memory cells 4912 in the reference row 4913 may be left floating, or may be connected, but not used. The first multiplexer 4908 couples each of the memory columns 4906 to a first input of each of the differential sense amplifiers 4904. The multiplexers 4910-1 through 4910-3 couple the respective memory column 4906-5 through 4906-7 to a second input of a respective differential sense amplifier 4904-1 through 4904-3. Each memory column 4906 comprises a column of the memory cells 4912 and a multiplexer 4914. For clarity, reference numerals are shown only for one memory column 4906. The multiplexer 4914 allows the memory cells 4912 to be accessed.

In one embodiment, data is stored in one of the array segments 4902, for example, the bottom array segment 4902, and reference voltages are stored in the memory cells 4912 of the reference rows 4913 that are in the memory columns 4906-5 through 4906-7 of the other array segment 4902, for example, the top array segment 4902. When memory cells 4912 in one of the array segments 4902 are selected for multiplexing to the differential sense amplifiers 4904, memory cells 4912 in the memory columns 4906-5 through 4906-7 that function as reference memory cells of the other array segment 4902 is selected at the same time.

Figure 50:
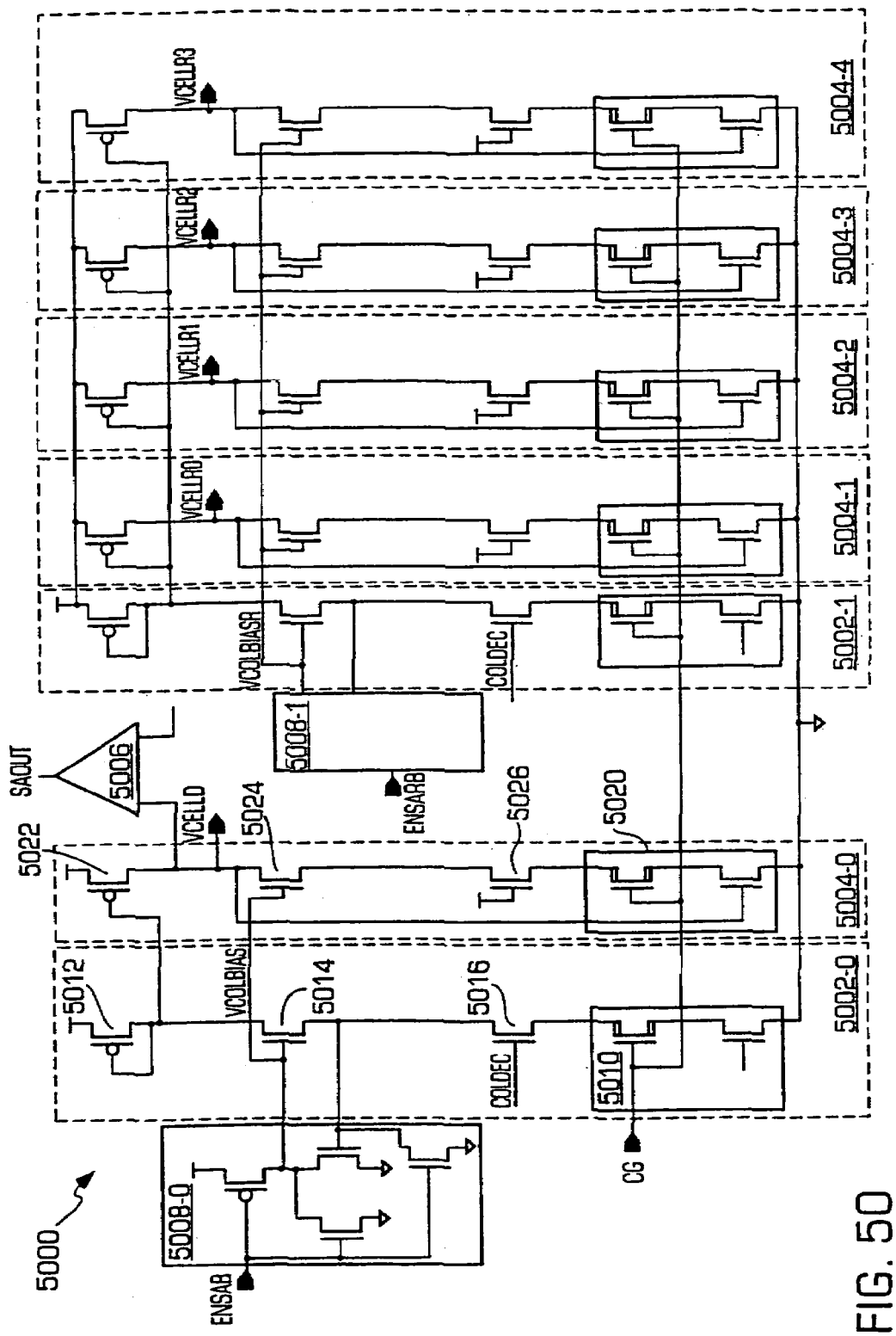
FIG. 50 is a schematic diagram illustrating a memory cell replica sense amplifier.

FIG. 50 is a schematic diagram illustrating a memory cell replica sense amplifier 5000.

The memory cell replica sense amplifier 5000 comprises a plurality of memory cell circuits 5002-0 and 5002-1, a plurality of replica memory cell circuits 5004-0 through 5004-4, a differential amplifier 5006, and a plurality of bias generators 5008-0 and 5008-1. For clarity, the details of only the bias generator 5008-0 are shown. Although five replica memory cell circuits 5004 are shown, other numbers of circuits 5004 may be used. One of inputs to the differential amplifier 5006 couples to the read out voltage from a data memory cell and the other input couples to read out voltage from a reference memory cell.

The memory cell circuits 5002 comprise a memory cell circuit 5010, a PMOS transistor 5012, and a plurality of NMOS transistors 5014 and 5016. For clarity, the details of only the memory cell circuit 5002-0 are shown. The memory cell circuit 5010 is a circuit that is an equivalent model for a source side injection (SSI) split gate flash memory cell in read mode. In one embodiment, the memory cell circuit 5010 comprises a pair of NMOS transistors, in which a bottom transistor corresponds to a floating gate transistor, and a top transistor corresponds to a select gate (control gate) transistor. The NMOS transistor 5016 operates as a switch or multiplexer to allow access to the memory cell circuit 5010 in response to a column decode (COLDEC) signal. The NMOS transistor 5014 provides column bias to the memory cell circuit 5002 in response to the bias generator 5008, which generates a bias and includes feedback control of the bias.

The replica memory cell circuits 5004 comprise a replica memory cell circuit 5020, a PMOS transistor 5022, and a plurality of NMOS transistors 5024 and 5026. For clarity, the details of only the replica memory cell circuit 5004-0 are shown. The replica memory circuit 5020 replicates the SSI flash memory cells. In one embodiment, the replica memory cell circuit 5020 comprises a pair of NMOS transistors. The PMOS transistor 5022 mirrors the current of the PMOS transistor 5012 of the memory cell circuit 5002. The NMOS transistor 5026 replicates the column select decoding of the NMOS transistor 5016. The NMOS transistor 5024 provides column bias to the replica memory cell circuit 5004. A control gate voltage CG is applied to the memory cell circuits 5010 of both memory cell circuits 5002-0 and 5002-1. A data floating gate voltage FCD is shown as a storage node of the data memory cell 5010 of the memory cell circuit 5002-0. A reference floating gate voltage FCR is shown as a storage node of the reference memory cell 5010 of the memory cell circuit 5002-1. The gate of a transistor in the replica memory cell circuit 5020 is coupled to the drain of the NMOS transistor 5024 so that the output voltage is approximately the same as the floating gate voltage because the size and operating condition of the replica memory cell circuit 5020 is equivalent to that of the memory cell circuit 5002. The drain of the PMOS transistor 5022 of the replica memory cell circuit 5004-0 provides an output data voltage, and the drain of the PMOS transistor 5022 of the other replica memory circuits 5004 provides an output reference voltage. The PMOS transistors 5022 of the replica memory cell circuits 5004-1 through 5004-4 are dimensioned to a ratio to the PMOS transistor 5012 of the memory cell circuit 5002 to set different output reference voltage levels. As an illustrative example, three levels are set for two-bit cells, and a fourth level is set as an erase reference.

In one embodiment, the transistors 5014 of the memory cell circuits 5002 and the transistors 5024 of the replica memory cell circuits 5004 are the same size.

In another embodiment, the replica memory cell circuits 5004-1 through 5004-4 are coupled to a corresponding memory cell circuit 5002. In this case each memory cell circuit 5010 of the memory circuit 5002 has a different floating gate voltage FGR to generate different levels.

Figure 51:
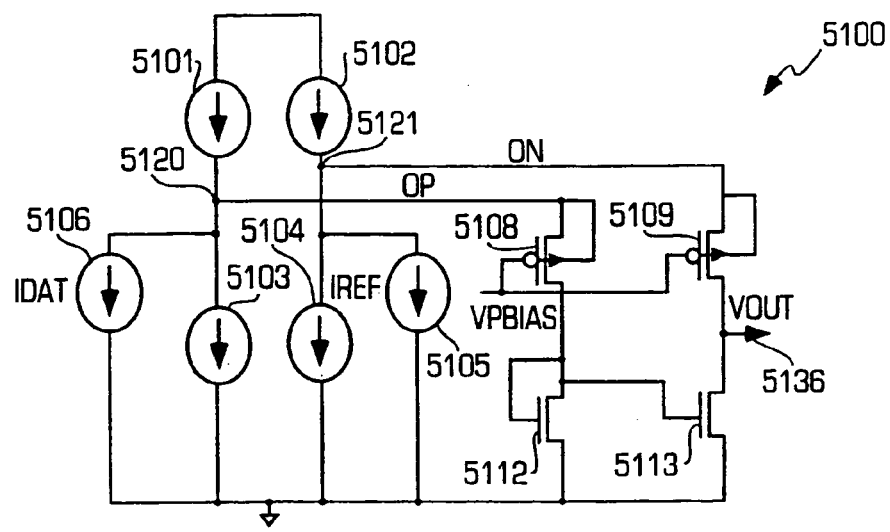
FIG. 51 is a schematic diagram illustrating a differential current sense amplifier.

FIG. 51 is a schematic diagram illustrating a differential current sense amplifier 5100.

The differential current sense amplifier 5100 comprises a plurality of current sources 5101 through 5106, a plurality of PMOS transistors 5108 and 5109, and a plurality of NMOS transistors 5112 and 5113. The current sense amplifiers 5101 through 5104 are arranged as a differential sense amplifier to form an up output (OP) node 5120 between the current sources 5101 and 5103 and to form a down output (ON) node 5121 between the current sources 5102 and 5104. The current source 5105 is parallel to the current source 5104, and the current source 5106 is parallel with the current source 5103. The current source 5106 is a data current source. The current source 5105 is a reference current source. In one embodiment, the current source 5105 replicates the reference current IREF from a reference memory cell, and the current source 5106 replicates the data current IDAT from a data memory cell.

The drain-source terminals of the PMOS transistor 5108 and the diode connected NMOS transistor 5112 are coupled between the up output node 5120 and ground. The drain-source terminals of the PMOS transistor 5109 and the NMOS transistor 5103 are coupled between the down output node 5121 and ground. The drains of the transistors 5109 and 5113 form an output node 5136. A bias voltage VPBIAS applied to the gates of the PMOS transistors 5108 and 5109 establishes a bias point on the up node 5120 and the down node 5121. The drain of the NMOS transistor 5112 biases the gate of the NMOS transistor 5113 to mirror the current.

In one embodiment, the fixed bias currents of the current sources 5101 and 5102 are set equal ($I_{5101}=I_{5102}$). The fixed bias currents of the current sources 5103 and 5104 are set equal to each other ($I_{5103}=I_{5104}$). The current of the current source 5101 is greater than the current of the current source 5103 ($I_{5101}>I_{5103}$). As an illustrative example, the current source 5103 provides a current of 30 µa and the current source 5101 provides a bias fixed current of 60 µa. The current in the NMOS transistor 5113, the current in the NMOS transistor 5112 and the current in the PMOS transistor 5108 are equal to each other ($I_{5113}=I_{5112}=I_{5108}$), and equal the difference of the current source 5101 and the sum of the currents from the current sources 5103 and 5106 ($I_{5113}=I_{5112}=I_{5108}=I_{5101}-I_{5103}-IDAT$). This relationship follows from the NMOS transistor 5113 mirroring the current of the NMOS transistor 5112. The current from the PMOS transistor 5109 is the difference between the current from the current source 5102 and the sum of the currents of the current sources 5104 and 5105 ($I_{5109}=I_{5102}-I_{5104}-IREF$). Accordingly, the output voltage equals $$VOUT=\Delta I * R_{OUT}=(I_{5113}-I_{5109})*R_{OUT},$$

where the resistance $R_{OUT}$ is the equivalent resistance at the output node (VOUT) 5116. Equivalently the output voltage equals $$VOUT=(IREF-DAT)*R_{OUT},$$

which is the difference of the data and reference currents multiplied by the output resistance. Alternatively, the output from the output terminal 5136 may be a current that is the difference of the data and reference currents multiplied by a gain factor G, or $$IOUT=G(IDAT-IREF),$$

where the gain factor G may be provided by an additional current gain circuit (not shown) having a gain G.

Figure 52:
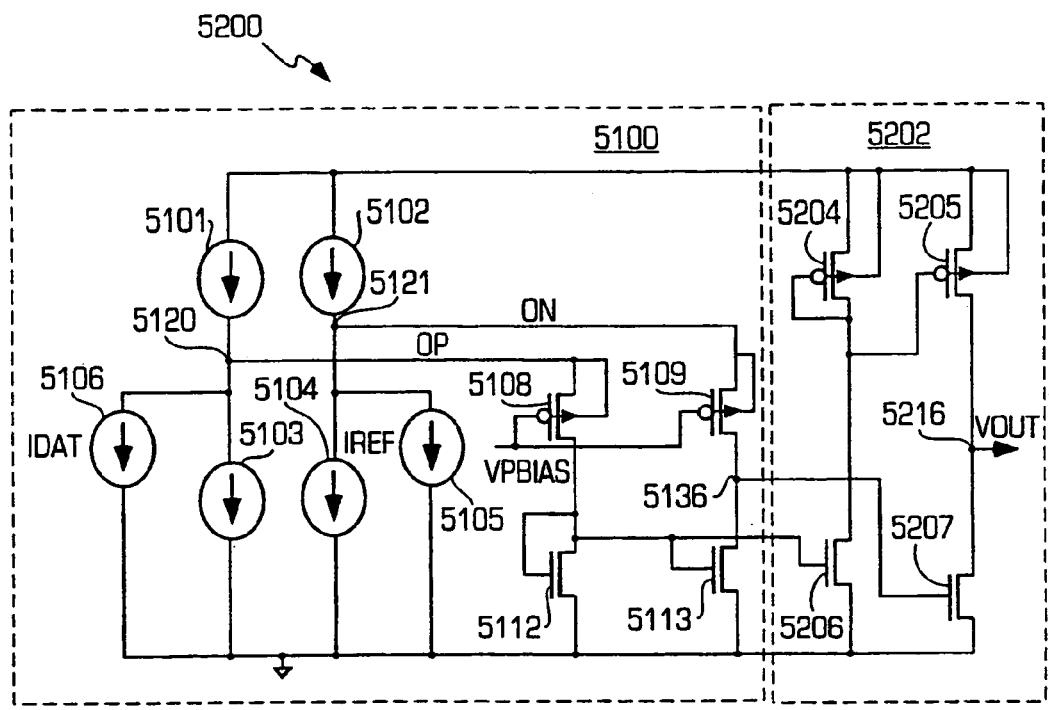
FIG. 52 is a schematic diagram illustrating a two-stage differential current sense amplifier.

FIG. 52 is a schematic diagram illustrating a two-stage differential current sense amplifier 5200.

The two-stage differential current sense amplifier 5200 comprises the differential current sense amplifier 5100 and an output stage 5202. The output stage 5202 comprises a plurality of PMOS transistors 5204 and 5205 and a plurality of NMOS transistors 5206 and 5207. The output stage 5202 operates as another gain stage. The output stage 5202 provides an output rail to rail level at an output node VOUT.

In another embodiment, the differential current sense amplifier stage 5100 includes an NMOS transistor 5113 that has a gate that is diode connected instead of being coupled to the NMOS transistor 5112.

The drain-source terminals of the diode connected PMOS transistor 5204 and the NMOS transistor 5206 are coupled in series between the supply voltage and ground. The gate of the NMOS transistor 5206 is coupled to the drain of the NMOS transistor 5112. The drain-source terminals of the PMOS transistor 5205 and the NMOS transistor 5207 are coupled in series between the supply voltage and ground and form an output voltage terminal 5216 of the common node of the drains of the transistors 5205 and 5207. The gate of the PMOS transistor 5205 is coupled to the drain of the PMOS transistor 5204 to mirror the current of the PMOS transistor 5204. The gate of the NMOS transistor 5207 is coupled to the drain of the NMOS transistor 5113.

Figure 53:
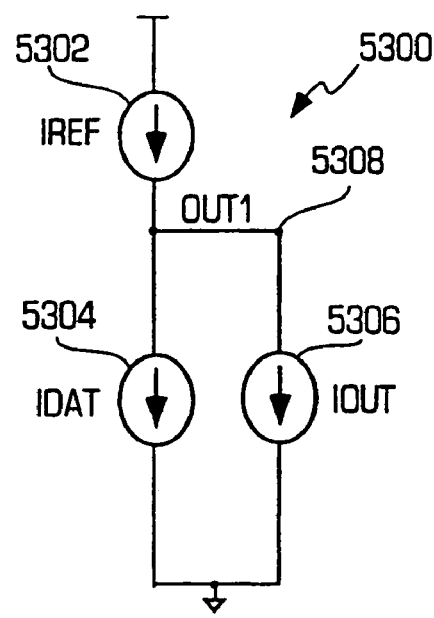
FIG. 53 is a schematic diagram illustrating a current difference sense amplifier.

FIG. 53 is a schematic diagram illustrating a current difference sense amplifier 5300.

The differential current sense amplifier 5300 comprises a reference current source 5302 that provides a reference current IREF, a data current source 5304 that provides a data current IDAT, and an output current source 5306 that provides an output current IOUT. The reference current source 5302 and the data current source 5304 are coupled in series between a power terminal and a ground terminal and form an output node 5308 that provides an output that is a current. The output current source 5306 is coupled between the output node 5308 and ground.

If the data current IDAT is greater than the reference current IREF, the output current IOUT equals zero. Otherwise, the output current IOUT=IREF−IDAT.

In another embodiment, the reference current source 5302 and the output current source 5306 may be interchanged.

In another embodiment, the output of the sense amplifier 5300 may be an output voltage VOUT equals the difference of the data and reference current multiplied by the output resistance, or $$VOUT=V(OUT1)=(IREF-IDAT)*ROUT,$$

where ROUT is the equivalent resistance at the output node 5308.

In another embodiment, the output current IOUT may be referred to the positive rail instead of ground, coupled between the power terminal and the output node 5308, and such the output current IOUT=IDAT−IREF.

In another embodiment, another output current source may be coupled between the power terminal and the output node 5308 to generate a positive output current IOUTP (=IDAT−IREF) in addition to a negative output current IOUTN (=IREF−IDAT) from the output current source 5306.

Figure 54:
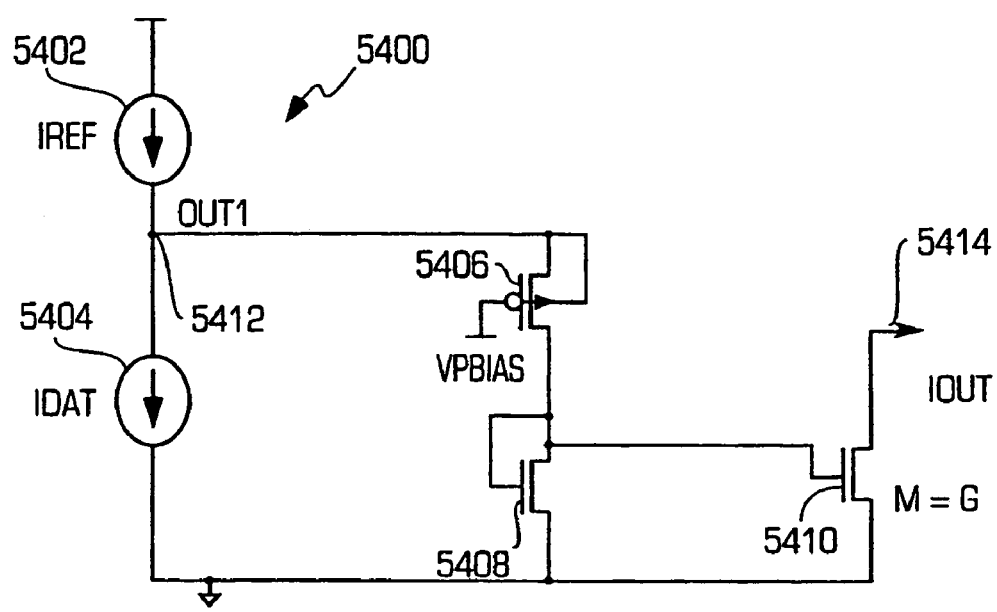
FIG. 54 is a schematic diagram illustrating a current difference sense amplifier.

FIG. 54 is a schematic diagram illustrating a current difference sense amplifier 5400.

The current difference sense amplifier 5400 comprises a reference current source 5402 that provides a reference current IREF, a data current source 5404 that provides a data current IDAT, a PMOS transistor 5406, and a plurality of NMOS transistors 5408 and 5410. The NMOS transistor 5410 provides an output current IOUT. The reference current source 5402 and the data current source 5404 are coupled in series between a power terminal and a ground terminal and form an output node 5412. The drain-source terminals of the PMOS transistor 5406 and the diode connected NMOS transistor 5408 are coupled in series between the output node 5412 and ground. The drain-source terminals of the NMOS transistor are coupled between an output note 5414 and ground, and the gate of the NMOS transistor 5410 is biased by the drain of the PMOS transistor 5406, which has a bias voltage VPBIAS applied to the gate of the PMOS transistor 5406 to establish the bias voltage on the node 5412. In another embodiment, the diode connected NMOS transistor 5408 is connected directly to the node 5412, i.e., without coupling through the PMOS transistor 5406.

The transistors 5406, 5408, and 5410 form an output stage to buffer the current, and amplify a current difference. The current flow in the NMOS transistor 5408 equals the difference of the reference current IREF and the data current IDAT, or 15408=IREF−IDAT.

The output current IOUT equals the difference of the data and reference currents multiplied by a gain factor G, or $$IOUT=G(IDAT-IREF).$$

The size of the NMOS transistor 5410 equals the gain factor G times the size of the NMOS transistor 5408.

Figure 55:
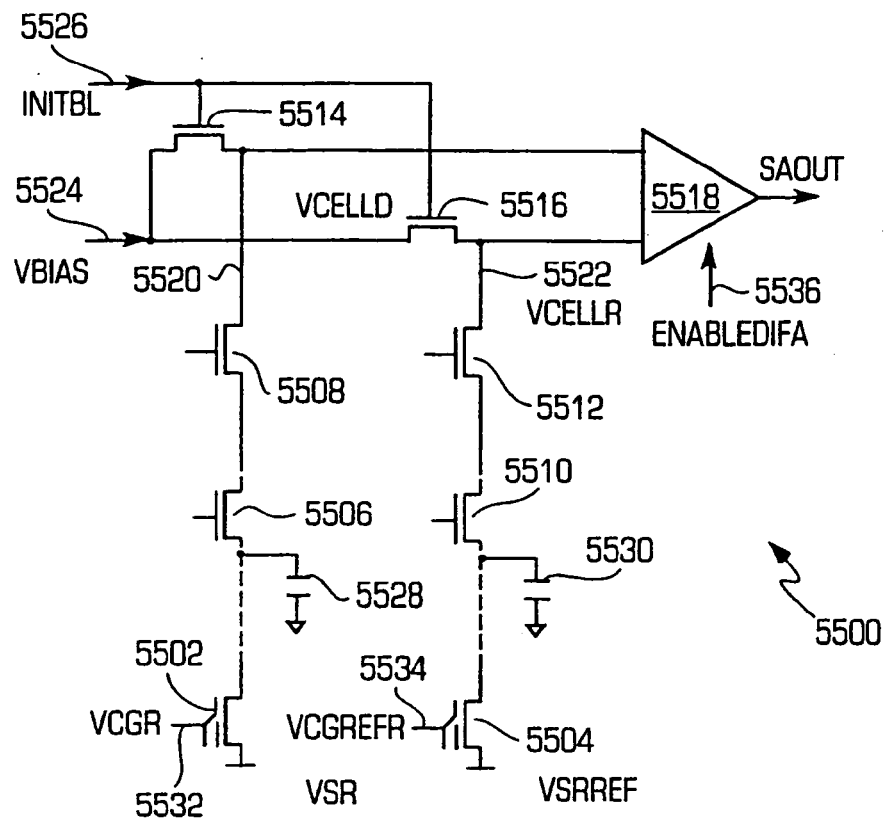
FIG. 55 is a schematic diagram illustrating a dynamic sense amplifier.

FIG. 55 is a schematic diagram illustrating a dynamic sense amplifier 5500.

The dynamic sense amplifier 5500 comprises a data memory cell 5502, a reference memory cell 5504, a plurality of NMOS transistors 5506, 5508, 5510, 5512, 5514, 5516, and a comparator 5518. For clarity, only one data memory cell 5502 and one reference memory cell 5504 are shown for subarray, but a subarray comprises a plurality of data memory cells 5502 arranged in columns and a plurality of reference cells 5504 arranged in columns. Each column of data memory cells 5502 includes corresponding NMOS transistors 5506 and 5508 for decoding. Each reference column comprises NMOS transistors 5510 and 5512 for decoding. Only one column with one data memory cell 5502 is shown.

The comparator 5518 determines the voltage of the data memory cell 5502 by comparing the cell voltage (VCELLD) on a cell bitline 5520 to a reference voltage (VCELLR) on a reference bitline 5522. The NMOS transistor 5514 couples a bias voltage (VBIAS) 5524 to the data cell voltage 5520 in response to an initialize bitline (INITBL) signal 5526. The NMOS transistor 5516 couples the bias voltage signal 5524 to the reference cell voltage 5522 in response to the initialized bitline signal 5526. The cell bitline 5520 has a capacitance shown as a capacitor 5528. The reference bitline 5522 has a capacitance shown as a capacitor 5530. Additional capacitance can be added to the bit lines 5520 and 5522 to achieve a desired value of capacitance. A data control gate voltage (VCGR) 5532 is applied to the control gate of the data memory cell 5502. A reference control voltage (VCGEFR) 5534 is applied to the control gate of the reference memory cell 5504. A comparator enable (EN-BLADIFA) signal 5536 enables the comparator 5518.

Figure 56:
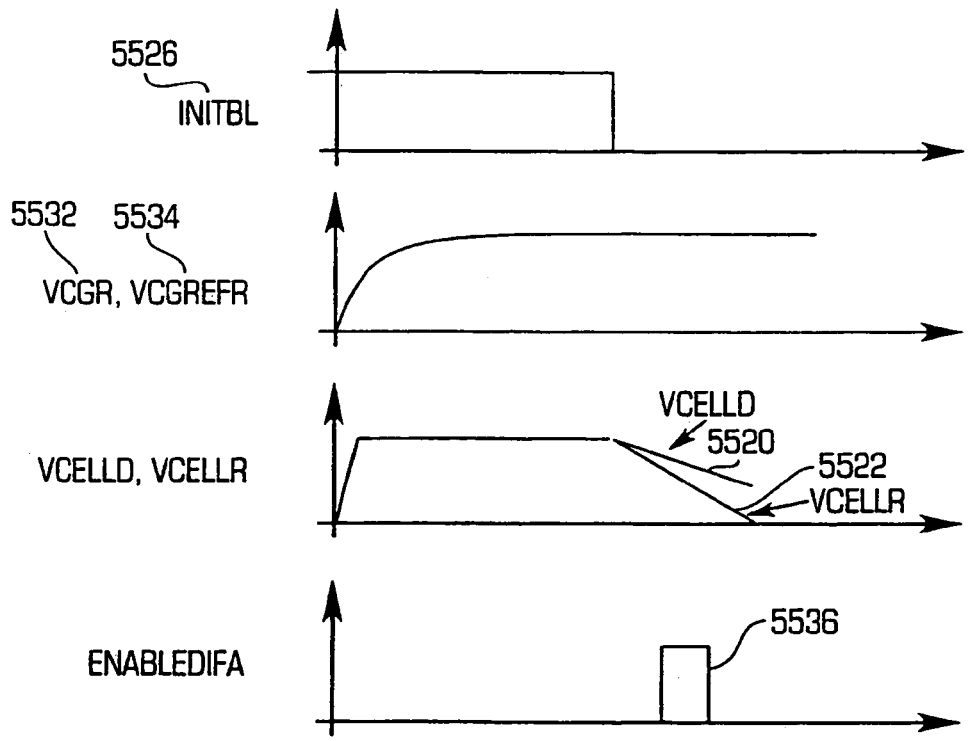
FIG. 56 is a graph illustrating control signals and voltage levels of the dynamic sense amplifier of FIG. 55.

FIG. 56 is a graph illustrating the control signals and voltages of the dynamic sense amplifier 5500.

The initialize bitline signal 5526 is set to high to enable the NMOS transistors 5514 and 5516 to initialize the bitlines 5520 and 5522, respectively, at a bias voltage (VBIAS) 5524. The control gate voltage of the data control gate voltage 5532 and the reference control gate voltage 5534 are applied during this time. Once sufficient voltage is developed between the data cell voltage (VCELLD) on the cell bitline 5520 and the reference cell voltage on the reference cell bitline 5522, the comparator 5518 is enabled to amplify the difference voltage. As an illustrative example, for a difference current of 0.5 µa, a bitline capacitance of 0.5 pF, and a voltage of 10 mV is developed in 10 nanoseconds from the relationship that 10 mV equals 0.5 µa times 10 nanoseconds divided by 0.5 pF. In this embodiment, no load, such as pullup, is needed for the sensing circuitry. In another embodiment, the data cell voltage (VCELLD) 5520 and the reference cell voltage (VCELLR) 5522 go in a positive direction during the signal development period instead of a negative direction as shown in FIG. 56. Voltage mode sensing or current mode sensing may be utilized for memory cells 5502 and 5504.

Figure 57:
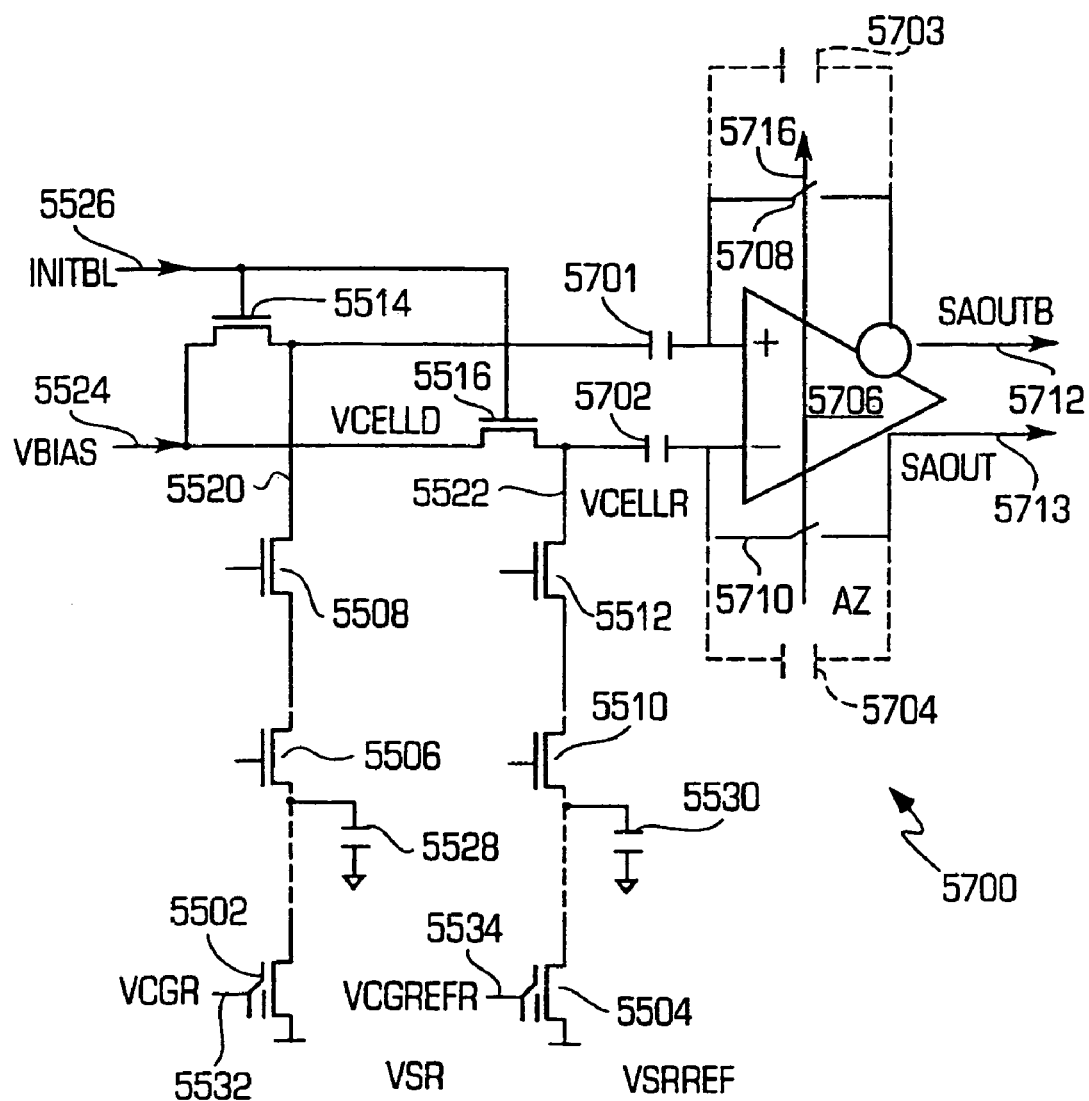
FIG. 57 is a schematic diagram illustrating the dynamic charge sense amplifier.

FIG. 57 is a schematic diagram illustrating a dynamic charge sense amplifier 5700.

The dynamic charge sense amplifier 5700 comprises a data memory cell 5502, a reference memory cell 5504, NMOS transistors 5506, 5508, 5510, 5512, 5514 and 5516 arranged in a similar manner as the dynamic sense amplifier 5500 of FIG. 55. The dynamic charge sense amplifier 5700 further comprises a plurality of capacitors 5701 through 5704, a comparator 5706, and a plurality of switches 5708 and 5710. The capacitor 5701 couples the cell voltage line 5520 to a positive input of the differential comparator 5706. The capacitor 5702 couples the reference cell voltage 5522 to a negative input of the comparator 5706. The switches 5708 and 5710 couple respective inverted and non-inverted outputs 5712 and 5713 to the positive and negative inputs of the comparator 5706. The capacitors 5703 and 5704 are coupled in parallel to the switches 5708 and 5710, respectively. An autozero signal 5716 is applied to the switches 5708 and 5710 and is an active low to enable voltage signal development of the comparator 5706. In one embodiment, the autozero signal 5716 is buffered from, and thus is logically the same as, the initialized bitline signal 5526. The negative and positive nodes of the comparator 5706 are initialized or autozeroed at a bias in an autozero state. The capacitors 5703 and 5704 cause the comparator 5706 to function as a gain amplifier with a gain equal to the ratio of the capacitances of the capacitors 5701 and 5703. In another embodiment, the dynamic charge sense amplifier 5700 does not include the capacitors 5703 and 5704, and the comparator 5706 functions as a comparator with the capacitor 5701 and 5702 providing capacitive coupling.

The systems described above may be used for Inverse Voltage Mode Sensing, No Current (Digital) Multilevel Mode Sensing, or Inverse Current Mode Sensing with appropriate modification, and may include an autozero function of the sense amplifier. The autozero function may include equalizing the input and output of the sense amplifier before sensing or the storage of the reference cell sensing before the data cell sensing to reduce signal path mismatch.

Figure 58:
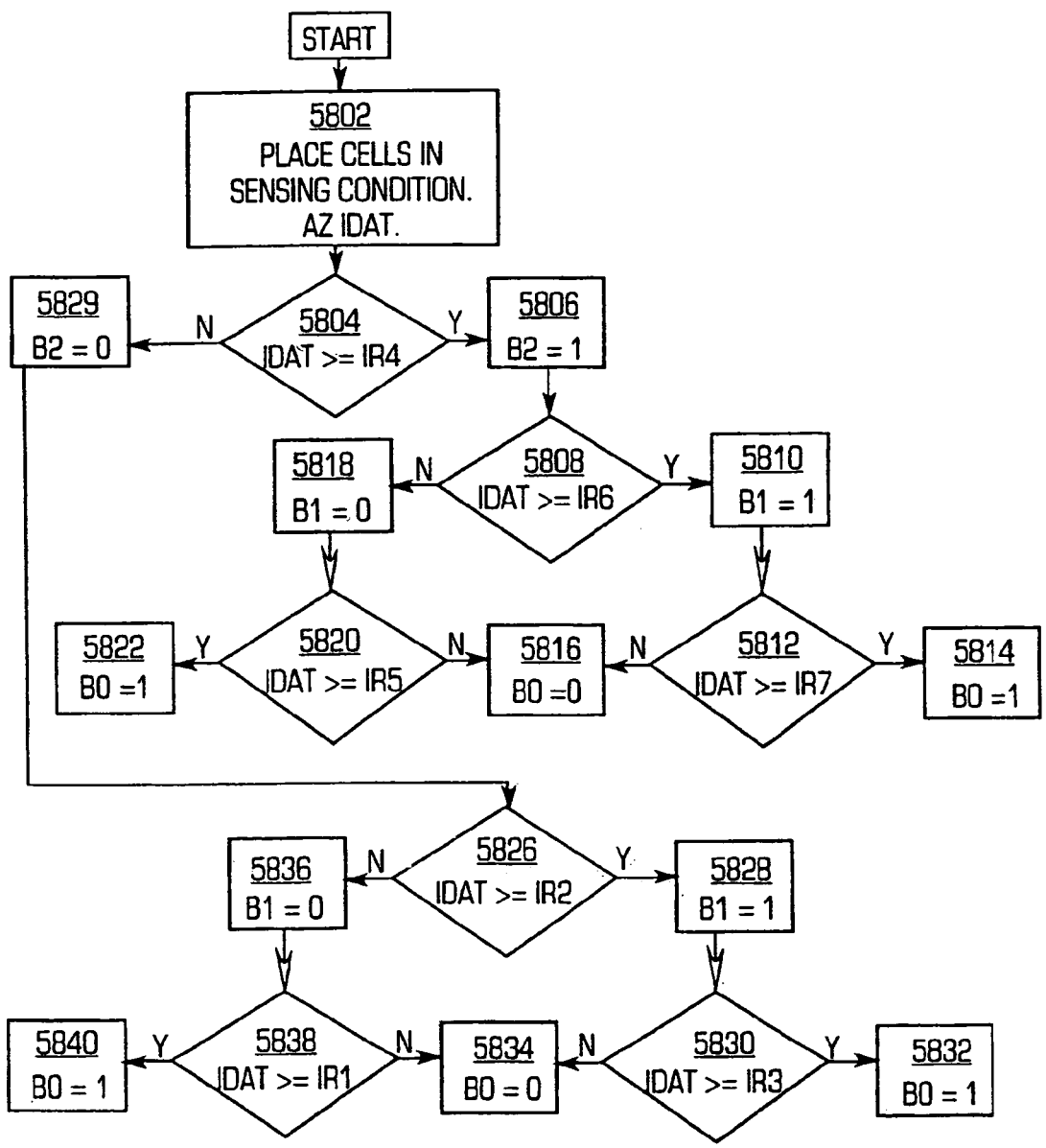
FIG. 58 is a flow diagram illustrating a single bit current sensing binary search.

FIG. 58 is a flow diagram illustrating a single bit current sensing binary search. During the binary search, the data value of a cell being read is analyzed one bit at a time. As an illustrative example, a three-bit data memory cell for an eight value memory cell is described in which the bits are B2, B1, and B0 with bit B2 being the most significant bit and bit B0 being the least significant bit. As an overview of the binary search, the data cell is set into a current sensing condition and the sensed data current is compared to a reference current from the reference memory cell. As part of the binary search, the full range of current values is divided into half and the data cells determine whether the data value is in the upper or lower half of the voltage range. After this determination, the selected one-half current range is divided into two one-quarter current ranges, and the data current is analyzed to determine which one-quarter range the data value is in. The one-quarter range is then divided into half and the data value is analyzed to determine which of the one-eighth ranges the data value is in, and likewise for each additional bit. For a three-bit data cell, three such determinations are made. For an n bit data cell, a number n determinations are made during the single bit current sensing binary search. The eight values can be arbitrary values.

The data cells are set into a sensing condition, and the data memory cell (IDAT) bitline is set into an autozero condition and the data cells are read (block 5802). The data range being evaluated is divided into half and the data current (IDAT) is analyzed to determine whether the data current is in the upper or lower half of the current range. The data current (IDAT) is compared to a reference current from the reference memory cells corresponding to the mid-point of the entire data range (block 5804). For example, for a three-bit system, the data current (IDAT) is compared to the reference current for the fourth memory level (IR4). If the sensed data current (IDAT) is greater than or equal to the fourth level reference current (IR4), the first bit being detected B2 is set to a high value (B2=1) (block 5806). The data current (IDAT) is in the upper half of the data range, and the upper half of the data range is divided in half or into two one-quarter data ranges. The data current (IDAT) is compared to the midpoint reference current of the upper half which in the illustrative example corresponds to the sixth reference current (IR6). If the data current (IDAT) is greater than or equal to the sixth reference current (IR6) (block 5808), the second data bit, B1, is set high (B1=1) (block 5810), and the data current (IDAT) is in the upper half of the data range. The upper quarter of the data range is again divided into half and the data current (IDAT) is compared to the bit level current of the upper quarter range, which is the seventh reference current (IR7). If the data current (IDAT) is greater than or equal to the seventh reference current (IR7) (block 5812), the third bit B0 is set high (B0=1) (block 5814). Thus in this case, the data of the cell corresponds to B2, B1 and B0 equals '111'. Otherwise if the data current (IDAT) is less than the seventh reference current (IR7) (block 5812), the data current (IDAT) is in the bottom half of the upper quarter of the data range and the last bit B0 is set low (B0=0) (block 5816), and the data in the cell corresponds to B2B1B0 equals '110'.

On the other hand, if the data current (IDAT) is less than the sixth reference current (IR6) (block 5808), the data is in the quarter range that is in the bottom half of the top half of the voltage range and the second bit B1 is set low (B1=0) (block 5818). This quarter range is then divided into two sections corresponding to one-eighth of the overall data range and the data current (IDAT) is compared to the fifth reference current (IR5). If the data current (IDAT) is greater than or equal to the fifth reference current (block 5820), the data current (IDAT) is in the top half of the quarter range, and the third data bit B0 is set high (B0=1) (block 5822), and the data in the cell corresponds to B2BB10 equals '101'. Otherwise, if the data current (IDAT) is less than the fifth reference current (block 5820), the third bit B0 is set low (B0=0) (block 5816), and the data in the cell corresponds to B2B1B0 equals '100'.

On the other hand, if the data current (IDAT) is less than the fourth reference current (IR4) (block 5804), the data is in the lower half of the current range, and the first bit B2 is set low (B2=0) (block 5824). The half range is divided into two halves corresponding to one-quarter ranges of the overall data range, and the data current (IDAT) is compared to the second reference current (IR2). If the data current (IDAT) is greater than or equal to the second reference current (block 5826), the data current (IDAT) is in the upper quarter range of the bottom half range, and the second data bit B1 is set high (B1=1) (block 5828). Again, the quarter range is divided into one-eighth ranges and the data current (IDAT) is compared to the third reference current (IR3). If the data current (IDAT) is greater than or equal to the third reference current (block 5830), the data current (IDAT) is in the top half of this quarter range, and the third data bit B0 is set high (B0=1) (block 5832), and the data in the cell corresponds to B2B1B0 equals '011'. Otherwise, if the data current (IDAT) was less than the third reference current (block 5830), the third bit B0 is set low (B0=0) (block 5834), and the data in the cell corresponds to B2B1B0 equals '010'.

On the other hand, if the data current (IDAT) is less than the second data current (IR2) (block 5826), the data is in the quarter range that is in the bottom half of the range, and the second bit B1 is set low (B1=0) (block 5836). This quarter range is then divided into two sections corresponding to one-eighth of the overall data range and the data current (IDAT) is compared to the first reference current (IR1). If the data current (IDAT) is greater than or equal to the first reference current (block 5838), the data current (IDAT) is in the top half of this quarter range, and the third bit B0 is set high (B0=1) (block 5840), and the data of the cell corresponds to B2B1B0 equals '001'. Otherwise if the data current (IDAT) is less than the first reference current (block 5838), the third bit B0 is set low (B0=0) (block 5834), and the data in the cell corresponds to B2B1B0 equals '000'.

Figure 59:
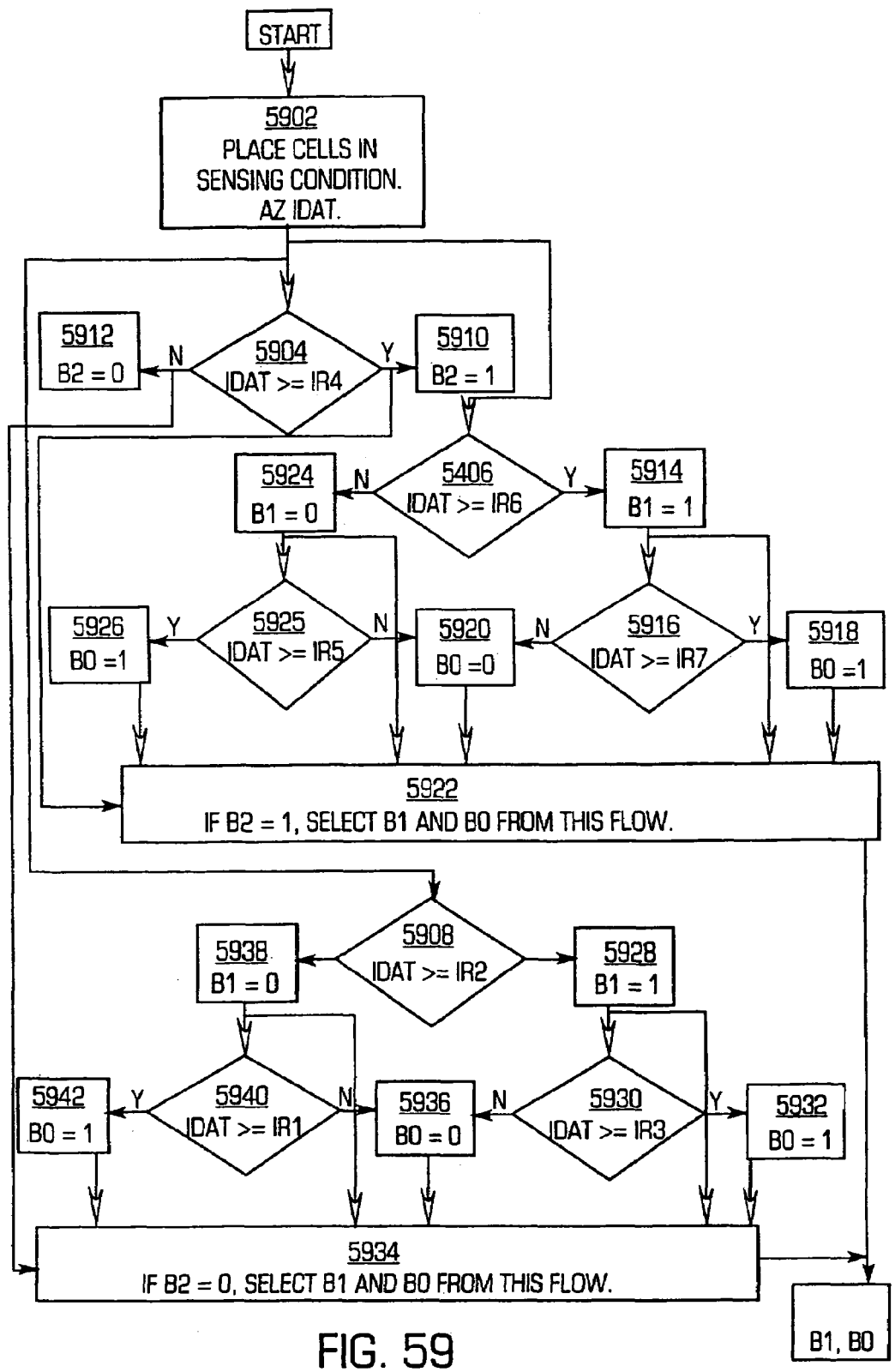
FIG. 59 is a flow diagram illustrating a multiple bit current sensing bit search.

FIG. 59 is a flow diagram illustrating a multiple bit current sensing binary search. The data cell may be connected to multiple sense amplifiers for comparing to different reference currents at the same time to reduce the number of steps of the search. During a first search stage, the data current (IDAT) from the data memory cell is applied to a plurality of comparators, which each determine the relationship between the data current and a reference level. One of the comparators compares the data current to a reference level that is in the middle of the data range. The results of this comparison are used to determine which reference levels are applied to the comparators during a second search stage. More particularly, the reference levels in the determined data range are applied. Further, the results of some of the data determination are discarded.

As an illustrative example, the data cell is a three-bit data cell that stores bits B2B1B0 in a manner similar to that described above for FIG. 58. Further to the illustrative example, two bits are determined per comparison stage. The three-bit system has eight data values with corresponding eight reference values. In this illustrative example, three comparators are used to compare the data current to the three different reference levels. In the first comparison, the full range is divided into eight ranges.

The data cells are put into a current sensing condition and the data memory cell (IDAT) bitline is set into an autozero condition and the data cells are read (block 5902). The data current (IDAT) is compared to a fourth reference level (IR4) (block 5904), a sixth reference current (IR6) (block 5906), and a second reference current (IR2) (block 5908). The comparison of the data current (IDAT) to the fourth reference level (IR4) determines whether the first data bit B2 is set high or low. If the data current (IDAT) is greater than or equal to the fourth reference current (IR4) (block 5904), the first data bit B2 is set high (B2=1) (block 5910), or otherwise the first data bit B2 is set low (B2=0) (block 5912). The data current (IDAT) is compared to the sixth reference current (IR6) to determine the second data bit B1. If the data current (IDAT) is greater than or equal to the sixth reference current (IR6) (block 5906), the second data bit B1 is set high (B1=1) (block 5914), or otherwise the second data bit B1 is set low (B1=0) (block 5924). The data current (IDAT) is compared to the second reference current (IR2). If the data current (IDAT) is greater than or equal to the second reference current (IR2) (block 5908), the second data bit B1 is set high (B1=1) (block 5928), or otherwise the second data bit B1 is set low (B1=0) (block 5938). If the comparison at block 5904 determines that the data current (IDAT) is greater than or equal to the fourth reference current, then the data from the comparison at block 5908 is discarded (block 5934). On the other hand, if the data current (IDAT) is less than the fourth reference current (IR4) (block 5904), the comparison of block 5906 is discarded (block 5922).

During the second stage, the third data bit B0 is determined. If the data current (IDAT) comparison to the sixth reference current (IR6) (block 5906) indicates the second bit B1 is set high (B1=1) (block 5914), the second comparison operation compares the data current (IDAT) to the seventh reference current (IR7). If the data current (IDAT) is greater than or equal to the seventh reference current (IR7) (block 5916), the third data bit B0 is set high (B0=1) (block 5918), and the data in the cell corresponds to B2B1B0 equals '111'. On the other hand, if the data current (IDAT) is less than the seventh reference current (IR7) (block 5916), the third data bit B0 is set low (B0=0) (block 5920), and the data in the cell corresponds to B2B1B0 equals '110'.

On the other hand, if the data current (IDAT) comparison to the sixth reference current IR6 (block 5906) indicates the second bit B1 is set low (B1=0) (block 5925), the second comparison operation compares the data current (IDAT) to the fifth reference current (IR5). If the data current (IDAT) is greater than or equal to the fifth data current (block 5924), the third data bit B0 is set high (B0=1) (block 5926), and the data in the cell corresponds to B2B1B0 equals '101'. On the other hand, if the data current (IDAT) is less than the fifth reference current (IR5) (block 5924), the third data bit B0 is set low (B0=0) (block 5920), and the data in the cell corresponds to B2B1B0 equals '100'.

If the data current comparison to the second reference current IR2 indicates the second bit B1 is set high (B1=1) (block 5928), the second comparison operation compares the data current to the third reference current IR3. If the data current (IDAT) is greater than or equal to the third reference current IR3 (block 5930), the third bit B0 is set high (B0=1) (block 5932), and the data in the cell corresponds to B2B1B0 equals '011'. On the other hand, if the data current (IDAT) is not greater than or equal to the reference current IR3 (block 5930), the third bit B0 is set low (B0=0) (block 5936), and the data in the cell corresponds to B2B1B0 equals '010'.

On the other hand, if the data current (IDAT) comparison to the second reference current IR2 (block 5908) indicates a second bit B1 is set low (B1=0) (block 5938), the second comparison operation compares the data current (IDAT) to the first reference current (IR1). If the data current (IDAT) is greater than or equal to the first data current (IR1) (block 5940), the third data bit B0 is set high (B0=1) (block 5942), and the data in the cell corresponds to B2B1B0 equals '001'. On the other hand, if the data current (IDAT) is less than the first reference current (IR1) (block 5940), the third data bit B0 is set low (B0=0) (block 5936), and the data in the cell corresponds to B2B1B0 equals '000'.

By increasing the number of comparisons done at one time to thereby determine multiple bits in one comparison cycle, the number of sequential comparison cycles may be reduced to increase the binary search operation.

Figure 60:
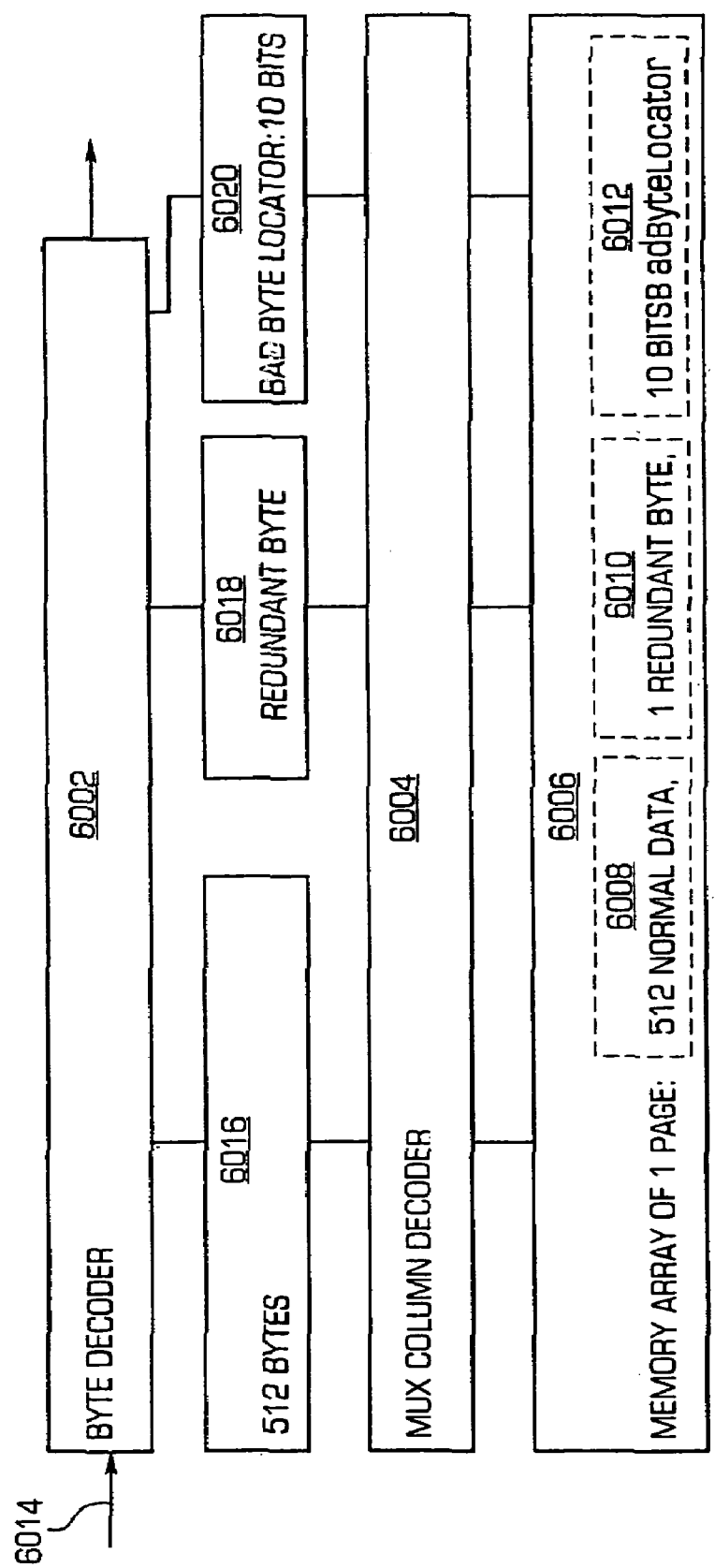
FIG. 60 is a block diagram illustrating a memory system with a built-in concurrent byte redundancy.

FIG. 60 is a block diagram illustrating a memory system 6000 including built-in concurrent byte redundancy.

The memory system 6000 may be a modified version of the super-high density, nonvolatile multilevel memory integrated circuit system of FIG. 2A. For clarity, FIG. 60 shows only the portions of the memory that are different. The memory system 6000 includes a byte decoder 6002, a multiplex column decoder 6004, and a memory array 6006. The byte decoder 6002 replaces the byte decoder 152 of FIG. 2A. The memory array 6006 is shown as a single page of the memory array 100. The multiplexer column decoder 6004 replaces the page select circuit 120 and the byte select circuit 140. As an illustrative example, a page of 512 bytes is described, but other sizes of pages may be used.

The memory array 6006 includes memory cells organized as a normal data region 6008, a redundant data region 6010, and a bad byte locator 6012. As an illustrative example, the memory array 6006 comprises 512 bytes of normal data in the normal data region 6008, one redundant byte in the redundant data region 6010, and 10 bits for the bad byte locator 6012. The bad byte locator 6012 includes an indicator of whether a bad byte exists in the normal data region 6008 of the memory array 6006, and includes an address of the location of the bad byte. In the illustrative embodiment, the bad byte locator 6012 includes one bit for the indicator and nine bits for the address of the bad byte. The byte decoder 6002 decodes an address 6014, which is shown illustratively in FIG. 60 as an address 6016 for the 512 bytes of normal data, an address 6018 for one redundant byte and an address 6020 for 10-bit bad byte locator, and addresses the page of the memory array 6006, and applies the decoded address to the multiplexer column decoder 6004 to address the memory array 6006.

In one embodiment, the bad byte latch may be configured to store a predetermined data pattern, such as 'FF' to disable programming of the bad byte of the normal data region 6008.

During byte loading, the byte decoder 6002 is addressed by the address 6014 to address the page of the memory array 6006 for loading data into the normal data region 6008, the redundant data region 6010, and the bad byte locator 6012. When the bad byte locator 6012 indicates a bad byte in the normal data region 6008, the byte data corresponding to this address is loaded into the redundant byte 6018. In one embodiment, the bad byte latch may remain with a predetermined data pattern, e.g., 'FF', to disable programming. In one embodiment, the bad byte locator 6012 is programmed during testing at another location, such as the manufacturer, with the bad byte indicator and the byte address of the location in the normal data region 6008 that is bad.

During a program and verify operation, the byte decoder 6002 addresses all locations of the normal data region 6008 and the redundant data region 6010 for writing the data, for example 513 bytes, into the memory cells of the memory array 6006. The bad byte locator 6012 is used by the byte decoder 6002 to determine whether the normal data region 6008 has a bad byte and the address of the bad byte from which the byte decoder 6002 determines the data for storing in the redundant data region 6010. In one embodiment, the bad byte is not programmed if an indicator 'FF' is used to disable the program and verify for that bad byte.

During a read operation, the byte decoder 6002 addresses all addresses in the page of the memory array 6006 to read the normal data region 6008, the redundant data region 6010, and the bad byte locator 6012. In the illustrative example, all 513 bytes of data and the 10 bits of the bad byte locator are read. The byte decoder 6002 decodes the bad byte locator 6012 to determine whether the byte redundancy is invoked and the address of the bad byte of the normal data region 6008. If the byte redundancy is invoked, the address of the bad byte is used to switch the data from the redundant data region 6010, and ignore the data read from the bad byte of the normal data region 6008.

During an erase operation, the byte decoder 6014 addresses all memory cells in the normal data region 6008 and the redundant data region 6010. In the illustrative embodiment, the 513 bytes are erased, but the bad byte locator 6012 is not erased. In another embodiment, the erase includes a process of storing the data in the bad byte locator 6020 in a latch, erasing the entire memory array 6006 and rewriting the data stored in the latch into the bad byte locator 6020.

In another embodiment, the memory cells may be verified and read in different sensing modes. For example, the memory cell may be verified by placing the memory cell in a voltage mode while reading of the memory cell may be done in a current sensing mode.

In another embodiment, additional reference currents may be formed by interpolating or extrapolating the values stored in the reference memory cells. For example, the reference memory cells may store data in 0.1 µa increments in a range from 0.0 to 1.6 µa. A reference current may be interpolated from currents with adjacent values stored in the reference memory cells, such as by forming a reference current as an average value between adjacent reference values. For example, the first memory cell may store 0.1 µa and a second memory cell may store 0.2 µa. A reference level of 0.15 µa may be generated by dividing the memory range into two. A reference current outside the range may be formed by extrapolation.

Figure 61:
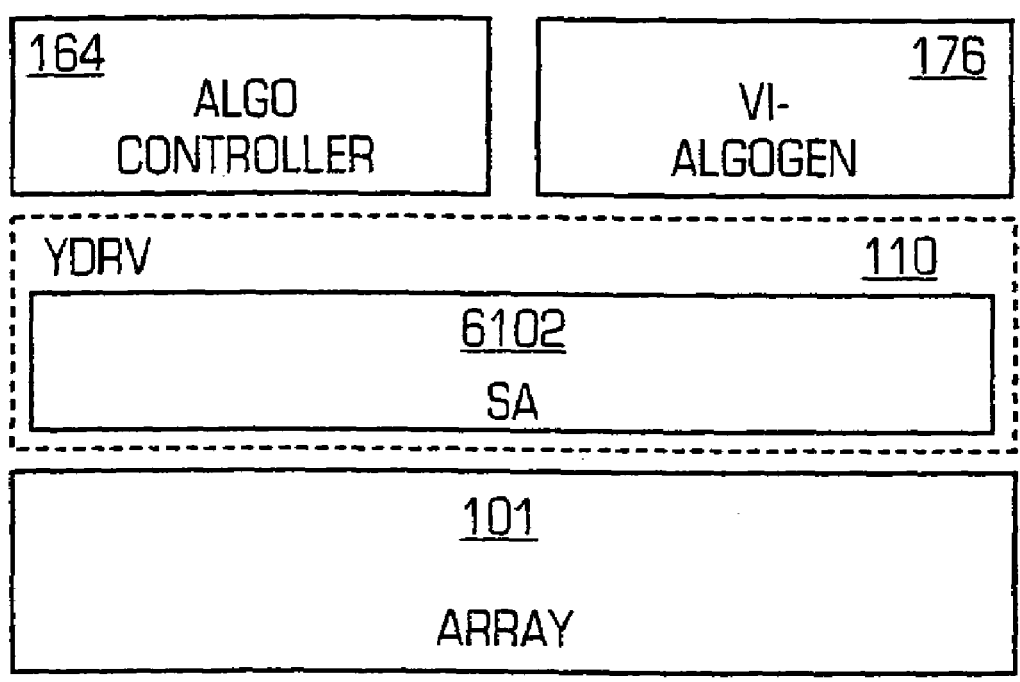
FIG. 61 is a block diagram illustrating a portion of the non-volatile multilevel memory integrated circuit system 2000 that executes a seek window programming procedure.

FIG. 61 is a block diagram illustrating a portion of the nonvolatile multilevel memory integrated circuit system 2000 that executes a seek window programming procedure.

The nonvolatile multilevel memory integrated circuit system 2000 comprises the algorithm controller 164, the voltage algorithm controller block 176, the plurality of y-drivers 110 and the plurality of memory arrays 101. The y-drivers 110 include a plurality of sense amplifiers 6102. The sense amplifiers 6102 may be the sense amplifiers described above in conjunction with FIGS. 28–57.

The algorithm controller 164 executes the multilevel erase, programming and sensing procedures for multilevel nonvolatile operation, and is also used to control the precise bias and timing conditions used for multilevel precision programming. The voltage algorithm controller 176 provides various specifically shaped voltage signals of various amplitudes and durations used for multilevel nonvolatile operation and to provide precise voltage levels with tight tolerance used for precision multilevel programming, erasing and sensing.

The algorithm controller 164 executes a multilevel cell seek window programming procedure that first seeks out a dynamic window collectively or individually and then executes precision programming. The dynamic window is a range of usable voltages or currents for the memory cells. The window may change depending on fundamental memory cell technology variation (distribution) (such as NAND cell, ETOX stack cell, or Source Side Injection Cell), data retention, foundry (e.g., different fabrication equipment causing different variation), data pattern (e.g., FF or AA or 00), and process drift. The window also may depend on the sensing method and mechanism, such as IM (current mode) sensing or VM (voltage mode) sensing. (In one embodiment, current mode sensing is used for the erase window for a deeper erase, and voltage mode sensing is used for the programming window for deeper programming.) The window may also depend on the cycling of the memory cells because the endurance of the cell depends on the number of program and erase cycles of the memory may be subjected to that changes the window of the memory cells. A typical cycling specification for flash memory is 10,000 to 100,000 cycles. The algorithm results in optimal programming time over memory cell distribution that may be due to a large memory array, cell variation, process variation, endurance, or data pattern.

The algorithm controller 164 seeks out the dynamic window of a group of cells (e.g., a sector of, e.g., 128 K or 32 K cells). After the window is found, the algorithm controller 164 applies precision programming to achieve precision levels.

Figure 62:
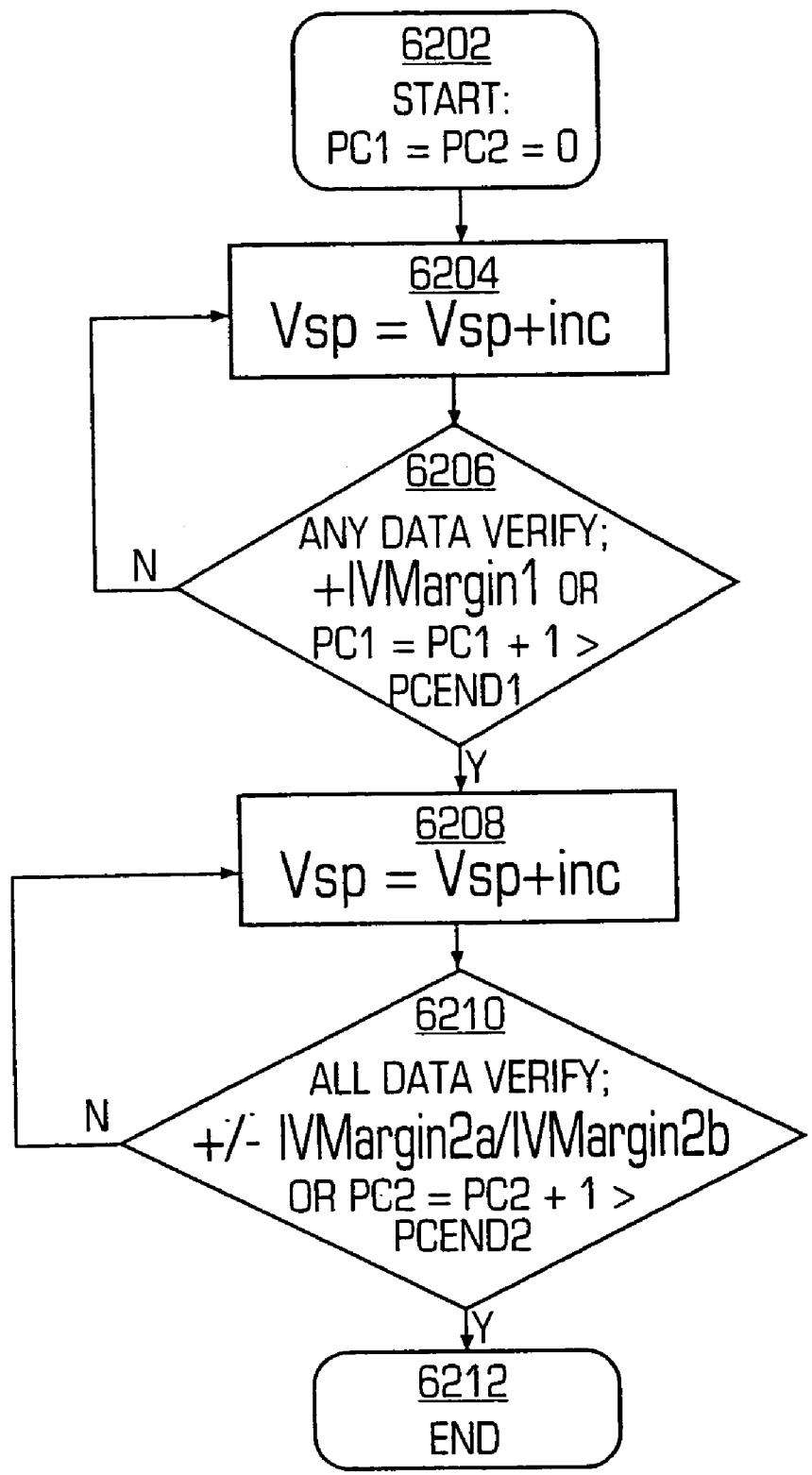
FIG. 62 is a flow chart illustrating an asymmetrical margining programming procedure.

FIG. 62 is a flow chart illustrating an asymmetrical margining programming procedure.

The algorithm controller 164 executes an asymmetrical margining programming procedure to search for one end of the dynamic window using a first parameter and then using a second parameter set to find the other end of the dynamic window. In this procedure, the dynamic window is searched for by stepping through varying increments in the programming voltage (Vsp) until data stored in any cell is verified to within a predetermined margin of a first endpoint of the dynamic window. The detected endpoint of the dynamic window may be within a range of the endpoint of the dynamic window because of the chosen incremental voltage. The endpoint of the dynamic window may refer to a voltage within this range. Afterward, all data is verified by stepping through all levels. The verification of the data may be verified within a predetermined margin that is different than the verification during the seeking process.

First and second increment pulse counters are initialized (PC1=PC2=0) (block 6202). The programming voltage VSP is incremented by a first incremental voltage (inc) (block 6204). The data is verified with a first margin (IVMargin1) associated with a reference level of the first point of the window (block 6206) and if the data is not verified and the first increment pulse counter (PC1) does not exceed a threshold (PC1+1>PCEND1), the first increment pulse counter (PC1) is incremented and the programming voltage is incremented (block 6204). If any data is verified or the first increment pulse counter (PC1) exceeds a threshold (PC1+1>PCEND1), all data is next programmed and verified. The programming voltage is again incremented, by an incremental voltage (inc) (block 6208). This data is verified using a different margin analysis (block 6210). In this verification, all data is verified with an upper margin (IVMargin2A) and a lower margin (IVMargin2B) associated with the reference levels corresponding to the data or until the second increment counter exceeds a threshold (PC2+1>PCEND2) (block 6210), and the programming ends (block 6212).

In one embodiment, the first margin (IVMargin1) is different from the second margin (IVMargin2a) and the third margin (IVMargin2b). In another embodiment, the first margin (IvMargin1) is equal to the second margin (IVMargin2a) and the third margin (IVMargin2b).

In alternative embodiments of FIGS. 62–66, the verifying is performed before the programming.

Figure 63:
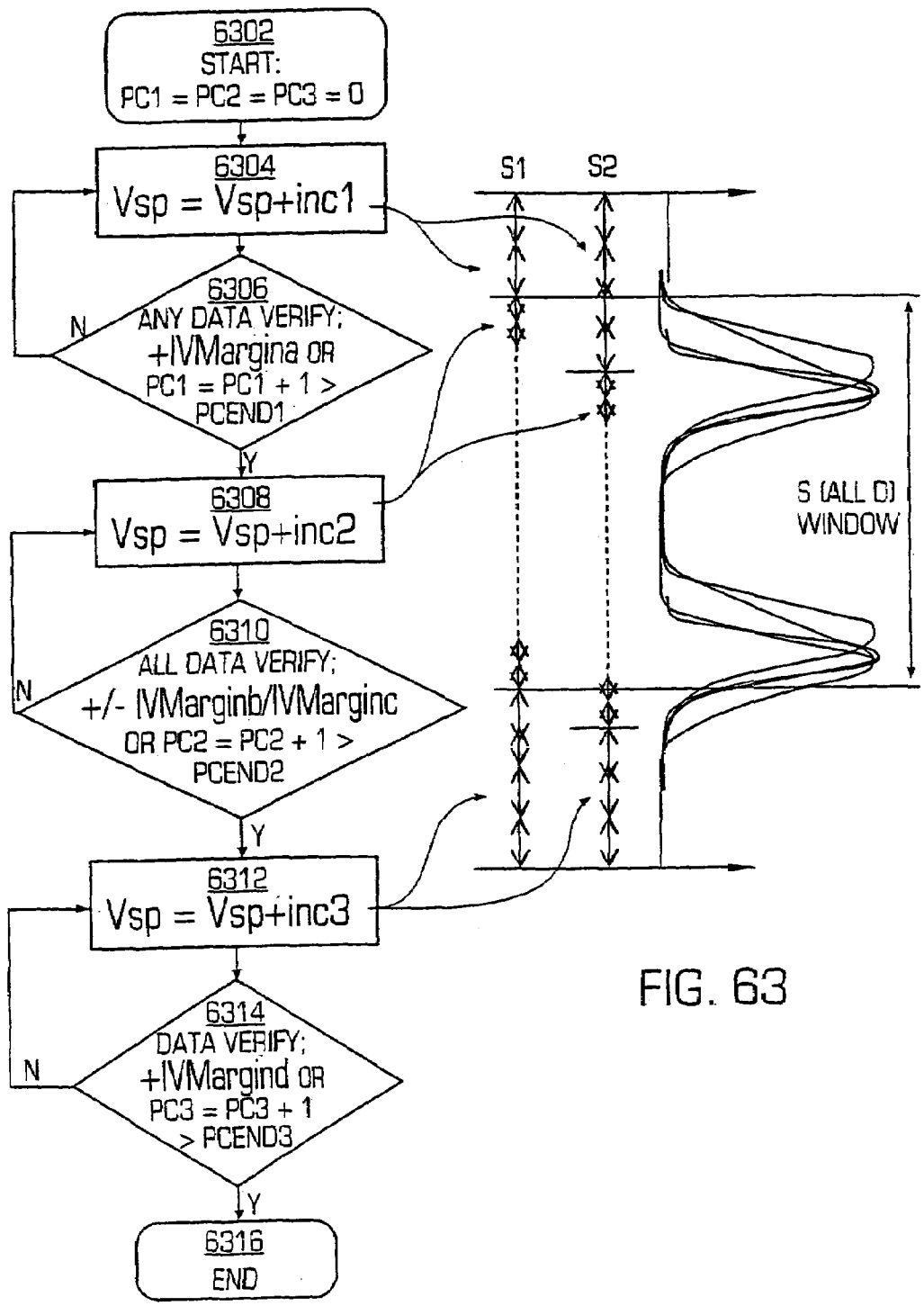
FIG. 63 is a flow diagram illustrating a seek window and programming procedure.

FIG. 63 is a flow diagram illustrating a seek window and program procedure.

First, second, and third increment pulse counters are initialized (PC1=PC2=PC3=0) (block 6302). The programming voltage VSP is incremented by a first incremental voltage (inc1) (block 6304). The data is verified with a first margin (IVMargina) associated with reference level of the first point of the window (block 6306), and if the data is not verified and the first increment pulse counter (PC1) does not exceed a threshold (PC1+1>PCEND1), the first increment pulse counter (PC1) is incremented and the programming voltage is incremented by the first incremental voltage (inc1) (block 6304). If any data is verified or the first increment pulse counter (PC1) exceeds a threshold (PC1+1>PCEND1), all data is next programmed and verified. The programming voltage is incremented by a second incremental voltage (inc2) (block 6308). The data is verified using a different margin analysis (block 6310). In this verification, all data is verified with an upper margin (IVMarginb) and a lower margin (IVMarginc) associated with the reference levels corresponding to the data or until the second increment pulse counter (PC2) exceeds a threshold (PC2+1>PCEND2) (block 6310). The remainder of the possible window is determined by a different margin analysis. In this section, the range is evaluated for whether certain selected data is verified. The certain selected data indicates end of window data. Specifically, the programming voltage VSP is incremented by an incremental voltage (inc3) (block 6312). The selected data is verified with a fourth margin (IVMargind) associated with a reference level of a second point of the window (block 6314), and if the data is not verified or the third increment pulse counter (PC3) does not exceed a threshold (PC3+1>PCEND3), the third increment pulse counter is incremented and the programming voltage is incremented by the incremental voltage (inc3) (block 6312). If selected data is verified within the fourth margin (IVMargind) or the third increment pulse counter (PC3) exceeds a threshold (PC3+1>PCEND3) (block 6314), the analysis of the range is terminated and the programming ends (block 6312).

Figure 64:
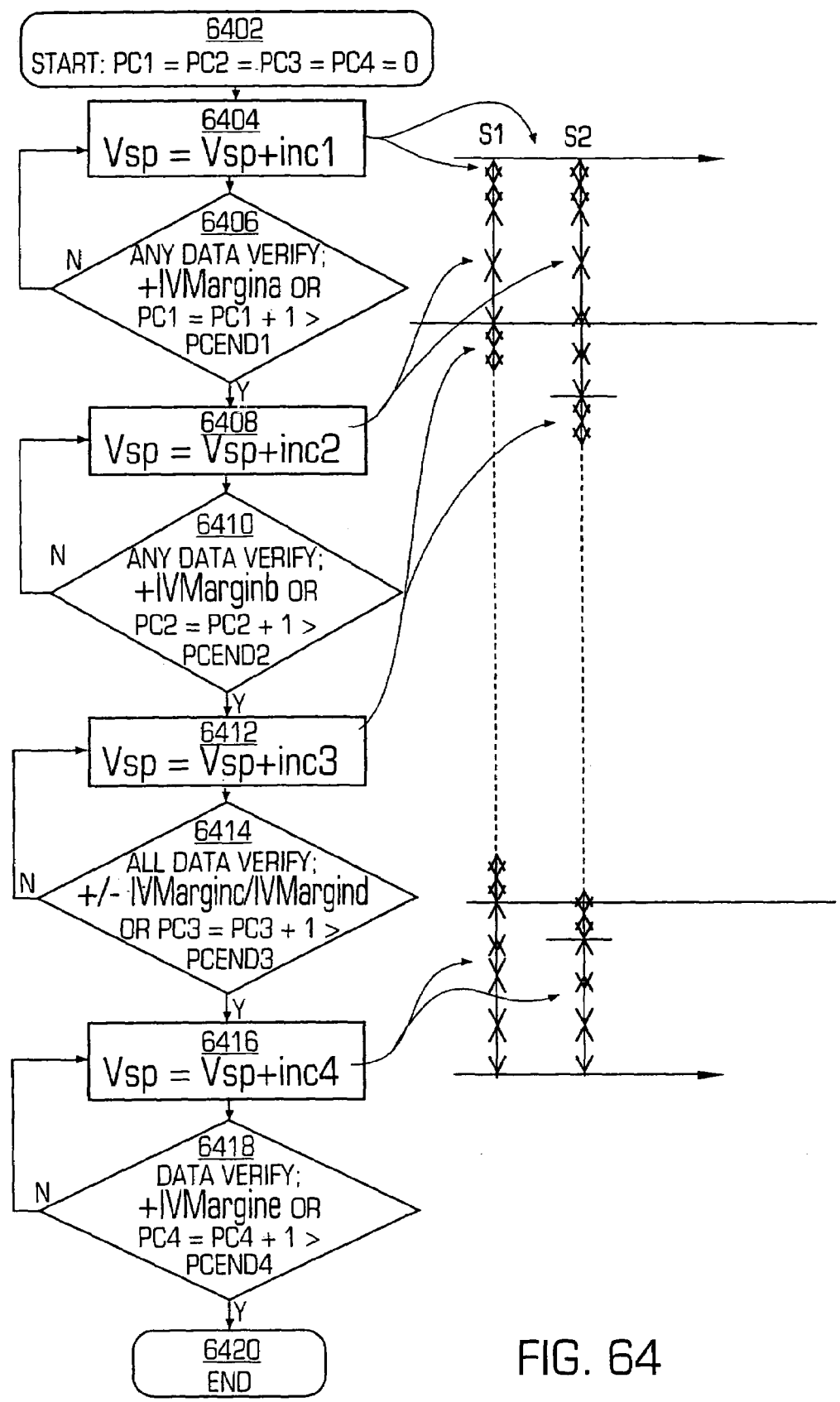
FIG. 64 is a flow diagram illustrating a seek window and programming procedure in a second embodiment.

FIG. 64 is a flow diagram illustrating a seek window and programming procedure in a second embodiment.

The algorithm controller 164 first seeks a dynamic window of a group of cells (e.g., a sector that may include for example 128 k or 32 k memory cells). The seeking of the window is done by using a combination of variable steps to seek out the first end portion of the window.

First, second, third, and fourth increment pulse counters are initialized (PC1=PC2=PC3=PC4=0) (block 6402). The programming voltage VSP is incremented by a first incremental voltage (inc1) (block 6404). The data is verified with a first margin (IVMargina) associated with reference level of the first point of the window (block 6406), and if the data is not verified and the first increment pulse counter (PC1) does not exceed a threshold (PC1+1>PCEND1), the first increment pulse counter (PC1) is incremented and the programming voltage is incremented by the first incremental voltage (inc1) (block 6404). If any data is verified, the programming and verification of other data is tested by changing the increment steps of the programming voltage VSP. Specifically, the programming voltage is incremented by a second incremental voltage (inc2) (block 6408). The data is verified with a second margin (IVMarginb) associated with the reference level of a second point of the window (block 6410), and if the data is not verified and the second increment pulse counter (PC2) does not exceed a threshold (PC2+1>PCEND2), the second increment pulse counter (PC2) is incremented and the programming voltage is incremented by the second incremental voltage (inc2) (block 6408). If any data is verified or the second increment pulse counter (PC2) exceeds a threshold (PC2+1>PCEND2), all data is next programmed and verified. The programming voltage is incremented by a third incremental voltage (inc3) (block 6412). The data is verified by a different margin analysis (block 6414). In this verification, all data is verified with an upper margin (IVMarginc) and a lower margin (IVMargind) associated with the reference levels corresponding to the data or until the third increment pulse counter exceeds a threshold (PC3+1>PCEPD3) (block 6414). The remainder of the possible windows is determined by a different margin analysis. In this section, the range is evaluated for whether certain selected data is verified. The certain selected data indicates end of window data. Specifically, the programming voltage VSP is incremented by a fourth incremental voltage (inc4) (block 6412). The data is verified against a fifth margin (IVMargine) associated with a second point of the window (block 6418), and if the block is not verified and the fourth increment pulse counter (PC4) does not exceed a threshold (PC4+1>PCEND4), the fourth increment pulse counter (PC4) is incremented and the programming voltage VSP is incremented by the fourth incremental voltage (inc4) (block 6416). If selected data is verified to within the fifth margin (IVMargine) or the fourth increment pulse counter exceeds a threshold (PC4+1>PCEND4) (block 6418), the analysis of the range is terminated and the programming ends (block 6420).

Figure 65:
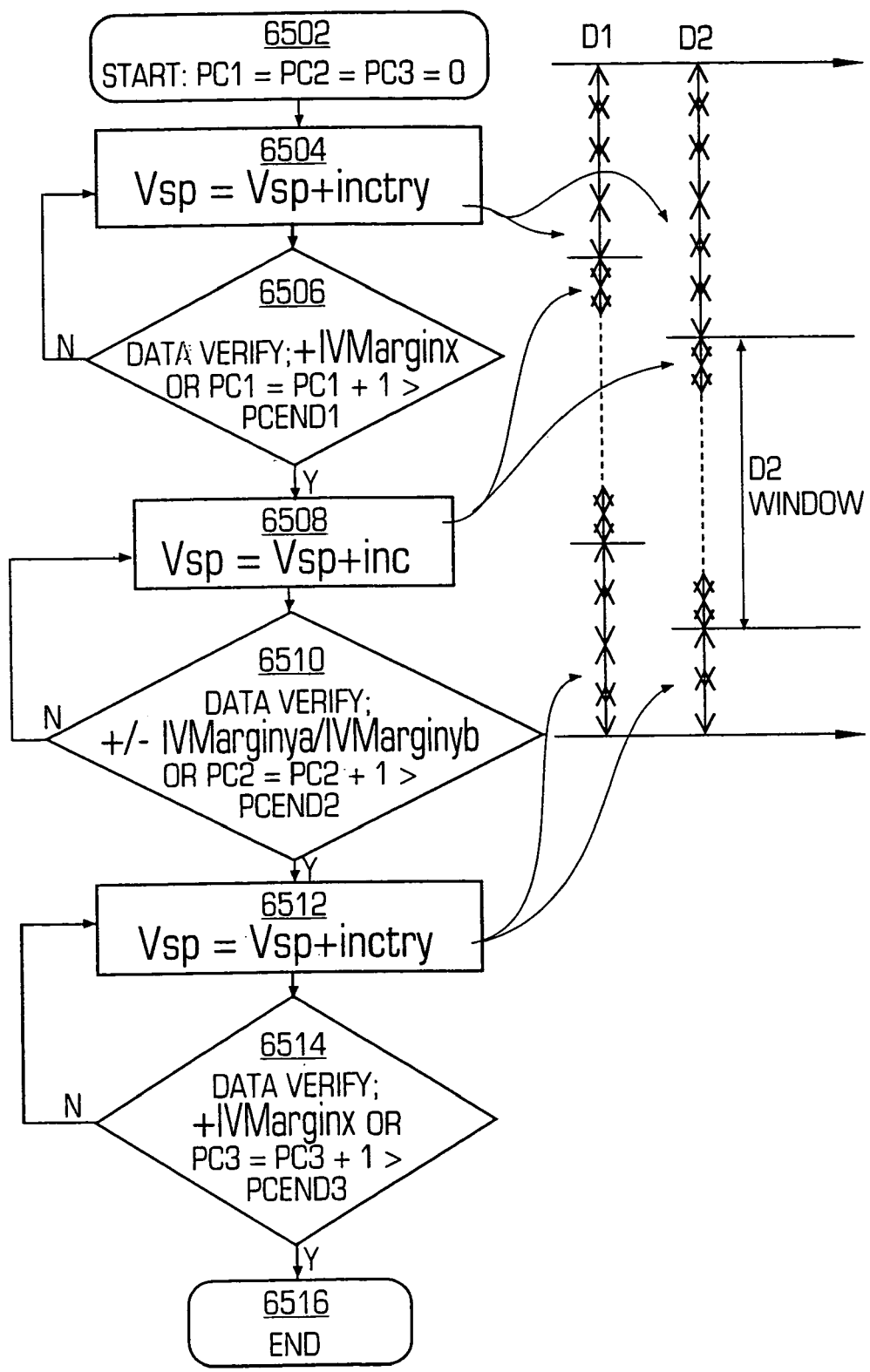
FIG. 65 is a flow diagram illustrating a seek window and programming procedure in a third embodiment.

FIG. 65 is a flow diagram illustrating a seek window and programming procedure in a third embodiment.

The algorithm controller 164 first seeks out a window for individual cells (e.g., D1 or D2) and then applies precision programming for the found data window to achieve precision levels.

First, second, and third increment pulse counters are initialized (PC1=PC2=PC3=0) (block 6502). The programming voltage VSP is incremented by a first incremental voltage (inctry) (block 6504). The data is verified with a first margin (IVMarginx) associated with the reference level of the first point of the window (block 6506), and if the data is not verified and the first increment pulse counter (PC1) does not exceed a threshold (PC1+1>PCEND1), the first increment pulse counter (PC1) is incremented and the programming voltage is incremented by the first incremental voltage (inctry) (block 6504). If any data is verified or the first increment pulse counter (PC1) exceeds a threshold (PC1+1>PCEND1, all data is next programmed and verified. The programming voltage is incremented by a second incremental voltage (inc) (block 6508). The data is verified by a different margin analysis (block 6510). In this verification, all data is verified with an upper margin (IVMarginya) and a lower margin (IVMarginyb) associated with the reference levels of the data, or until the second increment pulse counter (PC2) exceeds a threshold (PC2+1>PCEND2) (block 6510). The remainder of the possible window is determined by a different margin analysis. In this section, the range is evaluated for whether certain selected data is verified. The certain selected data corresponds to end of window data. Specifically, the programming voltage VSP is incremented by the first incremental voltage (inctry) (block 6512). The data is verified against the first margin (IVMarginx) (block 6514), and if the data is not verified or the third increment pulse counter (PC3) exceeds a threshold (PC3+1>PCEND3), the third increment pulse counter is incremented and the programming voltage is incremented (block 6512). If selected data is verified within the first margin (IvMarginx) (block 6514), the analysis of the range is terminated and the programming ends (block 6516).

Figure 66:
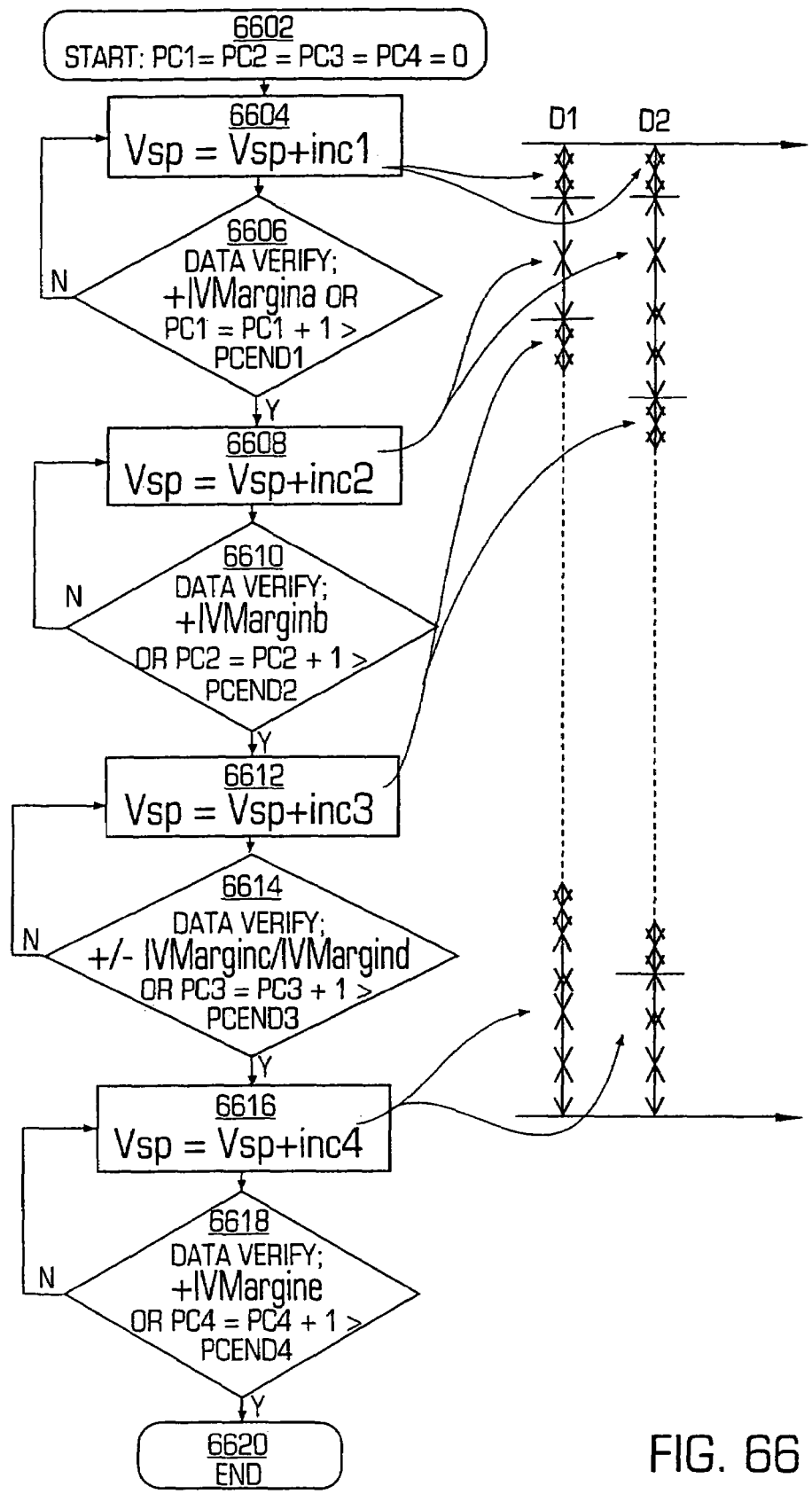
FIG. 66 is a flow diagram illustrating a seek window and programming procedure in accordance with a fourth embodiment.

FIG. 66 is a flow diagram illustrating a seek window and programming procedure in accordance with a fourth embodiment.

The algorithm controller 164 first seeks out a window for individual cells (e.g., D1 or D2) and then applies precision programming for the found data window to achieve precision levels. The seeking is done by using a combination of small steps and large steps to seek out the first end portion of the window.

First, second, third, and fourth increment pulse counters are initialized (PC1=PC2=PC3=PC4=0) (block 6602). The programming voltage VSP is incremented by a first incremental voltage (inc1) (block 6604). The data is verified with a first margin (IVMargina) associated with the reference level of the first point of the window (block 6606), and if data is not verified and the first increment pulse counter (PC1) does not exceed a threshold (PC1+1>PCEND1), the first increment pulse counter (PC1) is incremented and the programming voltage is incremented by the first incremental voltage (inc1) (block 6604). If any data is verified or the first increment pulse counter (PC1) exceeds a threshold (PC+1>PCEND1), the dynamic range is sought using a different sized increment, and verified against a different margin. The programming voltage VSP is incremented by a second incremental voltage (inc2) (block 6608). The data is verified with a second margin (IvMarginb) associated with the reference level at the second point of the window (block 6610), and if the data is not verified and the second increment pulse counter (PC2) does not exceed a threshold (PC2+1>PCEND2), the second increment pulse counter (PC2) is incremented and the programming voltage is incremented by the second incremental voltage (inc2) (block 6608). If any data is verified, all data is next programmed and verified. The programming voltage is incremented by a third incremental voltage (inc3) (block 6612). The data is verified by a different margin analysis (block 6614). In this verification, all data is verified with an upper margin (IVMarginc) and a lower margin (IVMargind) associated with the reference levels or until the third increment pulse counter (PC3) exceeds a threshold (PC3+1>PCEND3) (block 6614). The remainder of the possible window is determined by a different margin analysis. In this section, the range is evaluated for whether certain selected data is verified. The certain selected data corresponds to end of window data. Specifically, the programming voltage VSP is incremented by a fourth increment voltage (inc4) (block 6616). The data is verified against a fifth margin (IVMargine) associated with a third point of the window (block 6618), and if the data is not verified and the fourth increment pulse counter (PC4) does not exceed a threshold (PC4+1>PCEND4), the fourth increment pulse counter (PC4) is incremented and the programming voltage is incremented (block 6616). If selected data is verified to within the fifth margin (IVMargine) or the fourth increment pulse counter (PC4) exceeds a threshold (PC4+1>PCEND4) (block 6618), the analysis of the range is terminated and the programming ends (block 6620).

In alternative embodiments of the embodiments of FIGS. 62–67, the margins used in the programming and verify may be different or equal to other margins used during the procedures. In yet other alternative embodiments of the embodiments of FIGS. 62–67, the increments in the programming voltages used in the programming and verify may be different or equal to other programming voltages used during the procedures.

Figure 67:
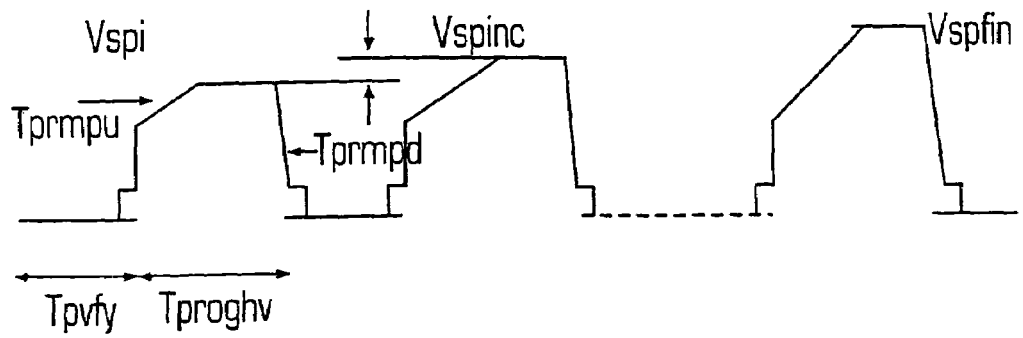
FIG. 67 is a timing diagram illustrating the programming voltage in an unequal margin verify-program procedure.

FIG. 67 is a timing diagram illustrating the programming voltage in an unequal margin verify-program procedure.

In this algorithm unequal steps are used to cover a greater voltage range in less time. The table portion of FIG. 67 shows the time of various parts of the programming pulse and the voltage levels of the programming pulse VSP.

The timing diagram of FIG. 67 is an illustrative embodiment of using unequal programming steps. The programming pulse has a verify time (Tpvfy) and a high voltage programming time (Tproghv). The programming high voltage time (Tproghv) comprises a ramp up time (Tprmpu), a flat portion time (Tprflat) and a ramp down time (Tprmpd). The programming voltage Vsp has increasing levels for each pulse with a first pulse having a voltage Vspi, the second pulse having a voltage that is an incremented voltage Vspinc greater than the first pulse Vspi. Subsequent pulses increase by the incremented voltage Vspinc so that the last pulse has an amplitude voltage Vspfin. During the programming, a programming current (ISP) is applied to the memory cells. The pulsewidth of one pulse is (Tp_1pls) and the total programming time is Tprogr_tol. As shown, the first eight and the last eight pulses have a greater increment than the other pulses.

In other embodiments, the incremental voltage may be changed linearly or geometrically.

Figure 68:
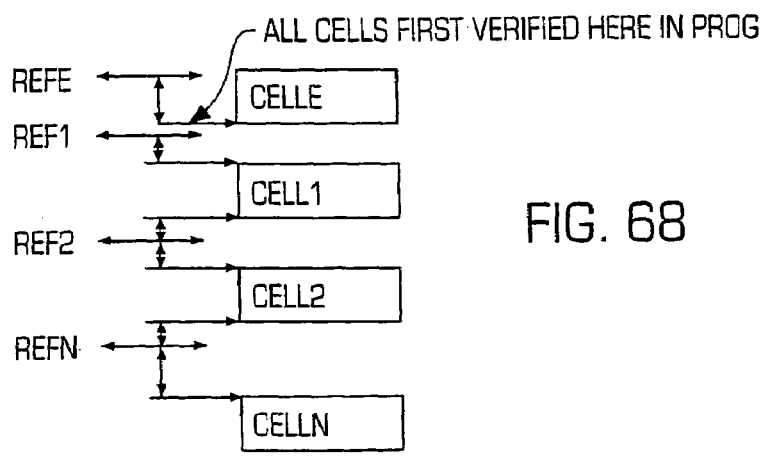
FIG. 68 is a diagram illustrating one embodiment of the reference voltage margin of the programming procedures of FIGS. 62–67.

FIG. 68 is a diagram illustrating the reference voltage margin of the programming procedures of FIGS. 62–67.

In this embodiment, unequal margins are used to speed up the programming. During the programming verify, a large margin is first used. For example, a first cell (cellE) is verified using a larger margin relative to a reference voltage REFE, and a second cell (cellN) is verified also using a larger margin relative to a reference voltage REFN. The larger margin uses less time at the beginning of the programming. Subsequent smaller margins such as shown in other cells (Cell1 and Cell2) are applied against other reference voltages REF1 and REF2, respectively.

Figure 69:
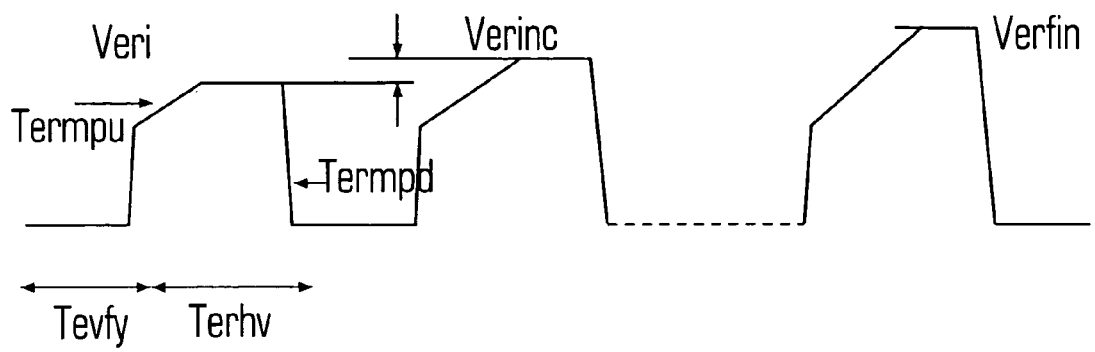
FIG. 69 is a timing diagram illustrating the voltage of an unequal incremental double ramp rate verify-erase procedure.

FIG. 69 is a timing diagram an unequal incremental double ramp rate verify-erase procedure.

In the erase algorithm, unequal steps are used to cover a greater voltage range in less time.

The timing diagram of FIG. 69 is an illustrative embodiment of using unequal erase steps. The erase pulse has an erase verify time (Tevfy) and a high voltage erase time (Terhv). The erase high voltage time (Terhv) comprises a ramp up time (Termpu), a flat portion time (Terflat) and a ramp down time (Termpd). The erase voltage Ver has increasing levels for each pulse with a first pulse having a voltage Veri, the second pulse having a voltage that is an incremented voltage Verinc greater than the first pulse Veri. Subsequent pulses increase by the incremented voltage Verinc so that the last pulse has an amplitude voltage Verfin. The pulsewidth of one pulse is (Terlpls) and the total erase time is Ter_tol. As shown, the last two pulses have a greater increment than the other pulses.

In other embodiments, the incremental voltage may be changed linearly or geometrically.

In the foregoing description, various methods and apparatus, and specific embodiments are described. However it should be obvious to the one conversant in the art, various alternatives, modifications, and changes may be possible without departing from the spirit and the scope of the invention which is defined by the metes and bounds of the appended claims.

What is claimed is:

1. A method for determining valid voltages for accessing a plurality of digital multilevel memory cells comprising:
   dynamically detecting a window of valid data voltages for said plurality of digital multilevel memory cells.

2. The method of claim 1 wherein the detecting comprises:
   incrementing a first programming voltage to program data in said plurality of memory cells;
   verifying whether said data in at least one of said plurality of memory cell is properly programmed; and
   repeating said incrementing and verifying until data is verified to be properly programmed in one of said plurality of memory cells.

3. The method of claim 2 wherein said verifying includes voltage mode sensing of the memory cells.

4. The method of claim 2 wherein said verifying includes current mode sensing of the memory cells.

5. The method of claim 2 wherein the memory cells are source side injection flash memory cells.

6. The method of claim 1 further comprising:
   verifying data in each memory cell of said plurality of memory cell.

7. The method of claim 6 wherein said verifying data at each memory cell includes voltage mode sensing of the memory cells.

8. The method of claim 6 wherein said verifying data in each memory cell includes current mode sensing of the memory cells.

9. The method of claim 6 wherein the verifying data further comprises:
   incrementing a second programming voltage;
   verifying whether data in each memory cell is properly programmed within a margin;
   repeating said incrementing and verifying for each memory cell outside of said margin.

10. The method of claim 9 wherein the margin has a upper margin and a lower margin, the upper margin being different than the lower margin.

11. The method of claim 10 wherein the verifying of said detecting is to another margin, said another margin being different than said upper and lower margins.

12. The method of claim 9 wherein the incrementing the first programming voltage includes incrementing said first programming voltage by a first incremental voltage, and wherein the incrementing the second programming voltage includes incrementing said second programming voltage by a second incremental voltage.

13. The method of claim 12 wherein the first and second incremental voltages are equal.

14. The method of claim 12 wherein the first and second incremental voltages are different.

15. A method for determining valid voltages for accessing a plurality of digital multilevel memory cells, the memory cells being arranged in sectors, the method comprising:
   dynamically detecting a window of valid data voltages for one of said sectors of said plurality of digital multilevel memory cells.

16. The method of claim 15 wherein the detecting comprises:
   first incrementing a first programming voltage by a first incremental voltage to program data in said sector of memory cells;
   first verifying whether said data in at least one memory cells of said sector is properly programmed; and
   first repeating said first incrementing and first verifying until data is verified to be properly programmed in one memory cell of said sector;
   second incrementing said first programming voltage by a second incremental voltage to program data in a sector of memory cells;
   second verifying whether said data in at least one memory cells of said sector is properly programmed; and
   second repeating said second incrementing and second verifying until data is verified to be properly programmed in one memory cell of said sector.

17. The method of claim 16 wherein said first and second verifying each include voltage mode sensing of the memory cells.

18. The method of claim 16 wherein said first and second verifying each include current mode sensing of the memory cells.

19. The method of claim 16 wherein said memory cells are source side injection flash memory cells.

20. The method of claim 16 further comprising:
   verifying data in each memory cell of said plurality of memory cells.

21. The method of claim 20 wherein the verifying data further comprises:
   incrementing a second programming voltage by a third incremental voltage;
   verifying whether data in each memory cell of a sector is properly programmed;
   repeating said incrementing and verifying for each memory cell outside of a margin.

22. The method of claim 21 wherein the verifying of said detecting is to another margin, said another margin being different than said first and second margins.

23. The method of claim 21 wherein the first, second, and third incremental voltages are different.

24. The method for determining valid voltages for accessing a plurality of digital multilevel memory cells, the method comprising:
   detecting a window of valid data voltages for said plurality of digital multilevel memory cells;
   verifying and programming with incremental small changes in a programming voltage; and verifying and programming with incremental large steps in said programming voltage.

25. The method of claim 24 wherein said small steps are variable.

26. The method of claim 25 wherein said large steps are variable.

27. A method of determining valid voltages for accessing a plurality of digital multilevel cells, the method comprising:
   detecting a window of valid data voltages for said plurality of digital multilevel memory cells;
   verifying and programming said plurality of memory cells using incremental changes in a programming voltage, said verifying including verifying a memory cell is properly programmed within a margin,
   wherein a valid voltage having a highest voltage and a valid voltage having a lowest voltage are verified relative to a first margin, other valid voltages are verified relative to a second margin, the first margin being greater than said second margin.

* * * * *